US012191282B2

(12) United States Patent
Chuang et al.

(10) Patent No.: US 12,191,282 B2
(45) Date of Patent: Jan. 7, 2025

(54) SHARED PAD/BRIDGE LAYOUT FOR A 3D IC

(71) Applicant: Taiwan Semiconductor Manufacturing Company, Ltd., Hsinchu (TW)

(72) Inventors: Harry-Hak-Lay Chuang, Zhubei (TW); Wei-Cheng Wu, Zhubei (TW); Wen-Tuo Huang, Tainan (TW); Chia-Sheng Lin, Tainan (TW); Wei Chuang Wu, Tainan (TW); Shih Kuang Yang, Tainan (TW); Chung-Jen Huang, Tainan (TW); Shun-Kuan Lin, Tainan (TW); Chien Lin Liu, Kaohsiung (TW); Ping-Tzu Chen, Tainan (TW); Yung Chun Tu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 380 days.

(21) Appl. No.: 17/702,068

(22) Filed: Mar. 23, 2022

(65) Prior Publication Data
US 2023/0170328 A1    Jun. 1, 2023

Related U.S. Application Data

(60) Provisional application No. 63/284,194, filed on Nov. 30, 2021.

(51) Int. Cl.
*H01L 25/065* (2023.01)
*H01L 23/00* (2006.01)
*H01L 25/00* (2006.01)

(52) U.S. Cl.
CPC .......... *H01L 25/0657* (2013.01); *H01L 24/08* (2013.01); *H01L 24/80* (2013.01);
(Continued)

(58) Field of Classification Search
CPC ..... H01L 25/0657; H01L 25/50; H01L 24/08; H01L 24/80
See application file for complete search history.

(56) References Cited

U.S. PATENT DOCUMENTS

| 10,157,867 B1 | 12/2018 | Chen et al. |
| 2010/0290191 A1 | 11/2010 | Lin et al. |

(Continued)

*Primary Examiner* — Marc Anthony Armand
(74) *Attorney, Agent, or Firm* — Eschweiler & Potashnik, LLC

(57) ABSTRACT

Various embodiments of the present disclosure are directed towards a shared frontside pad/bridge layout for a three-dimensional (3D) integrated circuit (IC), as well as the 3D IC and a method for forming the 3D IC. A second IC die underlies the first IC die, and a third IC die underlies the second IC die. A first-die backside pad, a second-die backside pad, and a third die backside pad are in a row extending in a dimension and overlie the first, second, and third IC dies. Further, the first-die, second-die, and third-die backside pads are electrically coupled respectively to individual semiconductor devices of the first, second, and third IC dies. The second and third IC dies include individual pad/bridge structures at top metal (TM) layers of corresponding interconnect structures. The pad/bridge structures share the shared frontside pad/bridge layout and provide lateral routing in the dimension for the aforementioned electrical coupling.

20 Claims, 96 Drawing Sheets

(52) U.S. Cl.
CPC .... *H01L 25/50* (2013.01); *H01L 2224/08146* (2013.01); *H01L 2224/80001* (2013.01); *H01L 2225/06541* (2013.01)

(56) References Cited

U.S. PATENT DOCUMENTS

| | | |
|---|---|---|
| 2011/0291266 A1 | 12/2011 | Jin et al. |
| 2012/0193785 A1 | 8/2012 | Lin et al. |
| 2016/0379960 A1 | 12/2016 | Huang et al. |
| 2018/0277519 A1 | 9/2018 | Lee et al. |
| 2019/0385977 A1 | 12/2019 | Elsherbini et al. |
| 2020/0135617 A1 | 4/2020 | Shen et al. |
| 2020/0161263 A1 | 5/2020 | Chen et al. |
| 2020/0273839 A1 | 8/2020 | Elsherbini et al. |
| 2020/0350284 A1* | 11/2020 | Shih .................... H01L 25/0657 |
| 2020/0395309 A1 | 12/2020 | Cheah et al. |
| 2021/0005577 A1* | 1/2021 | Zhao .................. H01L 25/0657 |
| 2021/0082873 A1 | 3/2021 | Chen et al. |
| 2021/0193622 A1 | 6/2021 | Choi |
| 2021/0273156 A1* | 9/2021 | Chen ...................... H10N 50/10 |
| 2021/0324136 A1 | 10/2021 | Choi et al. |
| 2021/0391302 A1* | 12/2021 | Kao ........................ H01L 24/08 |

* cited by examiner

SHARED PAD/BRIDGE LAYOUT FOR A 3D IC

REFERENCE TO RELATED APPLICATION

This application claims the benefit of U.S. Provisional Application No. 63/284,194, filed on Nov. 30, 2021, the contents of which are incorporated by reference in their entirety.

BACKGROUND

The semiconductor industry has continually improved the processing capabilities and power consumption of integrated circuits (ICs) by shrinking the minimum feature size. However, in recent years, process limitations have made it difficult to continue shrinking the minimum feature size. The stacking of two-dimensional (2D) ICs into three-dimensional (3D) ICs has emerged as a potential approach to continue improving processing capabilities and power consumption of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 26A and 26B to FIGS. 30A and 30B illustrate perspective views of some embodiments of the 3D IC of FIG. 24 in which conductive paths are emphasized.

DETAILED DESCRIPTION

Figure 1:
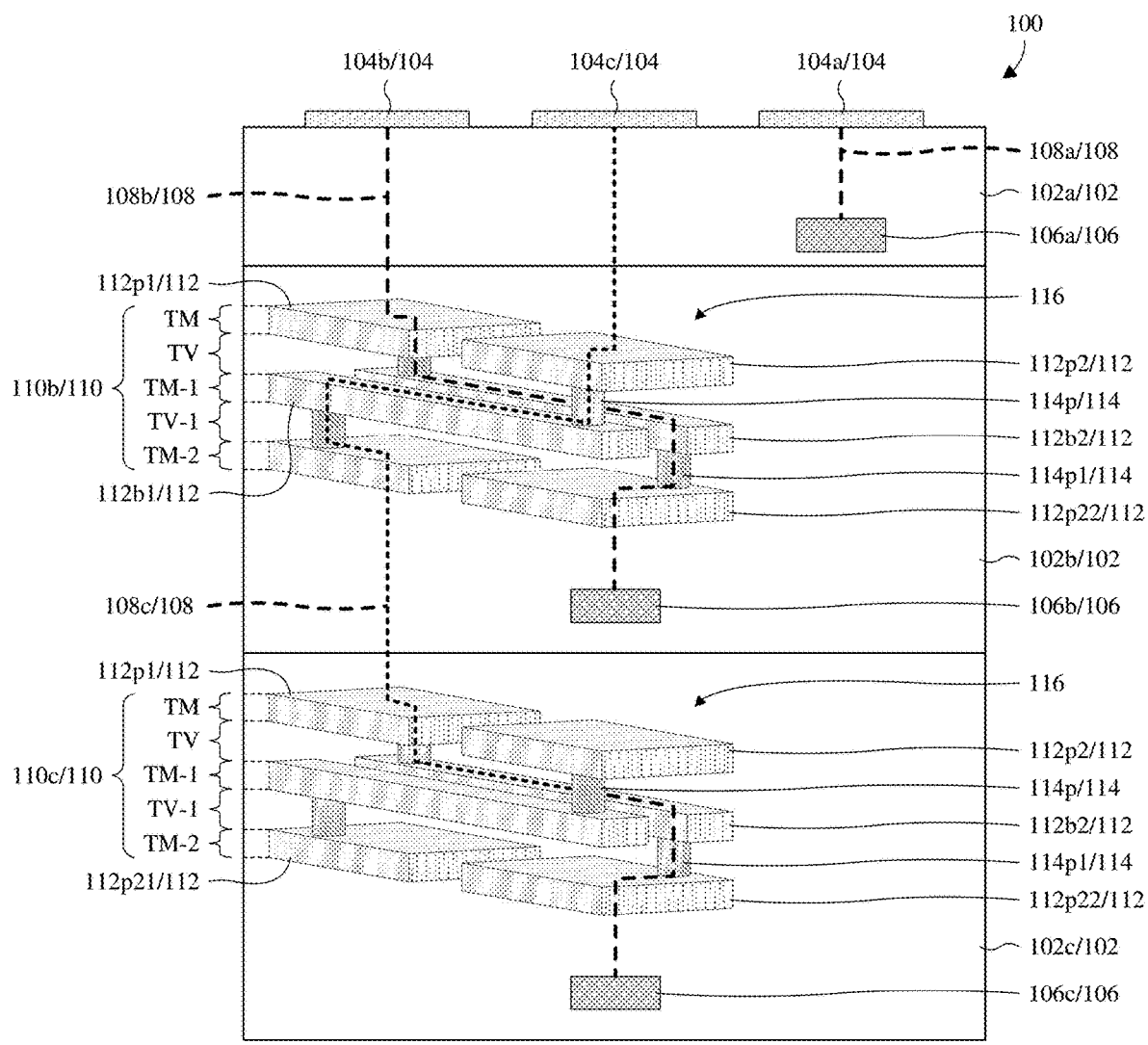
FIG. 1 illustrates a schematic view of some embodiments of a three-dimensional (3D) integrated circuit (IC) comprising a shared frontside pad/bridge layout.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional (3D) integrated circuit (IC) may comprise a first IC die, a second IC die underlying and bonded to the first IC die, and a third IC die underlying and bonded to the second IC die. Further, the 3D IC may comprise a plurality of backside pads overlying the first, second, and third IC dies. The plurality of backside pads comprises a first-die backside pad, a second-die backside pad, and a third-die backside pad arranged in a row and electrically coupled respectively to a semiconductor device of the first IC die, a semiconductor device of the second IC die, and a semiconductor device of the third IC die. This facilitates monitoring of electrical performance of the semiconductor devices from the backside pads.

For certain applications of the 3D IC, the second and third IC dies may be duplicates of each other, except for different frontside pad/bridge layouts facilitating the aforementioned electrical coupling. The different frontside pad/bridge layouts may respectively be at individual top metal (TM) layers of the second and third IC dies. The TM layer of the second IC die may comprise a first set of frontside pads individual to and respectively underlying the second-die and third-die backside pads, and the TM layer of the third IC die may comprise a second set of frontside pads individual to and respectively underlying the second-die and third-die backside pads. Further, the TM layer of the third IC die may comprise a bridge bridging the frontside pads of the second set, whereas the TM layer of the second IC die may be devoid of a bridge bridging the frontside pads of the first set. Because of the different frontside pad/bridge layouts, separate photoreticles/photomasks may be used to form the TM layers of the second and third IC dies. This may, in turn, lead to high costs and/or reduced throughput.

Various embodiments of the present disclosure are directed towards a shared frontside pad/bridge layout for a 3D IC, as well as the 3D IC and a method for forming the 3D IC. In some embodiments, the 3D IC is as above, except for use of the shared frontside pad/bridge layout in place of the different frontside pad/bridge layouts. Because the shared frontside pad/bridge layout is shared, and hence the same in both the second and third IC dies, the shared frontside pad/bridge layout does not depend on separate photoreticles/photomasks for the second and third IC dies. As such, the 3D IC may be formed with a lesser number of photoreticles/photomasks to reduce costs and/or increase throughput.

With reference to FIG. 1, a schematic view 100 of some embodiments of a 3D IC comprising a shared frontside pad/bridge layout is provided. The 3D IC comprises a plurality of IC dies 102 and a plurality of backside pads 104. The plurality of IC dies 102 includes a first IC die 102a, a second IC die 102b underlying and bonded to the first IC die 102a, and a third IC die 102c underlying and bonded to the second IC die 102b. The plurality of backside pads 104 overlie the plurality of IC dies 102 in a row. Further, the plurality of backside pads 104 includes a first-die backside pad 104a, a second-die backside pad 104b, and a third-die backside pad 104c between the first-die and second-die backside pads 104a, 104b.

The IC dies 102 comprise individual semiconductor devices 106 electrically and respectively coupled to the backside pads 104 by corresponding conductive paths 108. A first-die semiconductor device 106a of the first IC die 102a is electrically coupled to the first-die backside pad 104a by a first-die conductive path 108a. A second-die semiconductor device 106b of the second IC die 102b is electrically coupled to the second-die backside pad 104b by a second-die conductive path 108b. A third-die semiconductor device 106c of the third IC die 102c is electrically coupled to the third-die backside pad 104c by a third-die conductive path 108c. The electrical coupling by the conductive paths 108 may, for example, facilitate monitoring of electrical performance of the semiconductor devices 106.

The IC dies 102 further comprise individual interconnect structures 110, each partially forming at least one of the conductive paths 108. Note that the interconnect structure 110 of the first IC die 102a is not shown, and further note that the interconnect structures 110 of the second and third IC dies 102b, 102c are only partially shown. A second-die interconnect structure 110b of the second IC die 102b partially forms the second-die and third-die conductive paths 108b, 108c, but not the first-die conductive path 108a. A third-die interconnect structure 110c of the third IC die 102c partially forms the third-die conductive path 108c but not the first-die and second-die conductive paths 108a, 108b.

The interconnect structures 110 comprise a plurality of interconnect features 112 and plurality of interconnect vias 114. The interconnect features 112 may be, for example, pads, wires, lines, the like, or any combination of the foregoing. The interconnect features 112 and the interconnect vias 114 are grouped by elevation respectively into a plurality of metal layers and a plurality of via layers alternatingly stacked with the metal layers. In alternative embodiments, the metal layers are conductive but not metal. The plurality of metal layers comprises a TM layer, a TM-1 layer underlying the TM layer, and a TM-2 layer underlying the TM-1 layer at each of the second-die and third-die interconnect structures 110b, 110c. The plurality of via layers comprises a top via (TV) layer and TV-1 layer underlying the TV layer at each of the second-die and third-die interconnect structures 110b, 110c. Note that "−1" and "−2" in the names of the TM-1 and TM-2 layers correspond to offsets relative to the TM layer. Similarly, "−1" in the name of the TV-1 layer corresponds to an offset relative to the TV layer.

The second-die and third-die interconnect structures 110b, 110c form individual frontside pad/bridge structures 116. The frontside pad/bridge structures 116 are each spread across the TM, TM-1, TM-2, TV, and TV-1 layers of a corresponding IC die and provide routing to electrically couple the second-die and third-die backside pads 104b, 104c to corresponding semiconductor devices 106. Further, the frontside pad/bridge structures 116 share the shared frontside pad/bridge layout and hence have the same layout (e.g., top layout, cross-sectional layout, and so on) in both the second and third IC dies 102b, 102c. As such, the frontside pad/bridge structures 116 are the same as each other.

Because the frontside pad/bridge structures 116 have the same layout in both the second and third IC dies 102b, 102c, the TM, TM-1, TM-2, TV, and TV-1 layers of the second IC die 102b may have the same layouts respectively as the TM, TM-1, TM-2, TV, and TV-1 layers of the third IC die 102c. In other words, the TM layer of the second IC die 102b may be the same as the TM layer of the third IC die 102c, the TM-1 layer of the second IC die 102b may be the same as the TM-1 layer of the third IC die 102c, the TM-2 layer of the second IC die 102b may be the same as the TM-2 layer of the third IC die 102c, the TV layer of the second IC die 102b may be the same as the TV layer of the third IC die 102c, and the TV-1 layer of the second IC die 102b may be the same as the TV-1 layer of the third IC die 102c. Accordingly, the TM, TM-1, TM-2, TV, and TV-1 layers of the second IC die 102b may be formed using the same set of photoreticles/photomasks as the TM, TM-1, TM-2, TV, and TV-1 layers of the third IC die 102c. This may, in turn, reduce costs and/or increase throughput. In some embodiments, the second and third IC dies 102b, 102c are duplicates of each other (e.g., the same as each other), except for hybrid bond (HB) structures, through substrate vias (TSVs), and the like discussed hereafter as enabling stacking and electrical coupling of the IC dies 102.

Figure 2:
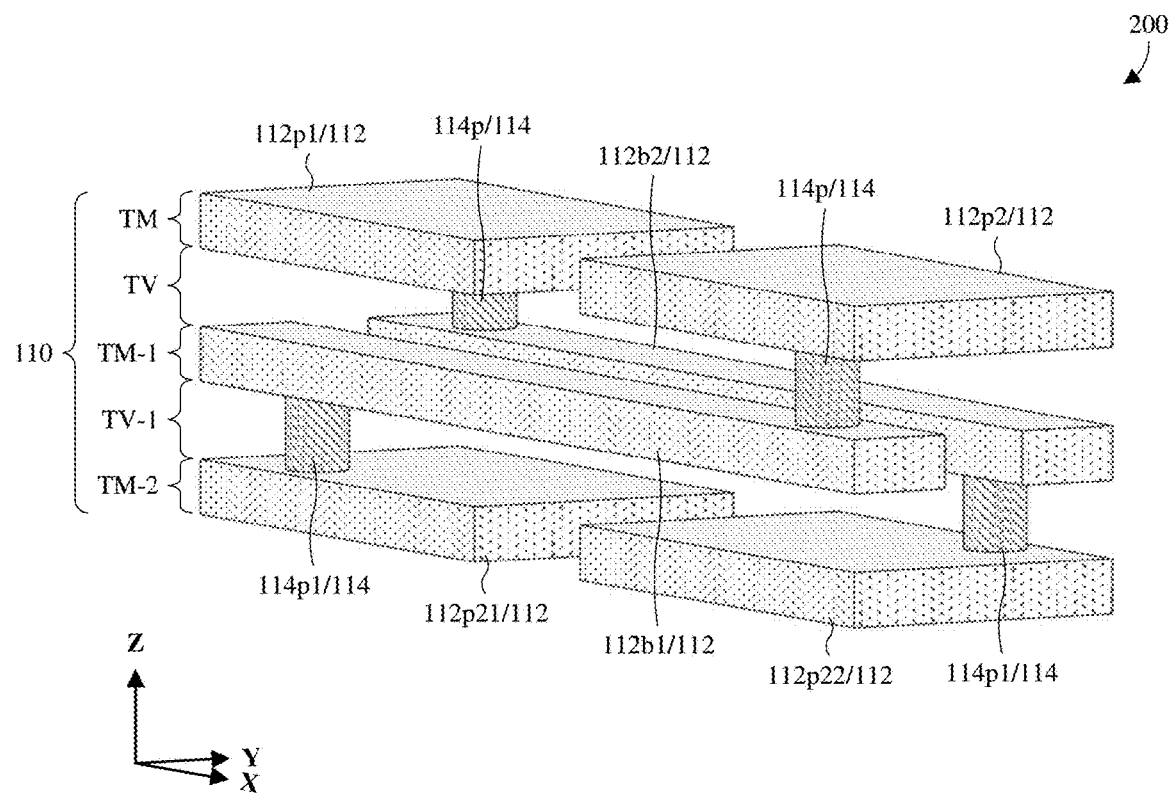
FIGS. 2 and 3A-3C illustrate various views of some embodiments of a frontside pad/bridge structure of FIG. 1.
Figure 3A:
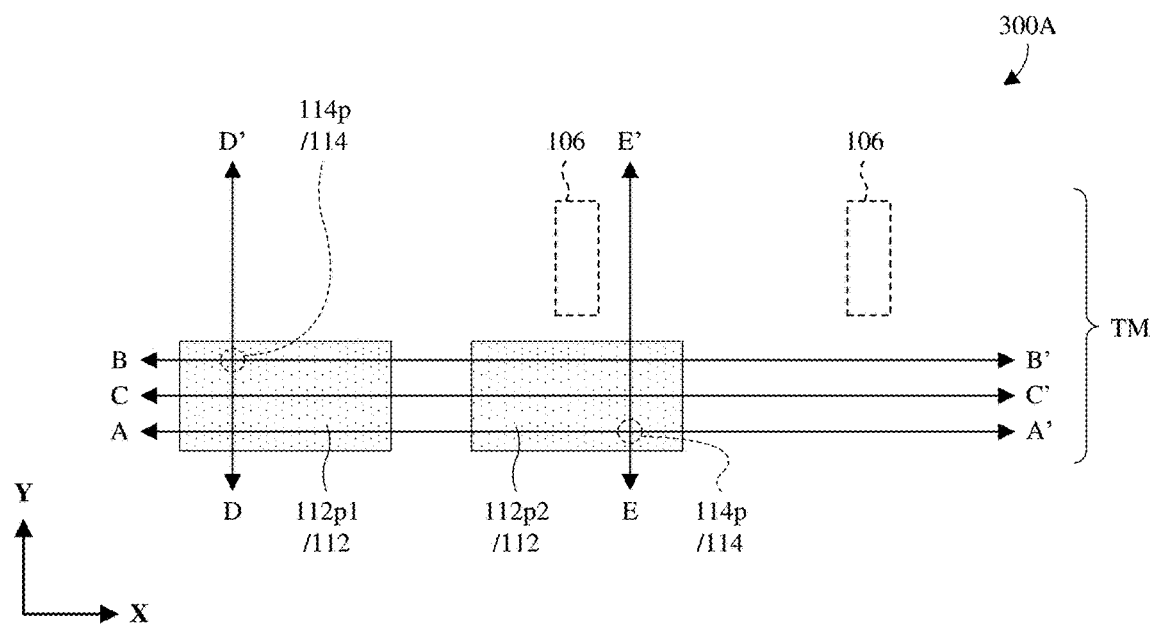
Figure 3B:
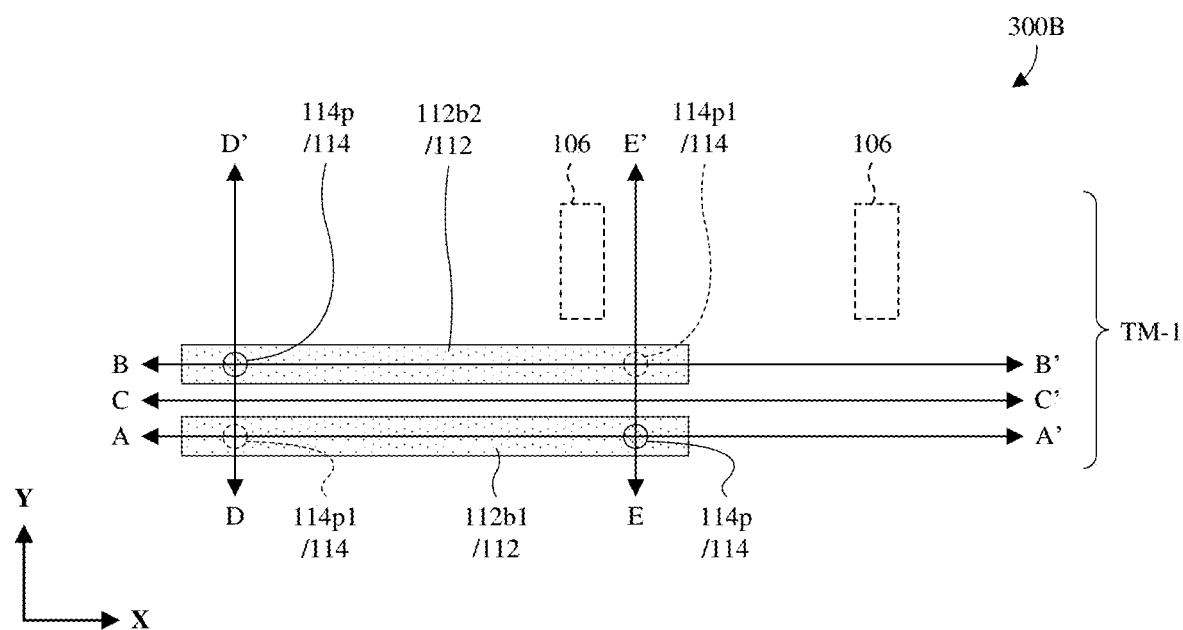
Figure 3C:
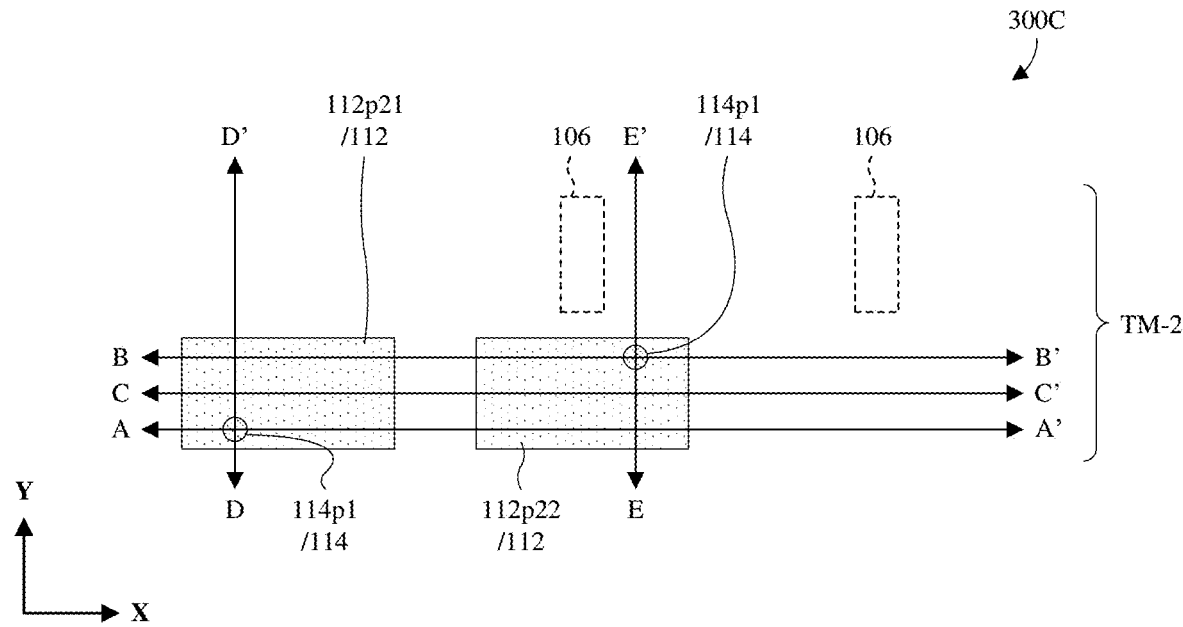

With reference to FIGS. 2 and 3A-3C, various views of some embodiments of a frontside pad/bridge structure of FIG. 1 are provided. FIG. 2 provides a perspective view 200 of the frontside pad/bridge structure, whereas FIGS. 3A-3C provide top layouts 300A-300C of the frontside pad/bridge structure. FIG. 3A corresponds to a top layout 300A at a TM layer, FIG. 3B corresponds to a top layout 300B at a TM-1 layer, and FIG. 3C corresponds to a top layout 300C at a TM-2 layer. Note that the semiconductor devices 106 of FIG. 1 are shown in phantom in FIGS. 3A-3C to provide a common point of reference.

The frontside pad/bridge structure corresponds to the frontside pad/bridge structure 116 of the second or third IC die 102b, 102c. Further, the frontside pad/bridge structure is representative of each frontside pad/bridge structure 116 of FIG. 1 because the frontside pad/bridge structures 116 of FIG. 1 are the same as each other as described above. The frontside pad/bridge structure comprises: 1) a first TM pad 112p1 and a second TM pad 112p2 at a TM layer (see, e.g., FIGS. 2 and 3A); 2) a first bridge wire 112b1 and a second bridge wire 112b2 at a TM-1 layer (see, e.g., FIGS. 2 and 3B); and 3) a first TM-2 pad 112p21 and a second TM-2 pad 112p22 at a TM-2 layer (see, e.g., FIGS. 2 and 3C).

The first and second TM pads 112p1, 112p2 are spaced from each other in a dimension (e.g., an X dimension) and are arranged in a first row extending in the dimension. Similarly, the first and second TM-2 pads 112p21, 112p22 are spaced from each other in the dimension and are arranged in a second row extending in the dimension. Further, the first and second TM-2 pads 112p21, 112p22 respectively underlie first and second TM pads 112p1, 112p2. The first and second bridge wires 112b1, 112b2 are elongated in parallel in the dimension. By elongated in parallel in the dimension, it is meant that greatest dimensions of the first and second bridge wires 112b1, 112b2 extend in parallel in the dimension. Further, the first and second bridge wires 112b1, 112b2 both overlie the first and second TM-2 pads 112p21, 112p22 and both underlie the first and second TM pads 112p1, 112p2.

TV pad vias 114p of a TV layer extend respectively from the first and second bridge wires 112b1, 112b2 respectively to the second and first TM pads 112p1, 112p2, and TV-1 pad vias 114p1 of a TV-1 layer extend respectively from the first and second bridge wires 112b1, 112b2 respectively to the first and second TM-2 pads 112p21, 112p22. Further, the TV and TV-1 pad vias 114p, 114p1 extending from a given bridge wire (e.g., the first or second bridge wires 112b1, 112b2) are on opposite ends of the given bridge wire. Note that the TV and TV-1 pad vias 114p, 114p1 are shown in phantom respectively in FIGS. 3A and 3B.

Referring back to FIG. 1, and focusing on the second IC die 102b, the first TM pad 112p1 of the second IC die 102b, the second bridge wire 112b2 of the second IC die 102b, and the second TM-2 pad 112p22 of the second IC die 102b partially form the second-die conductive path 108b. Further, the second TM pad 112p2 of the second IC die 102b, the first bridge wire 112b1 of the second IC die 102b, and the first TM-2 pad 112p21 of the second IC die 102b partially form the third-die conductive path 108c. As such, the second-die and third-die conductive paths 108b, 108c extend in opposite directions in route to corresponding semiconductor devices at the TM-1 layer of the second IC die 102b.

Focusing on the third IC die 102c, the first TM pad 112p1 of the third IC die 102c, the second bridge wire 112b2 of the third IC die 102c, and the second TM-2 pad 112p22 of the third IC die 102c partially form the third-die conductive path 108c. Further, the second TM pad 112p2 of the third IC die 102c, the first bridge wire 112b1 of the third IC die 102c, and the first TM-2 pad 112p21 of the third IC die 102c are not used and may hence be electrically floating or otherwise biased (e.g., to ground or some suitable voltage). As seen, the third-die conductive path 108c underlies the second-die conductive path 108b at the third IC die 102c. Further, the third-die conductive path 108c extends in opposite directions in route to the third-die semiconductor device 106c respectively at the first bridge wire 112b1 of the second IC die 102b and the second bridge wire 112b2 of the third IC die 102c.

In some embodiments, the first TM pads 112p1 of the second and third IC dies 102b, 102c underlie the second-die backside pad 104b, and/or the second TM pads 112p2 of the second and third IC dies 102b, 102c underlie the third-die backside pad 104c. Further, in some embodiments, the first TM-2 pads 112p21 of the second and third IC dies 102b, 102c underlie the second-die backside pads 104b, and/or the second TM-2 pads 112p22 of the second and third IC dies 102b, 102c underlie the third-die backside pads 104c.

In some embodiments, the semiconductor devices 106 are metal-oxide-semiconductor field-effect transistors (MOSFETs), fin field-effect transistors (finFETs), nanosheet field-effect transistors, nanowire field-effect transistors, gate-all-around field-effect transistors (GAA FETs), some other suitable semiconductor devices, or any combination of the foregoing. In some embodiments in which the semiconductor devices 106 are transistors, the conductive paths 108 electrically couple the backside pads 104 to source regions, drain regions, body regions, gate electrodes, or the like of the semiconductor devices 106.

In some embodiments, the interconnect features 112 and the interconnect vias 114 are copper, aluminum copper, aluminum, some other suitable metal(s) and/or conductive material(s), or any combination of the foregoing. In some embodiments, different metal layers of the interconnect structures 110 are or comprise different conductive materials, and/or different via layers of the interconnect structures 110 are or comprise different conductive materials.

Figure 4:
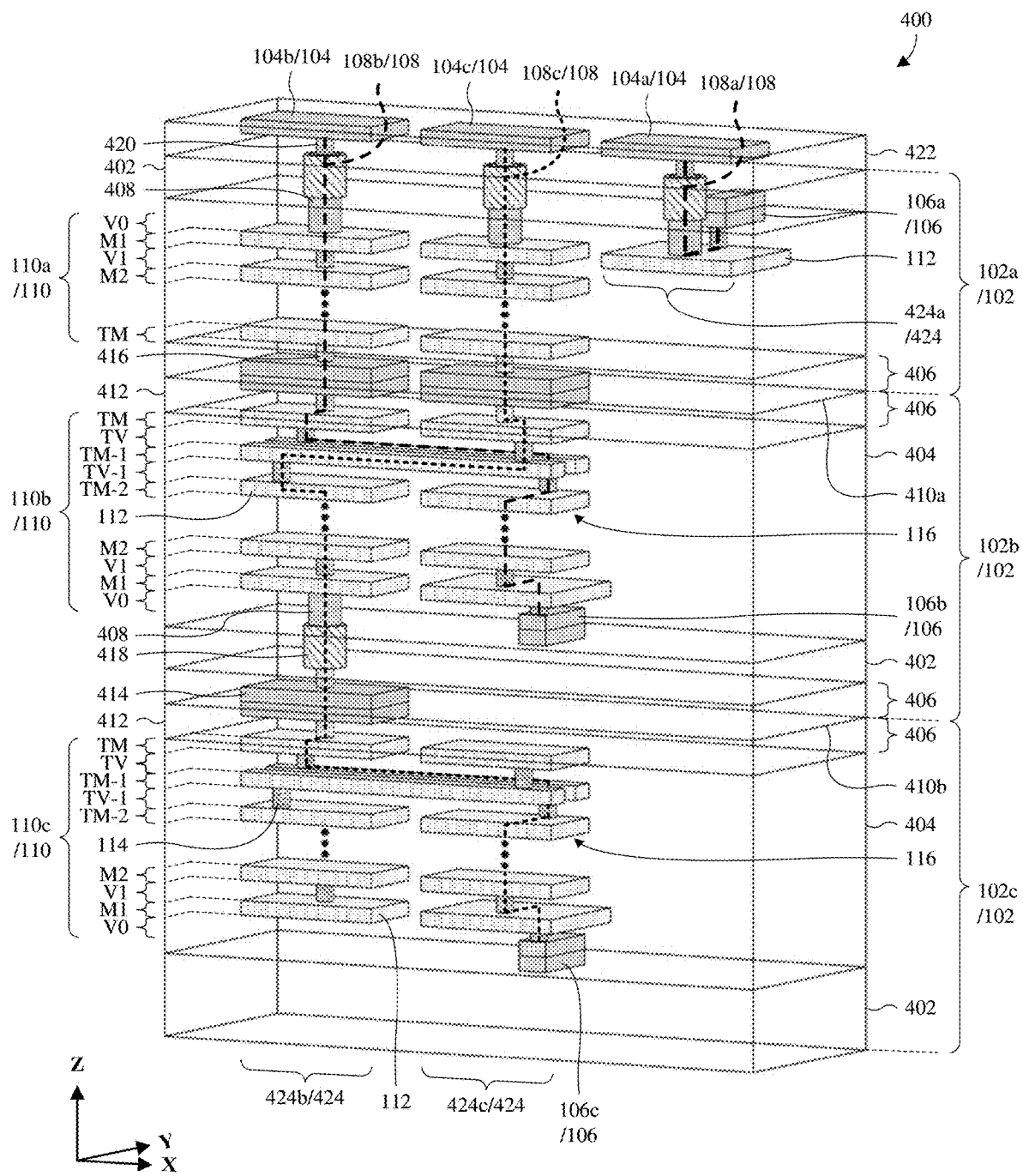
FIGS. 4 and 5A-5E illustrate various views of some more detailed embodiments of the 3D IC of FIG. 1.
Figure 5A:
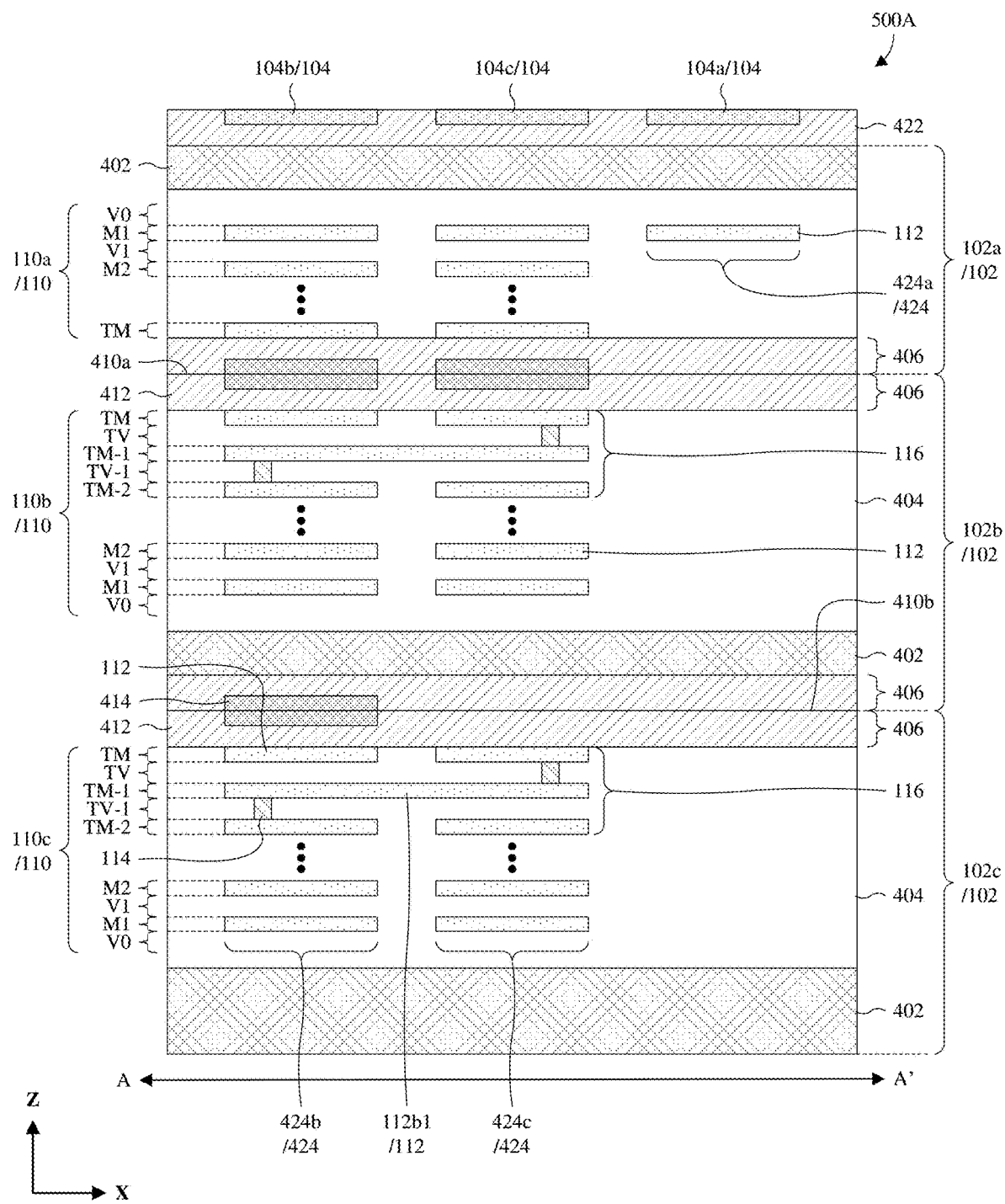
Figure 5B:
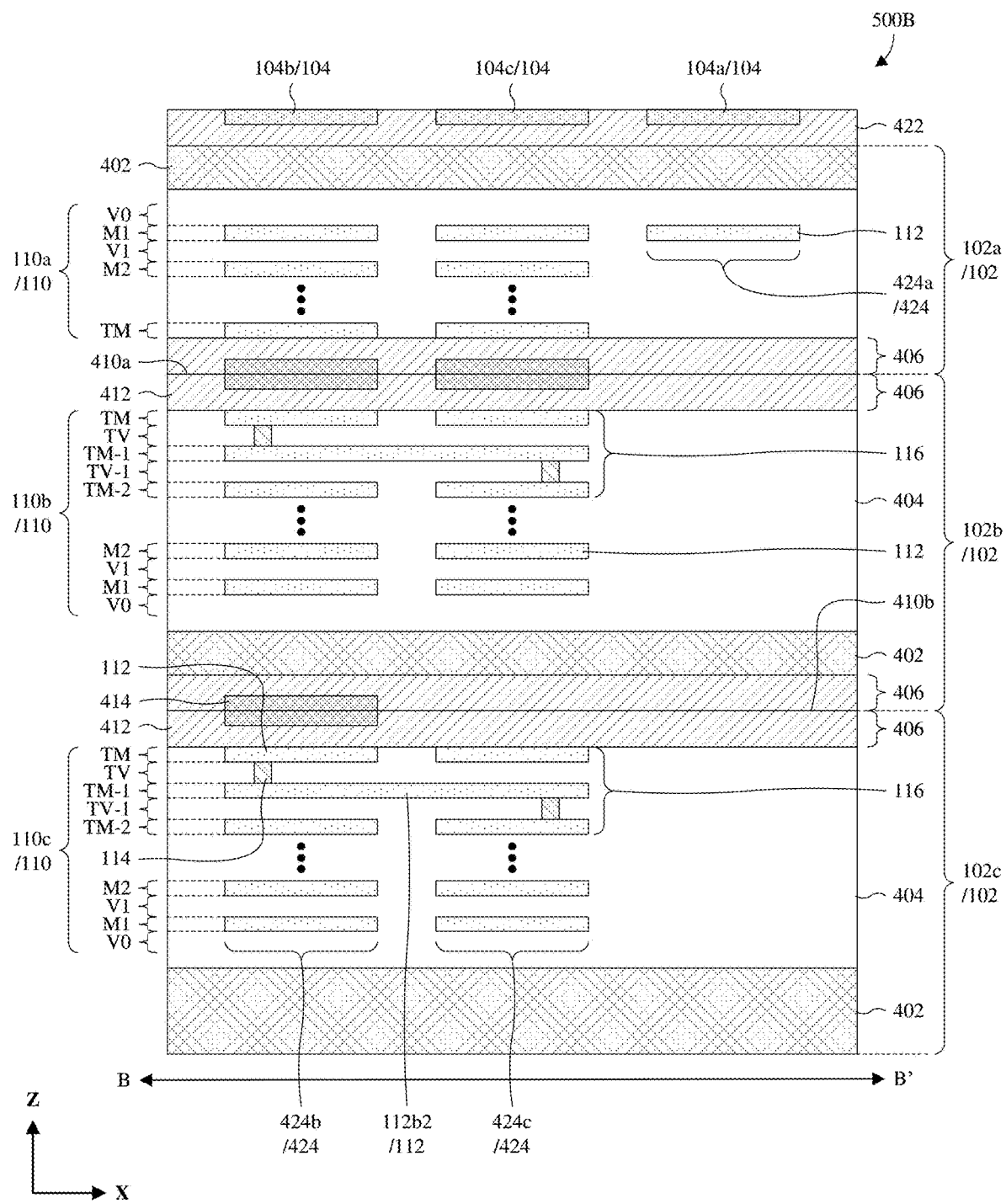
Figure 5C:
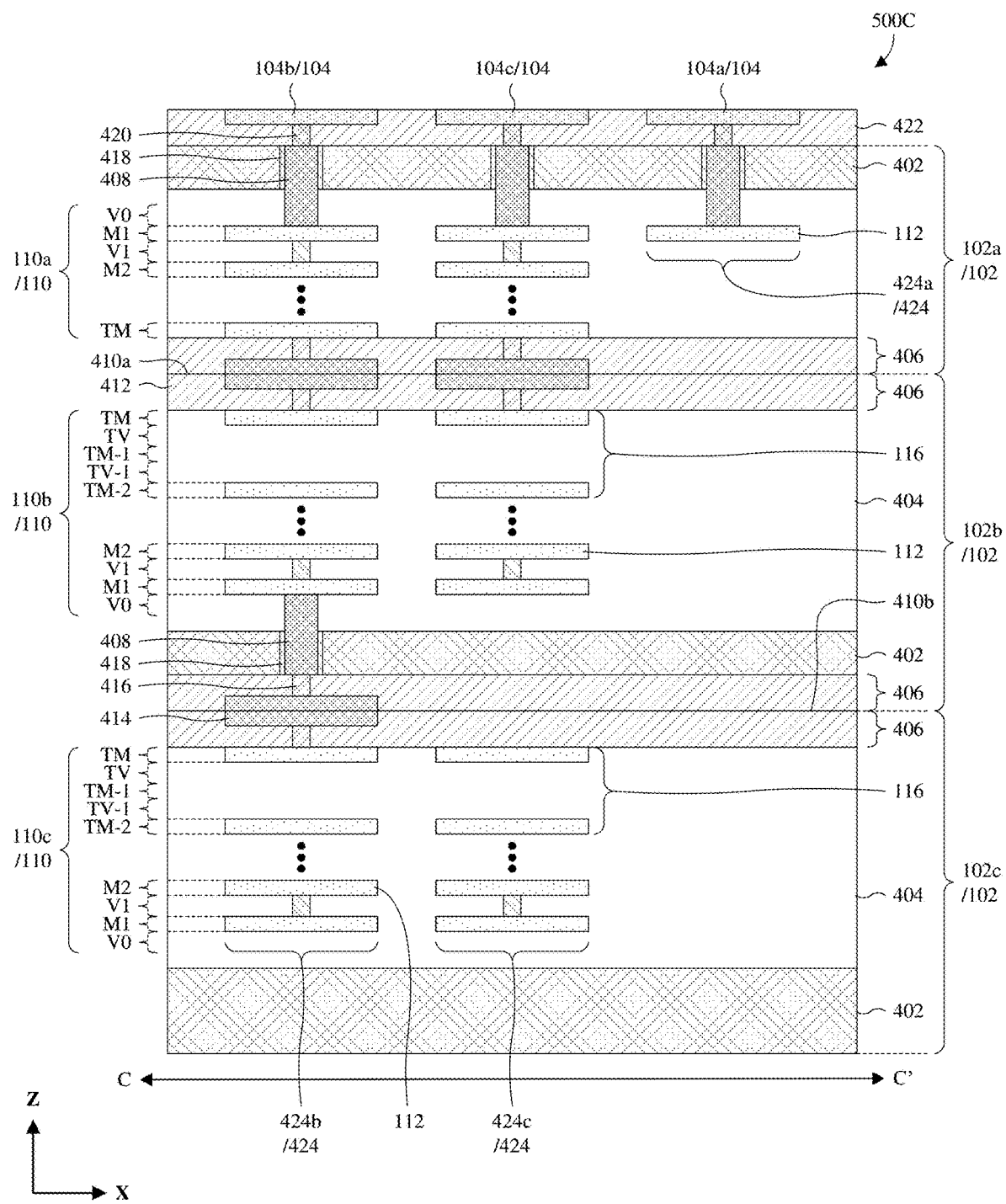
Figure 5D:
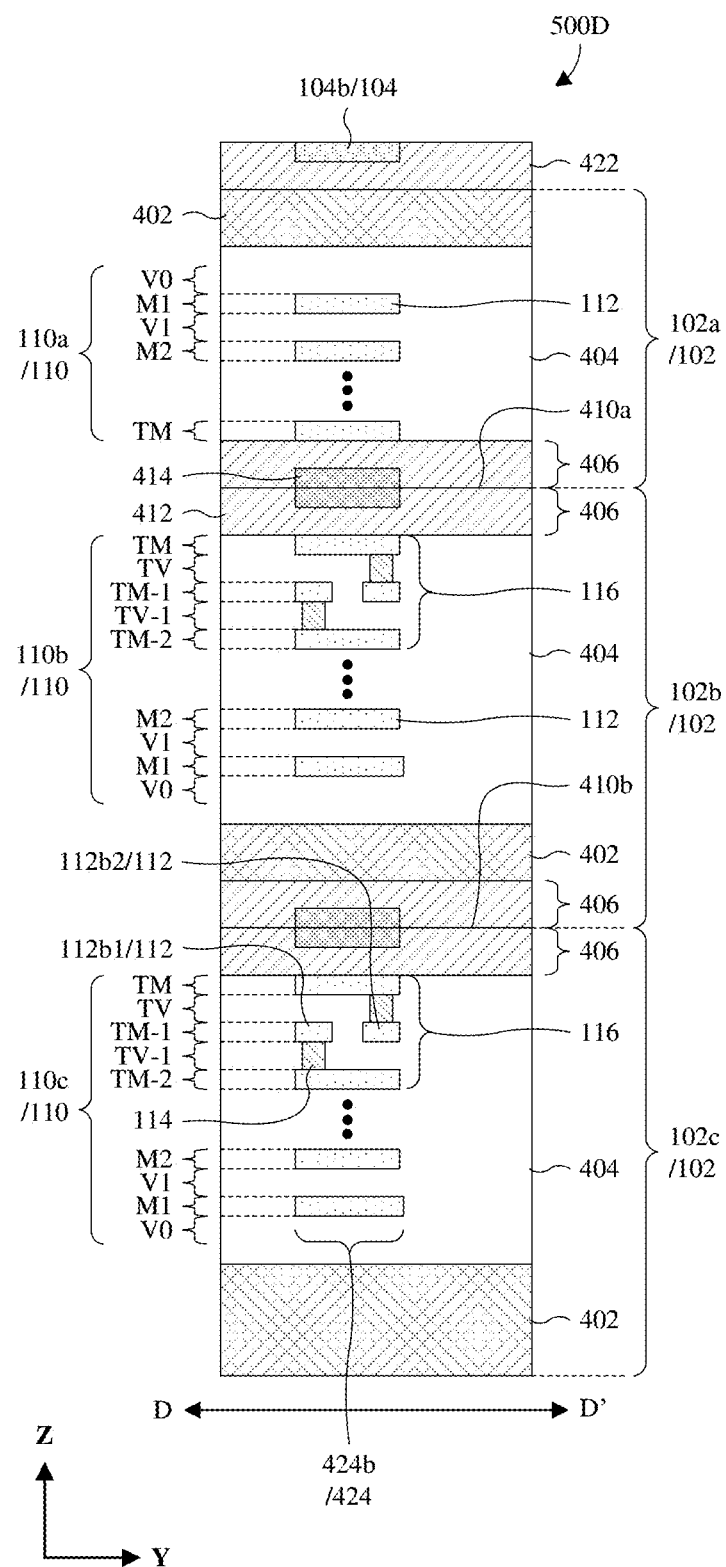
Figure 5E:
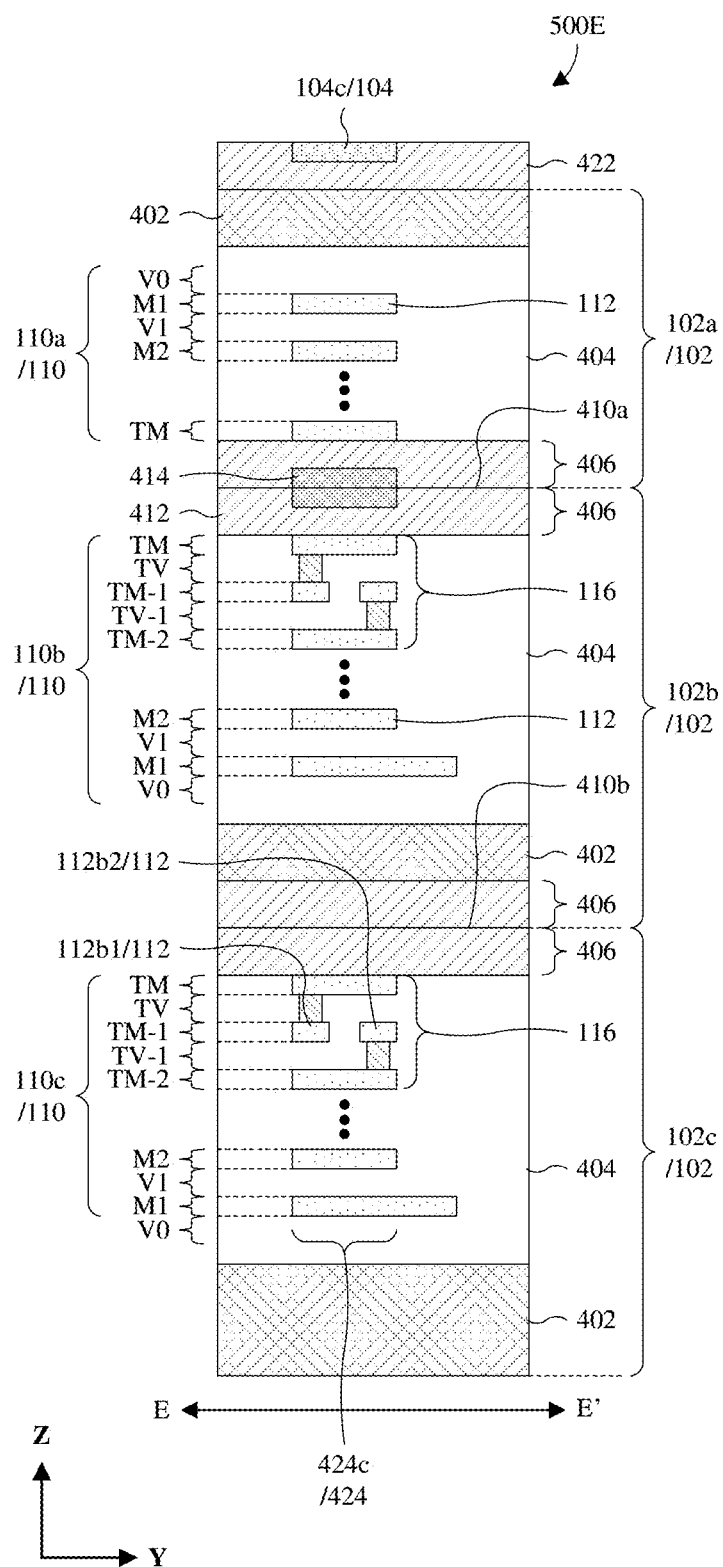

With reference to FIGS. 4 and 5A-5E, various views of some more detailed embodiments of the 3D IC of FIG. 1 are provided. FIG. 4 provides a perspective view 400 of the 3D IC, whereas FIGS. 5A-5E provide cross-sectional views 500A-500E of the 3D IC respectively along lines A-A' to E-E' in FIGS. 3A-3C. Note that the frontside pad/bridge structure of FIGS. 2 and 3A-3C is representative of each frontside pad/bridge structure 116 in FIGS. 4 and 5A-5E. The IC dies 102 comprise individual semiconductor substrates 402 respectively supporting the semiconductor devices 106 and the interconnect structures 110, and respectively and partially forming the semiconductor devices 106. The semiconductor substrates 402 may, for example, be or comprise bulk silicon substrates or some other suitable type of semiconductor substrate.

The interconnect structures 110 and the semiconductor devices 106 are on frontsides of corresponding semiconductor substrates 402, and the interconnect structures 110 electrically couple to corresponding semiconductor devices 106. The interconnect structures 110 comprise a plurality of interconnect features 112 and a plurality of interconnect vias 114. As above, the interconnect features 112 may be, for example, pads, wires, lines, the like, or any combination of the foregoing. The interconnect features 112 and the interconnect vias 114 are surrounded by corresponding interconnect dielectric layers 404, which are individual to the interconnect structures 110. Further, the interconnect features 112 and the interconnect vias 114 are grouped by elevation (e.g., in a Z dimension) respectively into a plurality of metal layers and a plurality of via layers that are alternatingly stacked with the metal layers.

The plurality of metal layers comprises a metal one (M1) layer, a metal two (M2) layer underlying the M1 layer, and a TM layer underlying the M2 layer at a first-die interconnect structure 110a of the first IC die 102a. Further, the plurality of metal layers comprises a M1 layer, a M2 layer overlying the M1 layer, a TM-2 layer overlying the M2 layer, a TM-1 layer overlying the TM-2 layer, and a TM layer overlying the TM-1 layer at each of the second-die and third-die interconnect structures 110b, 110c. The plurality of via layers comprises a zeroth via (V0) layer and a via one (V1) layer underlying the V0 layer at the first-die interconnect structure 110a. Further, the plurality of via layers comprises a V0 layer, a V1 layer underlying the V0 layer, a TV-1 layer overlying the V1 layer, and a TV layer overlying the TV-1 layer at each of the second-die and third-die interconnect structures 110b, 110c. The V0 layers of the interconnect structures 110 provide electrical coupling from M1 layers to the semiconductor devices 106 and may also be referred to as contact via layers or contact layers.

Each level of ellipses represents N number of via layers and N−1 number of metal layers alternatingly stacked with the N number of via layers, where N is an integer greater than zero. For example, N may be 1, 2, 3, or more. In some embodiments, each of the N number of via layers has a layout (e.g., is the same) as shown for the V1 layer of a corresponding interconnect structure, and/or each of the N−1 number of metal layers has a layout (e.g., is the same) as shown for the M2 layer of a corresponding interconnect structure.

As above, the second-die and third-die interconnect structures 110b, 110c form individual frontside pad/bridge structures 116. The frontside pad/bridge structures 116 are as illustrated and described with regard to FIGS. 1, 2, and 3A-3C, whereby the frontside pad/bridge structures 116 are each spread across the TM, TM-1, TM-2, TV, and TV-1 layers of a corresponding IC die and partially form the second-die and third-die conductive paths 108b, 108c. Further, the frontside pad/bridge structures 116 share the shared frontside pad/bridge layout and hence have the same layout (e.g., are the same) in both the second and third IC dies 102b, 102c. This may, in turn, reduce costs and/or increase throughput.

The IC dies 102 comprise individual HB structures 406, and the first and second IC dies 102a, 102b further comprise individual TSVs 408. The HB structures 406 together with the TSVs 408 facilitate stacking and electrical coupling of the IC dies 102.

The second IC die 102b comprises two HB structures 406 respectively on a frontside of a corresponding semiconductor substrate 402 and a backside of the corresponding semiconductor substrate 402 for hybrid bonding respectively to the first IC die 102a and the third IC die 102c. The frontside HB structure is electrically coupled directly to the interconnect structure 110 of the second IC die 102b, and the backside HB structure is electrically coupled to the interconnect structure 110 of the second IC die 102b by a corresponding TSV 408 extending through the semiconductor substrate 402 of the second IC die 102b.

The first and third IC dies 102a, 102c each has a single HB structure 406 on a frontside of a corresponding semiconductor substrate 402. The HB structure 406 of the first IC die 102a is hybrid bonded to the frontside HB structure of the second IC die 102b at a first HB interface 410a, and the HB structure 406 of the third IC die 102c is hybrid bonded to the backside HB structure of the second IC die at a second HB interface 410b.

The HB structures 406 comprise individual HB dielectric layers 412, individual HB layers 414, and individual HB vias 416. The HB layers 414 and the HB vias 416 are inset into and surrounded by corresponding HB dielectric layers 412. The HB layers 414 and the HB dielectric layers 412 form the first and second HB interfaces 410a, 410b, and the HB vias 416 extend respectively from the HB layers 414. The HB via 416 of the second IC die 102b at the second HB interface 410b extends to a corresponding TSV 408, whereas the remaining HB vias extend to corresponding interconnect structures 110. The HB layers 414 and the HB vias 416 are conductive and may, for example, be or comprise copper, some other suitable metal(s) and/or conductive material(s), or any combination of the foregoing.

As seen, hybrid bonding involves at least two types of bonding: metal-to-metal bonding; and non-metal-to-non-metal bonding. Bonding between the HB layers 414 corresponds to the metal-to-metal bonding, and bonding between the HB dielectric layers 412 corresponds to the non-metal-to-non-metal bonding. In some embodiments, the non-metal-to-non-metal bonding is performed by fusion bonding or the like. Further, in some embodiments, pads of the HB layers 414 may have different widths or the same widths. For example, for any given HB interface (e.g., the first or second HB interface 410a, 410b), an upper metal pad in the upper HB layer of that HB interface may have a width that is equal to or different than a width of an adjoining, lower metal pad in the lower HB layer of that HB interface. When misalignment occurs, the upper metal pad may extend laterally beyond an edge of the lower metal pad.

The TSVs 408 extend respectively through the semiconductor substrates 402 of the first and second IC dies 102a, 102b and are separated from the semiconductor substrates 402 by individual TSV dielectric layers 418. A TSV at the semiconductor substrate 402 of the second IC die 102b electrically couples the second-die interconnect structure 110b to an HB structure 406 of the second IC die 102b. TSVs at the semiconductor substrate 402 of the first IC die 102a electrically couple the first-die interconnect structure 110a to the backside pads 104 through backside vias 420 extending respectively from the TSVs respectively to the backside pads 104. The backside vias 420 may, for example, be or comprise copper, some other suitable metal(s) and/or conductive material(s), or any combination of the foregoing.

A backside dielectric layer 422 overlies the IC dies 102 on backside of the semiconductor substrate 402 of the first IC die 102a. Further, the backside dielectric layer 422 surrounds the backside vias 420 and the backside pads 104. The backside vias 420 extend respectively from the backside pads 104 to corresponding TSVs 408.

Along with the interconnect structures 110, the TSVs 408, the backside vias 420, the HB layers 414, and the HB vias 416 form the conductive paths 108. The conductive paths 108 each traverse at least one of the TSVs 408, and the third-die conductive path 108c traverses two of the TSVs 408. Further, the first-die conductive path 108a is spaced from the HB structures 406, whereas the second-die and third-die conductive paths 108b, 108c extend respectively to second and third IC dies 102b, 102c through the HB structures 406.

The interconnect features 112, the interconnect vias 114, the TSVs 408, the backside vias 420, the HB layers 414, and the HB vias 416 form columnar structures 424. The columnar structures 424 form vertical segments of the conductive paths 108 and are individual to and respectively underlie the backside pads 104. In some embodiments, the columnar structures 424 are localized under corresponding backside pads 104. A first columnar structure 424a underlies the first-die backside pad 104a, a second columnar structure 424b underlies the second-die backside pad 104b, and a third columnar structure 424c underlies the third-die backside pad 104c. Further, the second and third columnar structures 424b, 424c extend across the first, second, and third IC dies 102a-102c and are bridged by the frontside pad/bridge structures 116.

The second-die conductive path 108b extends vertically (e.g., in a Z dimension) along the second columnar structure 424b from the second-die backside pad 104b to the frontside pad/bridge structure 116 of the second IC die 102b. The frontside pad/bridge structure 116 of the second IC die 102b then transitions the second-die conductive path 108b from the second columnar structure 424b to the third columnar structure 424c. In at least some embodiments, this may also be regarded as transitioning the second-die conductive path 108b from a location directly under the second-die backside pad 104b to a location directly under the third-die backside pad 104c. At the third columnar structure 424c, the second-die conductive path 108b extends vertically to the second-die semiconductor device 106b.

The third-die conductive path 108c extends vertically (e.g., in the Z dimension) along the third columnar structure 424c from the third-die backside pad 104c to the frontside pad/bridge structure 116 of the second IC die 102b. The frontside pad/bridge structure 116 of the second IC die 102b then transitions the third-die conductive path 108c from the third columnar structure 424c to the second columnar structure 424b. In at least some embodiments, this may also be regarded as transitioning the third-die conductive path 108c from a location directly under the third-die backside pad 104c to a location directly under the second-die backside pad 104b. At the second columnar structure 424b, the third-die conductive path 108c extends vertically to the frontside pad/bridge structure 116 of the third IC die 102c. The frontside pad/bridge structure 116 of the third IC die 102c then transitions the third-die conductive path 108c from the second columnar structure 424b to the third columnar structure 424c. In at least some embodiments, this may also be regarded as transitioning the third-die conductive path 108c from a location directly under the second-die backside pad 104b to a location directly under the third-die backside pad 104c. At the third columnar structure 424c, the third-die conductive path 108c extends vertically to the third-die semiconductor device 106c.

Figure 6:
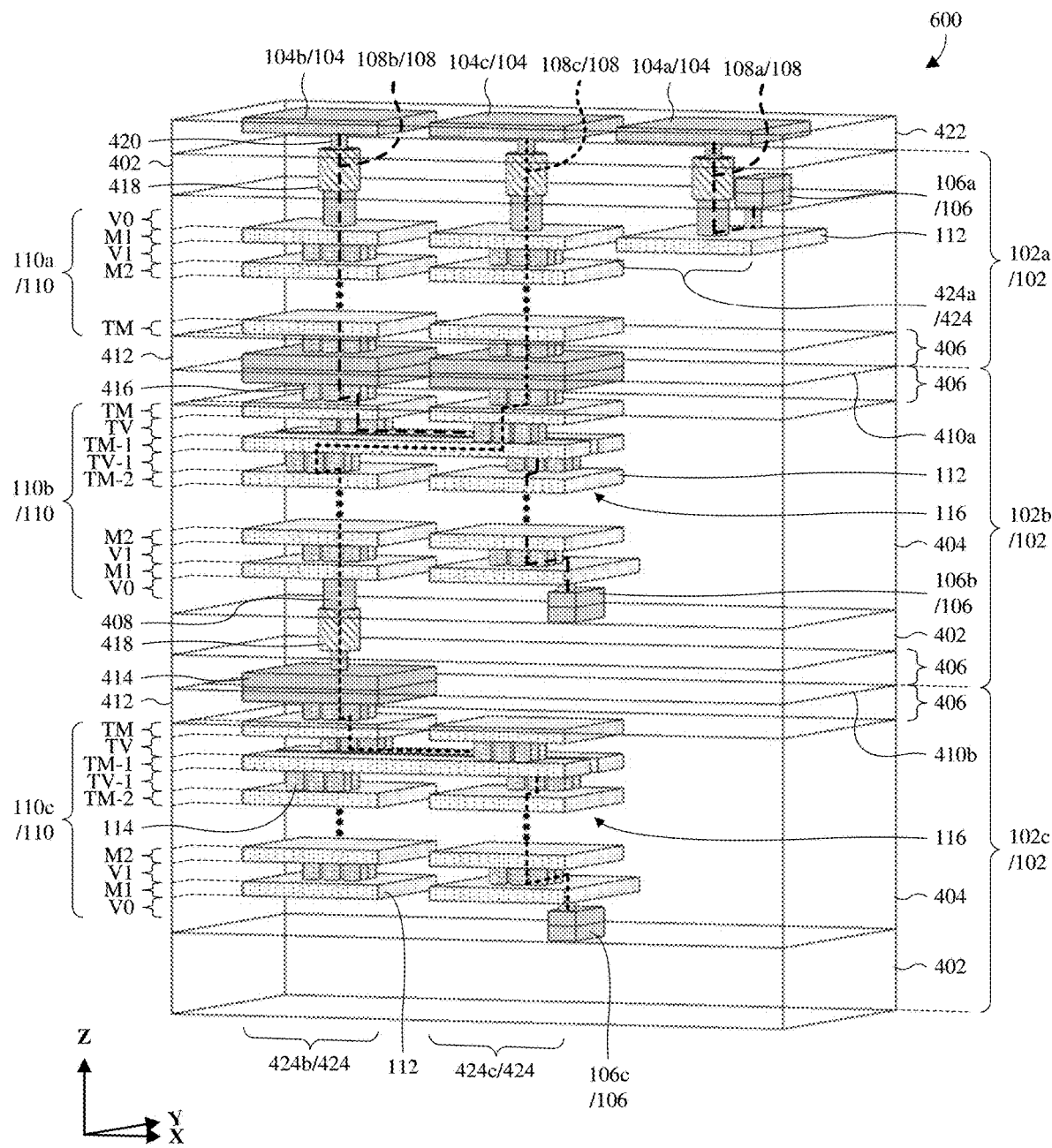
FIG. 6 illustrates a perspective view of some alternative embodiments of the 3D IC of FIG. 4 in which vias are replaced with 3×3 arrays of vias.

With reference to FIG. 6, a perspective view 600 of some alternative embodiments of the 3D IC of FIG. 4 is provided in which vias of FIG. 4 are replaced with 3×3 arrays of vias. In particular, the interconnect vias 114 of FIG. 4 are each replaced with 3×3 arrays of interconnect vias, except at the V0 layers. Further, the HB vias 416 of FIG. 4 are each replaced with 3×3 arrays of HB vias 416, except at the TSV 408 of the second IC die 102b. Replacing vias with multiple vias, as illustrated, may reduce resistance along the conductive paths 108 and may therefore enhance power efficiency of the 3D IC.

Figure 7:
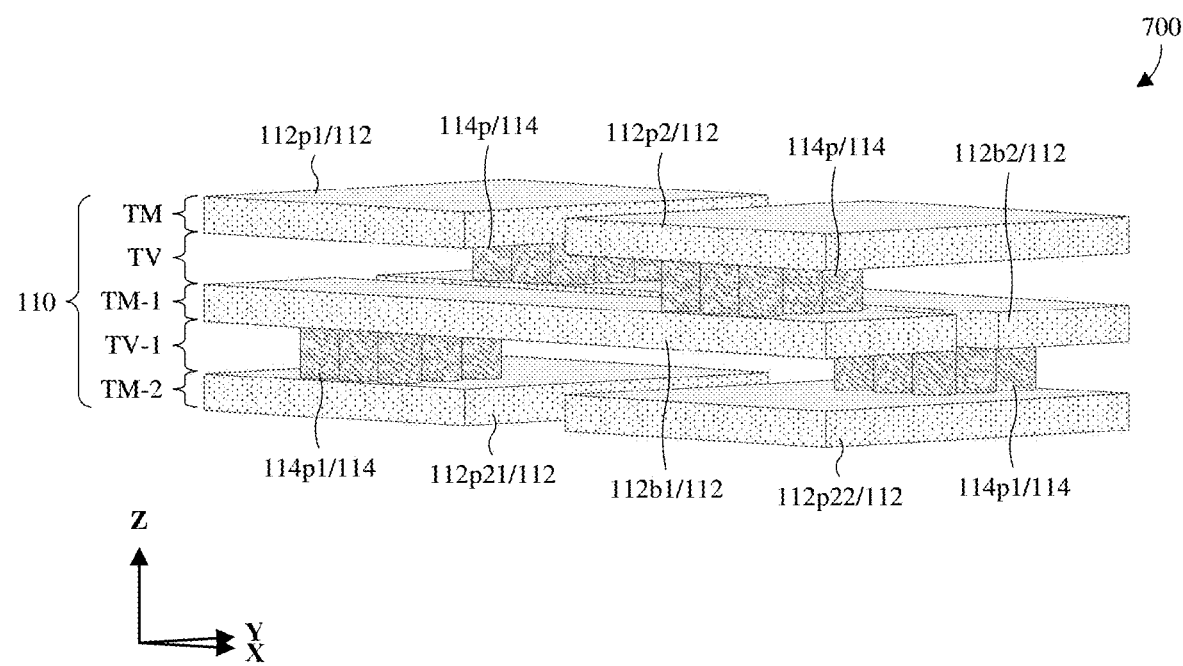
FIGS. 7 and 8A-8C illustrate various views of some embodiments of a frontside pad/bridge structure of FIG. 6.
Figure 8A:
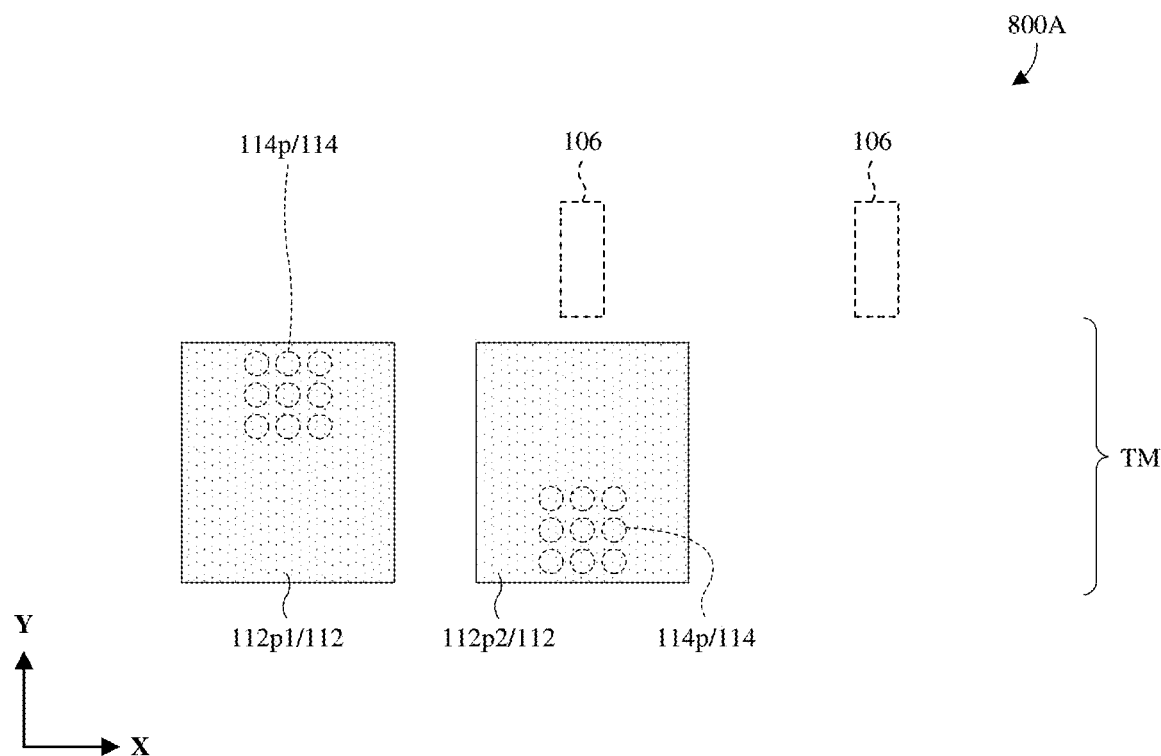
Figure 8B:
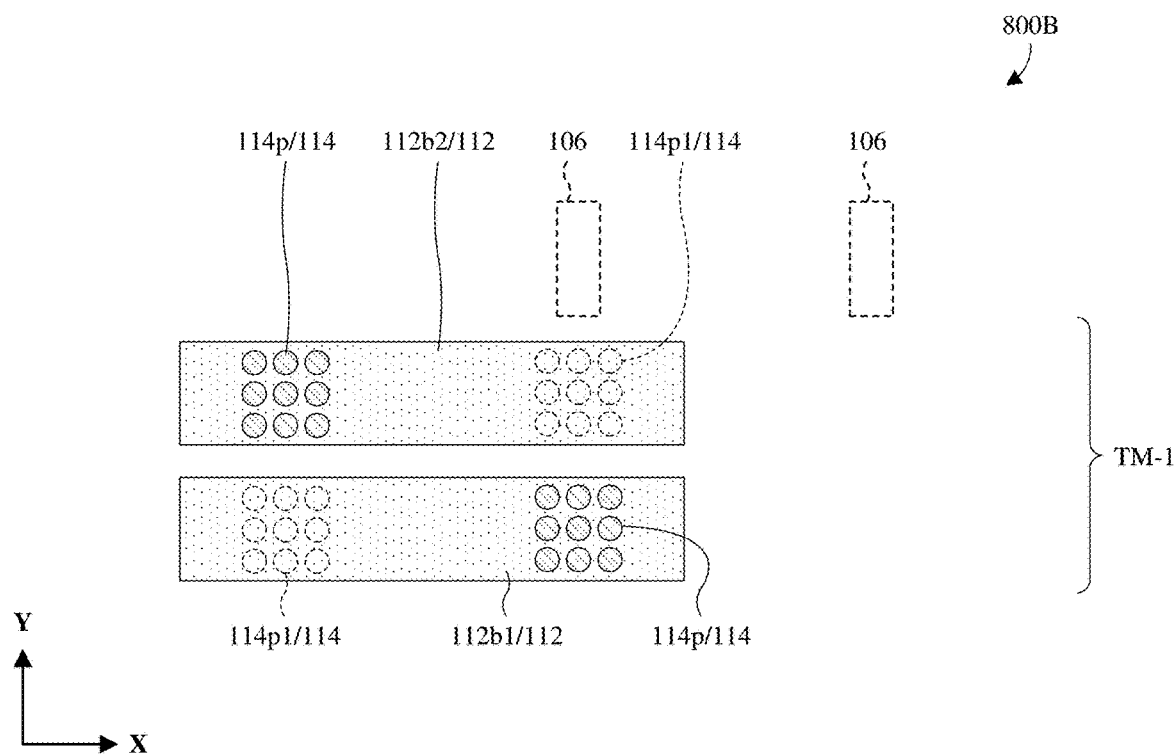
Figure 8C:
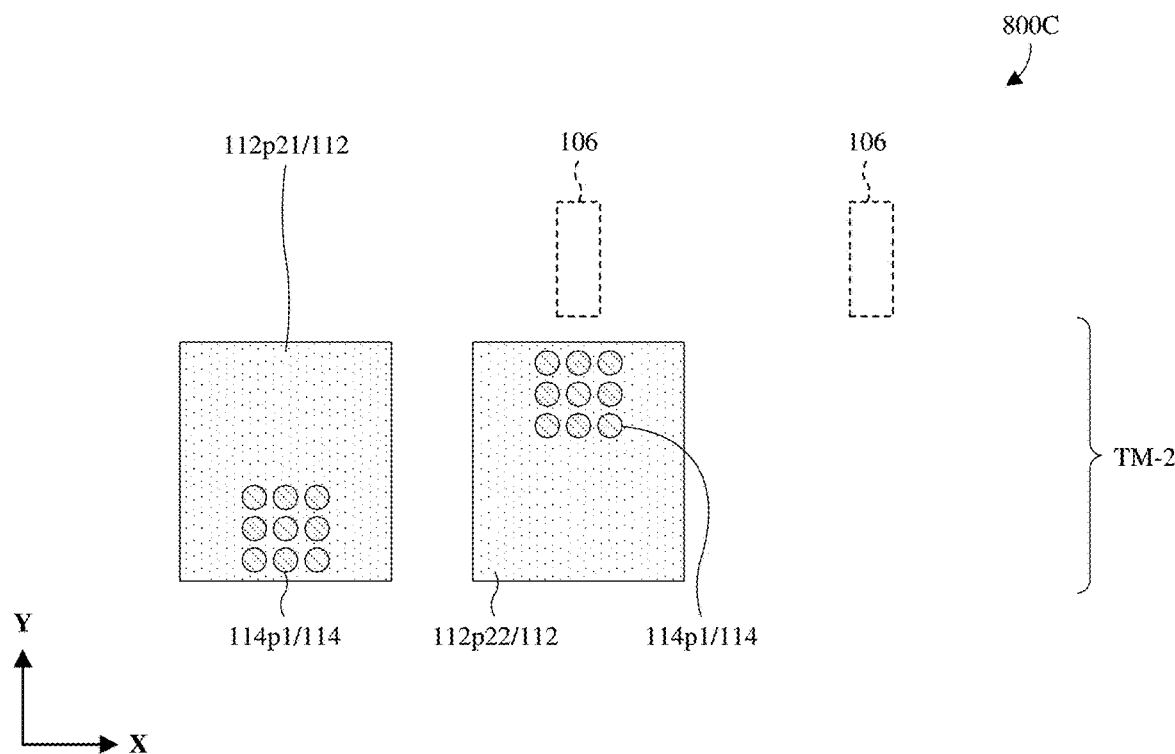

With reference to FIGS. 7 and 8A-8C, various views of some embodiments of a frontside pad/bridge structure of FIG. 6 are provided. FIG. 7 provides a perspective view 700 of the frontside pad/bridge structure, whereas FIGS. 8A-8C provide top layouts 800A-800C of the frontside pad/bridge structure. FIG. 8A corresponds to a top layout 800A at a TM layer, FIG. 8B corresponds to a top layout 800B at a TM-1 layer, and FIG. 8C corresponds to a top layout 800C at a TM-2 layer. Note that the semiconductor devices 106 of FIG. 6 are shown in phantom in FIGS. 8A-8C to provide a common point of reference. The frontside pad/bridge structure corresponds to the frontside pad/bridge structure 116 of the second or third IC die 102b, 102c and is representative of each frontside pad/bridge structure 116 of FIG. 6.

Figure 9:
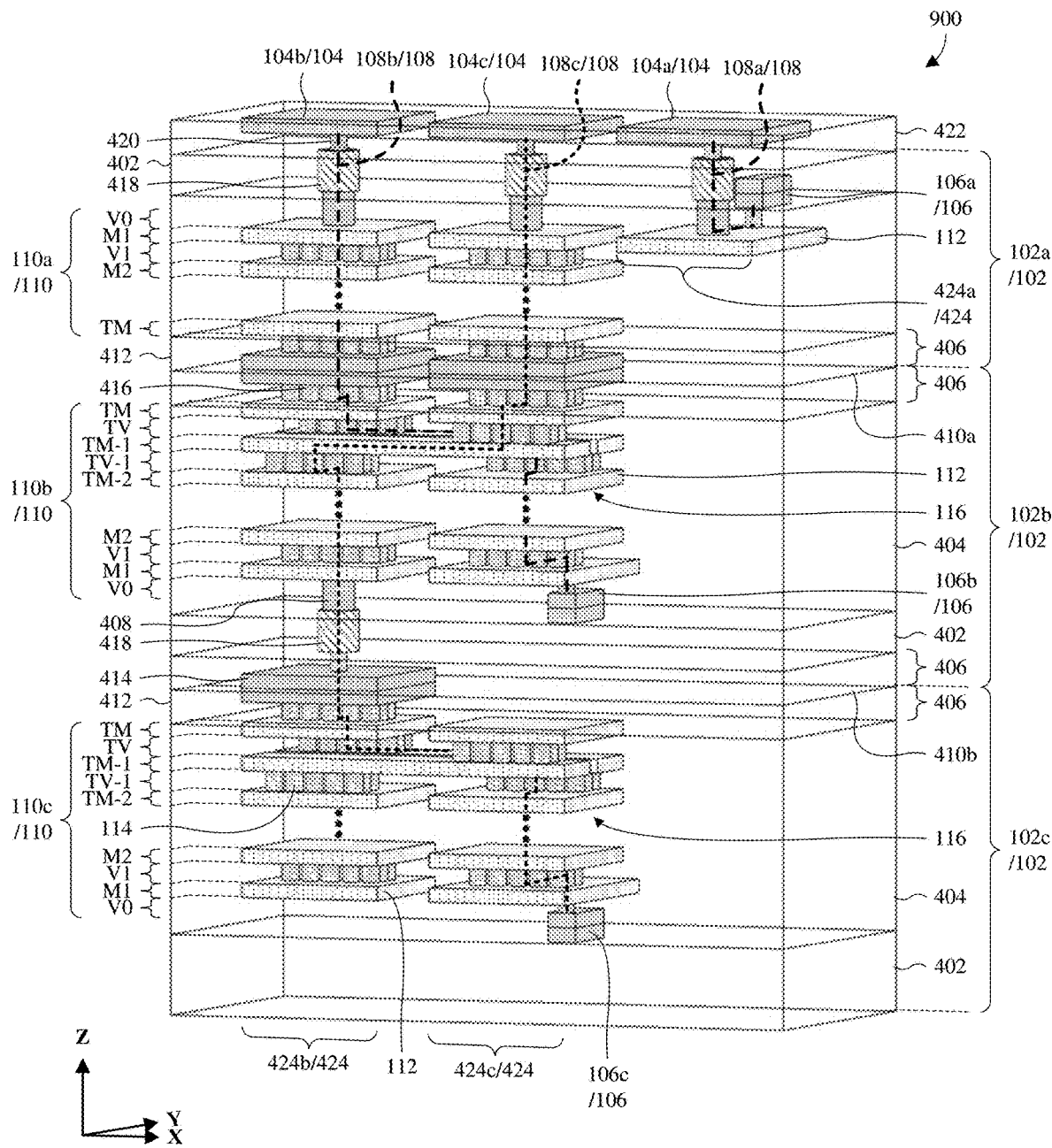
FIG. 9 illustrates a perspective view of some alternative embodiments of the 3D IC of FIG. 4 in which vias are replaced with 5×3 arrays of vias.

With reference to FIG. 9, a perspective view 900 of some alternative embodiments of the 3D IC of FIG. 4 is provided in which vias of FIG. 4 are replaced with 5×3 arrays of vias. In particular, the interconnect vias 114 of FIG. 4 are each replaced with 5×3 arrays of interconnect vias, except at the V0 layers. Further, the HB vias 416 of FIG. 4 are each replaced with 5×3 arrays of HB vias 416, except at the TSV 408 of the second IC die 102b. Replacing vias with multiple vias, as illustrated, may reduce resistance along the conductive paths 108 and may therefore enhance power efficiency of the 3D IC.

Figure 10:
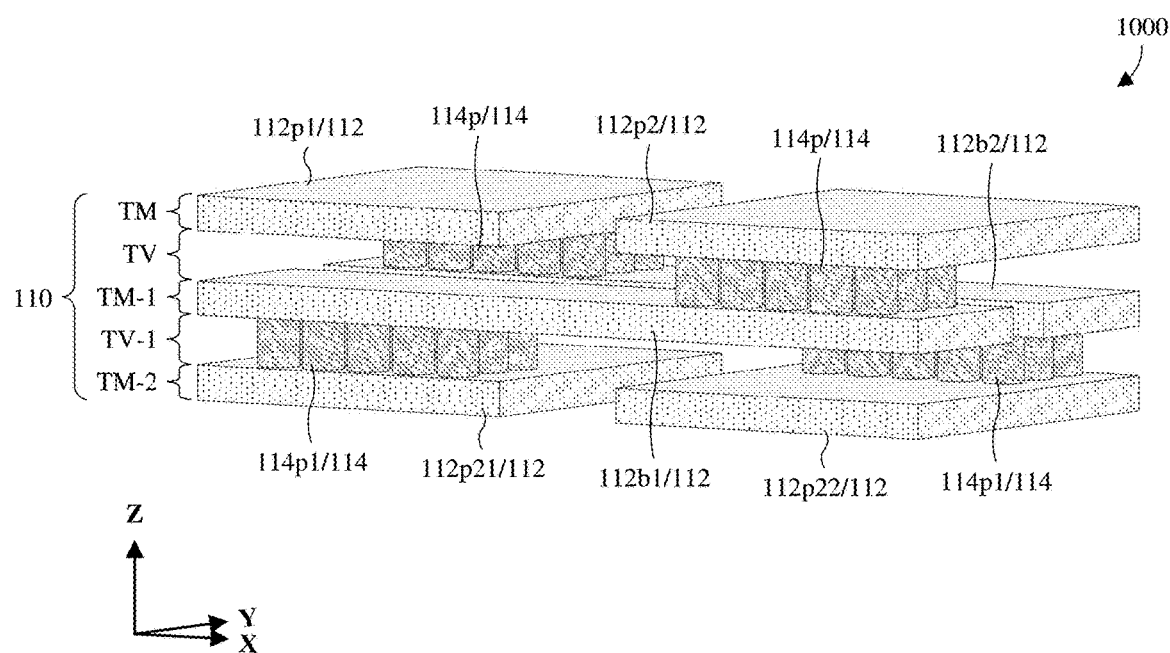
FIGS. 10 and 11A-11C illustrate various views of some embodiments of a frontside pad/bridge structure of FIG. 9.
Figure 11A:
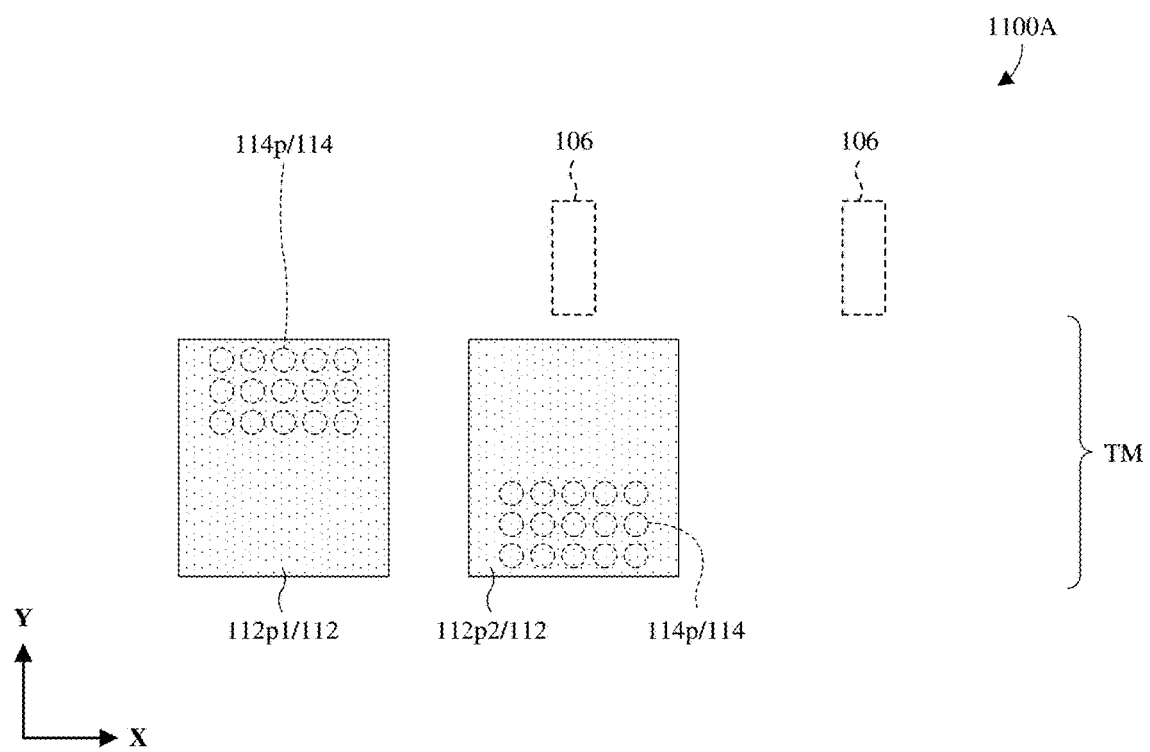
Figure 11B:
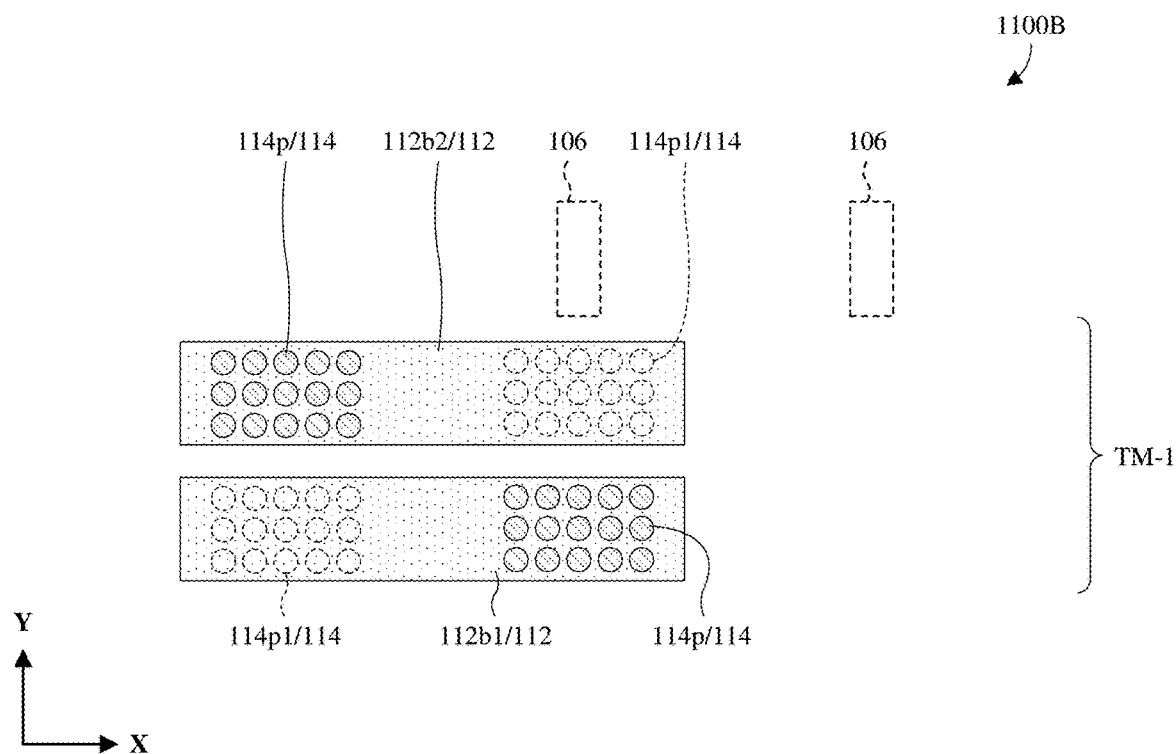
Figure 11C:
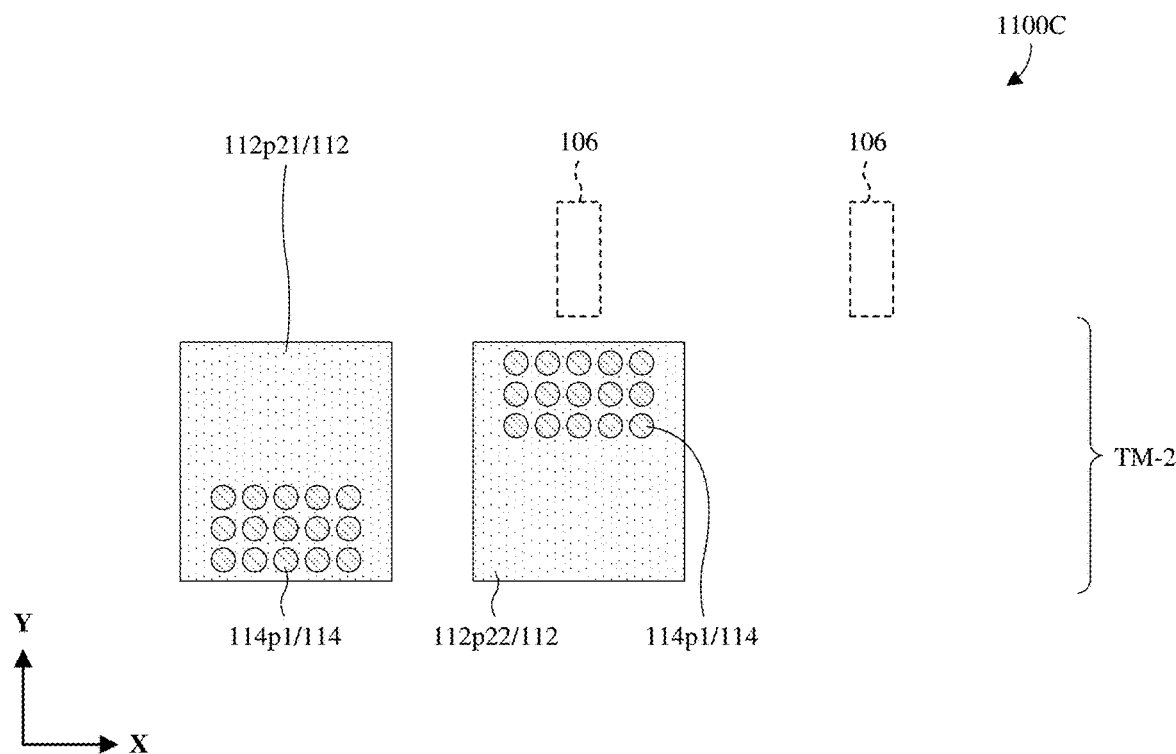

With reference to FIGS. 10 and 11A-11C, various views of some embodiments of a frontside pad/bridge structure of FIG. 9 are provided. FIG. 10 provides a perspective view 1000 of the frontside pad/bridge structure, whereas FIGS. 11A-11C provide top layouts 1100A-1100C of the frontside pad/bridge structure. FIG. 11A corresponds to a top layout 1100A at a TM layer, FIG. 11B corresponds to a top layout 1100B at a TM-1 layer, and FIG. 11C corresponds to a top layout 1100C at a TM-2 layer. Note that the semiconductor devices 106 of FIG. 9 are shown in phantom in FIGS. 11A-11C to provide a common point of reference. The frontside pad/bridge structure corresponds to the frontside pad/bridge structure 116 of the second or third IC die 102b, 102c and is representative of each frontside pad/bridge structure 116 of FIG. 9.

Figure 12:
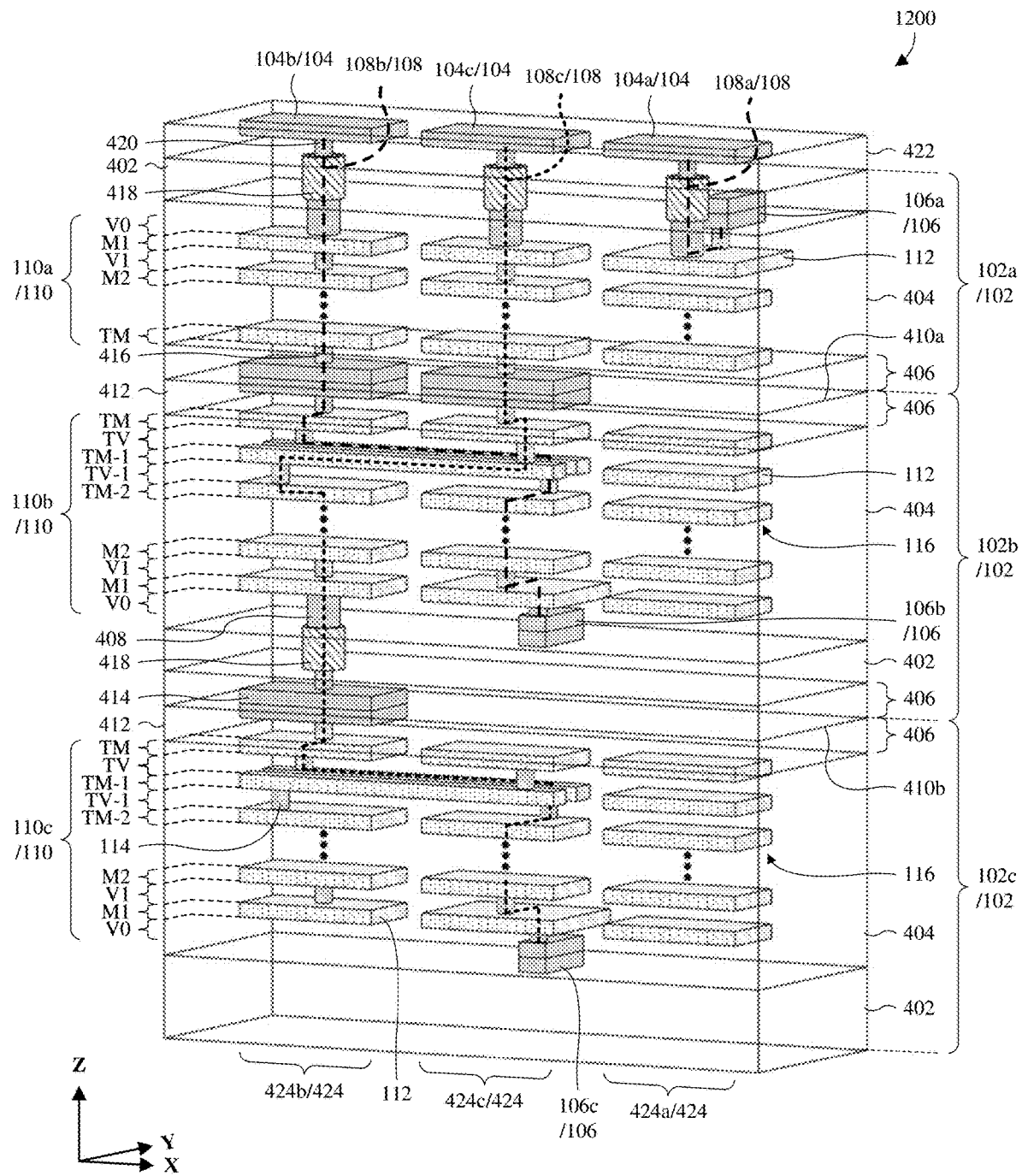
FIG. 12 illustrates a perspective view of some alternative embodiments of the 3D IC of FIG. 4 in which additional interconnect features and additional interconnect vias underlie a first backside pad.

With reference to FIG. 12, a perspective view 1200 of some alternative embodiments of the 3D IC of FIG. 4 is provided in which additional interconnect features 112 and additional interconnect vias 114 underlie the first-die backside pad 104a. The additional interconnect features 112 and the additional interconnect vias 114 expand the first columnar structure 424a, such that the first columnar structure 424a extends across the first, second, and third IC dies 102a-102c. Further, the additional interconnect features 112 and the additional interconnect vias 114 improve uniformity of process loading (e.g., etch loading, chemical mechanical polish (CMP) loading, or the like) during formation of the interconnect structures 110. For example, loading at a portion of the 3D IC directly under the first-die backside pad 104a may be about the same as loading at portions of the 3D IC directly under the second-die and third-die backside pads 104b, 104c. As such, manufacturing processes may be more uniform, which may, for example, increase yields and lower costs during manufacture of the 3D IC.

Figure 13:
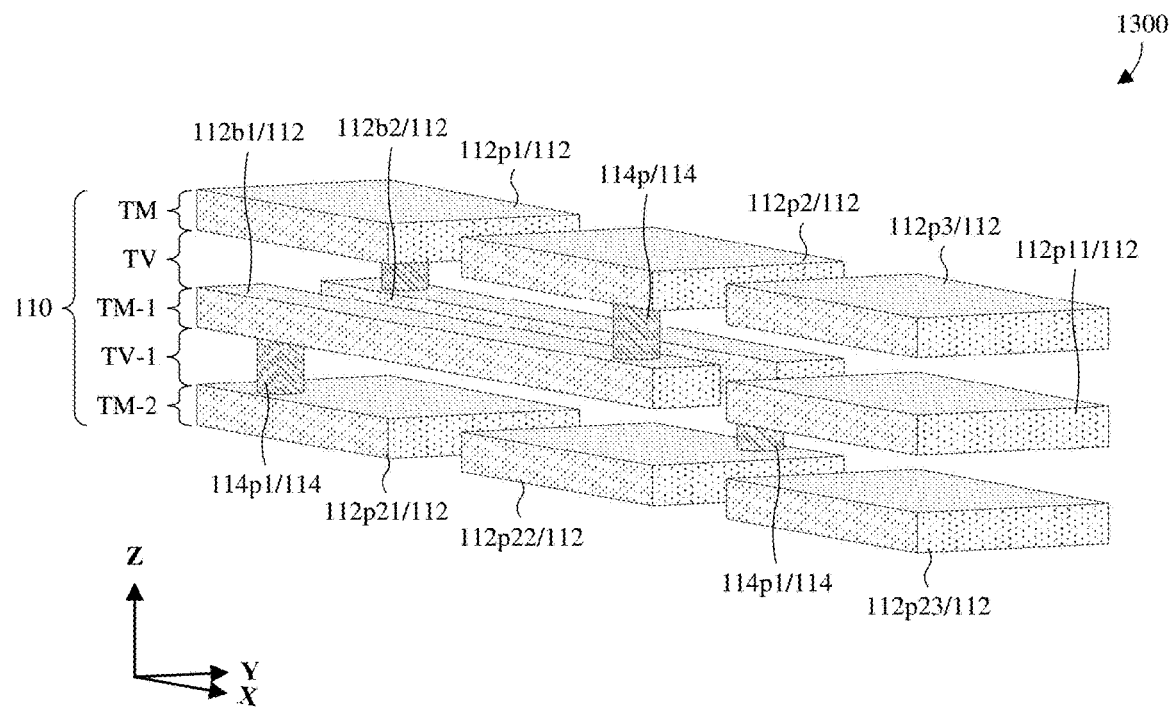
FIGS. 13 and 14A-14C illustrate various views of some embodiments of a frontside pad/bridge structure of FIG. 12.
Figure 14A:
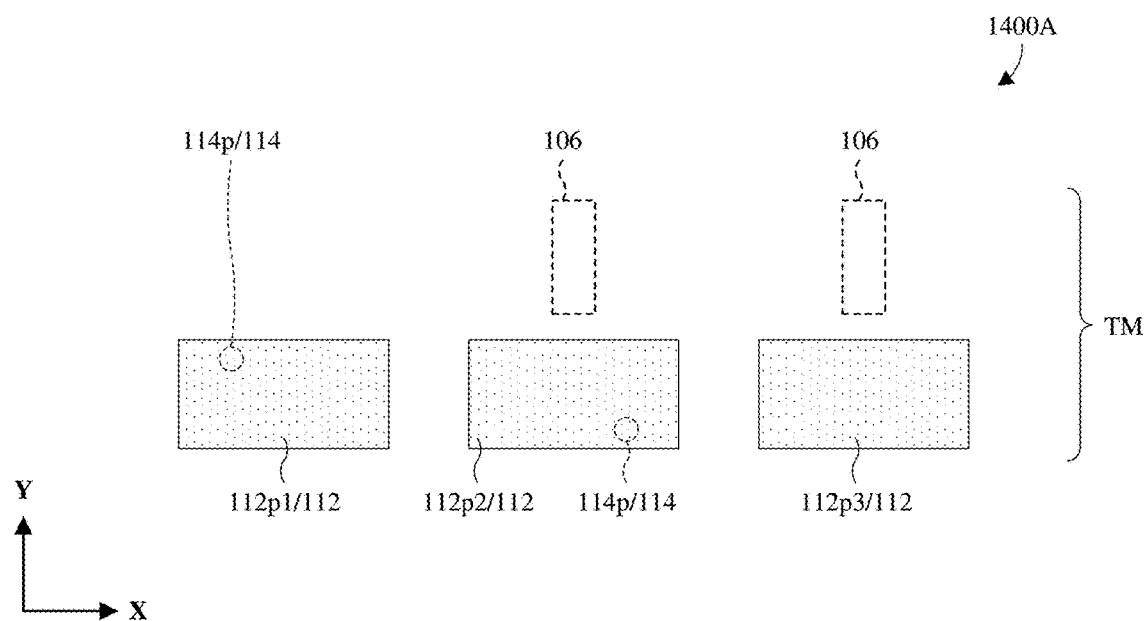
Figure 14B:
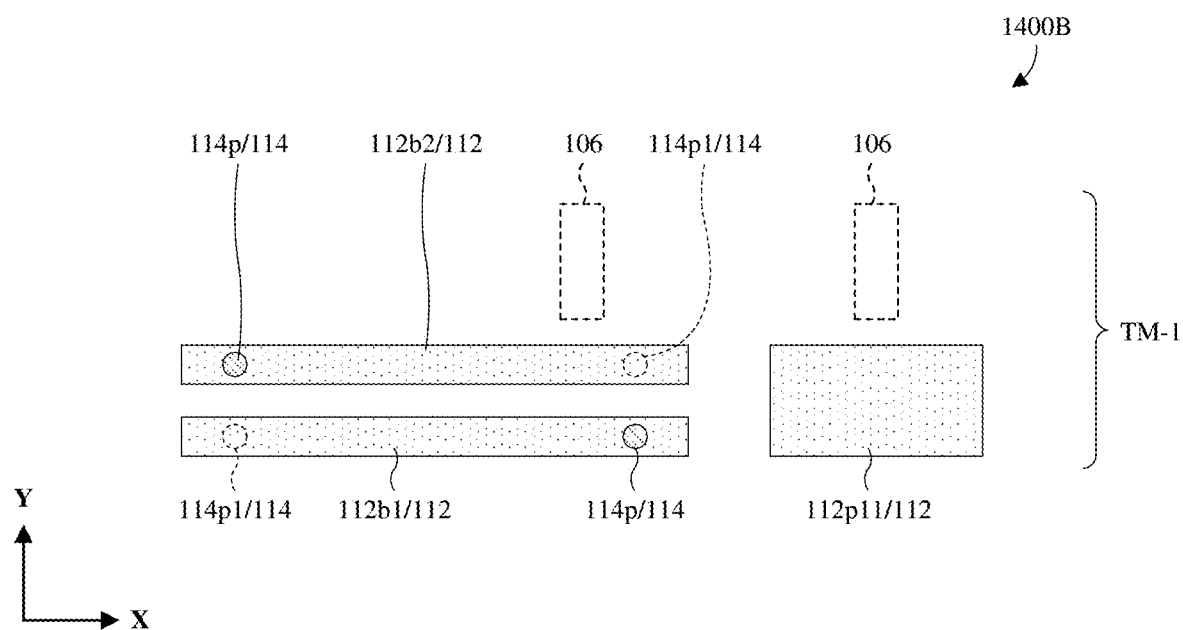
Figure 14C:
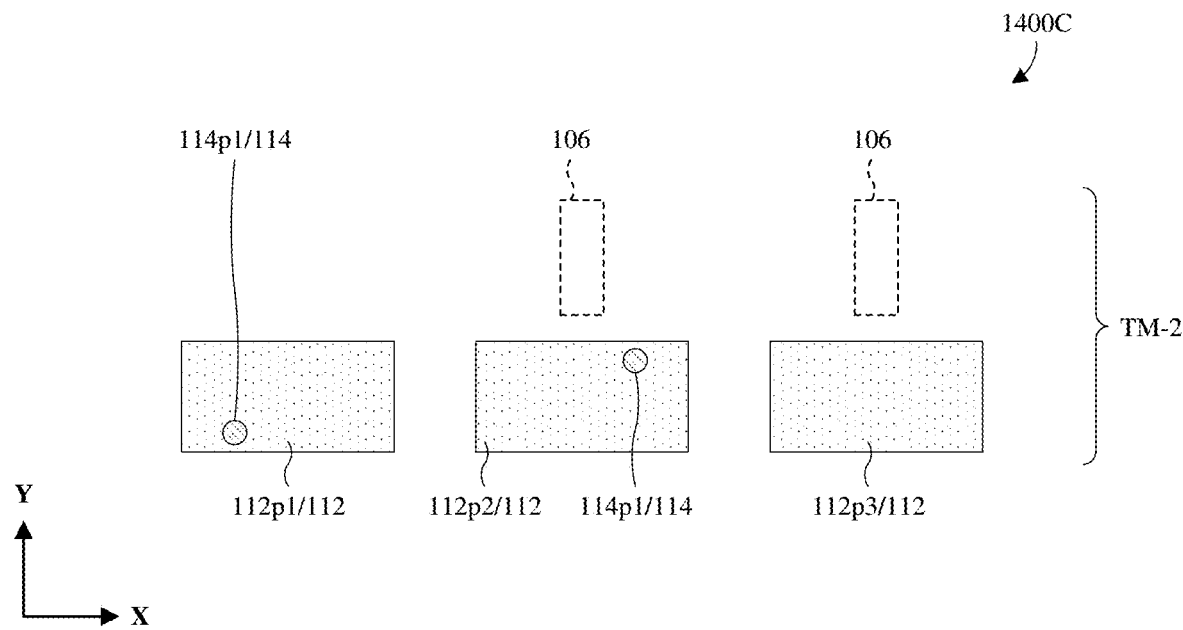

With reference to FIGS. 13 and 14A-14C, various views of some embodiments of a frontside pad/bridge structure of FIG. 12 are provided. FIG. 13 provides a perspective view 1300 of the frontside pad/bridge structure, whereas FIGS. 14A-14C provide top layouts 1400A-1400C of the frontside pad/bridge structure. FIG. 14A corresponds to a top layout 1400A at a TM layer, FIG. 14B corresponds to a top layout 1400B at a TM-1 layer, and FIG. 14C corresponds to a top layout 1400C at a TM-2 layer. Note that the semiconductor devices 106 of FIG. 12 are shown in phantom in FIGS. 14A-14C to provide a common point of reference. The frontside pad/bridge structure corresponds to the frontside pad/bridge structure 116 of the second or third IC die 102b, 102c and is representative of each frontside pad/bridge structure 116 of FIG. 12.

Focusing on FIG. 13 together with FIG. 14A, the frontside pad/bridge structure includes a third TM pad 112p3, which underlies the first-die backside pad 104a as seen in FIG. 12. Focusing on FIG. 13 together with FIG. 14B, the frontside pad/bridge structure includes a first TM-1 pad 112p11, which underlies the first-die backside pad 104a as seen in FIG. 12. Focusing on FIG. 13 together with FIG. 14C, the frontside pad/bridge structure includes a third TM-2 pad 112p23, which underlies the first-die backside pad 104a as seen in FIG. 12. In some embodiments, the third TM pad 112p3, the third TM-2 pad 112p23, the first TM-1 pad 112p11, or any combination of the foregoing is/are electrically floating.

Figure 15:
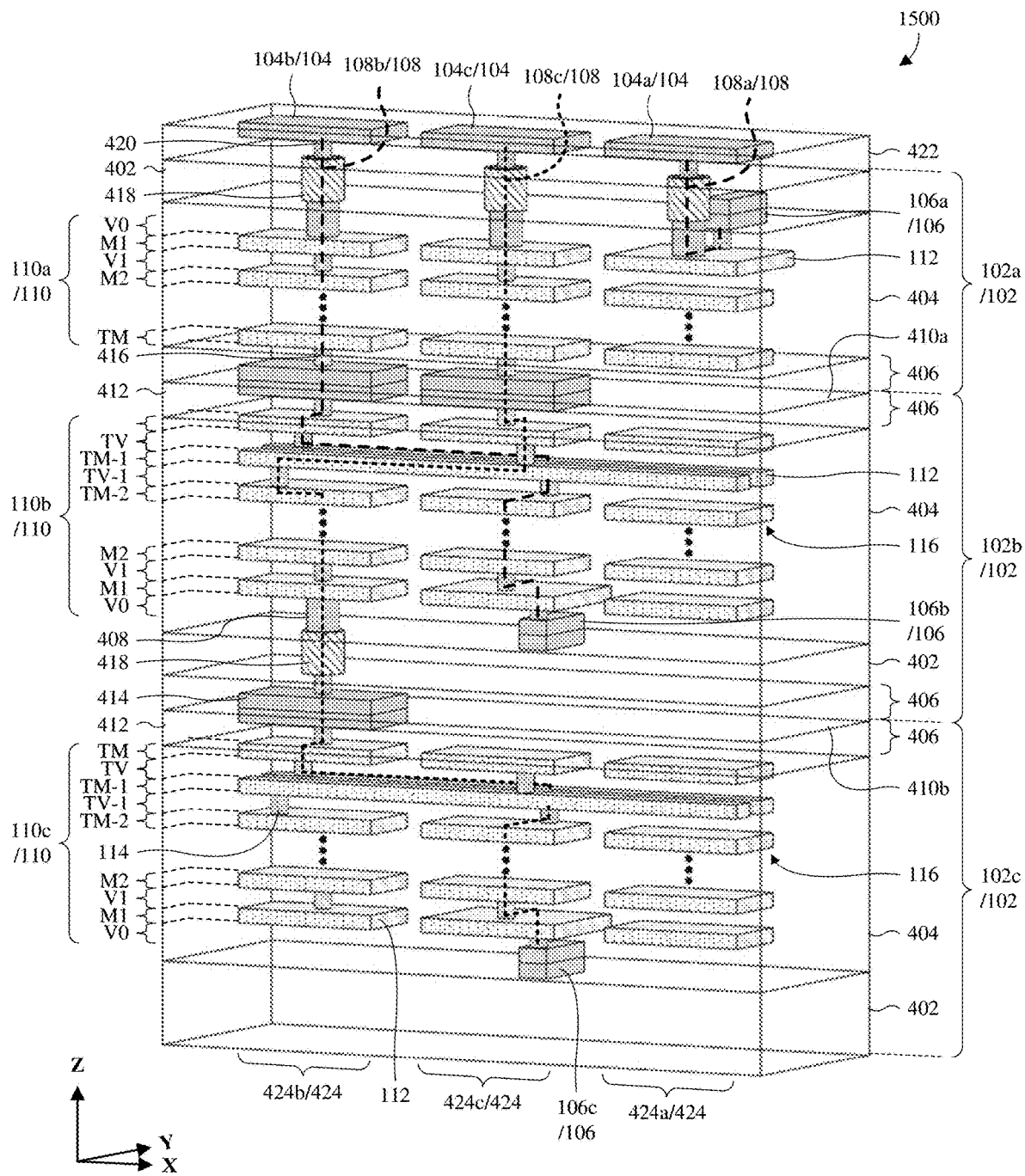
FIG. 15 illustrates a perspective view of some alternative embodiments of the 3D IC of FIG. 12 in which bridge wires extend under the first backside pad.

With reference to FIG. 15, a perspective view 1500 of some alternative embodiments of the 3D IC of FIG. 12 is provided in which interconnect features 112 at the TM-1 layers of the second and third IC dies 102b, 102c extend from directly under the second-die backside pad 104b to directly under the first-die backside pad 104a. These interconnect features correspond to the first and second bridge wires 112b1, 112b2 labeled hereafter at FIGS. 16 and 17A-17C.

Figure 16:
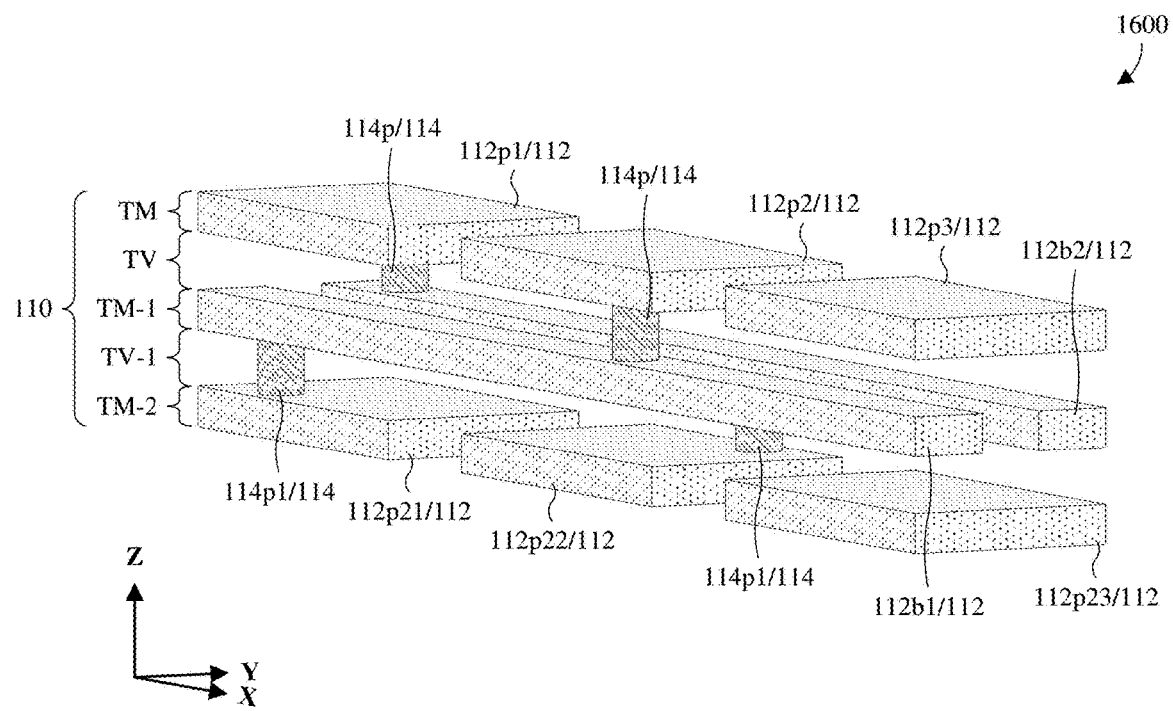
FIGS. 16 and 17A-17C illustrate various views of some embodiments of a frontside pad/bridge structure of FIG. 15.
Figure 17A:
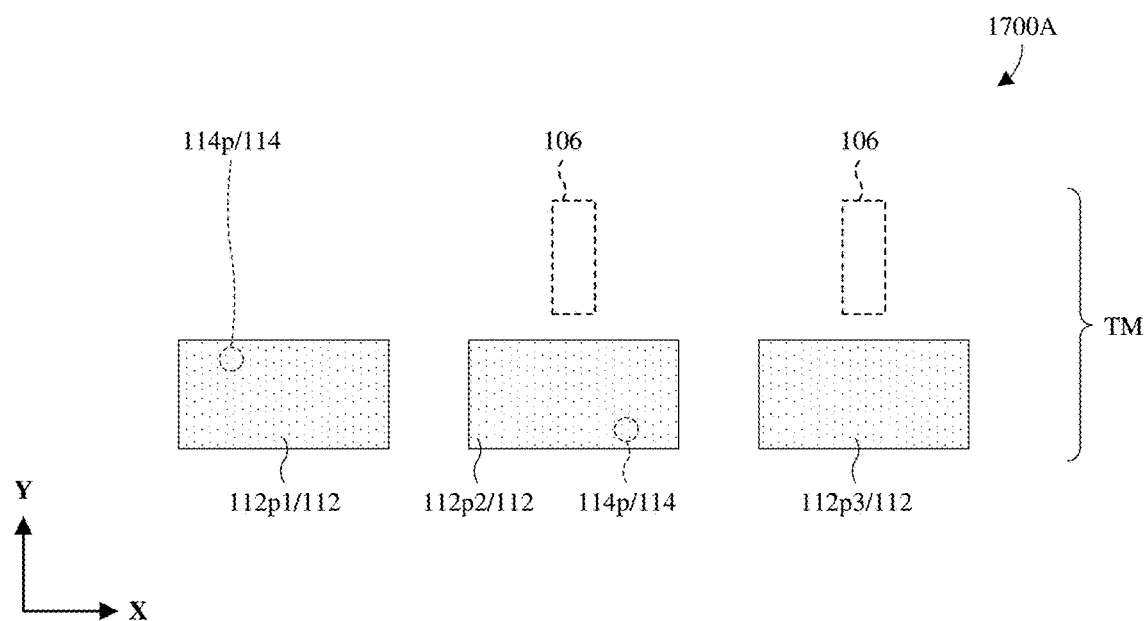
Figure 17B:
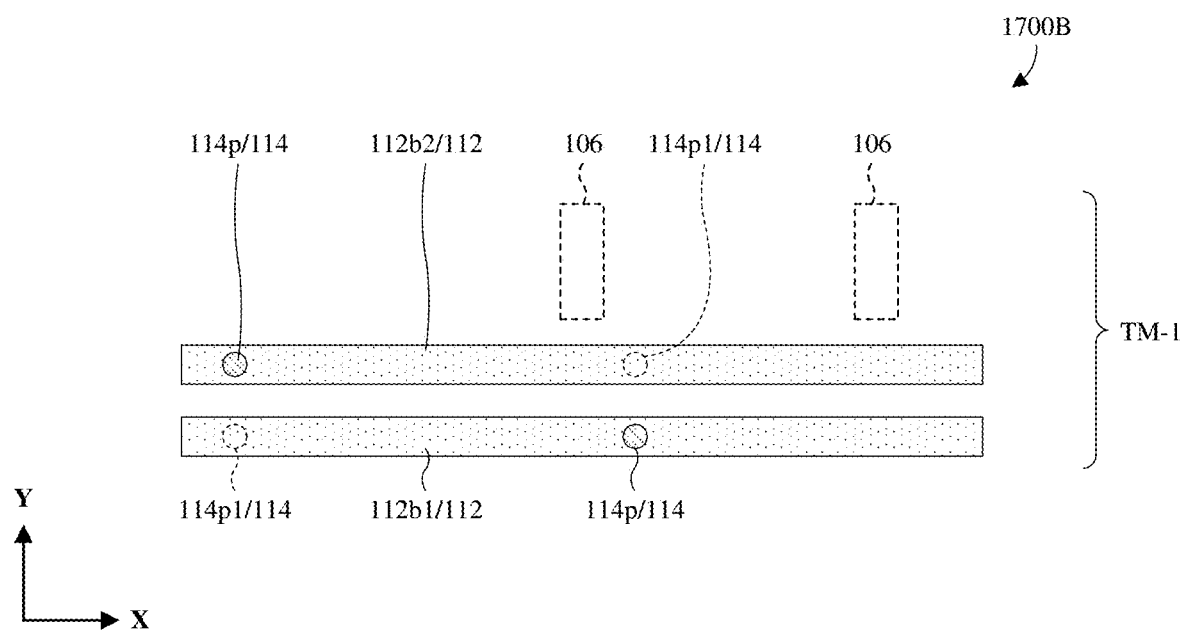
Figure 17C:
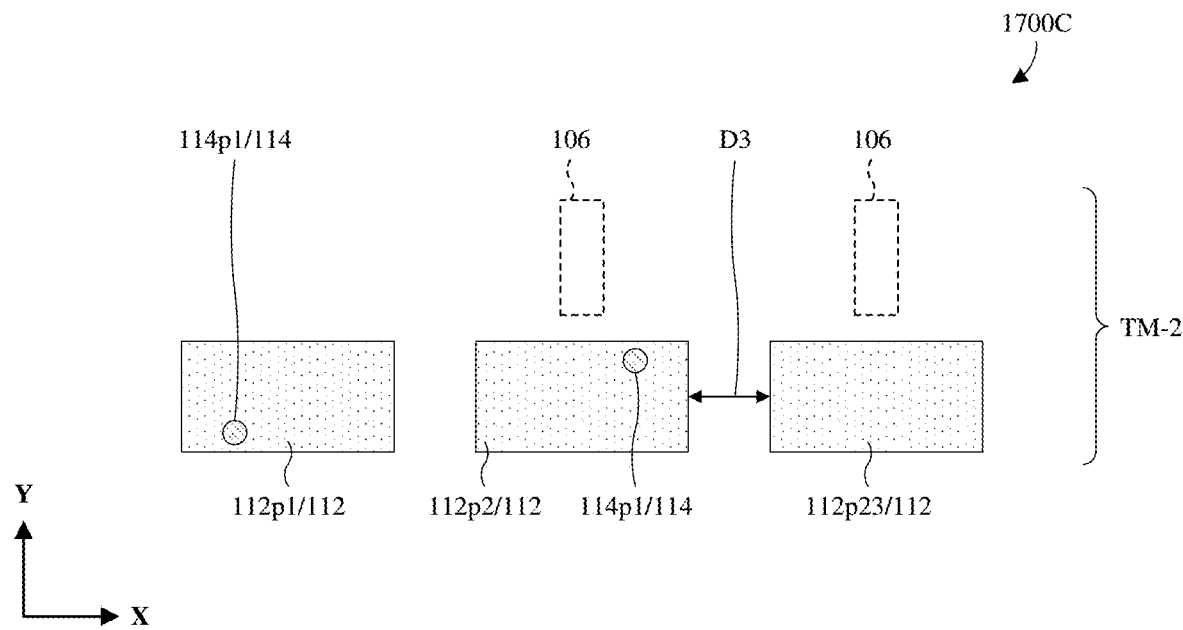

With reference to FIGS. 16 and 17A-17C, various views of some embodiments of a frontside pad/bridge structure of FIG. 15 is provided. FIG. 16 provides a perspective view 1600 of the frontside pad/bridge structure, whereas FIGS. 17A-17C provide top layouts 1700A-1700C of the frontside pad/bridge structure. FIG. 17A corresponds to a top layout 1700A at a TM layer, FIG. 17B corresponds to a top layout 1700B at a TM-1 layer, and FIG. 17C corresponds to a top layout 1700C at a TM-2 layer. Note that the semiconductor devices 106 of FIG. 15 are shown in phantom in FIGS. 17A-17C to provide a common point of reference. The frontside pad/bridge structure corresponds to the frontside pad/bridge structure 116 of the second or third IC die 102b, 102c and is representative of each frontside pad/bridge structure 116 of FIG. 15.

Figure 18:
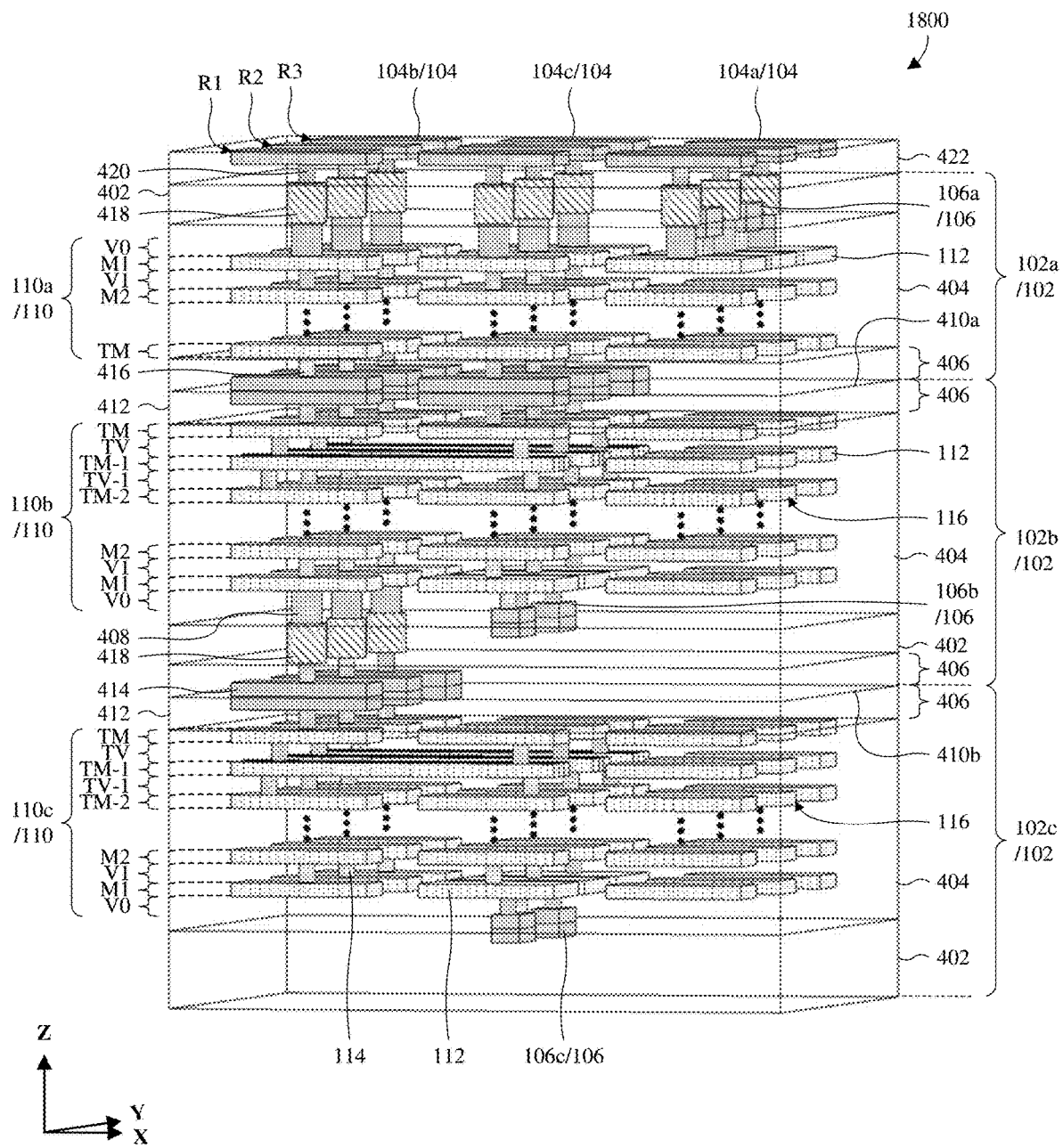
FIG. 18 illustrates a perspective view of some alternative embodiments of the 3D IC of FIG. 12 in which the 3D IC has multiple rows of backside pads.

With reference to FIG. 18, a perspective view 1800 of some embodiments of the 3D IC of FIG. 12 is provided in which the 3D IC has multiple rows R1, R2, R3 of backside pads 104. The rows extend in a first dimension (e.g., an X dimension) and are spaced from each other in a second dimension (e.g., a Y dimension) transverse to the first dimension. Each row R1-R3 comprises a first-die backside pad 104a, a second-die backside pad 104b, and a third-die backside pad 104c as described above. Further, at each row R1-R3, the structure of FIG. 12 repeats as illustrated and described above, except semiconductor devices 106 may be shared between rows and the V0 and M1 layers may vary from row to row. In alternative embodiments, the structure of FIG. 4, 6, 9, or 15 may instead by employed.

Because the structure of FIG. 12 repeats at each row R1-R3, the frontside pad/bridge structures 116 also repeat. As described above, the frontside pad/bridge structures 116 are the same within any given row as described above. Further, the frontside pad/bridge structures 116 are the same across rows. For example, the frontside pad/bridge structures 116 of row R1 are the same as the frontside pad/bridge structures 116 of row R2. In alternative embodiments, the frontside pad/bridge structures 116 are different at different rows.

Figure 19A:
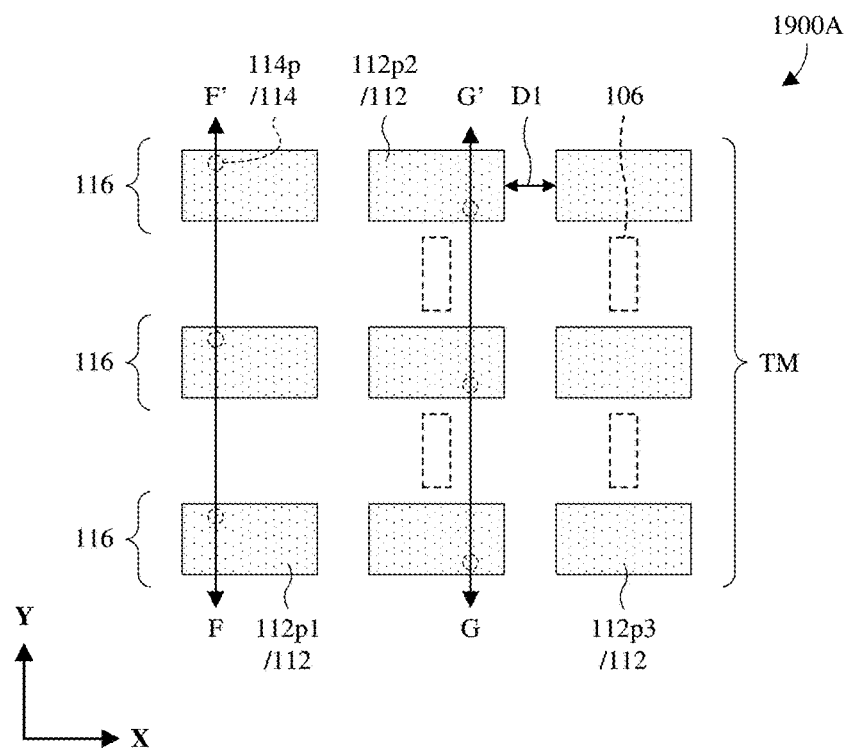
FIGS. 19A-19C illustrate top layouts of some embodiments of a level of frontside pad/bridge structures of FIG. 18.
Figure 19B:
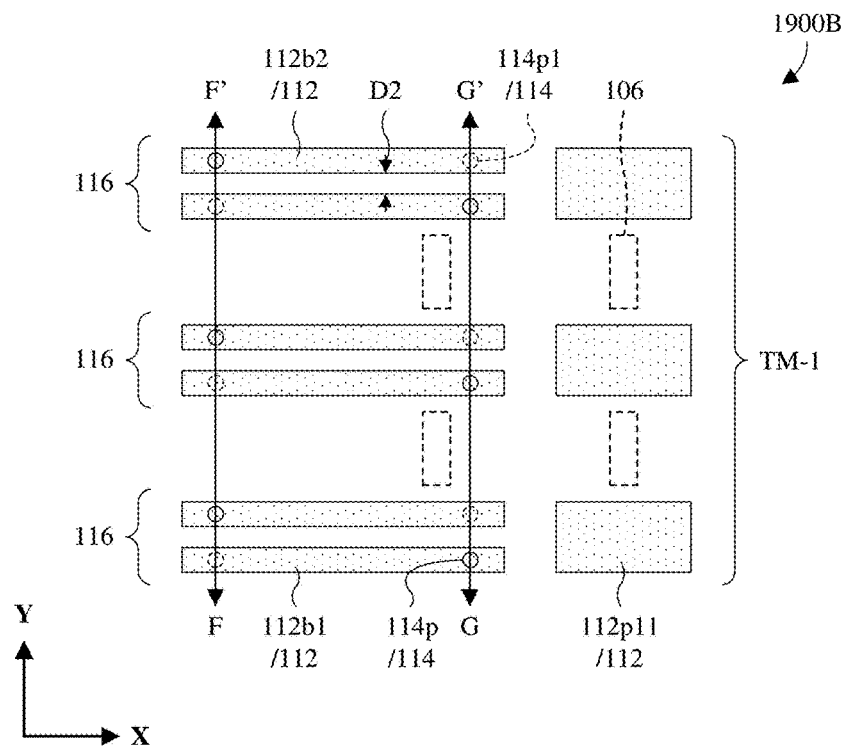
Figure 19C:
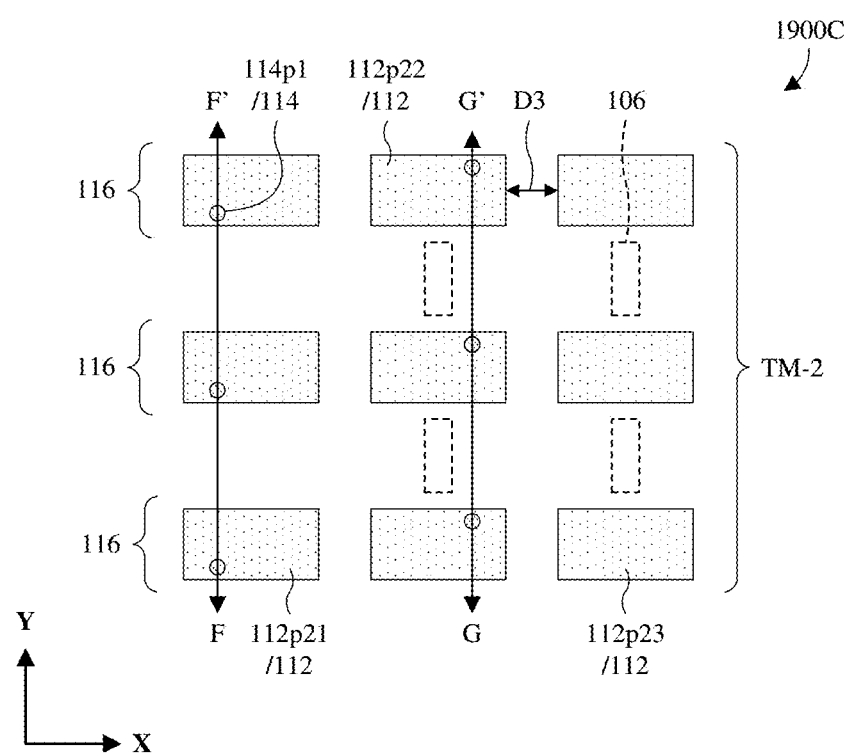

With reference to FIGS. 19A-19C, top layouts 1900A-1900C of some embodiments of a level of frontside pad/bridge structures 116 of FIG. 18 are provided. The semiconductor devices 106 of FIG. 18 are also shown in phantom to provide a common point of reference. FIG. 19A corresponds to a top layout 1900A at a TM layer, FIG. 19B corresponds to a top layout 1900B at a TM-1 layer, and FIG. 19C corresponds to a top layout 1900C at a TM-2 layer. The frontside pad/bridge structures 116 are spaced from each other in a dimension (e.g., a Y dimension), and the top layouts 1900A-1900C are made up of repetitions respectively of the top layouts 1400A-1400C of FIGS. 14A-14C in the dimension.

Figure 20A:
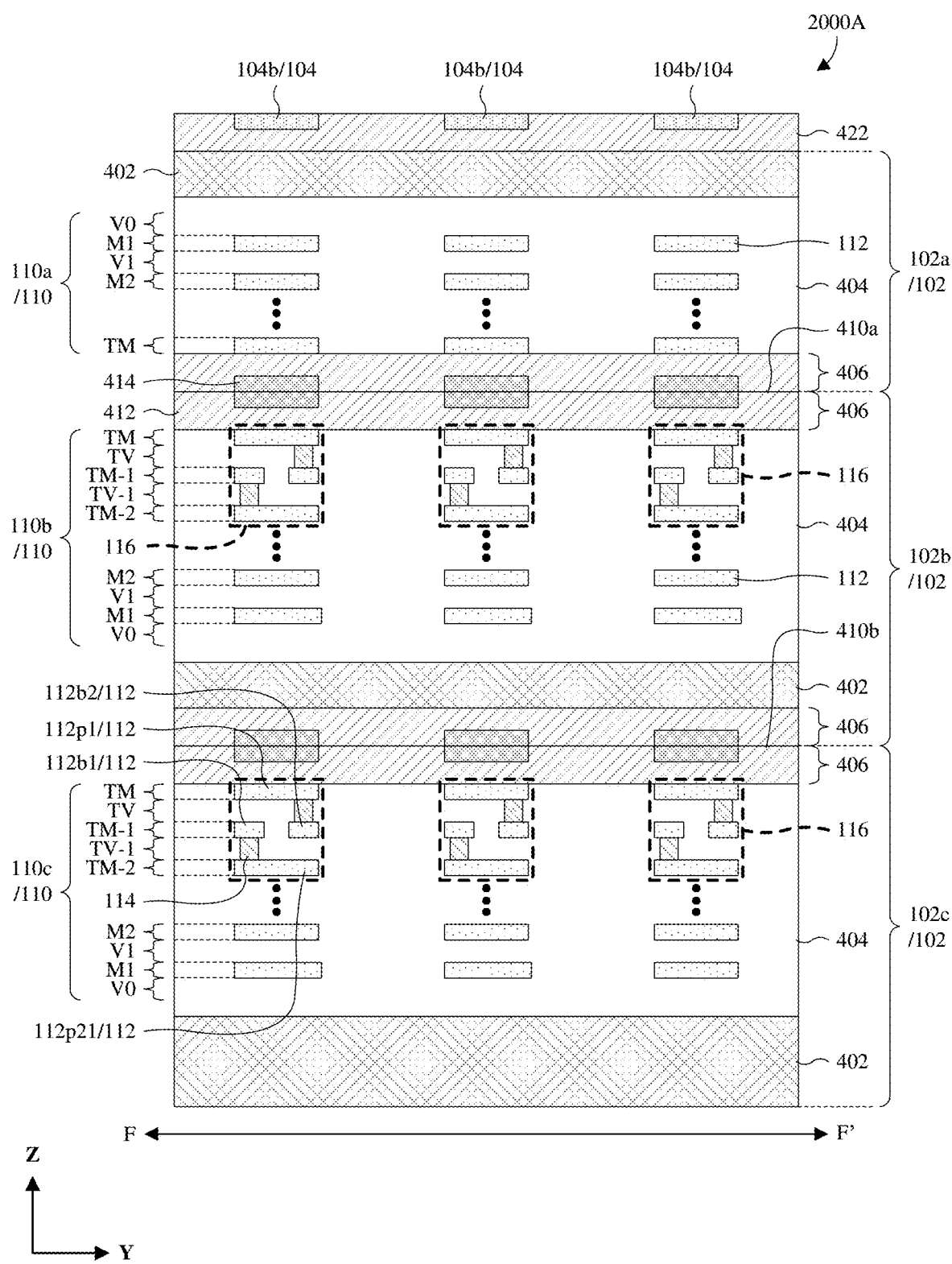
FIGS. 20A and 20B illustrate cross-sectional views of some embodiments of the 3D IC of FIG. 18.
Figure 20B:
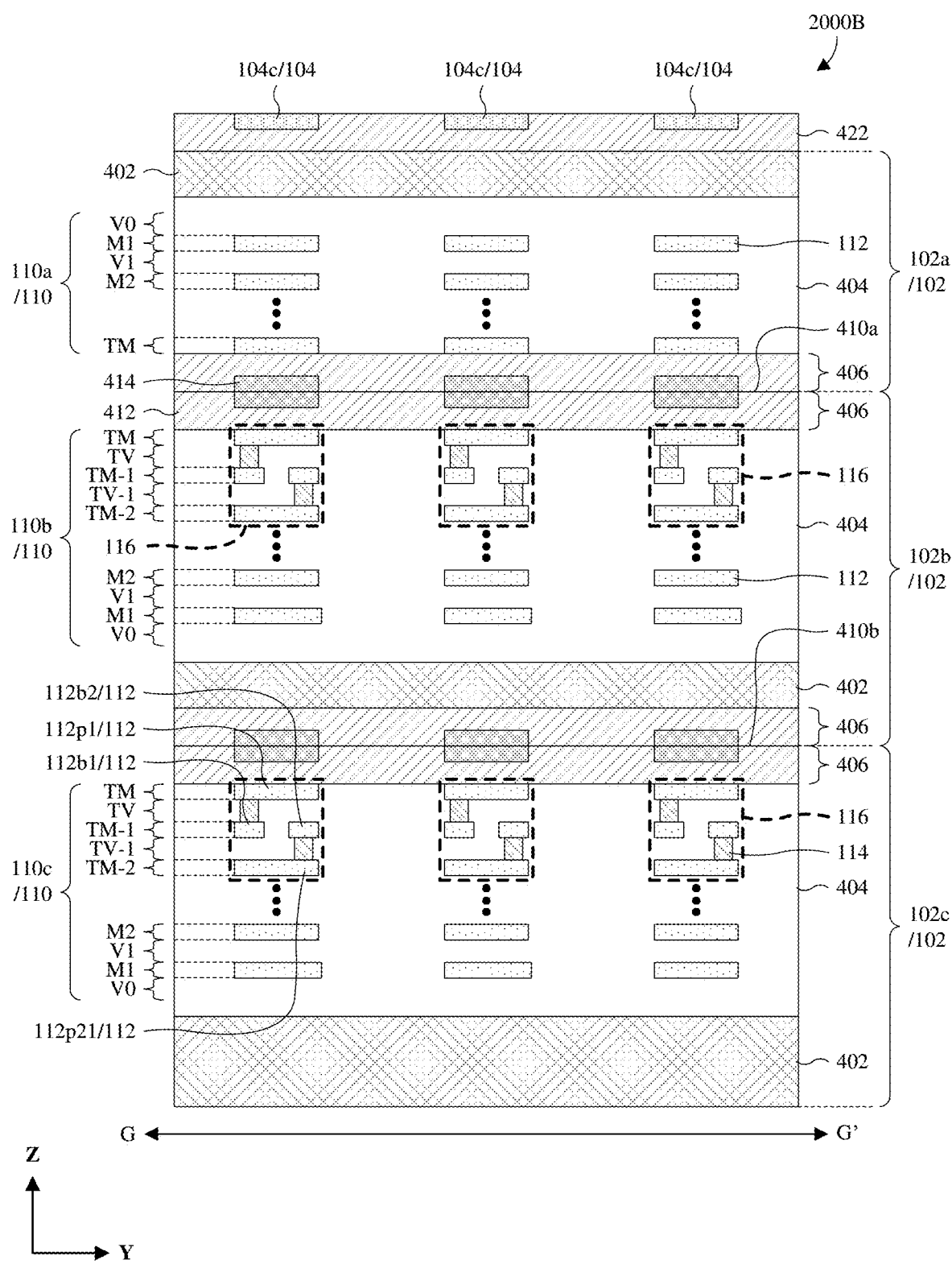

With reference to FIGS. 20A and 20B, cross-sectional views 2000A, 2000B of some embodiments of the 3D IC of FIG. 18 are provided. The cross-sectional view 2000A of FIG. 20A corresponds to line F-F' in FIGS. 19A-19C, and the cross-sectional view 2000B of FIG. 20B corresponds to line G-G' in FIGS. 19A-19C.

Figure 21:
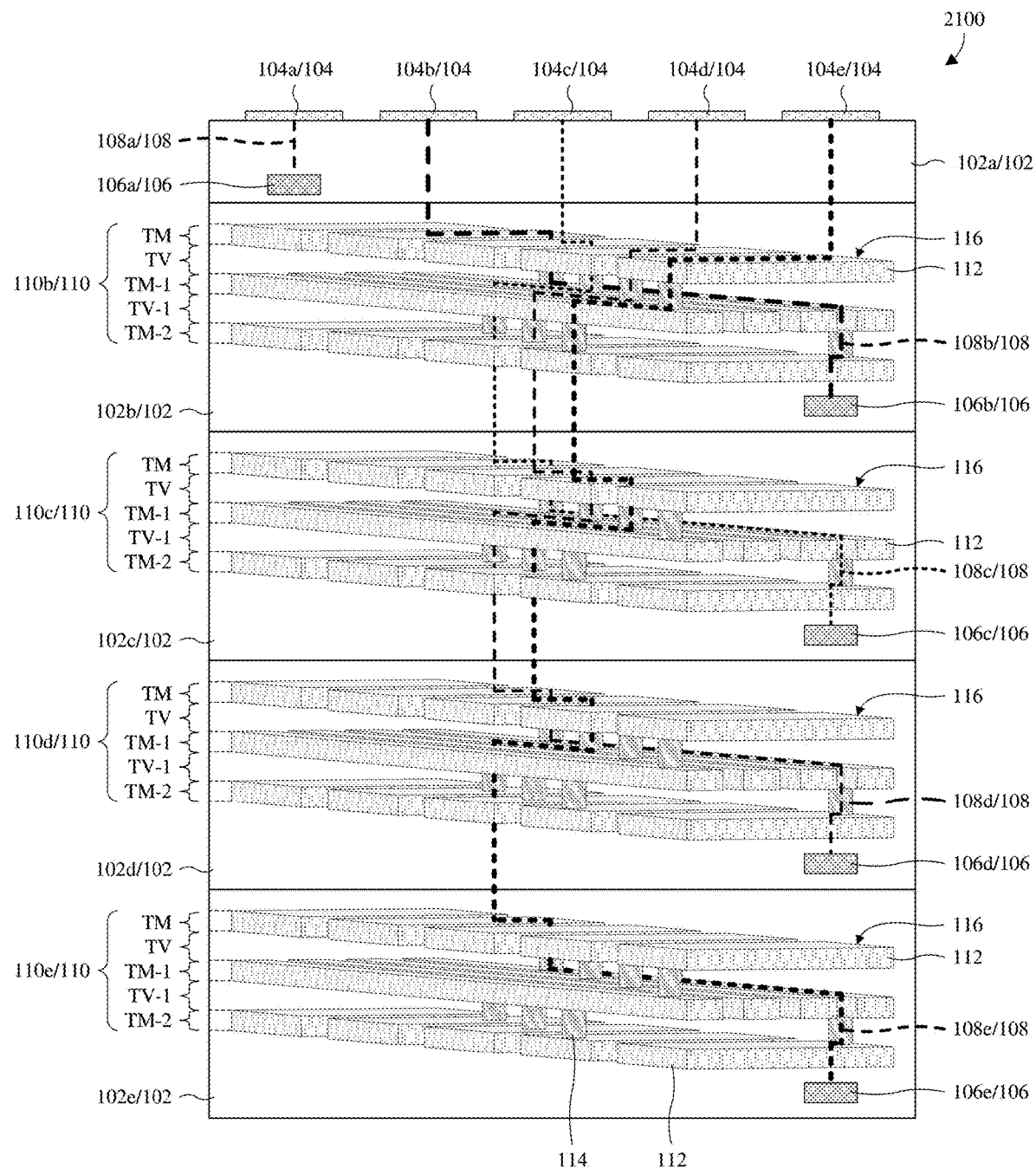
FIG. 21 illustrates a schematic view of some alternative embodiments of the 3D IC of FIG. 1 in which the 3D IC comprises additional IC dies.

With reference to FIG. 21, a schematic view 2100 of some alternative embodiments of the 3D IC of FIG. 1 is provided in which the 3D IC comprises additional IC dies and additional backside pads. In particular, the plurality of IC dies 102 further comprise a fourth IC die 102d and a fifth IC die 102e, and the plurality of backside pads 104 further comprises a fourth-die backside pad 104d and a fifth-die backside pads 104e.

The backside pads 104 are individually named with names beginning with integers. For example, the first-die backside pad 104a has a name beginning with "first". The integers correspond to the IC dies 102, and the backside pads 104 are ordered sequentially from one to five in a row in accordance with the corresponding integers. Hence, the fourth-die backside pad 104d follows the third-die backside pad 104c in the row, and the fifth-die backside pad 104e follows the fourth-die backside pad 104d in the row.

The fourth IC die 102d underlies and is bonded to the third IC die 102c, and the fifth IC die 102e underlies and is bonded to the fourth IC die 102d. As described above, the IC dies 102 comprise individual semiconductor devices 106 electrically coupled to corresponding backside pads 104 by corresponding conductive paths 108, and further comprise individual interconnect structures 110 partially forming the conductive paths 108. Accordingly, the fourth IC die 102d comprises a fourth-die semiconductor device 106d electrically coupled to the fourth-die backside pad 104d by a fourth-die conductive path 108d, and further comprises a fourth-die interconnect structure 110d partially forming the conductive paths 108. Similarly, the fifth IC die 102e comprises a fifth-die semiconductor device 106e electrically coupled to the fifth-die backside pad 104e by a fifth-die conductive path 108e, and further comprises a fifth-die interconnect structure 110e partially forming the conductive paths 108.

The interconnect structures 110 comprise a plurality of interconnect features 112 and plurality of interconnect vias 114. The interconnect features 112 may be, for example, pads, wires, lines, the like, or any combination of the foregoing. The interconnect features 112 and the interconnect vias 114 are grouped by elevation respectively into a plurality of metal layers and a plurality of via layers alternatingly stacked with the metal layers. In alternative embodiments, the metal layers are conductive but not metal. The plurality of metal layers comprises a TM layer, a TM-1 layer underlying the TM layer, and a TM-2 layer underlying the TM-1 layer at each of the second-die, third-die, fourth-die, and fifth-die interconnect structures 110b-110e. The plurality of via layers comprises a TV layer and TV-1 layer underlying the TV layer at each of the second-die, third-die, fourth-die, and fifth-die interconnect structures 110b-110e.

The second-die, third-die, fourth-die, and fifth-die interconnect structures 110b-110e form individual frontside pad/bridge structures 116. The frontside pad/bridge structures 116 are each spread across the TM, TM-1, TM-2, TV, and TV-1 layers of a corresponding IC die and provide routing to electrically couple the second-die, third-die, fourth-die, and fifth-die backside pads 104b-104e respectively to the second-die, third-die, fourth-die, and fifth-die semiconductor devices 106b-106e. Further, the frontside pad/bridge structures 116 share the shared frontside pad/bridge layout and hence have the same layout (e.g., top layout, cross-sectional layout, and so on) in the second-die, third-die, fourth-die, and fifth-die interconnect structures 110b-110e. As such, the frontside pad/bridge structures 116 are the same as each other.

Because the frontside pad/bridge structures 116 are the same in the second-die, third-die, fourth-die, and fifth-die interconnect structures 110b-110e, the TM layers may be same, the TM-1 layers may be the same, the TM-2 layers may be the same, the TV layers may be the same, and the TV-1 layers may be the same in the second-die, third-die, fourth-die, and fifth-die interconnect structures 110b-110e. Hence, the TM, TM-1, TM-2, TV, and TV-1 layers at each of the second-die, third-die, fourth-die, and fifth-die interconnect structures 110b-110e may be formed using the same set of photoreticles/photomasks. This may, in turn, reduce costs and/or increase throughput. In some embodiments, the second, third, and fifth IC dies 102b-102e are duplicates of each other (e.g., the same as each other), except for HB structures, TSVs, and the like enabling stacking and electrical coupling of the IC dies 102.

Figure 22:
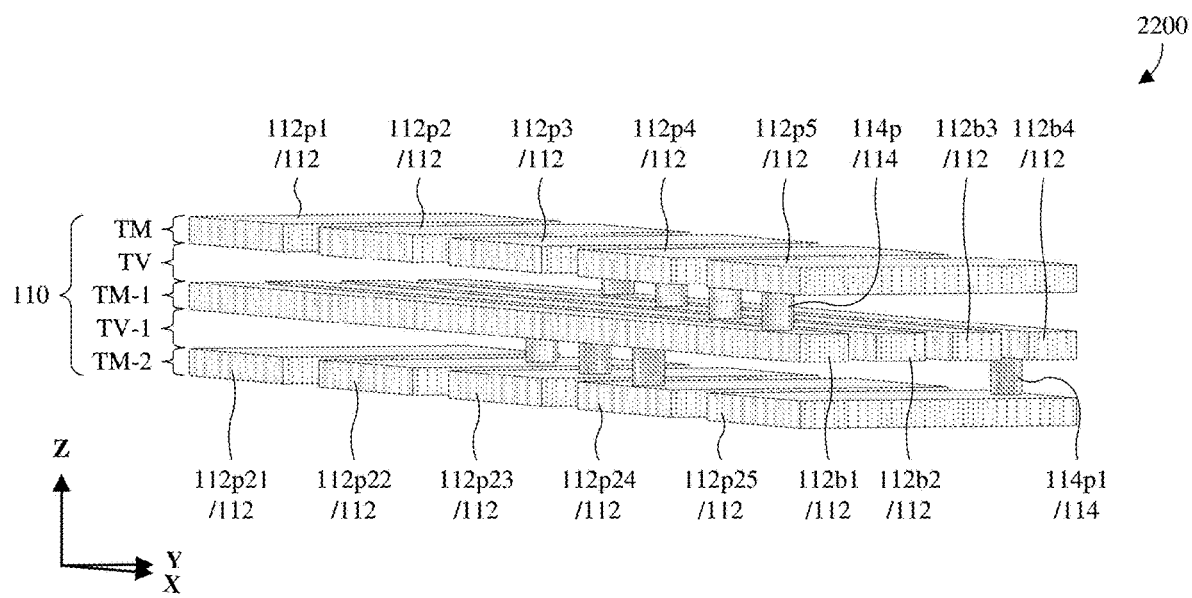
FIGS. 22 and 23A-23C illustrate various views of some embodiments of a frontside pad/bridge structure of FIG. 21.
Figure 23A:
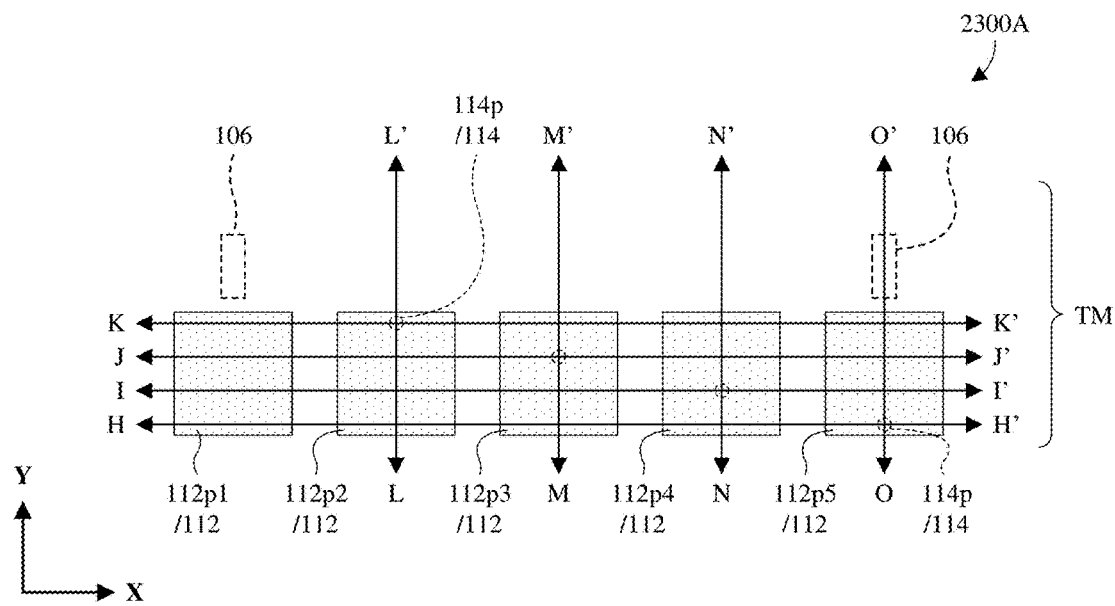
Figure 23B:
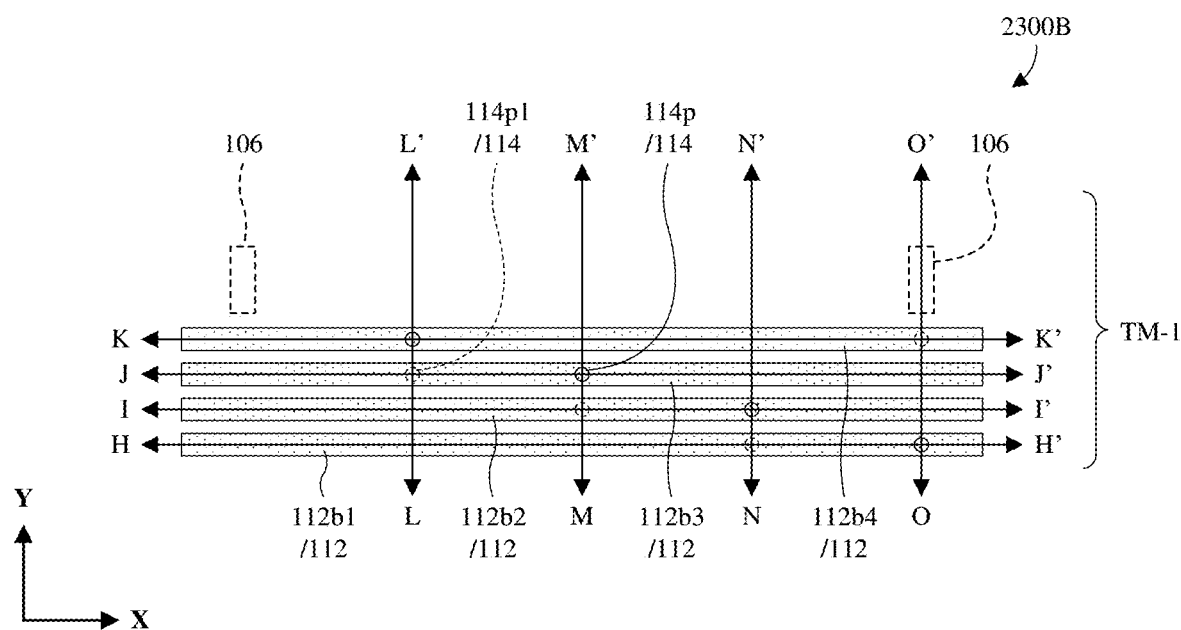
Figure 23C:
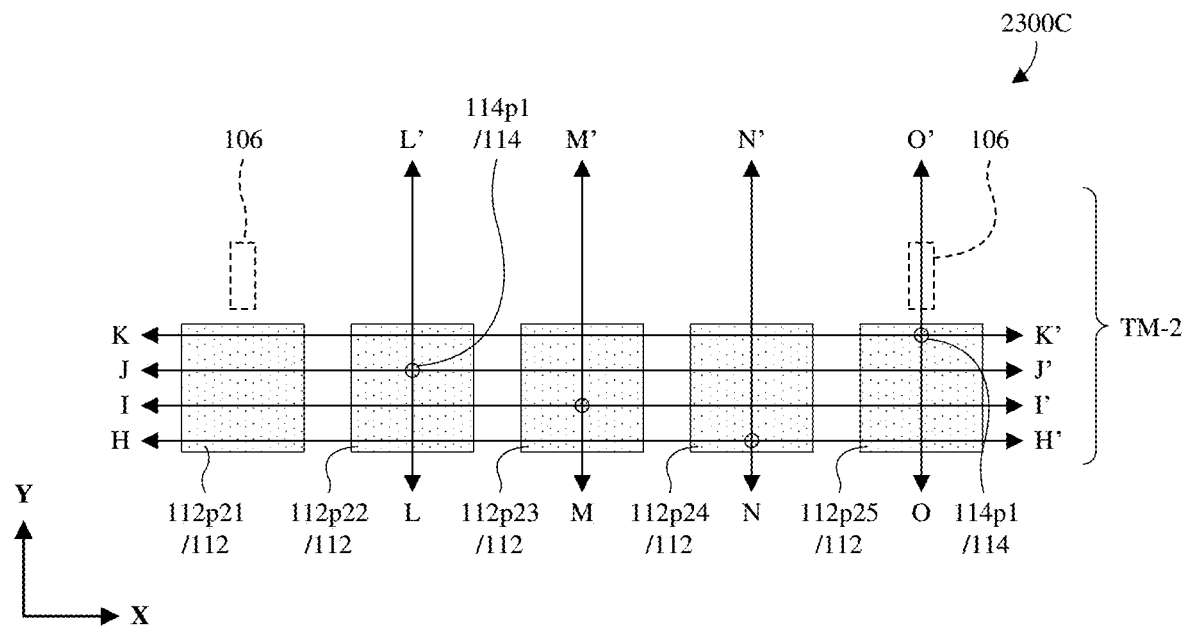

With reference to FIGS. 22 and 23A-23C, various views of some embodiments of a frontside pad/bridge structure of FIG. 21 is provided. FIG. 22 provides a perspective view 2200 of the frontside pad/bridge structure, whereas FIGS. 23A-23C provide top layouts 2300A-2300C of the frontside pad/bridge structure. FIG. 23A corresponds to a top layout 2300A at a TM layer, FIG. 23B corresponds to a top layout 2300B at a TM-1 layer, and FIG. 23C corresponds to a top layout 2300C at a TM-2 layer. Note that the semiconductor devices 106 of FIG. 21 are shown in phantom in FIGS. 23A-23C to provide a common point of reference.

The frontside pad/bridge structure corresponds to the frontside pad/bridge structure 116 of the second, third, fourth, or fifth IC die 102b-102e. Further, the frontside pad/bridge structure is representative of each frontside pad/bridge structure 116 of FIG. 21 because the frontside pad/bridge structures 116 of FIG. 21 are the same as each other as described above. The frontside pad/bridge structure comprises: 1) a first TM pad 112p1, a second TM pad 112p2, a third TM pad 112p3, a fourth TM pad 112p4, and fifth TM pad 112p5 at a TM layer (see, e.g., FIGS. 22 and 23A); 2) a first bridge wire 112b1, a second bridge wire 112b2, a third bridge wire 112b3, and a fourth bridge wire 112b4 at a TM-1 layer (see, e.g., FIGS. 22 and 23B); and 3) a first TM-2 pad 112p21, a second TM-2 pad 112p22, a third TM-2 pad 112p23, a fourth TM-2 pad 112p24, and fifth TM-2 pad 112p25 at a TM-2 layer (see, e.g., FIGS. 22 and 23C).

The first, second, third, fourth, and fifth TM pads 112p1-112p5 (collectively the TM pads) are spaced from each other in in a dimension (e.g., an X dimension) and are arranged in a first row extending the dimension. Similarly, the first, second, third, fourth, and fifth TM-2 pads 112p21-112p25 (collectively the TM-2 pads) are spaced from each other in the dimension and are arranged in a second row extending the dimension. The TM pads 112p1-112p5 and the TM-2 pads 112p21-112p25 are individually named with names beginning with integers. For example, the first TM pad 112p1 has a name beginning with "first". The TM pads 112p1-112p5 are ordered sequentially from one to five in the first row in accordance with the corresponding integers, and the TM-2 pads 112p21-112p25 are similarly ordered sequentially from one to five in the second row in accordance with the corresponding integers. Further, the TM-2 pads 112p21-112p25 respectively underlie the TM pads 112p1-112p5.

The first, second, third, and fourth bridge wires 112b1-112b4 (collectively the bridge wires) are elongated in parallel in the dimension. By elongated in parallel in the dimension, it is meant that greatest dimensions of the bridge wires 112b1-112b4 extend in parallel in the dimension. Further, the bridge wires 112b1-112b4 each underlie each of the TM pads 112p1-112p5 and overlie each of the TM-2 pads 112p21-112p25. The bridge wires 112b1-112b4 are individually named with names beginning with integers. For example, the first bridge wire 112b1 has a name beginning with "first". Further, the bridge wires 112b1-112b4 are ordered sequentially from one to four in accordance with the corresponding integers. The first bridge wire 112b1 is at a front of the frontside pad/bridge structure, whereas the fourth bridge wire 112b4 is at a back of the frontside pad/bridge structure.

TV pad vias 114p of a TV layer extend respectively from the first, second, third, and fourth bridge wires 112b1-112b4 respectively to the fifth, fourth, third, and second TM pads 112p5-112p2. Further, TV-1 pad vias 114p1 of a TV-1 layer extend respectively from the first, second, third, and fourth bridge wires 112b1-112b4 respectively to fourth, third, second, and fifth TM-2 pads 112p24, 112p23, 112p22, 112p25. Note that the TV and TV-1 pad vias 114p, 114p1 are shown in phantom respectively in FIGS. 23A and 23B.

As described above, the frontside pad/bridge structure is tailored to a 3D IC with five IC dies. However, the frontside pad/bridge structure may be generalized for use with a 3D IC having X IC dies, where X is an integer greater than two. Hence, FIGS. 22 and 23A-23C provide an example of the generalized frontside pad/bridge structure in which X is five.

The generalized frontside pad/bridge structure comprises: 1) X TM pads; 2) X TM-2 pads underlying the X TM pads; and 3) X−1 bridge wires between the X TM pads and the X TM-2 pads. The X TM pads respectively have index values from 1 to X and are sequentially ordered from 1 to X according to the index values in a first row extending in a dimension (e.g., an X dimension). Similarly, the X TM-2 pads respectively have index values from 1 to X and are sequentially ordered from 1 to X according to the index values in a second row extending in the dimension. Further, the X TM-2 pads each underlie the TM pad with a like index value. The X−1 bridge wires respectively have index values from 1 to X−1 and are sequentially ordered from 1 to X−1 according to the index values, where bridge wire 1 is at a front of the generalized frontside pad/bridge structure and bridge wire X−1 is at a back of the generalized frontside pad/bridge structure. Further, the X−1 bridge wires are elongated in parallel in the dimension from directly over TM-2 pad X to directly over TM-2 pad 1 and are further elongated in parallel in the dimension from directly under TM pad X to directly under TM pad 1. Note that the index values of the X TM pads, the X TM-2 pads, and the X−1 bridge wires are integers.

For each i of the X−1 bridge wires, a TV pad via of a TV layer extends from that bridge wire i to TM pad j=X−i+1, where i and j are indexes respectively of the X−1 bridge wires and the X TM pads. For bridge wire X−1 of the X−1 bridge wires, a TV-1 pad via of a TV-1 layer extends from bridge wire X−1 to TM-2 pad X. For each remaining bridge i of the X−1 bridge wires (e.g., bridge wire 1 to bridge wire X−2), a TV-1 pad via of the TV-1 layer extends from that bridge wire i to TM-2 pad k=X−i, where i and k are indexes respectively of the X−1 bridge wires and the X TM-2 pads.

Figure 24:
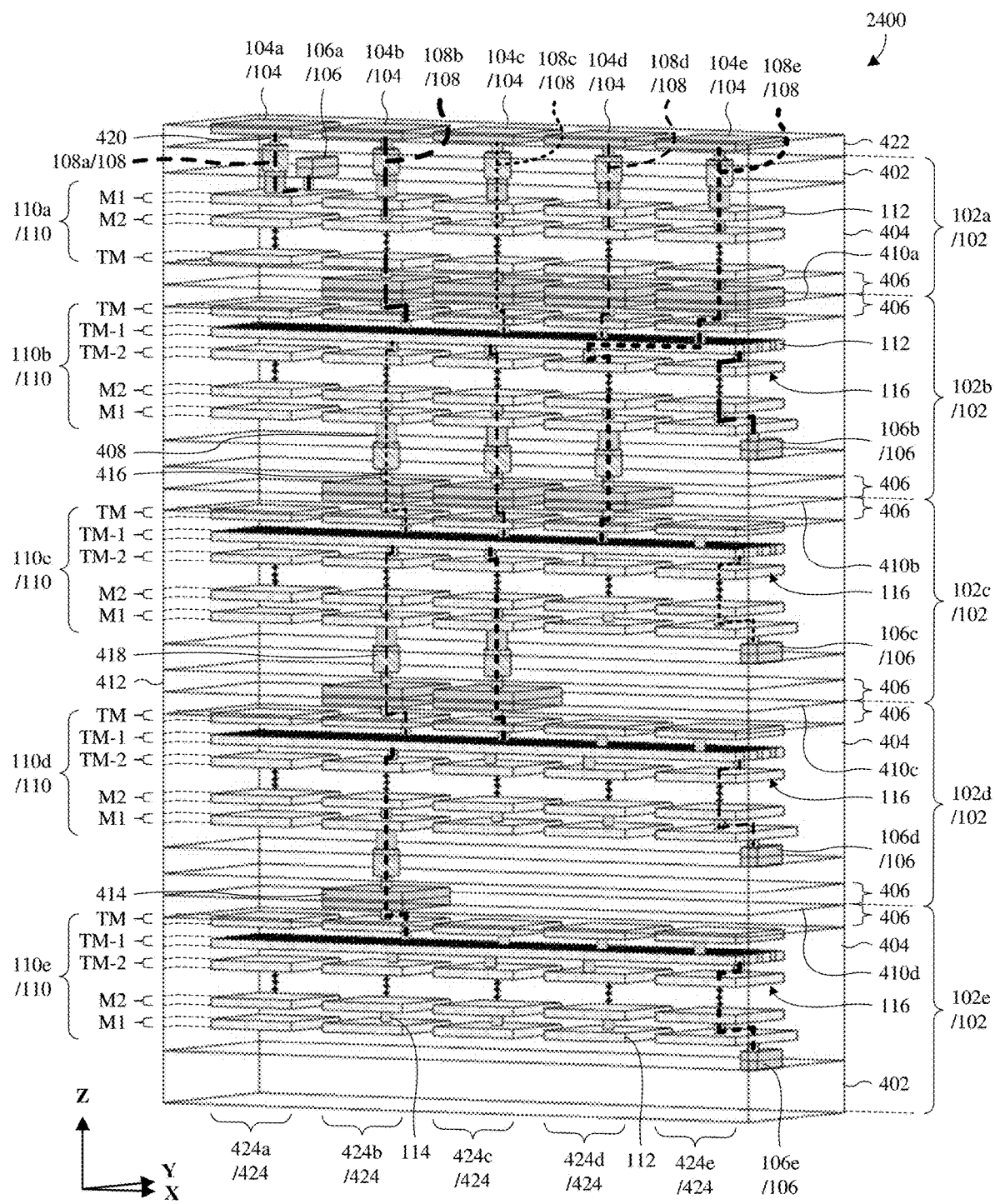
FIGS. 24 and 25A-25H illustrate various views of some more detailed embodiments of the 3D IC of FIG. 21.
Figure 25A:
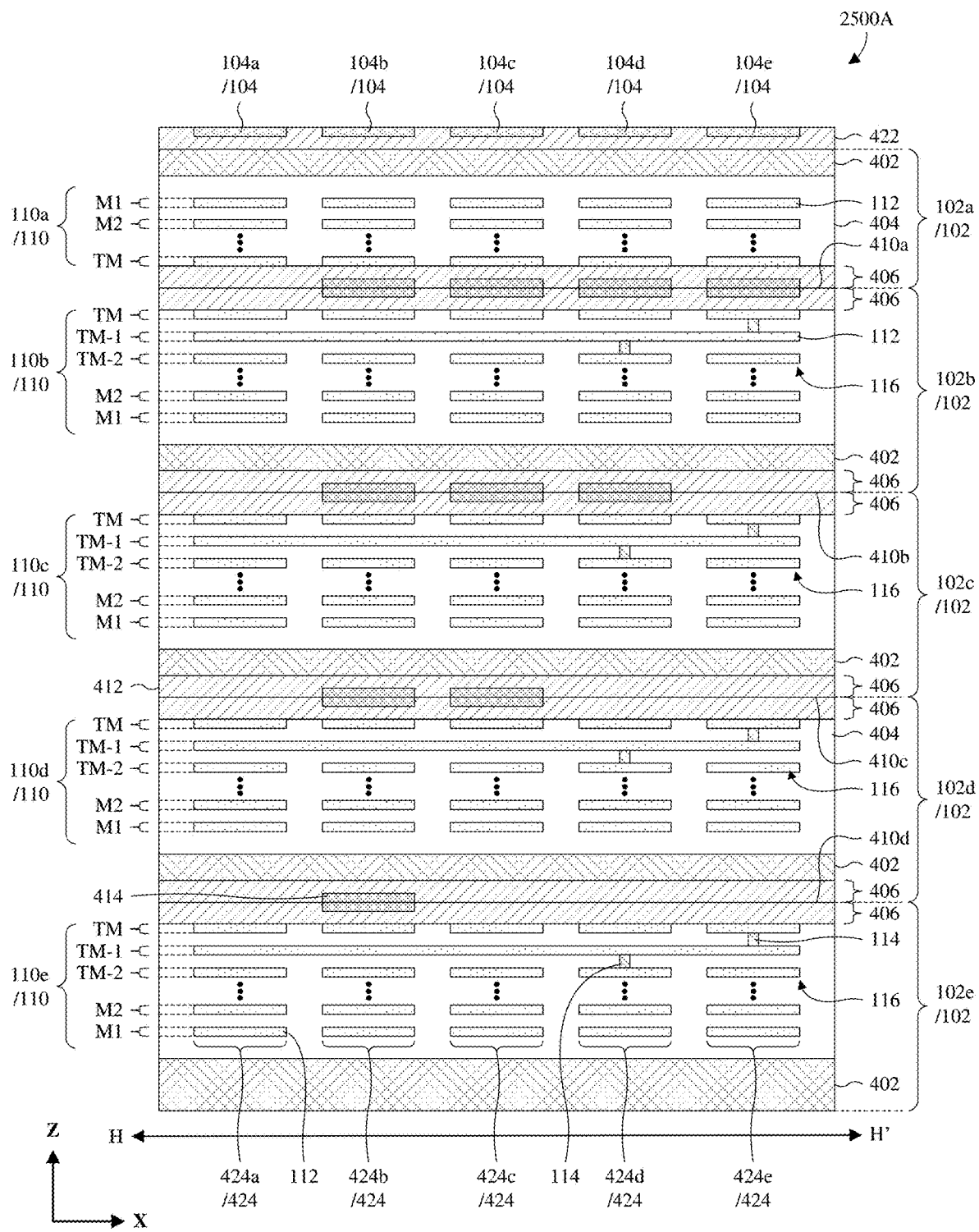
Figure 25B:
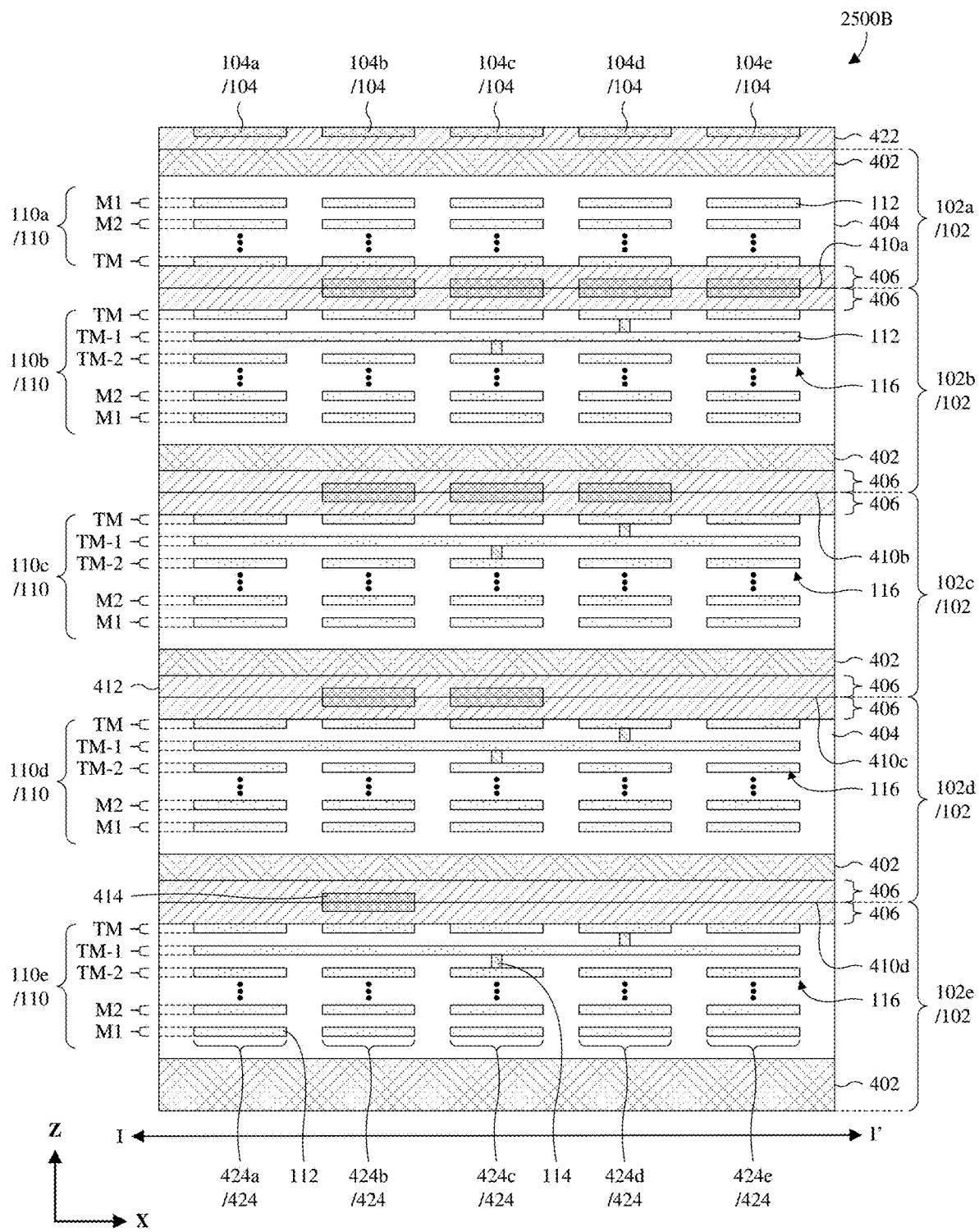
Figure 25C:
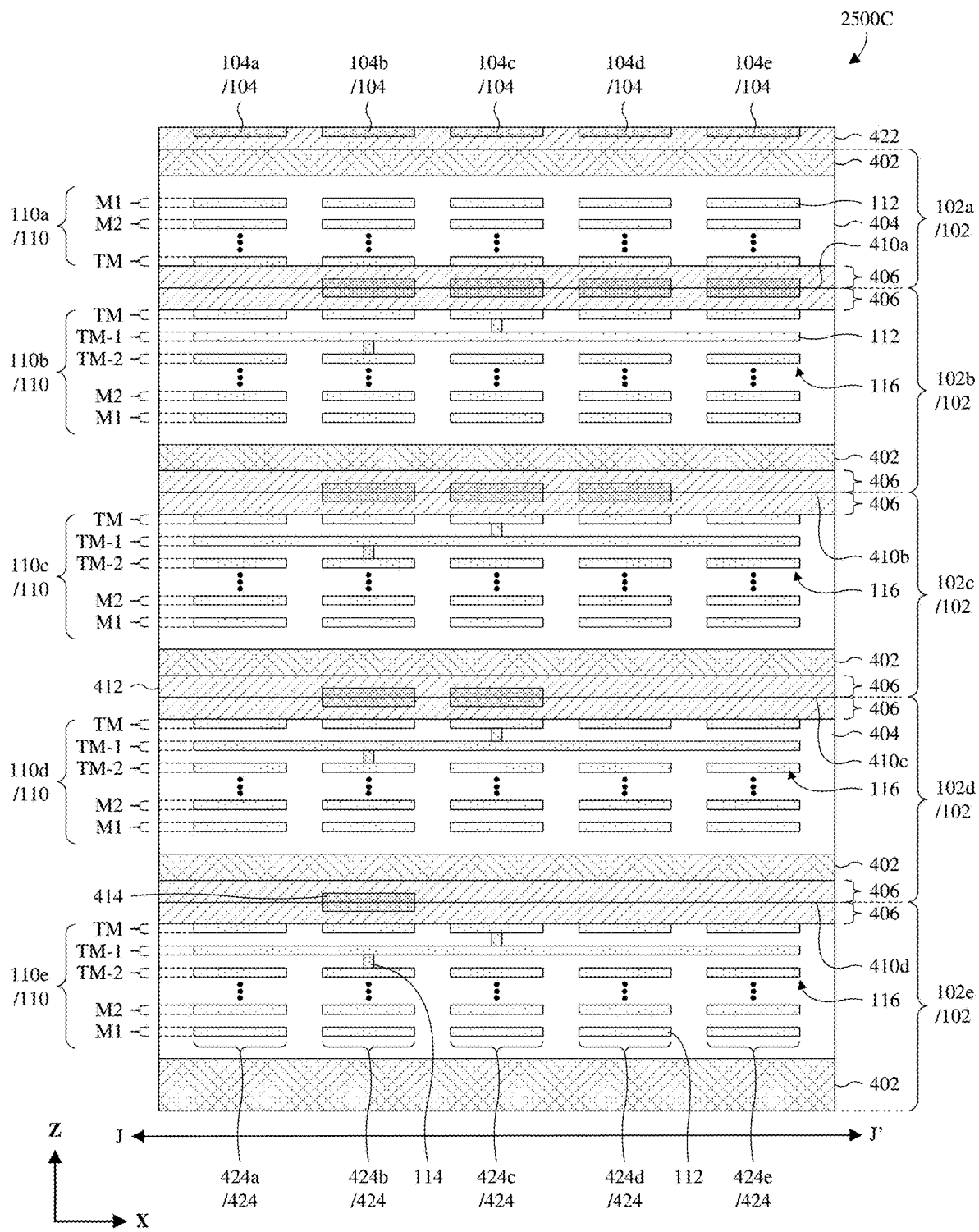
Figure 25D:
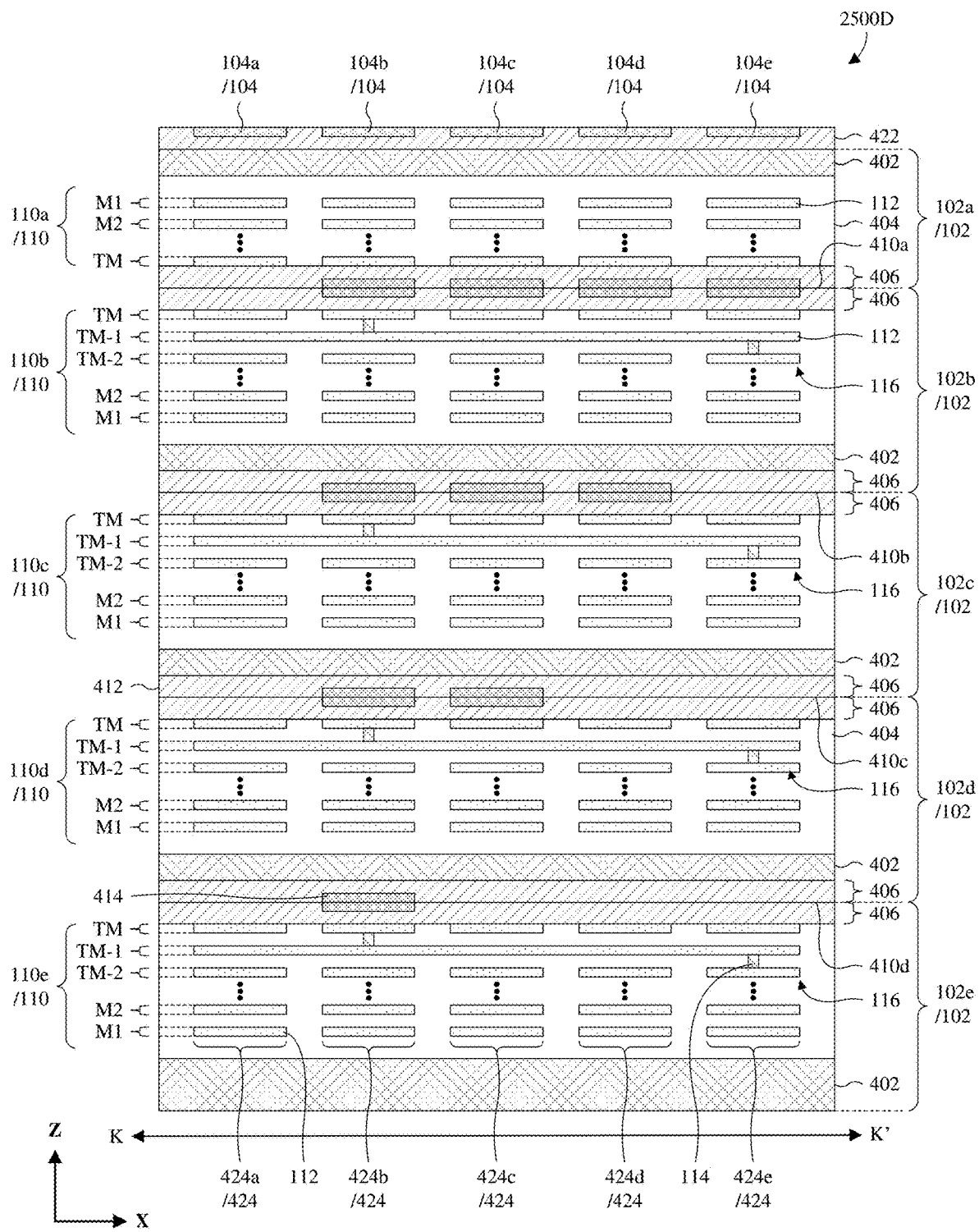
Figure 25E:
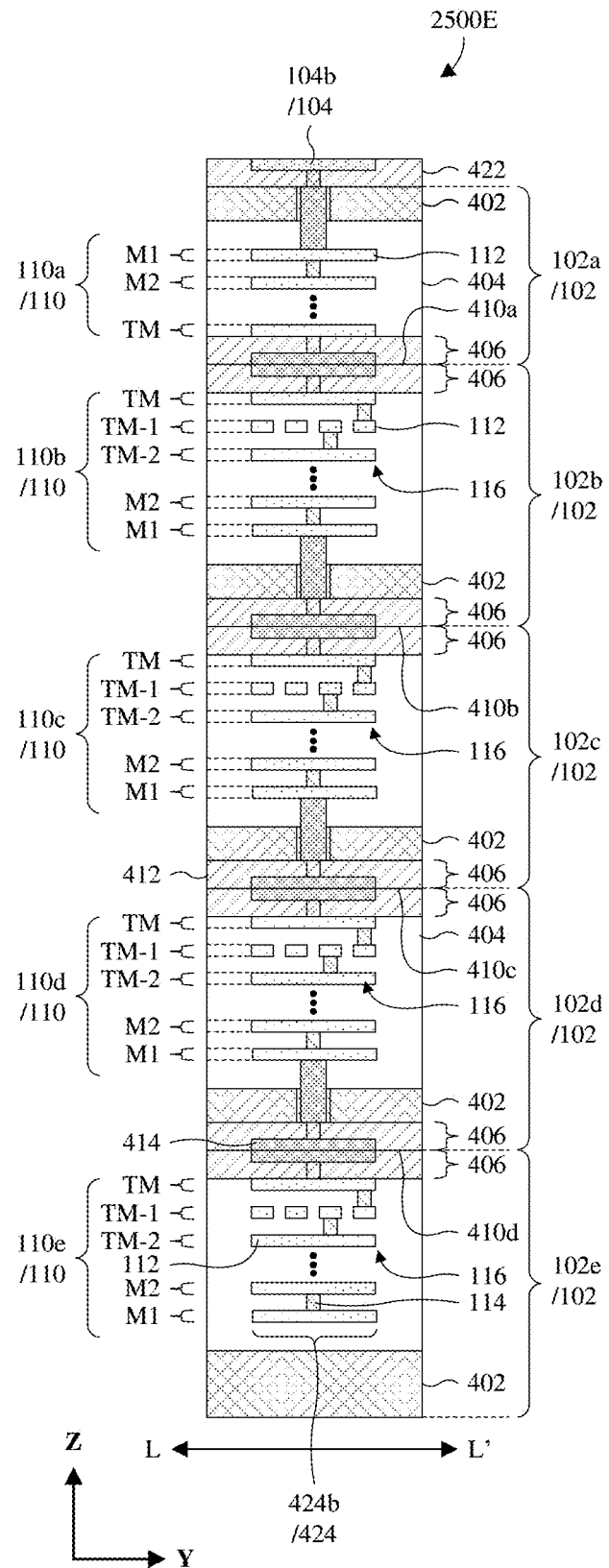
Figure 25F:
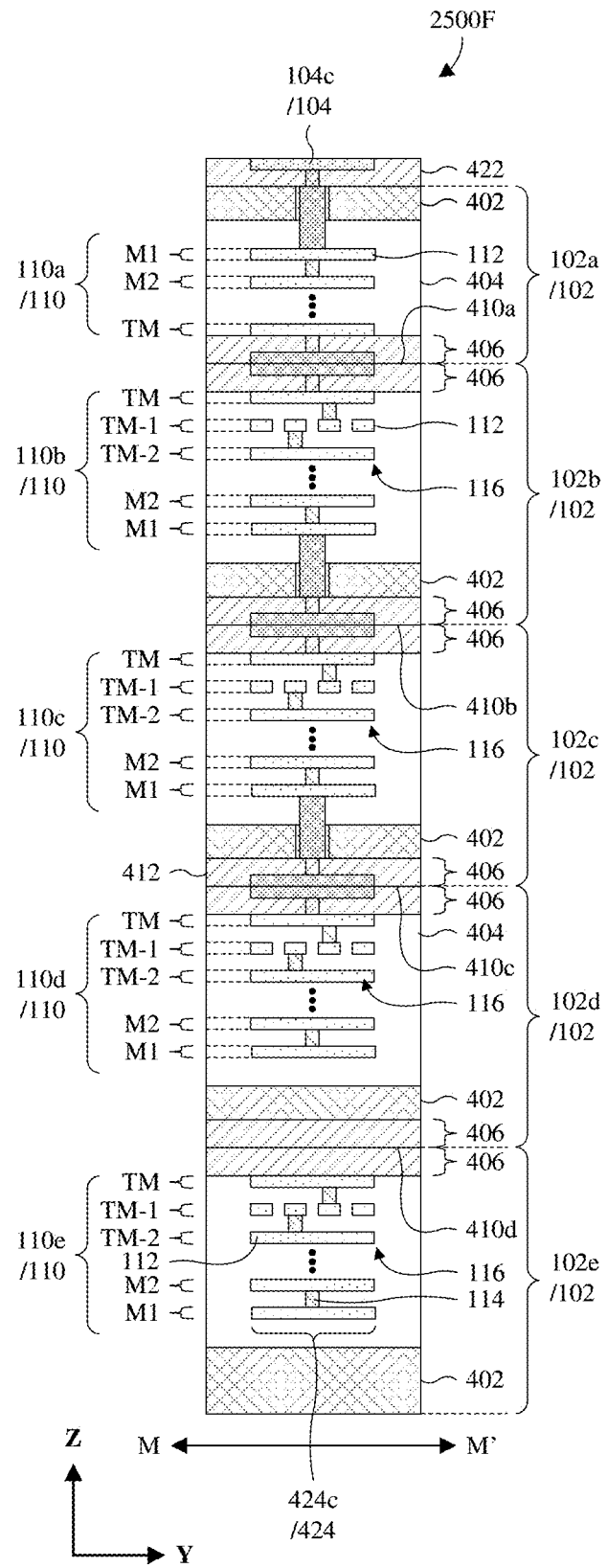
Figure 25G:
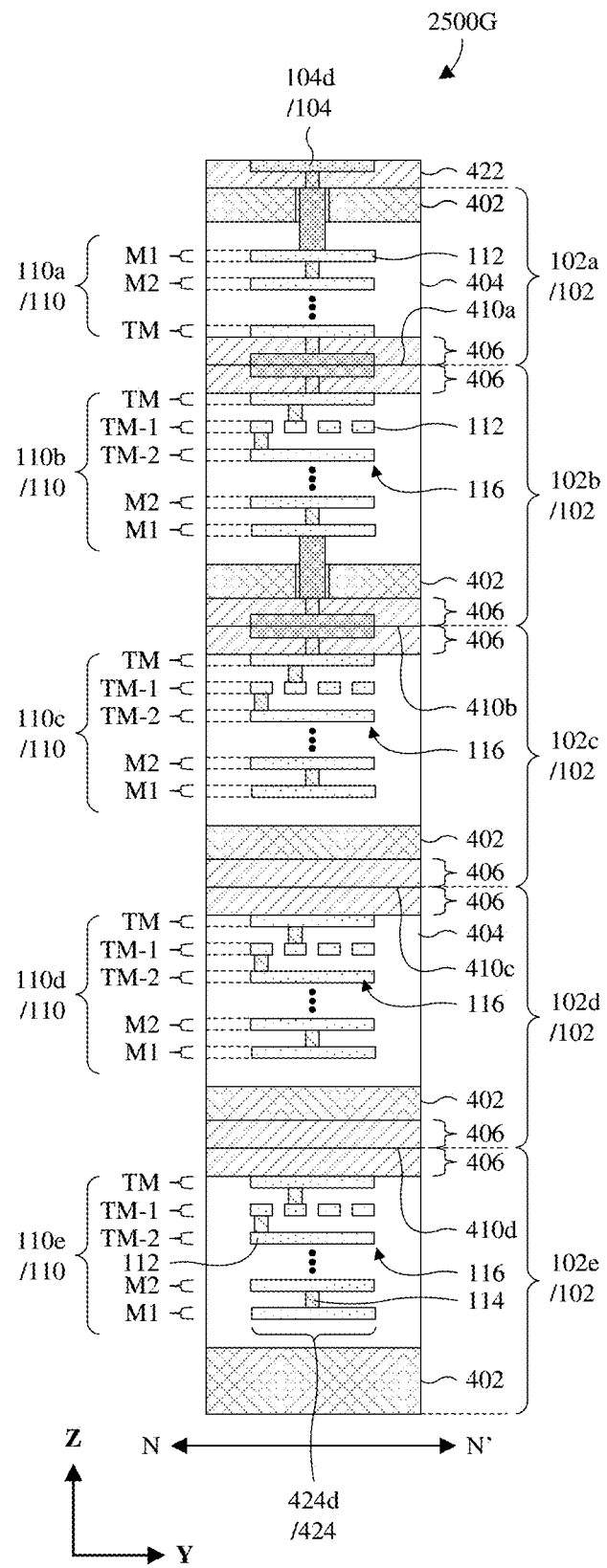
Figure 25H:
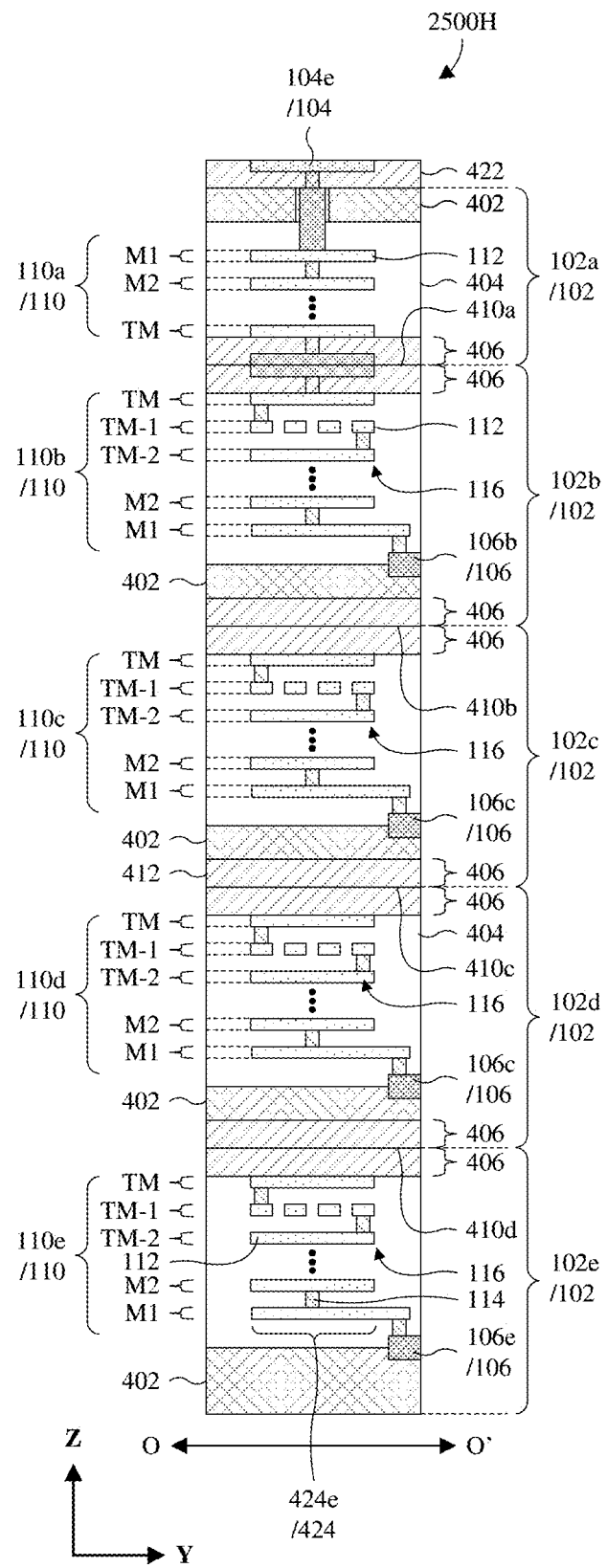

With reference to FIGS. 24 and 25A-25H, various views of some more detailed embodiments of the 3D IC of FIG. 21 are provided. FIG. 24 provides a perspective view 2400 of the 3D IC, whereas FIGS. 25A-25H provide cross-sectional views 2500A-2500H of the 3D IC respectively along lines H-H' to O-O' in FIGS. 23A-23C. Note that the frontside pad/bridge structure of FIGS. 22 and 23A-23C is representative of each frontside pad/bridge structure 116 in FIGS. 24 and 25A-25H. The IC dies 102 comprise individual semiconductor substrates 402 respectively supporting the semiconductor devices 106 and the interconnect structures 110, and respectively and partially defining the semiconductor devices 106.

The interconnect structures 110 and the semiconductor devices 106 are on frontsides of corresponding semiconductor substrates 402, and the interconnect structures 110 are electrically coupled to corresponding semiconductor devices 106. The interconnect structures 110 comprise a plurality of interconnect features 112 and a plurality of interconnect vias 114. The interconnect features 112 and the interconnect vias 114 are surrounded by corresponding interconnect dielectric layers 404. Further, the interconnect features 112 and the interconnect vias 114 are grouped by elevation (e.g., a Z dimension) respectively into a plurality of metal layers and a plurality of via layers that are alternatingly stacked with the metal layers.

The plurality of metal layers comprises a M1 layer, a M2 layer underlying the M1 layer, and a TM layer underlying the M2 layer at a first-die interconnect structure 110a of the first IC die 102a. Further, the plurality of metal layers comprises a M1 layer, a M2 layer overlying the M1 layer, a TM-2 layer overlying the M2 layer, a TM-1 layer overlying the TM-2 layer, and a TM layer overlying the TM-1 layer at each of the second-die, third-die, fourth-die, and fifth-die interconnect structures 110b-110e.

Each level of ellipses represents N number of via layers and N−1 number of metal layers alternatingly stacked with the N number of via layers, where N is an integer greater than zero. For example, N may be 1, 2, 3, or more. In some embodiments, each of the N number of via layers has a layout (e.g., is the same) as shown for the via layer between the M1 and M2 layers of a corresponding interconnect structure. Further, in some embodiments, each of the N−1 number of metal layers has a layout (e.g., is the same) as shown for the M2 layer of a corresponding interconnect structure.

As above, the second-die, third-die, fourth-die, and fifth-die interconnect structures 110b-110e form individual frontside pad/bridge structures 116. The frontside pad/bridge structures 116 are as illustrated and described with regard to FIGS. 21, 22, and 23A-23C, whereby the frontside pad/bridge structures 116 are each spread across the TM, TM-1, and TM-2 layers of a corresponding IC die and partially form the second-die, third-die, fourth-die, and fifth-die conductive paths 108b-108e. Further, the frontside pad/bridge structures 116 share the shared frontside pad/bridge layout and hence have the same layout (e.g., are the same) in the second, third, fourth, and fifth IC dies 102b-102e to reduce costs and/or increase throughput.

The IC dies 102 further comprise individual HB structures 406, and the first, second, third, and fourth IC dies 102a-102d further comprise individual TSVs 408. The HB structures 406 and the TSVs 408 facilitate stacking and electrical coupling of the IC dies 102.

The second, third, and fourth IC dies 102b-102d each comprises two HB structures 406 respectively on a frontside of a corresponding semiconductor substrate 402 and a backside of the corresponding semiconductor substrate 402. Further, the first and fifth IC dies 102a, 102e each has a single HB structure 406 on a frontside of a corresponding semiconductor substrate 402. The HB structure 406 of the first IC die 102a is hybrid bonded to the frontside HB structure of the second IC die 102b at a first HB interface 410a. The backside HB structure of the second IC die 102b is hybrid bonded to the frontside HB structure of the third IC die 102c at a second HB interface 410b. The backside HB structure of the third IC die 102c is hybrid bonded to the frontside HB structure of the fourth IC die 102d at a third HB interface 410c. The backside HB structure of the fourth IC die 102d is hybrid bonded to the HB structure 406 of the fifth IC die 102e at a fourth HB interface 410d.

The HB structures 406 comprise individual HB dielectric layers 412, individual HB layers 414, and individual HB vias 416. The HB layers 414 and the HB vias 416 are conductive and are inset into and surrounded by corresponding HB dielectric layers 412. The HB layers 414 and the HB dielectric layers 412 form the first, second, third, and fourth HB interfaces 410a-410d, and the HB vias 416 extend respectively from the HB layers 414. The HB vias 416 of the second IC die 102b at the second HB interface 410b, the HB vias 416 of the third IC die 102c at the third HB interface 410c, and the HB via 416 of the fourth IC die 102d at the fourth HB interface 410d extend to corresponding TSVs 408. On the other hand, the remaining HB vias extend to corresponding interconnect structures 110.

The TSVs 408 extend through corresponding semiconductor substrates 402 of the first, second, third, and fourth IC dies 102a-102d to provide electrically coupling from frontsides of the corresponding semiconductor substrates 402 to backsides of the corresponding semiconductor substrates 402. Further, the TSVs 408 are separated from the semiconductor substrates 402 by individual TSV dielectric layers 418.

A backside dielectric layer 422 overlies the IC dies 102 on backside of the semiconductor substrate 402 of the first IC die 102a. Further, the backside dielectric layer 422 surrounds the backside pads 104 and backside vias 420, which extend respectively from the backside pads 104 to corresponding TSVs 408.

Along with the interconnect structures 110, the TSVs 408, the backside vias 420, the HB layers 414, and the HB vias 416 form the conductive paths 108. The first-die and second-die conductive paths 108a, 108b each traverse a single TSV, the third-die conductive path 108c traverses two TSVs, the fourth-die conductive path 108d traverses three TSVs, and the fifth-die conductive path 108e traverses four TSVs. Further, the first-die conductive path 108a is spaced from the HB structures 406, and the second-die, third-die, fourth-die, and fifth-die conductive paths 108b-108e extend through the HB structures 406.

The interconnect features 112, the interconnect vias 114, the TSVs 408, the backside vias 420, the HB layers 414, and the HB vias 416 form columnar structures 424. The columnar structures 424 form vertical segments of the conductive paths 108 and are individual to and respectively underlie the backside pads 104. In some embodiments, the columnar structures 424 are localized under corresponding backside pads 104. A first columnar structure 424a underlies the first-die backside pad 104a, a second columnar structure 424b underlies the second-die backside pad 104b, a third columnar structure 424c underlies the third-die backside pad 104c, a fourth columnar structure 424d underlies the fourth-die backside pad 104d, and a fifth columnar structure 424e underlies the fifth-die backside pad 104e. Further, the second, third, fourth, and fifth columnar structures 424b-424e are bridged by the frontside pad/bridge structures 116.

With reference to FIGS. 26A and 26B to FIGS. 30A and 30B, perspective views of some embodiments of the 3DIC of FIGS. 24 and 25A-25C are provided to emphasize the conductive paths 108. Figures with a suffix of "A" correspond to perspective views in which hashing is limited to corresponding conductive paths 108. Figures with a suffix of "B" correspond to perspective views in which structure surrounding corresponding conductive paths is removed. Further, figures with a suffix of "B" do not illustrate IC dies that are independent of and spaced from the corresponding conductive path.

Figure 26A:
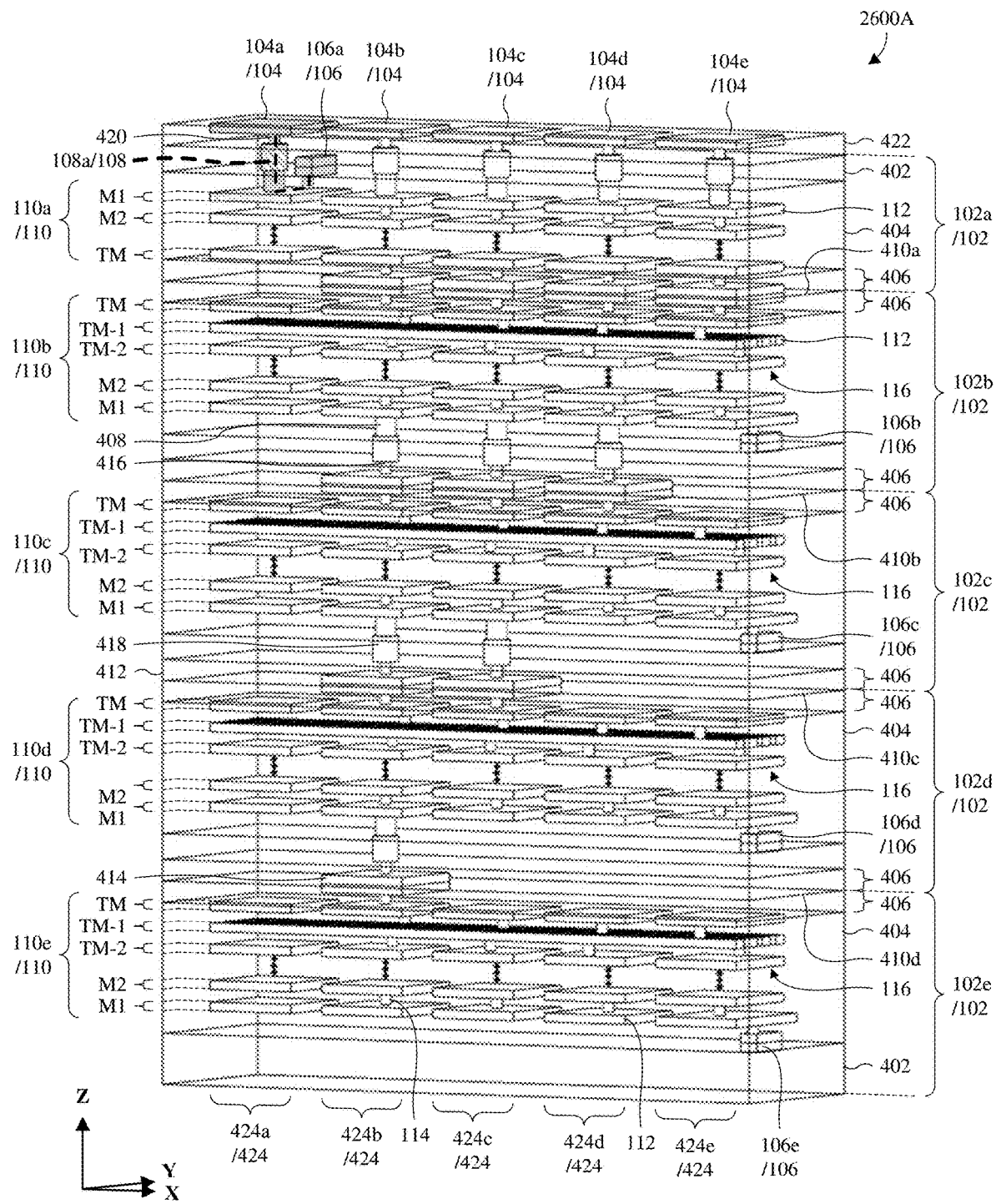
Figure 26B:
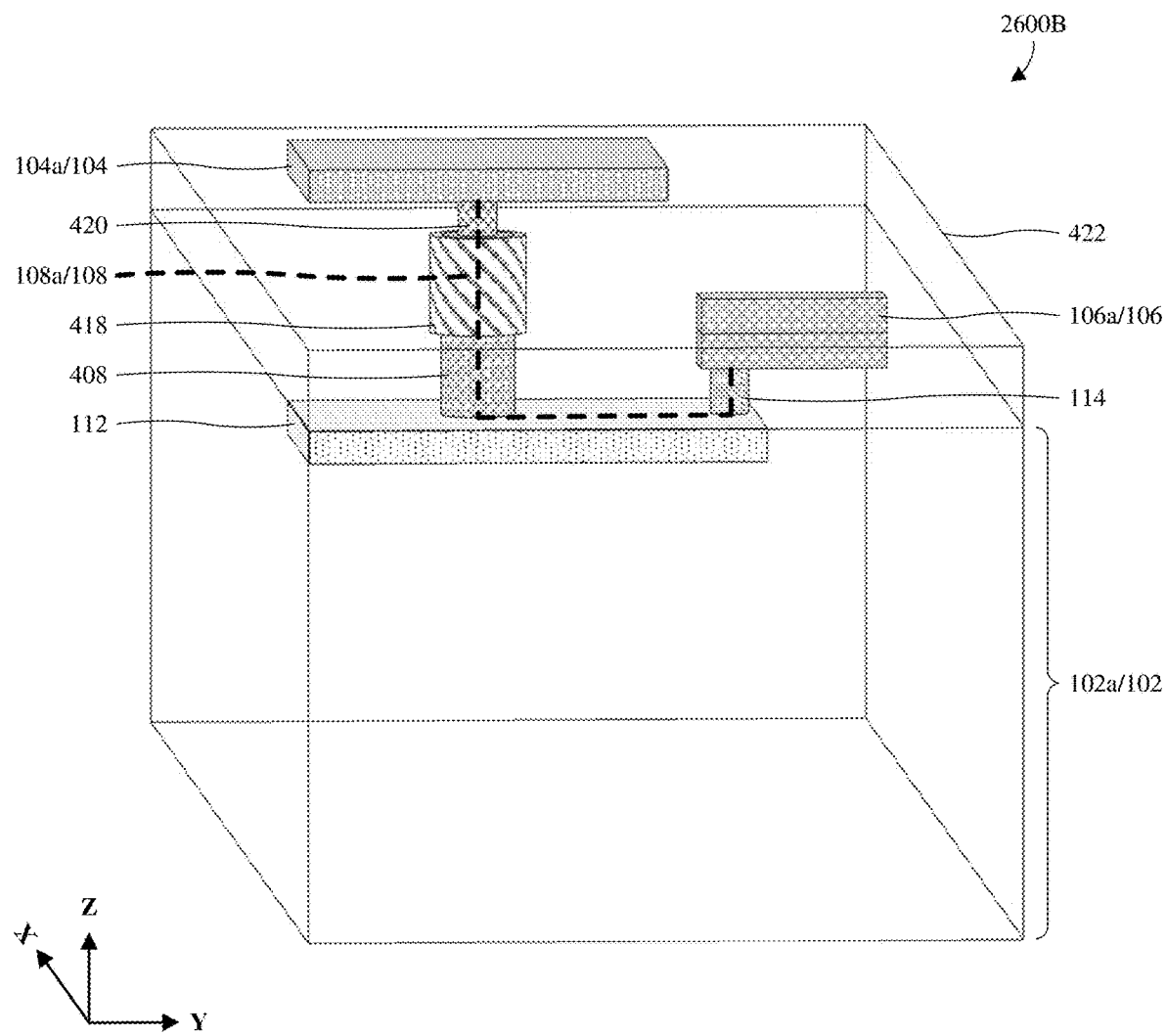

Focusing on the perspective views 2600A, 2600B of FIGS. 26A and 26B, the structure forming the first-die conductive path 108a is emphasized. The first-die conductive path 108a extends through the semiconductor substrate 402 of the first IC die 102a at the first columnar structure 424a and then extends to the first-die semiconductor device 106a.

Figure 27A:
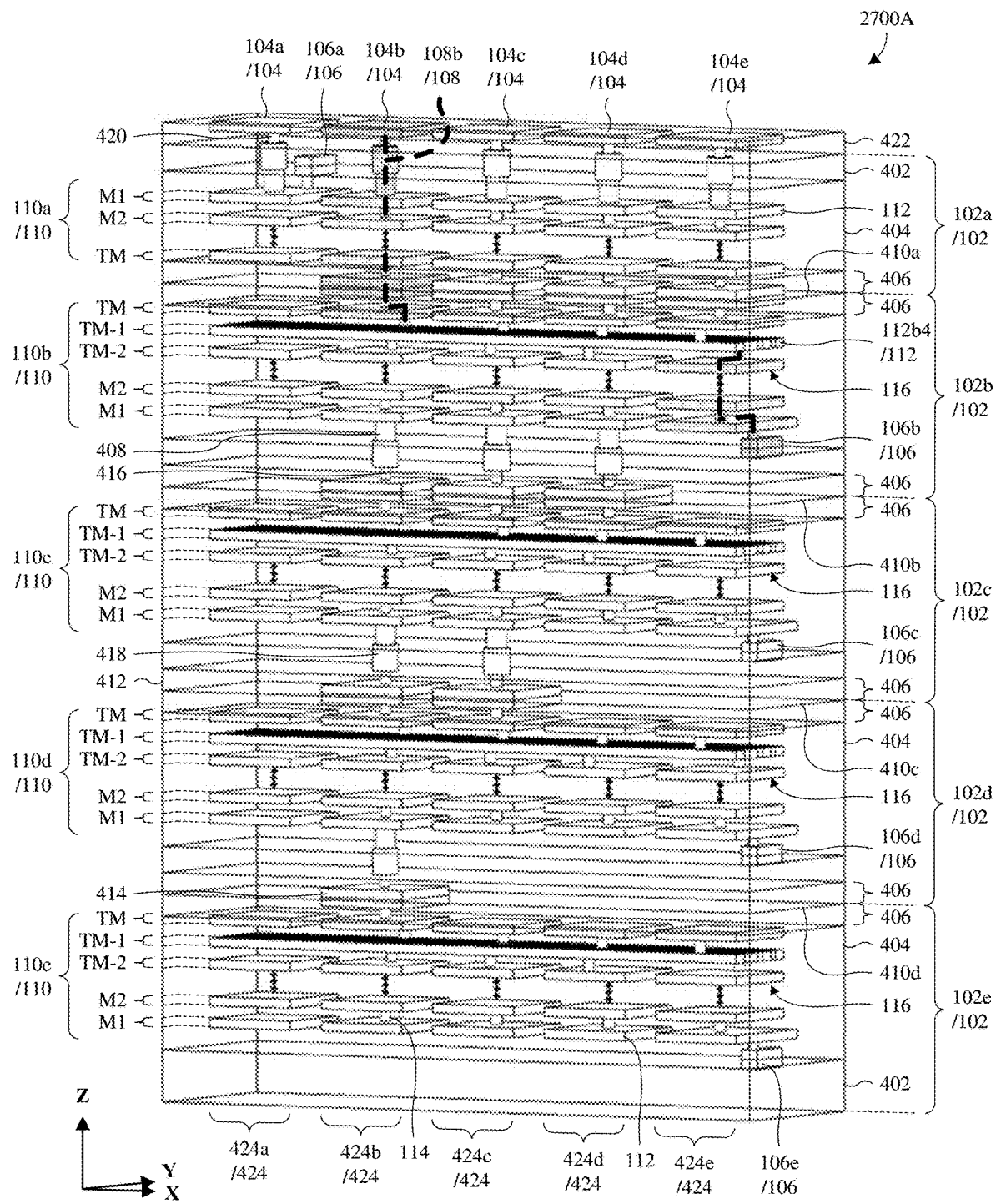
Figure 27B:
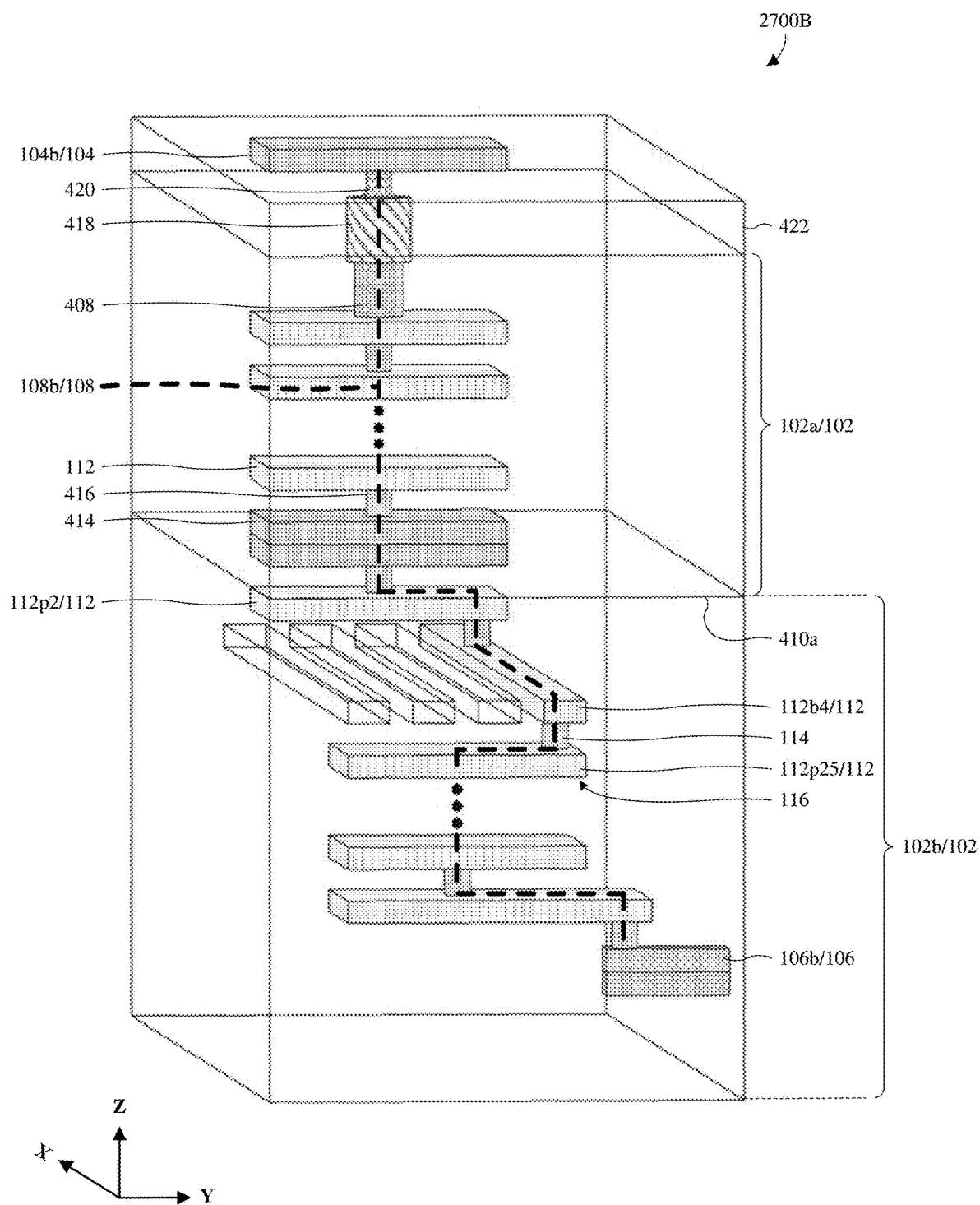

Focusing on the perspective views 2700A, 2700B of FIGS. 27A and 27B, the structure forming the second-die conductive path 108b is emphasized. The second-die conductive path 108b extends vertically (e.g., in a Z dimension) along the second columnar structure 424b from the second-die backside pad 104b to the frontside pad/bridge structure 116 of the second IC die 102b. The frontside pad/bridge structure 116 of the second IC die 102b transitions the second-die conductive path 108b from the second columnar structure 424b to the fifth columnar structure 424e. The second-die conductive path 108b then extends vertically to the second-die semiconductor device 106b along the fifth columnar structure 424e.

Because of the transitioning at the frontside pad/bridge structure 116 of the second IC die 102b, the second-die conductive path 108b has a first step down at that frontside pad/bridge structure. The first step down is in a dimension (e.g., an X dimension) along which the backside pads 104 are spaced from each other and is formed in part by the fourth bridge wire 112b4 of the second IC die 102b. Further, the first step down is from a location directly under the second-die backside pad 104b to a location directly under the fifth-die backside pad 104e.

Figure 28A:
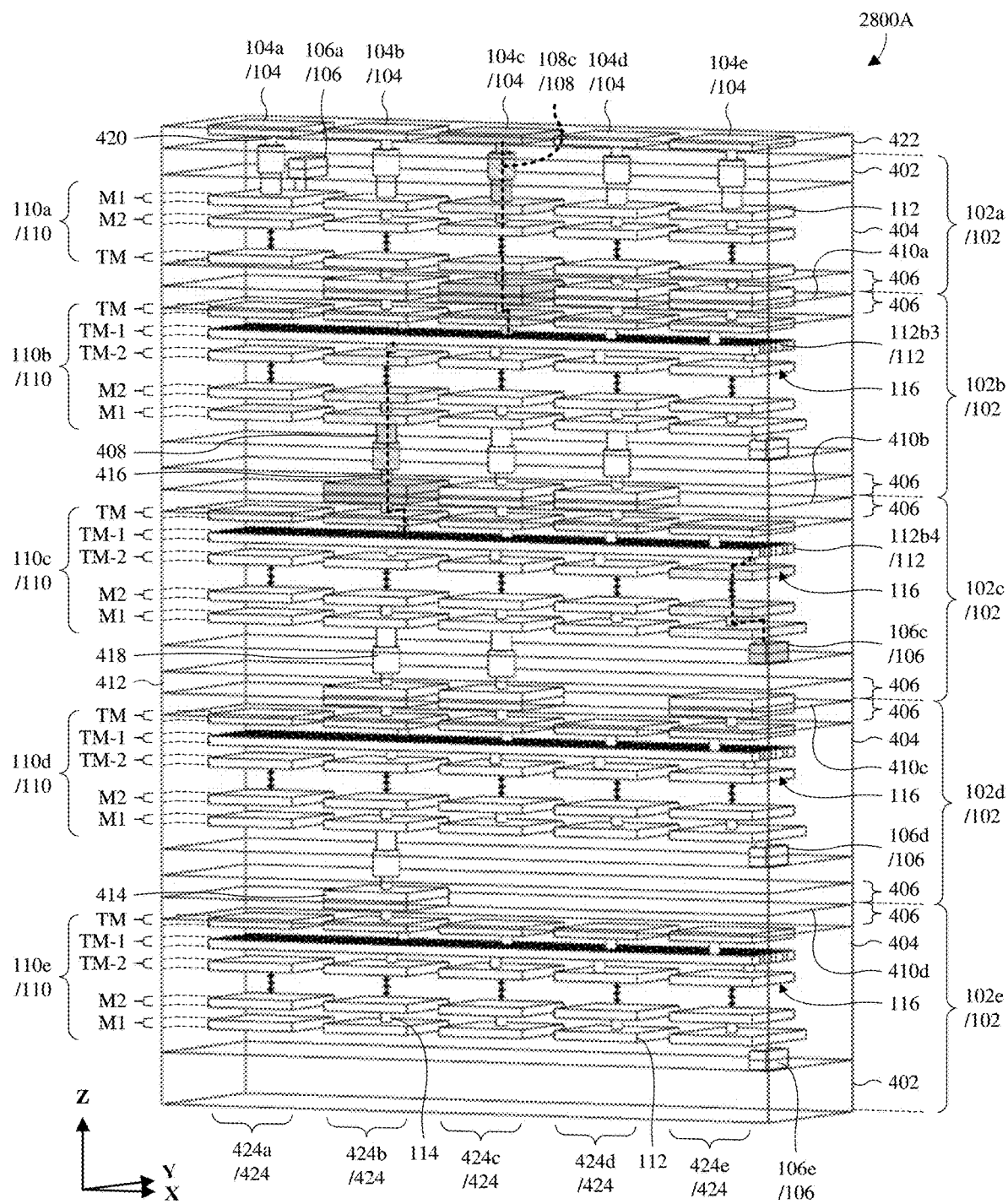
Figure 28B:
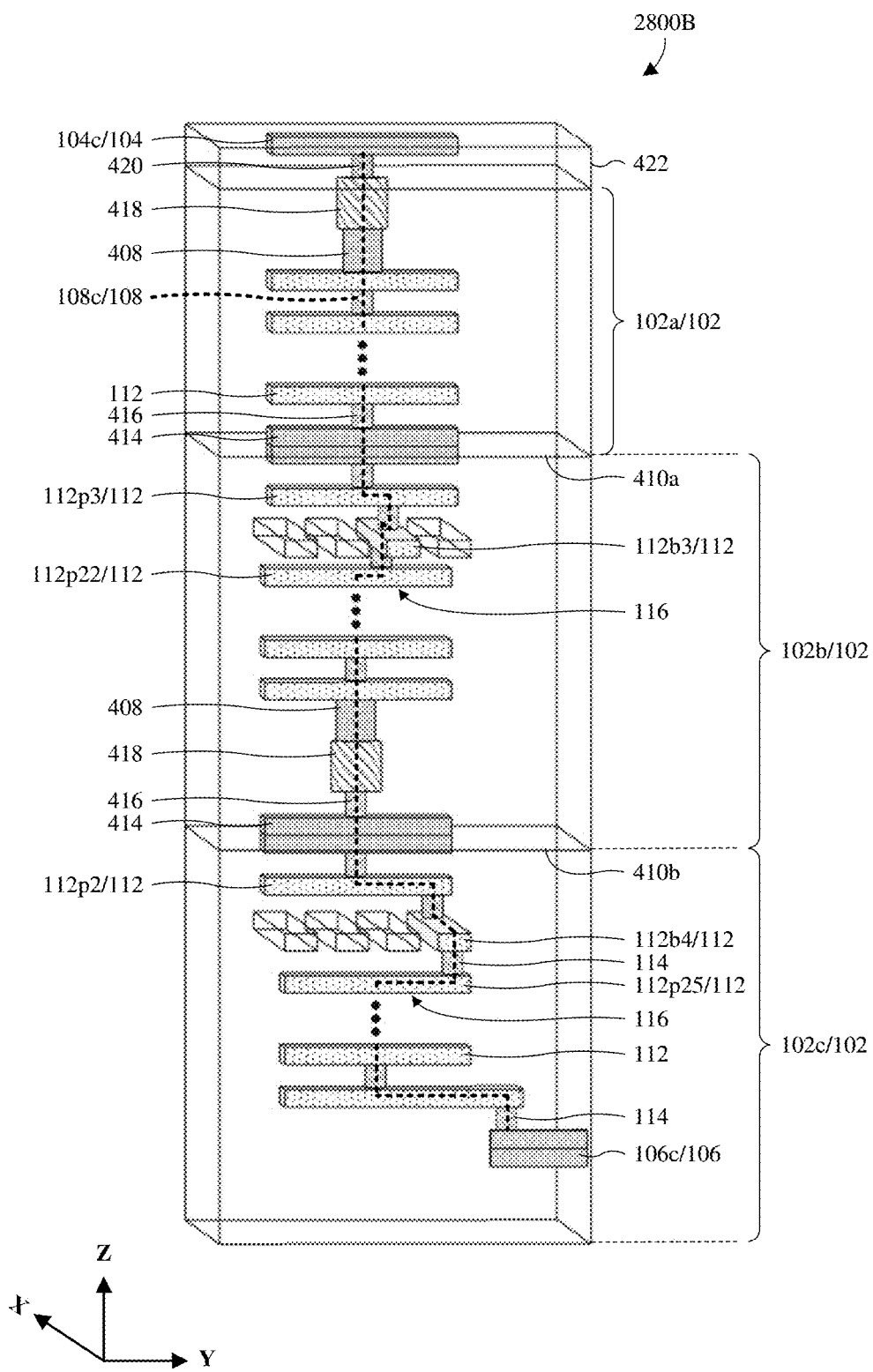

Focusing on the perspective views 2800A, 2800B of FIGS. 28A and 28B, the third-die conductive path 108c extends vertically (e.g., in the Z dimension) along the third columnar structure 424c from the third-die backside pad 104c to the frontside pad/bridge structure 116 of the second IC die 102b. The frontside pad/bridge structure 116 of the second IC die 102b transitions the third-die conductive path 108c from the third columnar structure 424c to the second columnar structure 424b. The third-die conductive path 108c then extends vertically to the frontside pad/bridge structure 116 of the third IC die 102c along the second columnar structure 424b. The frontside pad/bridge structure 116 of the third IC die 102c transitions the third-die conductive path 108c from the second columnar structure 424b to the fifth columnar structure 424e. The third-die conductive path 108c then extends vertically to the third-die semiconductor device 106c along the fifth columnar structure 424e.

Because of the transitioning at the frontside pad/bridge structures 116 of the second and third IC dies 102b, 102c, the third-die conductive path 108c has a first step down and a second step down respectively at those frontside pad/bridge structures. The first and second steps down are in a dimension (e.g., an X dimension) along which the backside pads 104 are spaced from each other. The first step down is formed in part by the third bridge wire 112b3 of the second IC die 102b and is from a location directly under the third-die backside pad 104c to a location directly under the second-die backside pad 104b. The second step down is formed in part by the fourth bridge wire 112b4 of the third IC die 102c and is from a location directly under the second-die backside pad 104b to a location directly under the fifth-die backside pad 104e.

Figure 29A:
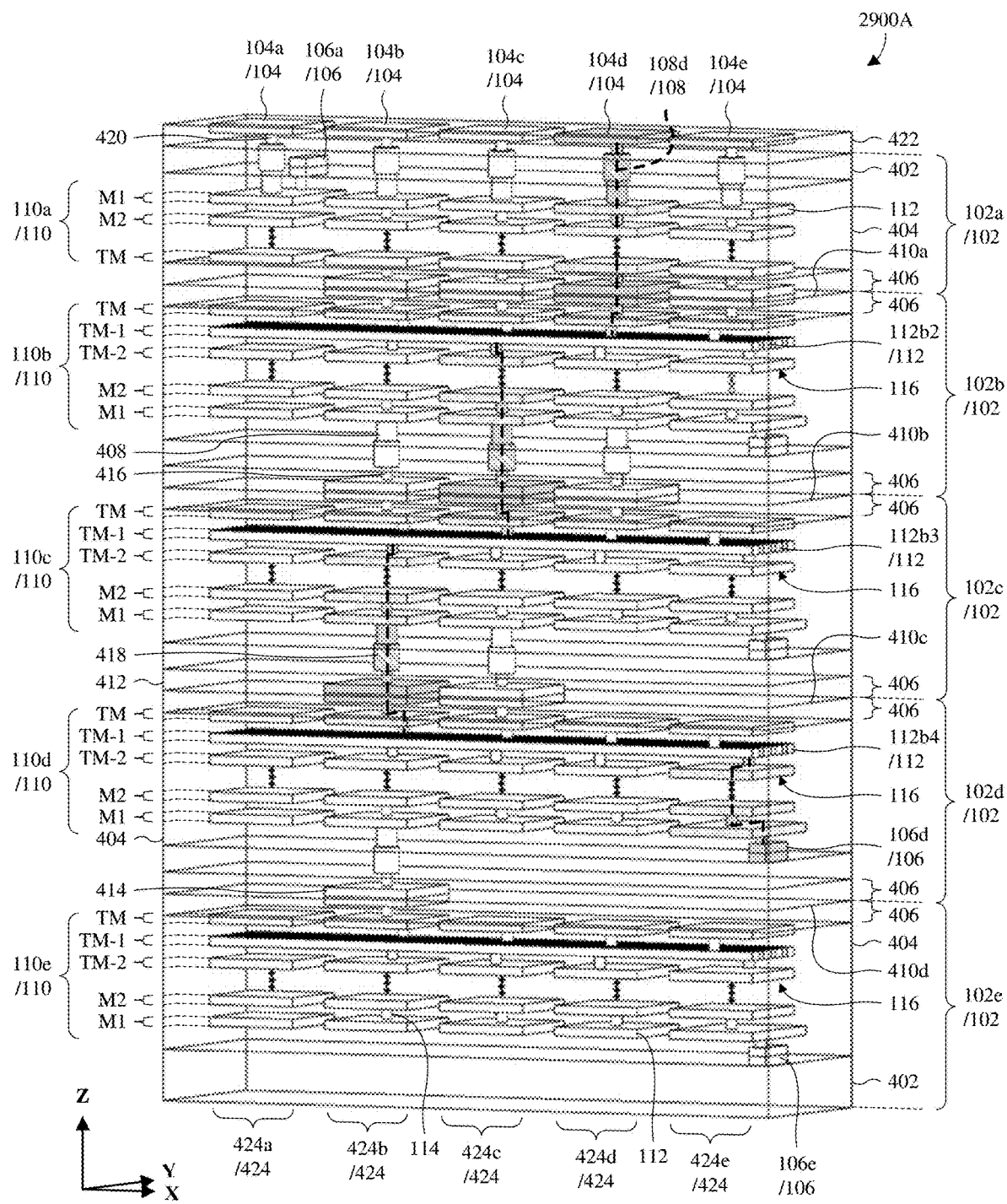
Figure 29B:
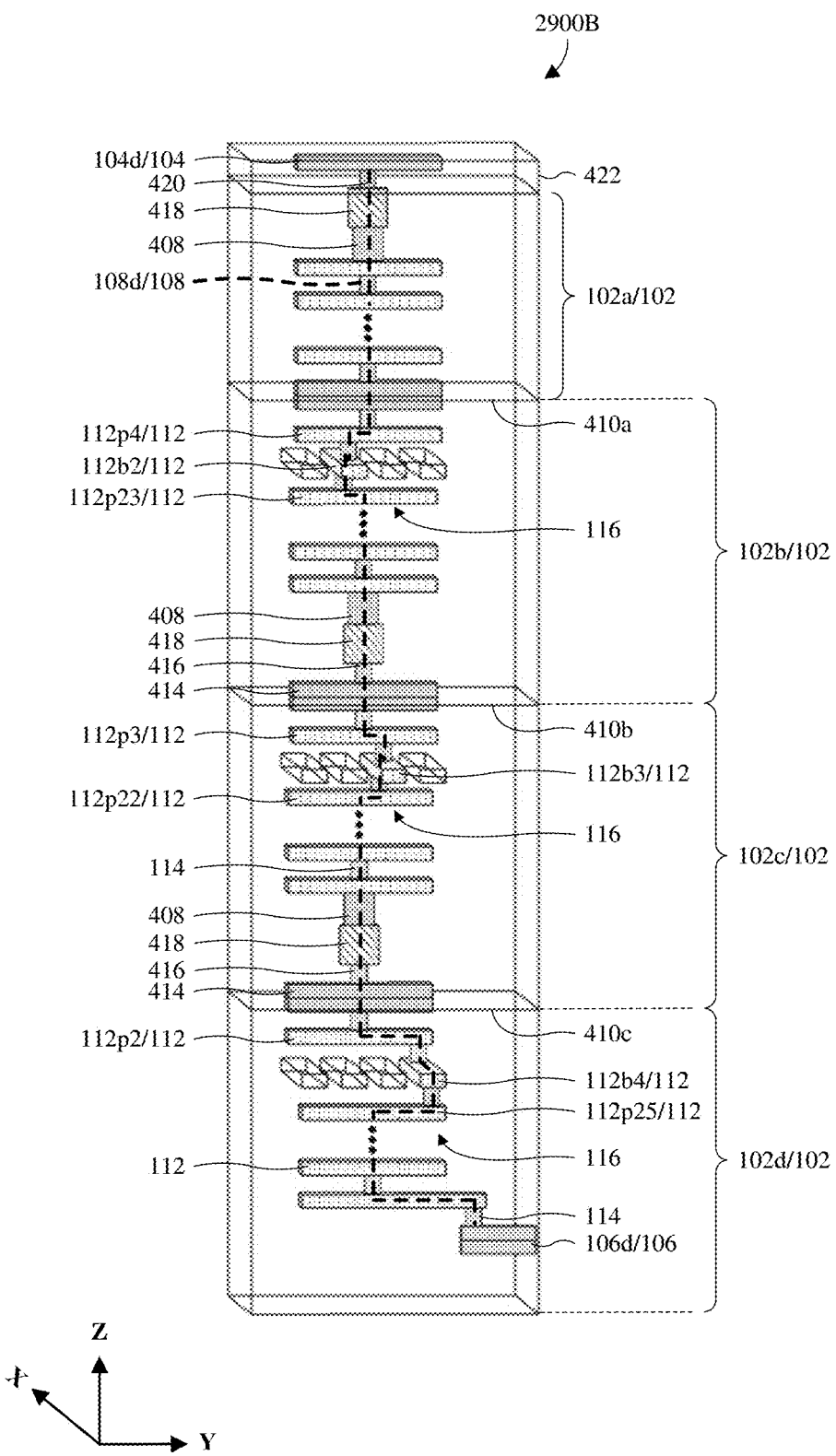

Focusing on the perspective views 2900A, 2900B of FIGS. 29A and 29B, the fourth-die conductive path 108d extends vertically (e.g., in the Z dimension) along the fourth columnar structure 424d from the fourth-die backside pad 104d to the frontside pad/bridge structure 116 of the second IC die 102b. The frontside pad/bridge structure 116 of the second IC die 102b transitions the fourth-die conductive path 108d from the fourth columnar structure 424d to the third columnar structure 424c. The fourth-die conductive path 108d then extends vertically to the frontside pad/bridge structure 116 of the third IC die 102c along the third columnar structure 424c. The frontside pad/bridge structure 116 of the third IC die 102c transitions the fourth-die conductive path 108d from the third columnar structure 424c to the second columnar structure 424b. The fourth-die conductive path 108d then extends vertically to the frontside pad/bridge structure 116 of the fourth IC die 102d along the second columnar structure 424b. The frontside pad/bridge structure 116 of the fourth IC die 102d transitions the fourth-die conductive path 108d from the second columnar structure 424b to the fifth columnar structure 424e. The fourth-die conductive path 108d then extends vertically to the fourth-die semiconductor device 106d along the fifth columnar structure 424e.

Because of the transitioning at the frontside pad/bridge structures 116 of the second, third, and fourth IC dies 102b-102d, the fourth-die conductive path 108d has a first step down, a second step down, and a third step down respectively at those frontside pad/bridge structures. The first, second, and third steps down are in a dimension (e.g., an X dimension) along which the backside pads 104 are spaced from each other. The first step down is formed in part by the second bridge wire 112b2 of the second IC die 102b and is from a location directly under the fourth-die backside pad 104d to a location directly under the third-die backside pad 104c. The second step down is formed in part by the third bridge wire 112b3 of the third IC die 102c and is from a location directly under the third-die backside pad 104c to a location directly under the second-die backside pad 104b. The third step down is formed in part by the fourth bridge wire 112b4 of the fourth IC die 102d and is from a location directly under the second-die backside pad 104b to a location directly under the fifth-die backside pad 104e.

Figure 30A:
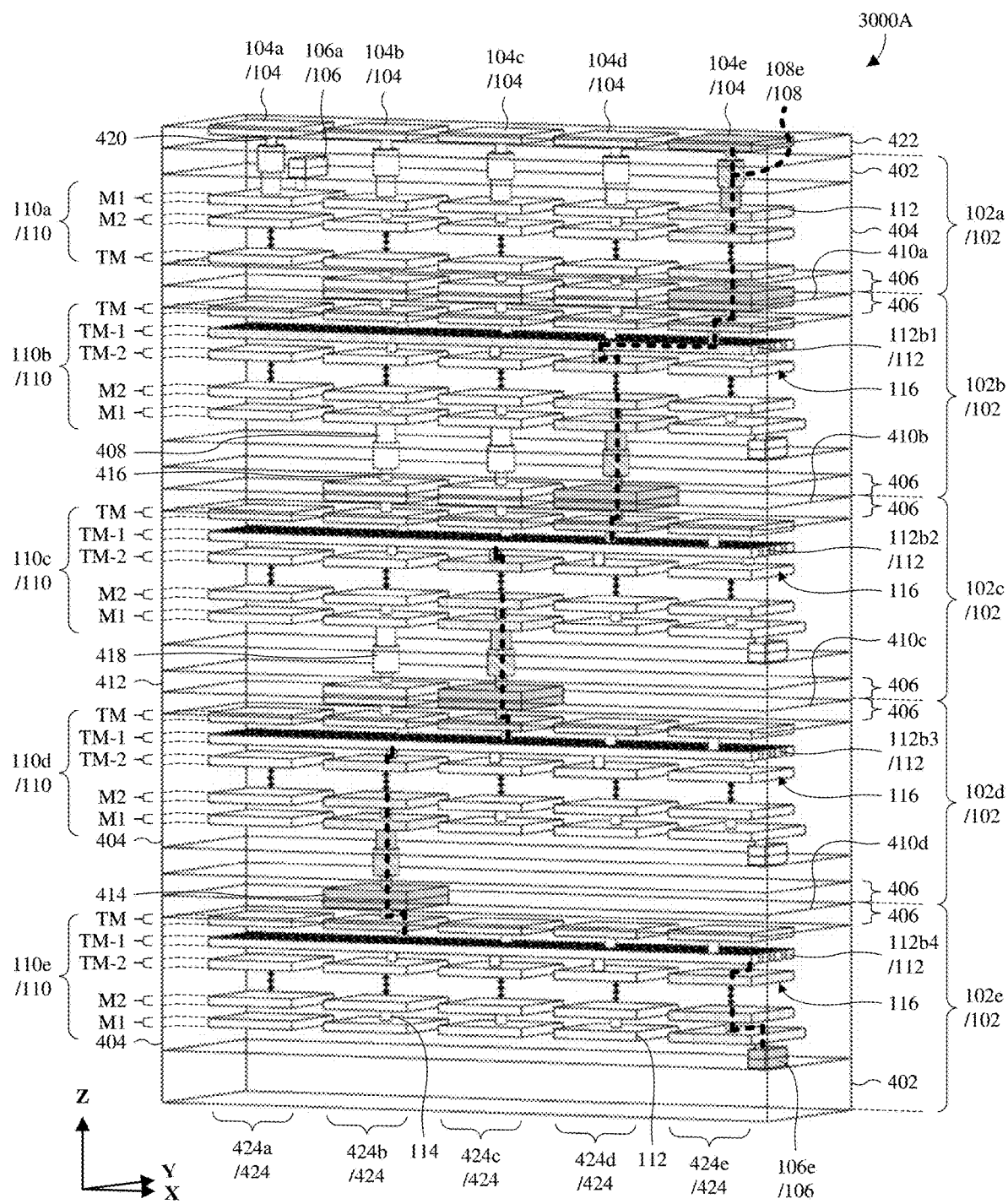
Figure 30B:
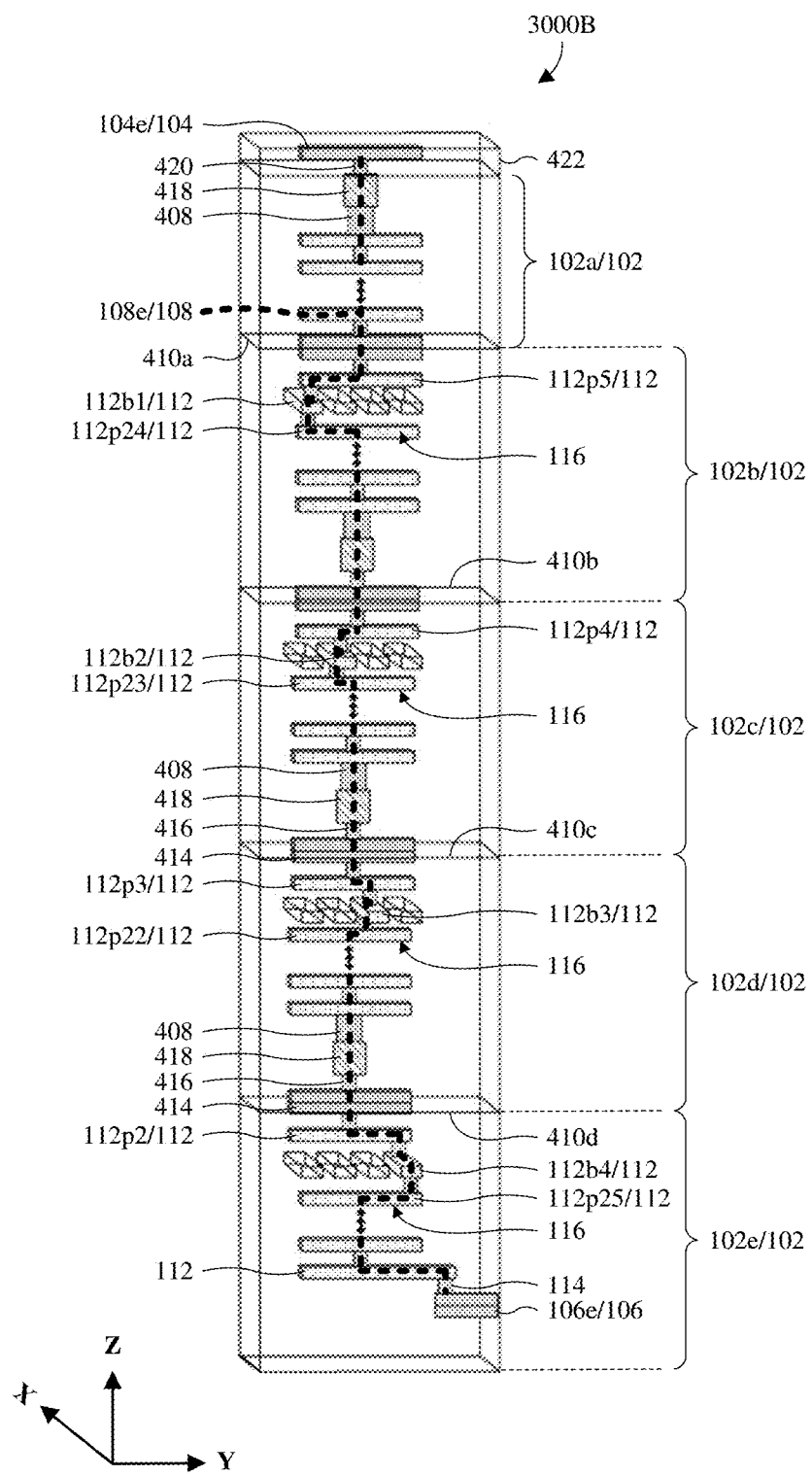

Focusing on the perspective views 3000A, 3000B of FIGS. 30A and 30B, the fifth-die conductive path 108e extends vertically (e.g., in the Z dimension) along the fifth columnar structure 424e from the fifth-die backside pad 104e to the frontside pad/bridge structure 116 of the second IC die 102b. The frontside pad/bridge structure 116 of the second IC die 102b transitions the fifth-die conductive path 108e from the fifth columnar structure 424e to the fourth columnar structure 424d. The fifth-die conductive path 108e then extends vertically to the frontside pad/bridge structure 116 of the third IC die 102c along the fourth columnar structure 424d. The frontside pad/bridge structure 116 of the third IC die 102c transitions the fifth-die conductive path 108e from the fourth columnar structure 424d to the third columnar structure 424c. The fifth-die conductive path 108e then extends vertically to the frontside pad/bridge structure 116 of the fourth IC die 102d along the third columnar structure 424c. The frontside pad/bridge structure 116 of the fourth IC die 102d transitions the fifth-die conductive path 108e from the third columnar structure 424c to the second columnar structure 424b. The fifth-die conductive path 108e then extends vertically to the frontside pad/bridge structure 116 of the fifth IC die 102e along the second columnar structure 424b. The frontside pad/bridge structure 116 of the fifth IC die 102e transitions the fifth-die conductive path 108e from the second columnar structure 424b to the fifth columnar structure 424e. The fifth-die conductive path 108e then extends vertically to the fifth-die semiconductor device 106e along the fifth columnar structure 424e.

Because of the transitioning at the frontside pad/bridge structures 116 of the second, third, fourth, and fifth IC dies 102b-102e, the fifth-die conductive path 108e has a first step down, a second step down, a third step down, and a fourth step down respectively at those frontside pad/bridge structures. The first, second, third, and fourth steps down are in a dimension (e.g., an X dimension) along which the backside pads 104 are spaced from each other. The first step down is formed in part by the first bridge wire 112b1 of the second IC die 102b and is from a location directly under the fifth-die backside pad 104e to a location directly under the fourth-die backside pad 104d. The second step down is formed in part by the second bridge wire 112b2 of the third IC die 102c and is from a location directly under the fourth-die backside pad 104d to a location directly under the third-die backside pad 104c. The third step down is formed in part by the third bridge wire 112b3 of the fourth IC die 102d and is from a location directly under the third-die backside pad 104c to a location directly under the second-die backside pad 104b. The fourth step down is formed in part by the fourth bridge wire 112b4 of the fifth IC die 102e and is from a location directly under the second-die backside pad 104b to a location directly under the fifth-die backside pad 104e.

In view of the foregoing, it should be appreciated that the conductive paths 108 traverse the IC dies 102 in generally the same way. Therefore, while the 3D IC is illustrated and described as having five IC dies, the 3D IC may be generalized to X IC dies, where X is an integer greater than two.

Further, FIGS. 24, 25A-25H, and 26A and 26B to 30A and 30B provide an example of the generalized 3D IC in which X is five.

The generalized 3D IC comprises: 1) X IC dies; and 2) X backside pads overlying the X IC dies. The X backside pads respectively have index values from 1 to X and are sequentially ordered from 1 to X according to the index values in a first row extending in a dimension (e.g., an X dimension). The X IC dies respectively have index values from 1 to X and are sequentially ordered vertically (e.g., a Z dimension) from 1 to X according to the index values, where IC die 1 is at a top of the 3D IC and IC die X is at a bottom of the 3D IC. Further, the X IC dies form X columnar structures, X semiconductor devices, X conductive paths, and X−1 frontside pad/bridge structures. Note that the index values of the X IC dies and the X backside pads are integers.

The X columnar structures respectively have index values from 1 to X and are sequentially ordered from 1 to X according to the index values in a second row extending in the dimension. Further, the X columnar structures each underlie the backside pad with a like index value. The X semiconductor devices respectively have index values from 1 to X and are each at the IC die with a like index value. Further, semiconductor device 1 is at columnar structure 1, whereas remaining semiconductor devices (e.g., semiconductor devices 2 to 5) are each at columnar structure X. The X conductive paths respectively have index values from 1 to X and each of the X conductive paths extends from the backside pad with a like index value to the semiconductor device with a like index value. Note that the index values of the X columnar structures, the X semiconductor devices, and the X conductive paths are integers.

The X−1 frontside pad/bridge structures respectively have index values from 1 to X−1. Further, each x of the X−1 frontside pad/bridge structures is at IC die y=x+1, where x and y are indexes respectively of the X−1 frontside pad/bridge structures and the X IC dies. The X−1 frontside pad/bridge structures are the same as each other and are as the generalized frontside pad/bridge structure is described with regard to FIGS. 22 and 23A-23C. Note that the index values of the X−1 frontside pad/bridge structures are integers.

Conductive path 1 of the X conductive paths is as the first-die conductive path 108a is illustrated at FIGS. 24, 25A-25H, and 26A and 26B. For each conductive path m={2 to X} of the X conductive paths, that conductive path m transitions from columnar structure n=m−o+2 to columnar structure n'=m−o+1 at each IC die o={2 to m−1}, where m, n, n', and o are indexes respectively of the X conductive paths, the X columnar structures, and the X IC dies. For each conductive path m={2 to X} of the X conductive paths, that conductive path m transitions from columnar structure 2 to columnar structure 5 at IC die o=m, where m and o are indexes as above. Further, the transitioning at each IC die o={2 to X} of the X IC dies is performed by frontside pad/bridge structure p=o−1, where p is an index of the X−1 frontside pad/bridge structures and o is an index as above. More specifically, the transitioning for each conductive path m={2 to X} is performed by bridge wire i=X−m−1+o at each IC die o={2 to m}, where m and o are indexes as above and i is a bridge wire index of the generalized frontside pad/bridge structure described with regard to FIGS. 22 and 23A-23C.

In addition to the foregoing, the generalized 3D IC comprises TSVs, HB layers, and HB vias providing electrical and structural coupling between the X IC dies. In particular, such structures form vertical segments of the X conductive paths that interconnect the X−1 frontside pad/bridge structures and the X backside pads. In some embodiments, IC die 1 of the X IC dies comprises X TSVs respectively underlying the X backside pads. Further, in some embodiments, each o={2 to X−1} of the X IC dies has X−o number of TSVs respectively underlying backside pad 2 to backside pad X−o+1, where o is an index as described above.

In some embodiments, IC die 1 and IC die X are respectively as the first IC die 102a and the fifth IC die 102e are described and illustrated with regard to FIGS. 24, 25A-25H, and 26A and 26B to 30A and 30B, except for variations (described above) in the interconnect structures 110, the HB structures 406, and the TSVs 408 to accommodate a different number of ICs. Further, in some embodiments, IC dies 2 to X−1 are each as the second IC die 102b is described and illustrated with regard to FIGS. 24, 25A-25H, and 26A and 26B to 30A and 30B, except for variations (described above) in the interconnect structures 110, the HB structures 406, and the TSVs 408 to accommodate a different number of ICs With reference to FIG. 31, a perspective view 3100 of some alternative embodiments of the 3D IC of FIG. 24 is provided in which the frontside pad/bridge structures 116 include additional interconnect features 112 underlying the first-die backside pad 104a at corresponding TM-1 layers. As a result, neighboring interconnect features 112 (e.g., the bridge wires discussed above) at the corresponding TM-1 layers have reduced lengths.

Figure 31:
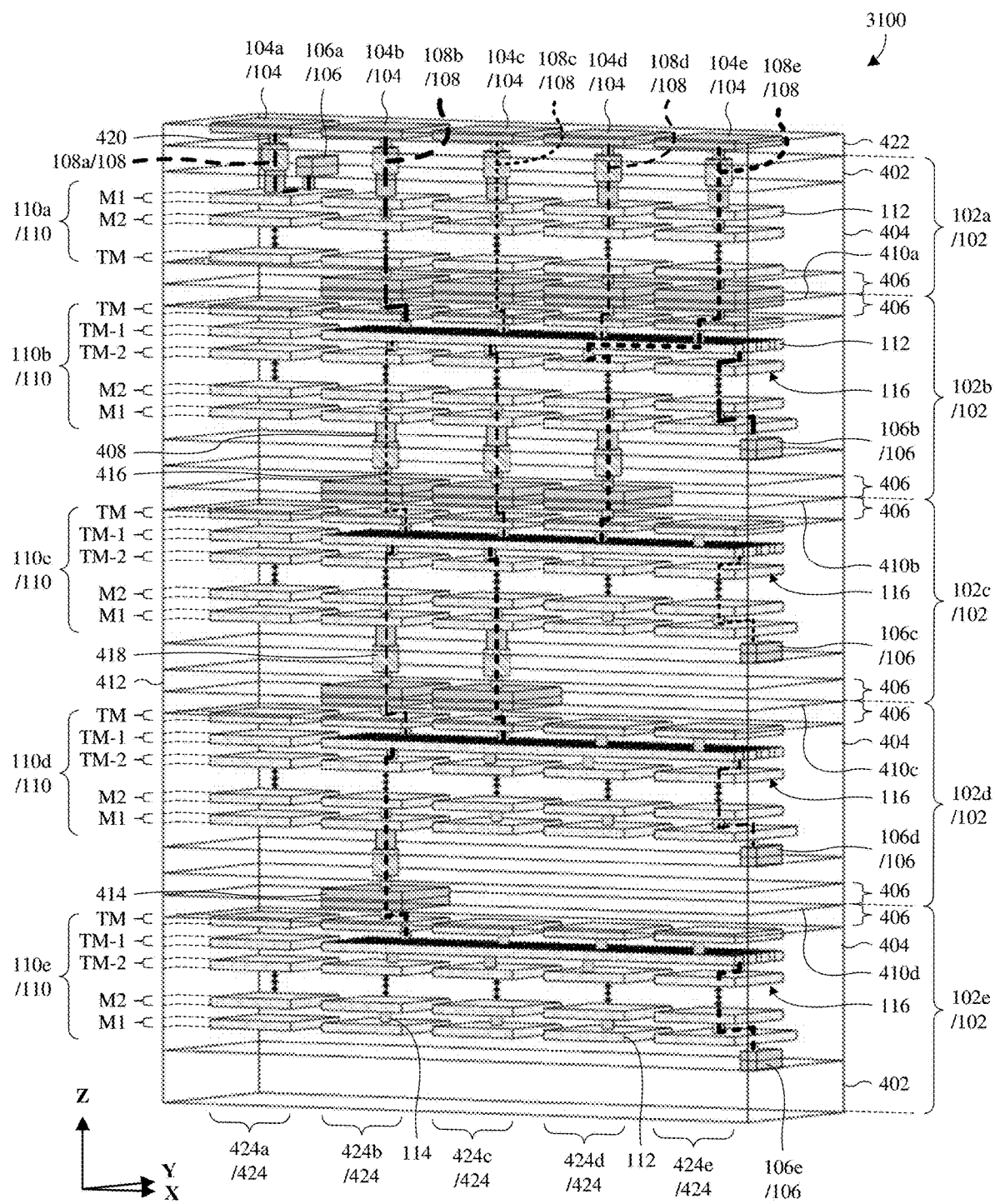
FIG. 31 illustrates a perspective view of some alternative embodiments of the 3D IC of FIG. 24 in which frontside pad/bridge structures include additional interconnect features underlying a first backside pad.
Figure 32:
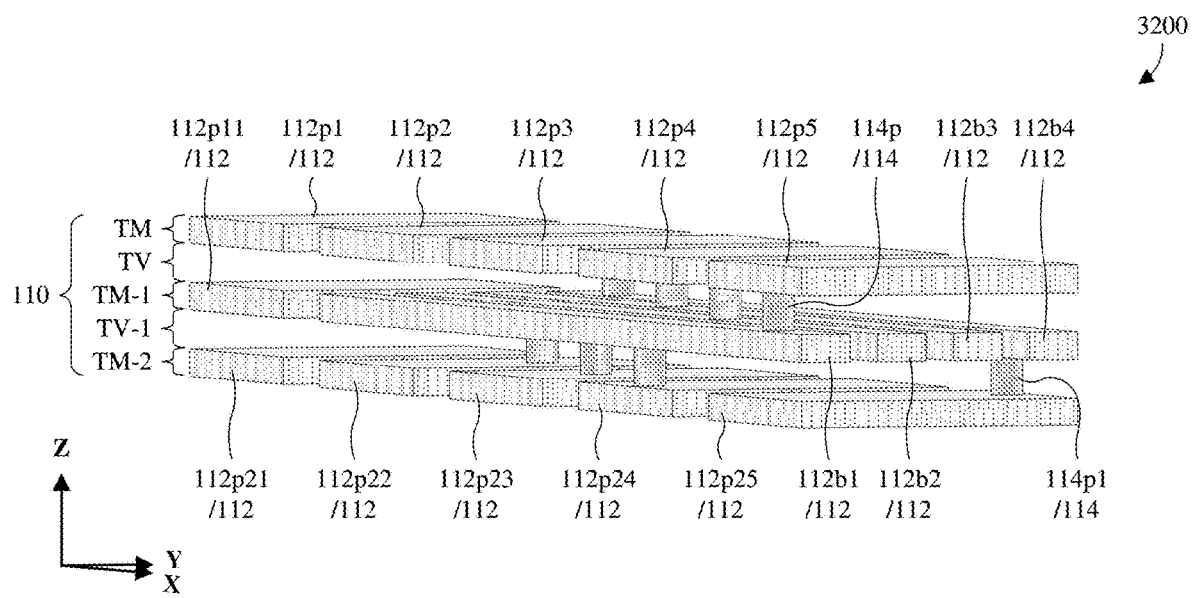
FIGS. 32 and 33A-33C illustrate various views of some embodiments of a frontside pad/bridge structure of FIG. 31.
Figure 33A:
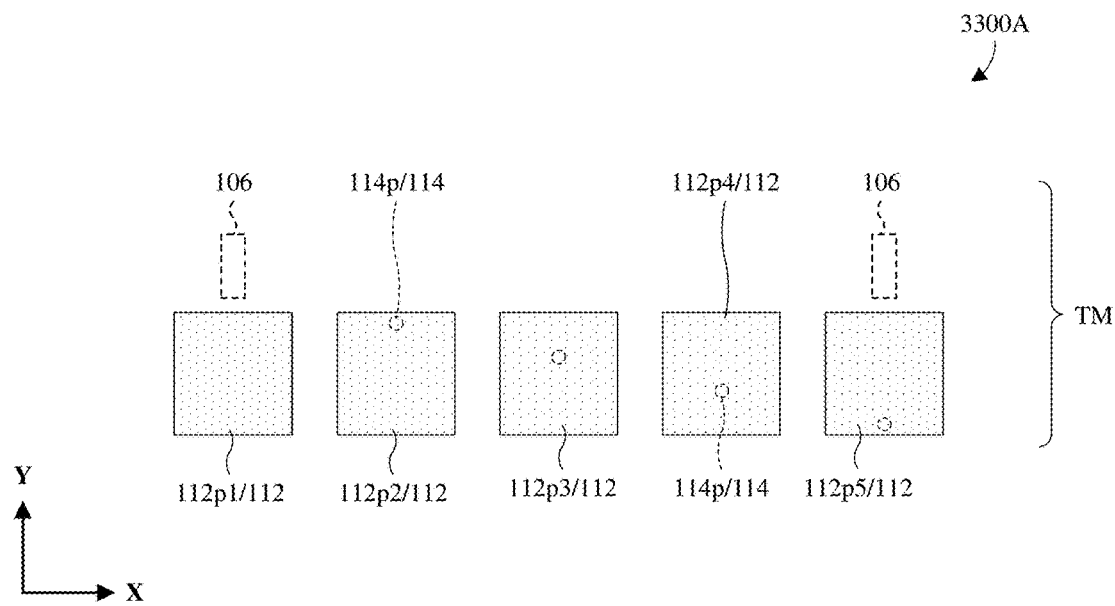
Figure 33B:
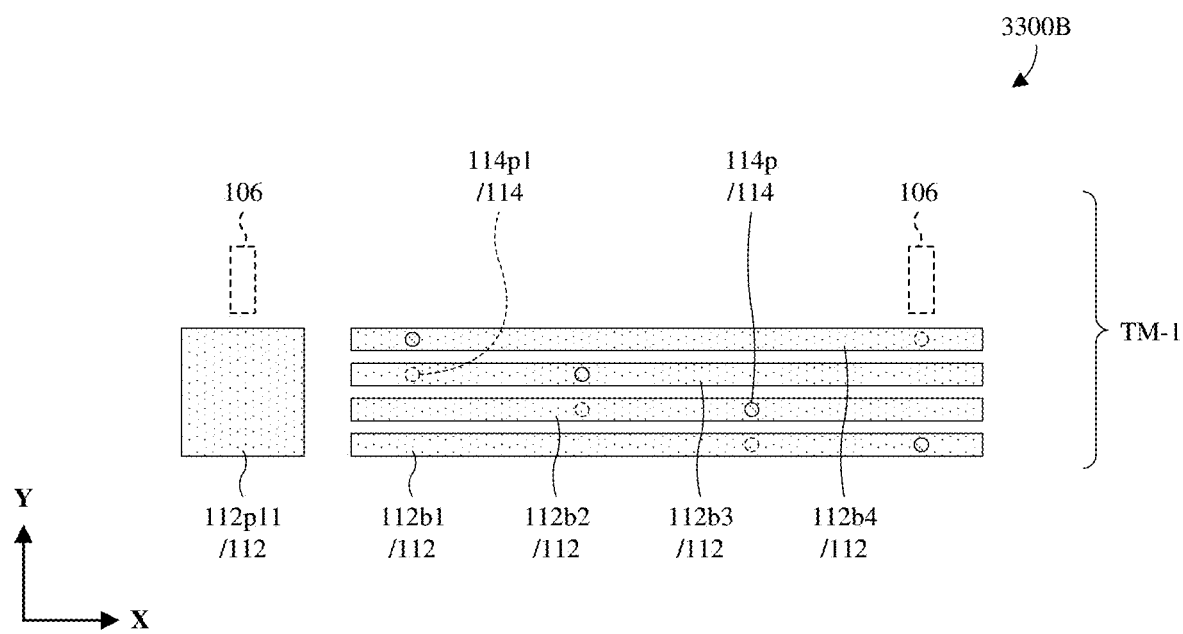
Figure 33C:
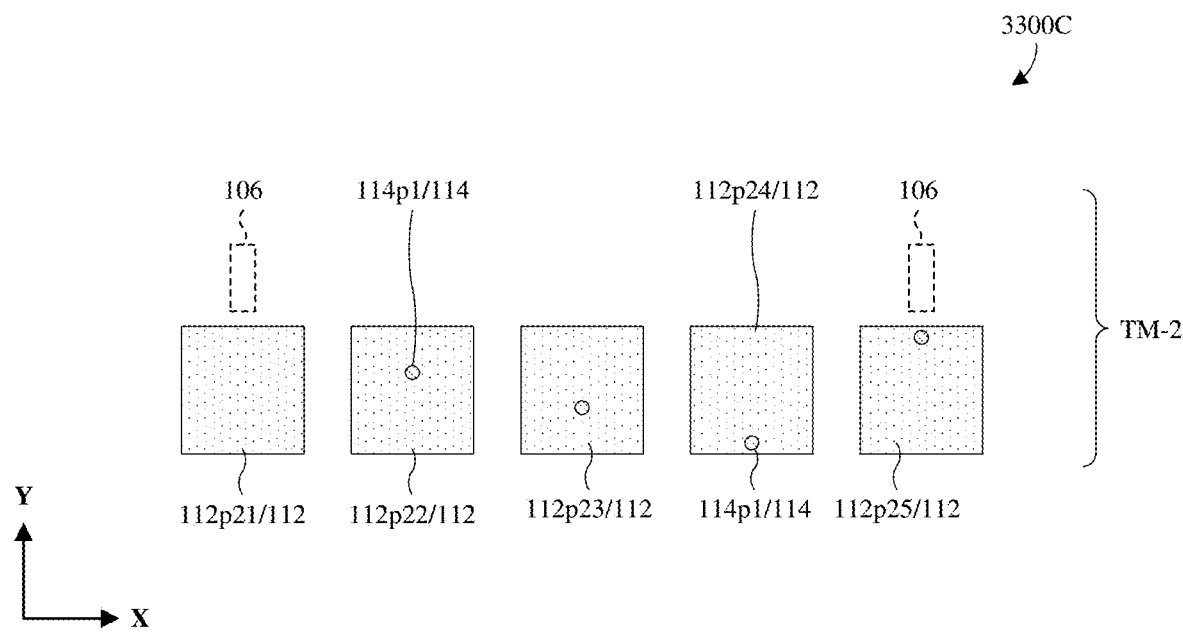

With reference to FIGS. 32 and 33A-33C, various views of some embodiments of a frontside pad/bridge structure of FIG. 31 are provided. FIG. 32 provides a perspective view 3200 of the frontside pad/bridge structure, whereas FIGS. 33A-33C provide top layouts 3300A-3300C of the frontside pad/bridge structure. FIG. 33A corresponds to a top layout 3300A at a TM layer, FIG. 33B corresponds to a top layout 3300B at a TM-1 layer, and FIG. 33C corresponds to a top layout 3300C at a TM-2 layer. Note that the semiconductor devices 106 of FIG. 31 are shown in phantom in FIGS. 33A-33C to provide reference point. The frontside pad/bridge structure corresponds to the frontside pad/bridge structure 116 of the second, third, fourth, or fifth IC die 102b-102e and is representative of each frontside pad/bridge structure 116 of FIG. 31.

Figure 34:
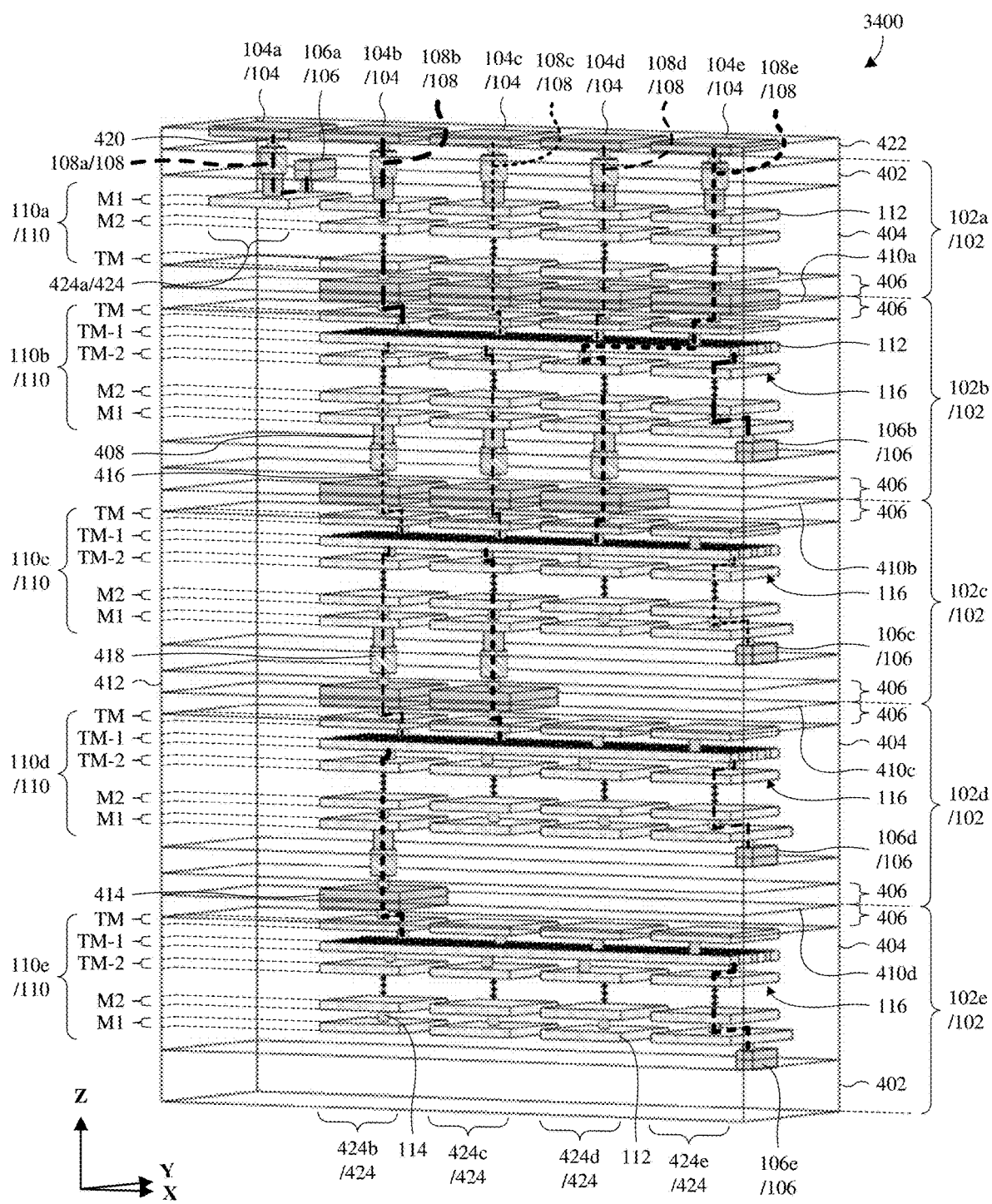
FIG. 34 illustrates a perspective view of some alternative embodiments of the 3D IC of FIG. 31 in which interconnect features are cleared from under a first-die backside pad.

With reference to FIG. 34, a perspective view 3400 of some alternative embodiments of the 3D IC of FIG. 31 is provided in which interconnect features are cleared from under the first-die backside pad 104a. As a result, a height of the first columnar structure 424a is reduced and material costs may be reduced.

Figure 35:
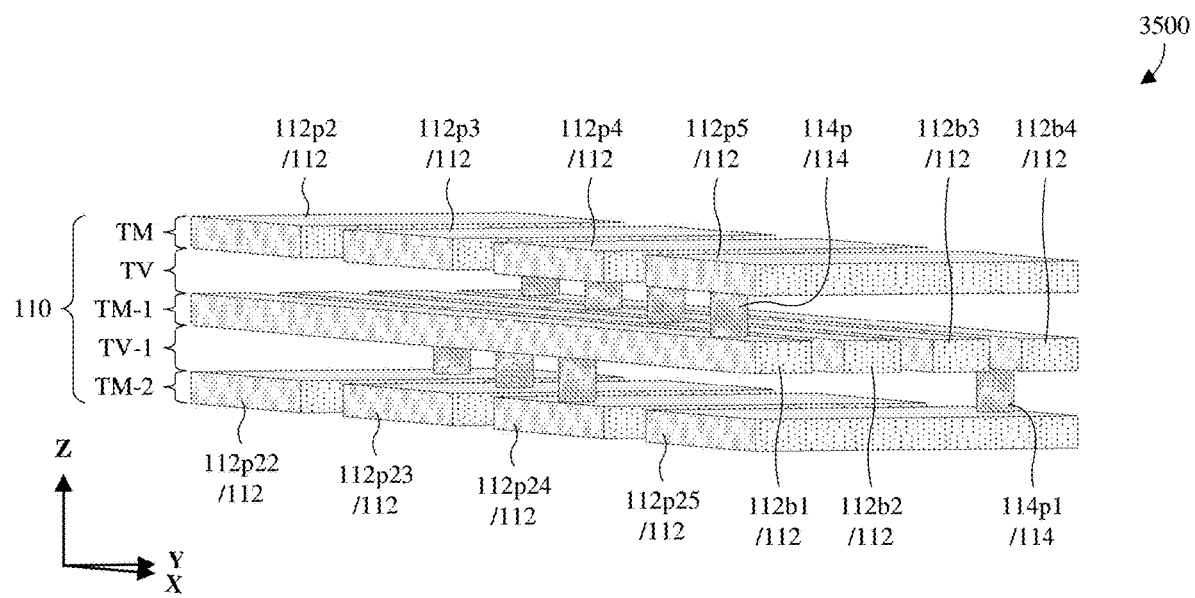
FIGS. 35 and 36A-36C illustrate various views of some embodiments of a frontside pad/bridge structure of FIG. 34.
Figure 36A:
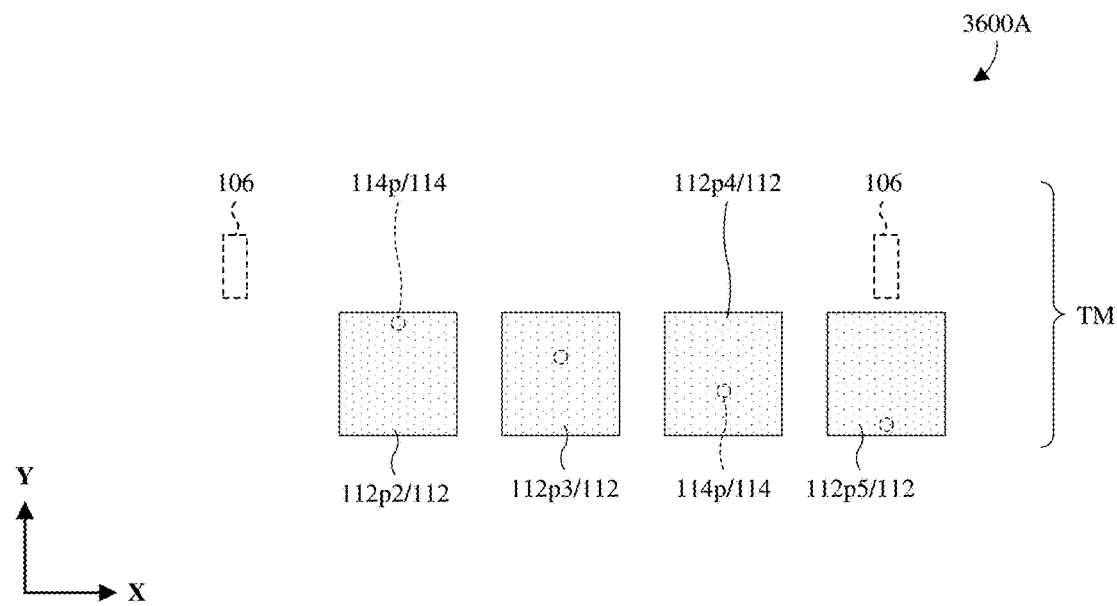
Figure 36B:
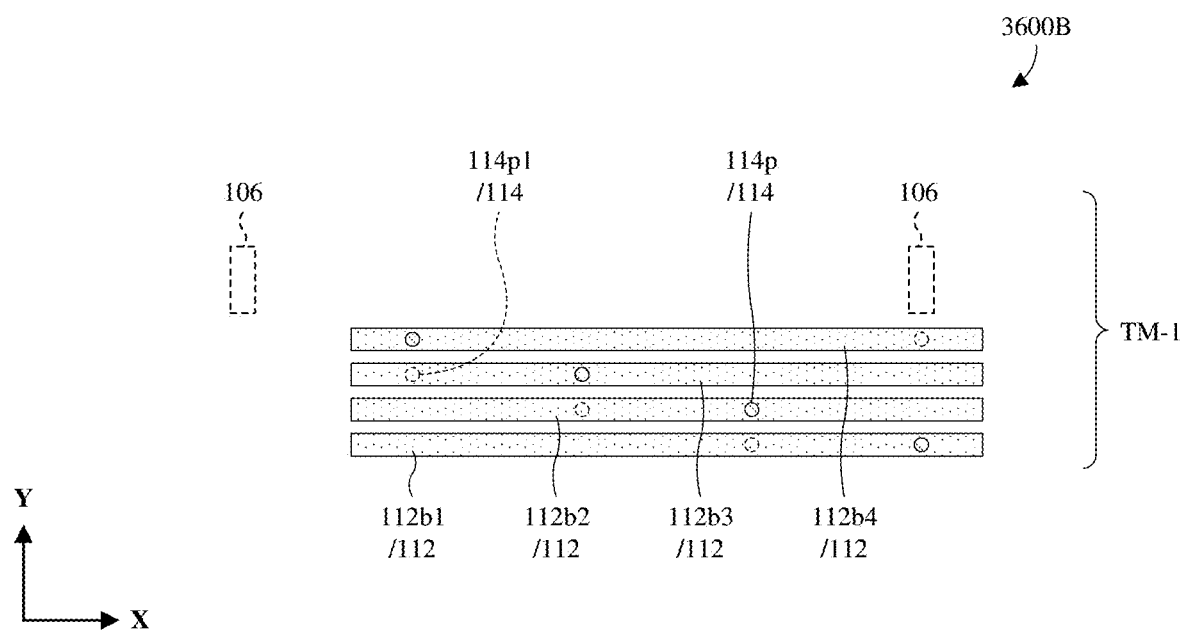
Figure 36C:
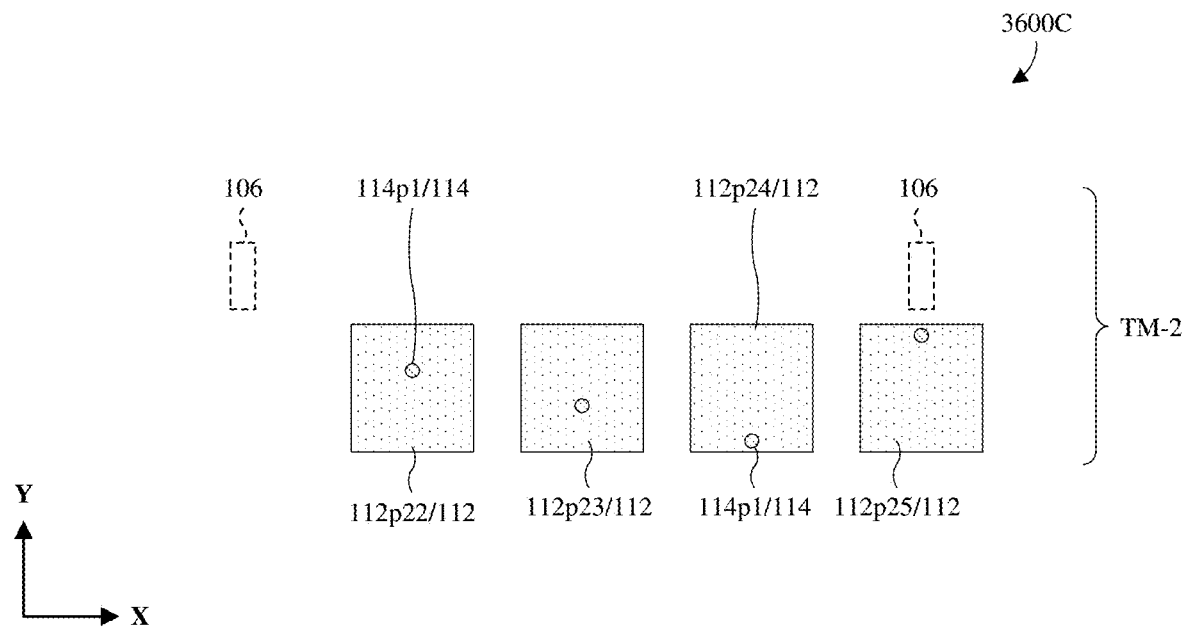

With reference to FIGS. 35 and 36A-36C, various views of some embodiments of a frontside pad/bridge structure of FIG. 34 are provided. FIG. 35 provides a perspective view 3500 of the frontside pad/bridge structure, whereas FIGS. 36A-36C provide top layouts 3600A-3600C of the frontside pad/bridge structure. FIG. 36A corresponds to a top layout 3600A at a TM layer, FIG. 36B corresponds to a top layout 3600B at a TM-1 layer, and FIG. 36C corresponds to a top layout 3600C at a TM-2 layer. Note that the semiconductor devices 106 of FIG. 34 are shown in phantom in FIGS. 36A-36C to provide reference point. The frontside pad/bridge structure corresponds to the frontside pad/bridge structure 116 of the second, third, fourth, or fifth IC die 102b-102e and is representative of each frontside pad/bridge structure 116 of FIG. 34.

Figure 37:
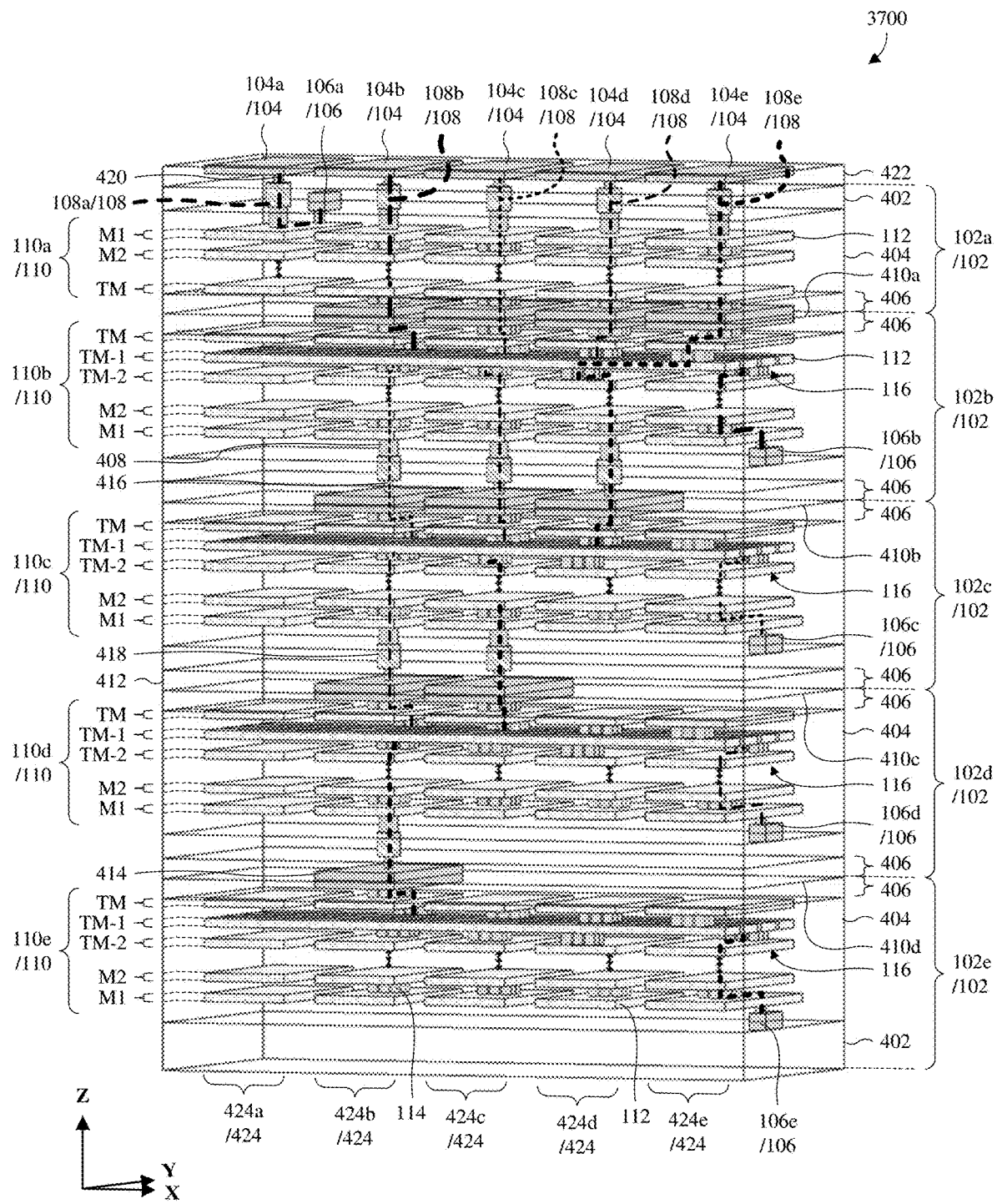
FIG. 37 illustrates a perspective view of some alternative embodiments of the 3D IC of FIG. 24 in which vias are replaced with 3×3 arrays of vias.

With reference to FIG. 37, a perspective view 3700 of some alternative embodiments of the 3D IC of FIG. 24 is provided in which vias of FIG. 24 are replaced with 3×3 arrays of vias. In particular, the interconnect vias 114 of FIG. 24 are each replaced with 3×3 arrays of interconnect vias, except at the V0 layers. Further, the HB vias 416 of FIG. 24 are each replaced with 3×3 arrays of HB vias 416, except at the TSV 408 of the second, third, and fourth IC dies 102b-102d. Replacing vias with multiple vias, as illustrated, may reduce resistance along the conductive paths 108 and may therefore enhance power efficiency of the 3D IC.

Figure 38:
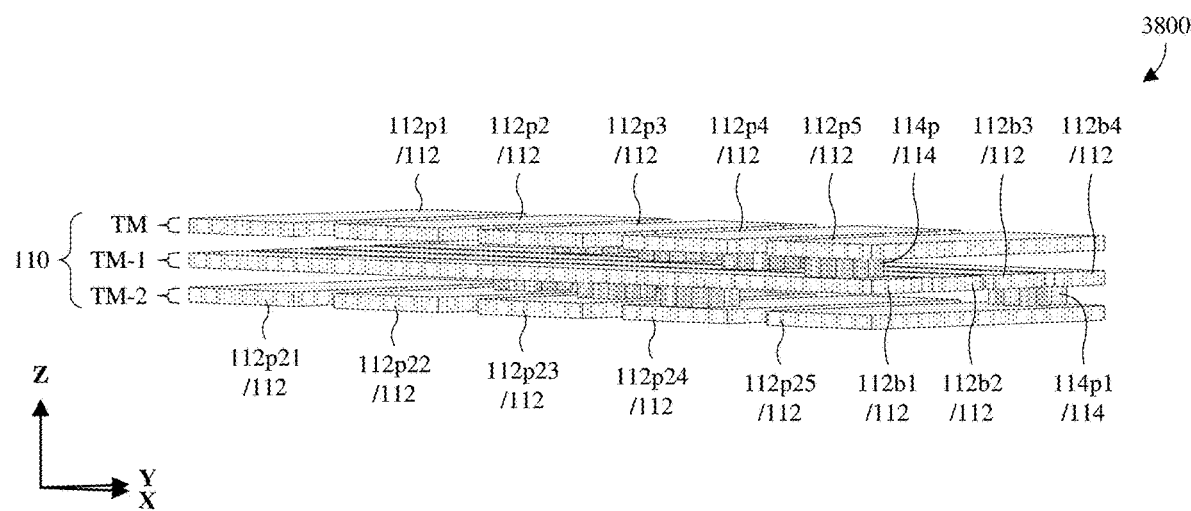
FIGS. 38 and 39A-39C illustrate various views of some embodiments of a frontside pad/bridge structure of FIG. 37.
Figure 39A:
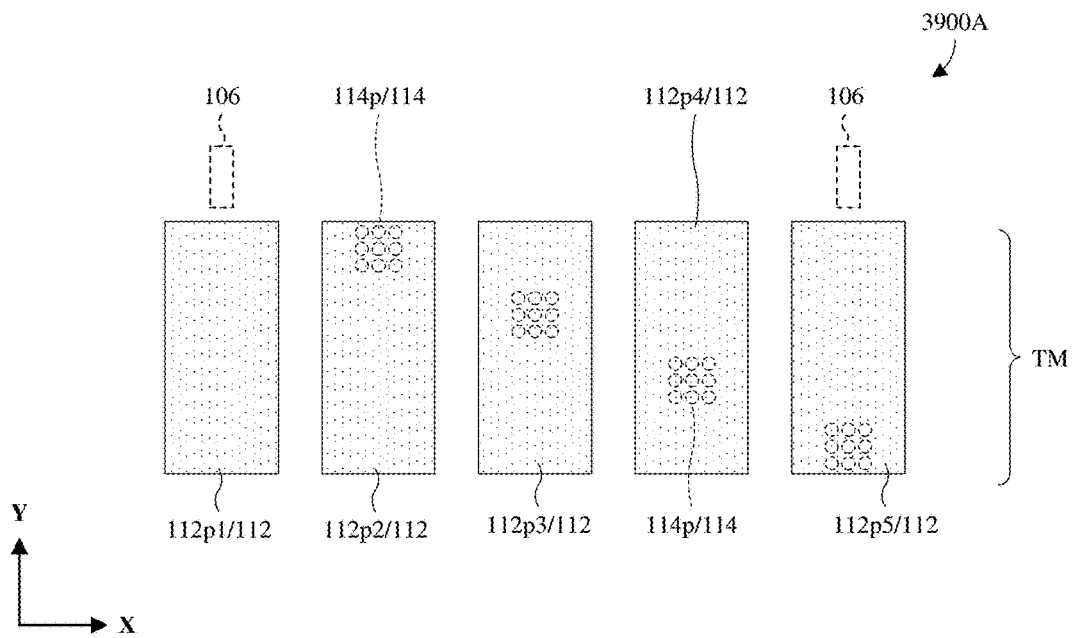
Figure 39B:
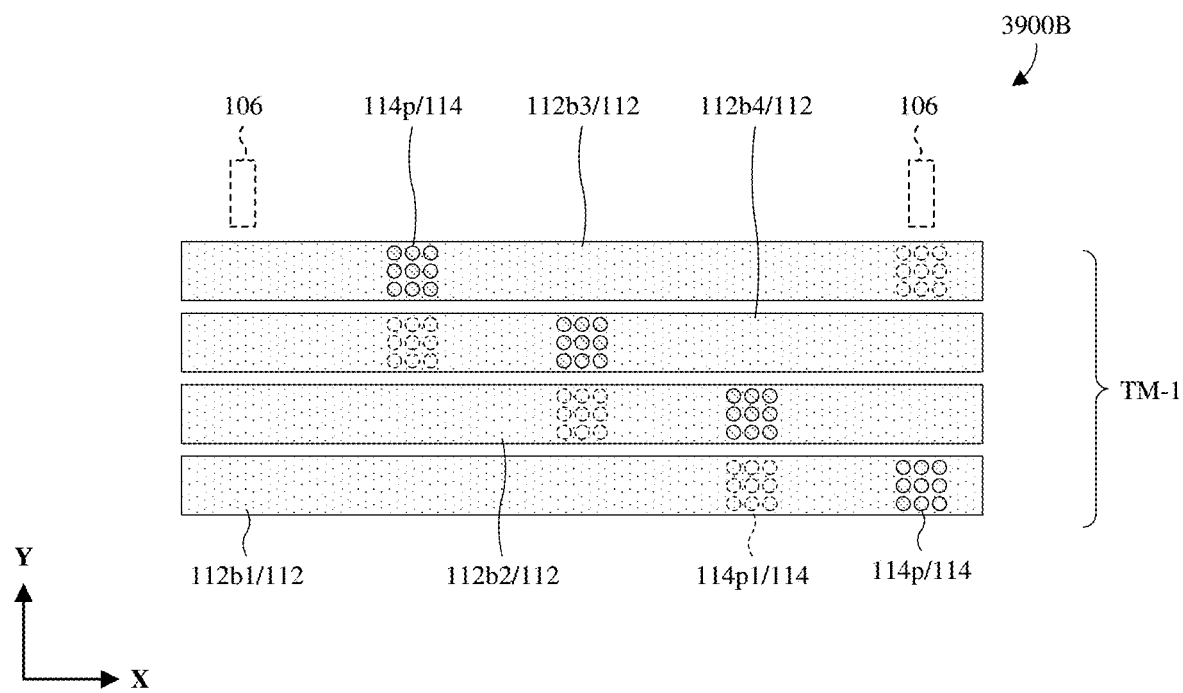
Figure 39C:
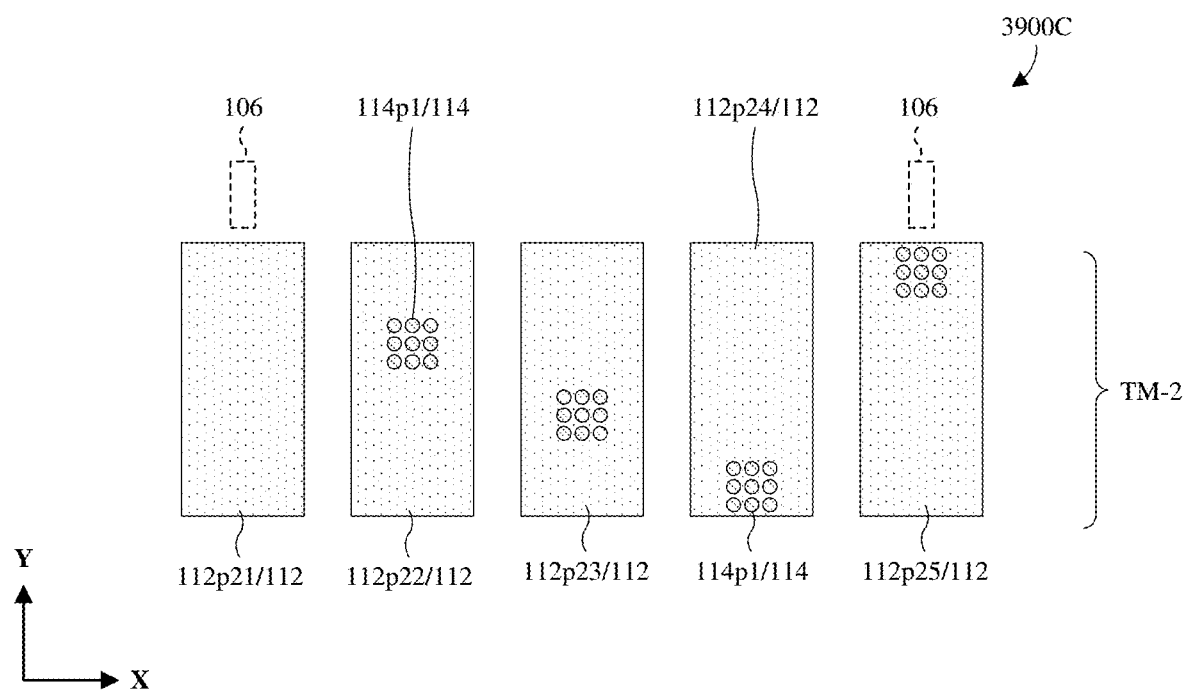

With reference to FIGS. 38 and 39A-39C, various views of some embodiments of a frontside pad/bridge structure of FIG. 37 are provided. FIG. 38 provides a perspective view 3800 of the frontside pad/bridge structure, whereas FIGS. 39A-39C provide top layouts 3900A-3900C of the frontside pad/bridge structure. FIG. 39A corresponds to a top layout 3900A at a TM layer, FIG. 39B corresponds to a top layout 3900B at a TM-1 layer, and FIG. 39C corresponds to a top layout 3900C at a TM-2 layer. Note that the semiconductor devices 106 of FIG. 37 are shown in phantom in FIGS. 39A-39C to provide reference point. The frontside pad/bridge structure corresponds to the frontside pad/bridge structure 116 of the second, third, fourth, or fifth IC die 102b-102e and is representative of each frontside pad/bridge structure 116 of FIG. 37.

Figure 40:
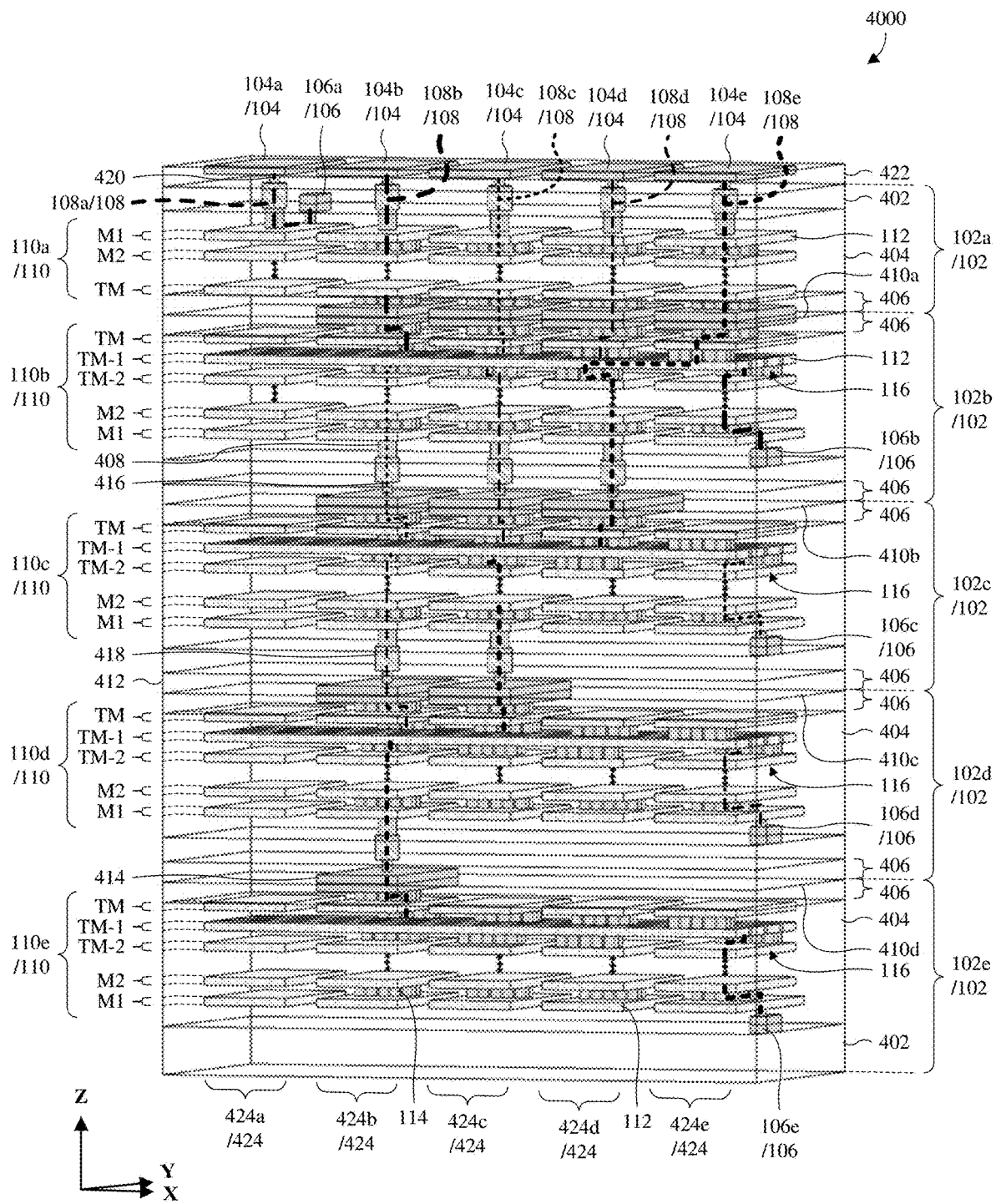
FIG. 40 illustrates a perspective view of some alternative embodiments of the 3D IC of FIG. 24 in which vias are replaced with 5×3 arrays of vias.

With reference to FIG. 40, a perspective view 4000 of some alternative embodiments of the 3D IC of FIG. 24 is provided in which vias of FIG. 24 are replaced with 5×3 arrays of vias. In particular, the interconnect vias 114 of FIG. 24 are each replaced with 5×3 arrays of interconnect vias, except at the V0 layers. Further, the HB vias 416 of FIG. 24 are each replaced with 5×3 arrays of HB vias 416, except at the TSVs 408 of the second, third, and fourth IC dies 102b-102d. Replacing vias with multiple vias, as illustrated, may reduce resistance along the conductive paths 108 and may therefore enhance power efficiency of the 3D IC.

Figure 41:
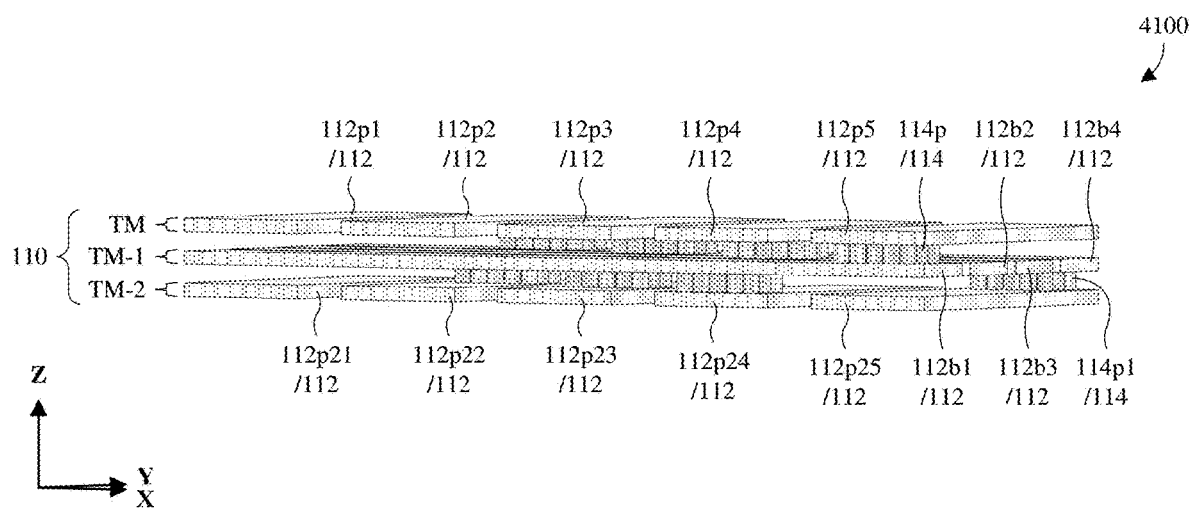
FIGS. 41 and 42A-42C illustrate various views of some embodiments of a frontside pad/bridge structure of FIG. 40.
Figure 42A:
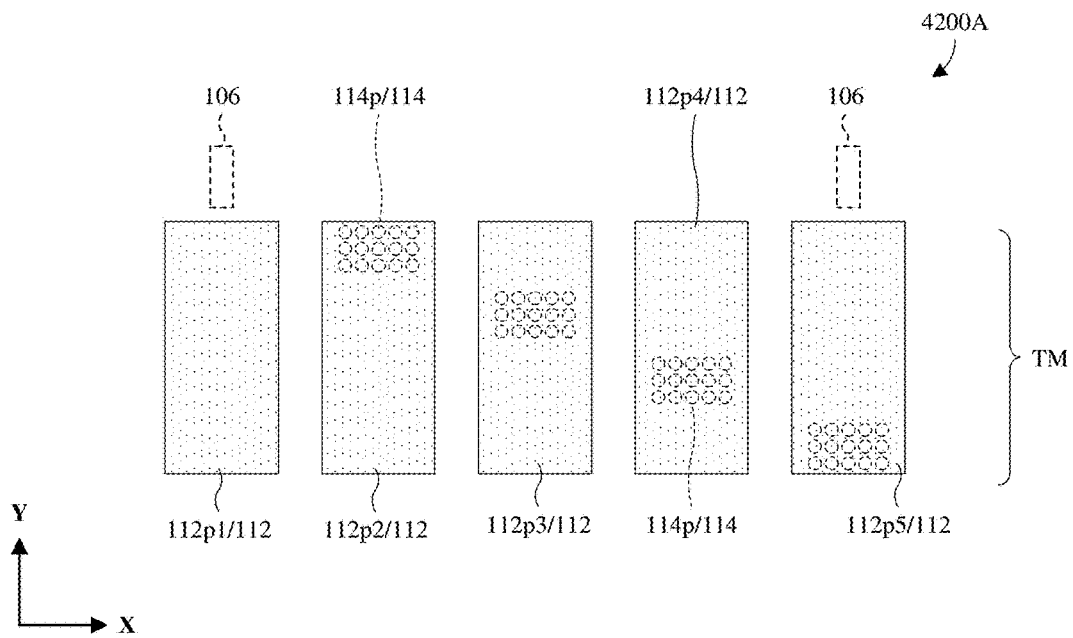
Figure 42B:
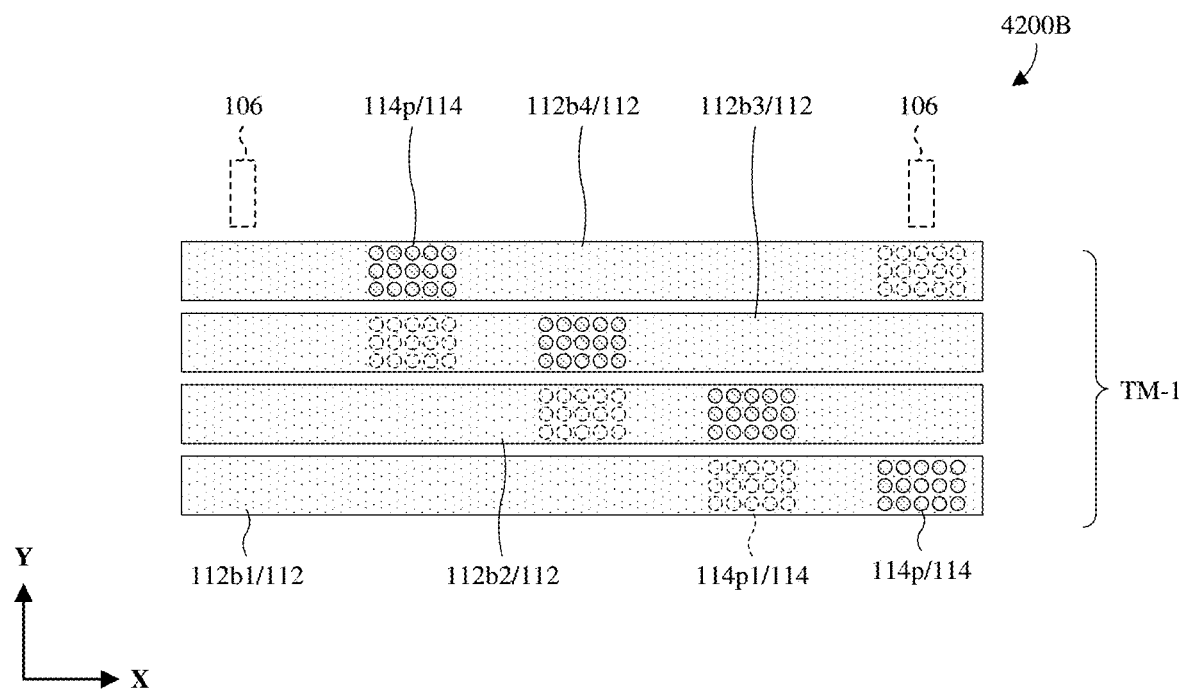
Figure 42C:
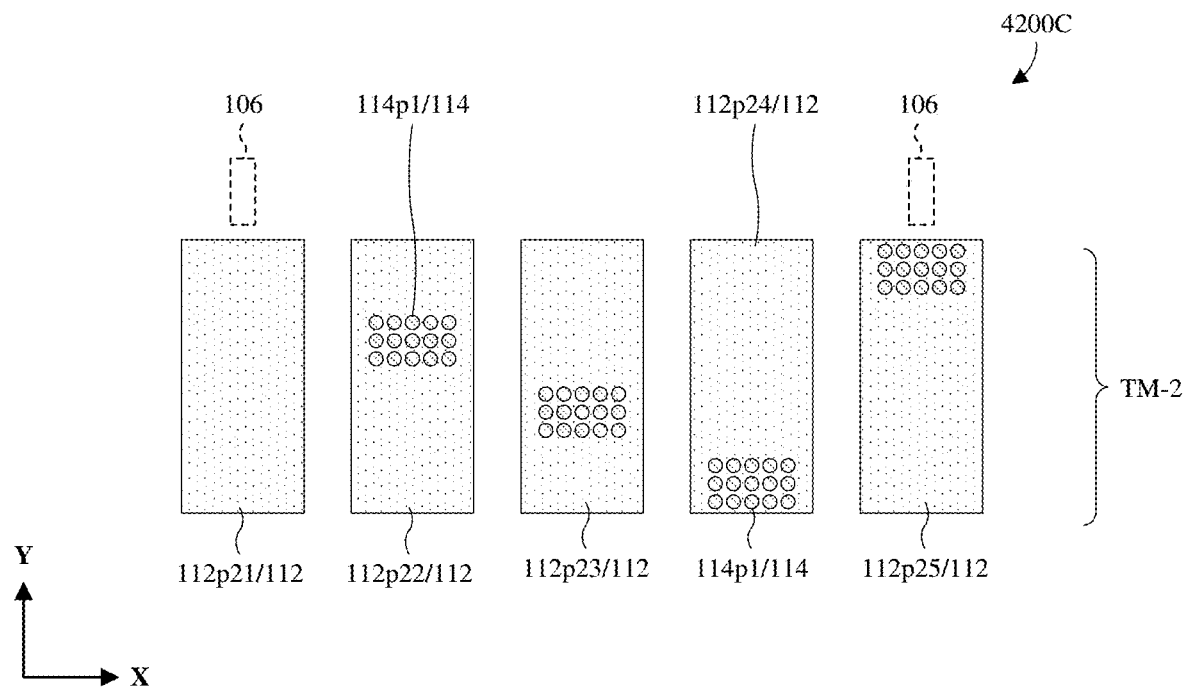

With reference to FIGS. 41 and 42A-42C, various views of some embodiments of a frontside pad/bridge structure of FIG. 40 are provided. FIG. 41 provides a perspective view 4100 of the frontside pad/bridge structure, whereas FIGS. 42A-42C provide top layouts 4200A-4200C of the frontside pad/bridge structure. FIG. 42A corresponds to a top layout 4200A at a TM layer, FIG. 42B corresponds to a top layout 4200B at a TM-1 layer, and FIG. 42C corresponds to a top layout 4200C at a TM-2 layer. Note that the semiconductor devices 106 of FIG. 40 are shown in phantom in FIGS. 42A-42C to provide reference point. The frontside pad/bridge structure corresponds to the frontside pad/bridge structure 116 of the second, third, fourth, or fifth IC die 102b-102e and is representative of each frontside pad/bridge structure 116 of FIG. 40.

Figure 43:
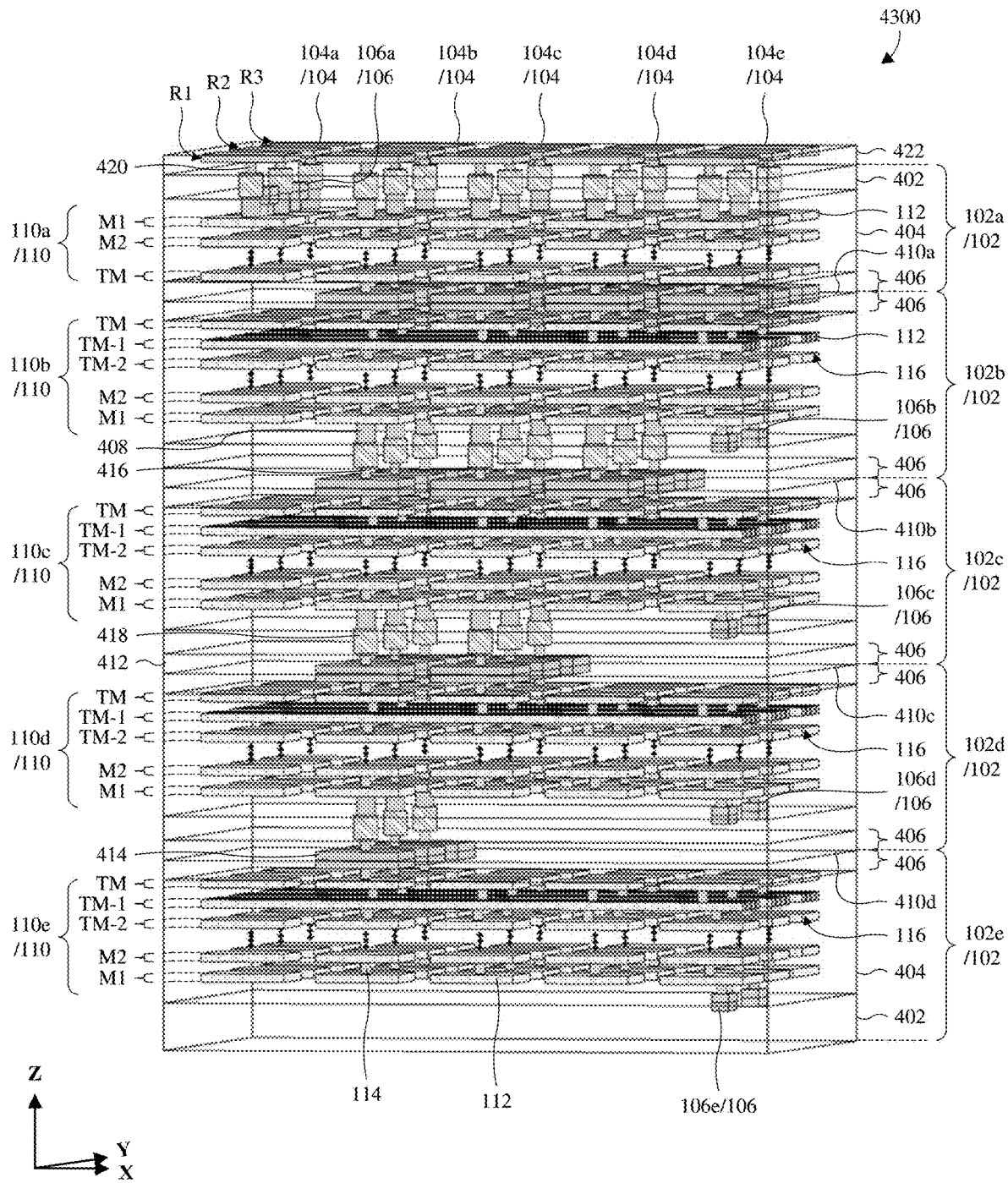
FIG. 43 illustrates a perspective view of some alternative embodiments of the 3D IC of FIG. 24 in which the 3D IC has multiple rows of backside pads.

With reference to FIG. 43, a perspective view 4300 of some embodiments of the 3D IC of FIG. 24 is provided in which the 3D IC has multiple rows R1, R2, R3 of backside pads 104. The rows extend in a first dimension (e.g., an X dimension) and are spaced from each other in a second dimension (e.g., a Y dimension) transverse to the first dimension. Each row R1-R3 comprises a first-die backside pad 104a, a second-die backside pad 104b, a third-die backside pad 104c, a fourth-die backside pad 104d, and a fifth-die backside pad 104e as described above. Further, at each row R1-R3, the structure of FIG. 24 repeats as illustrated and described above, except semiconductor devices 106 may be shared between rows and the V0 and M1 layers may vary from row to row. In alternative embodiments, the structure of FIG. 31, 34, 37, or 40 may instead by employed.

Because the structure of FIG. 43 repeats at each row R1-R3, the frontside pad/bridge structures 116 also repeat. As described above, the frontside pad/bridge structures 116 are the same within any given row as described above. Further, the frontside pad/bridge structures 116 are the same across rows. In alternative embodiments, the frontside pad/bridge structures 116 are different at different rows.

Figure 44A:
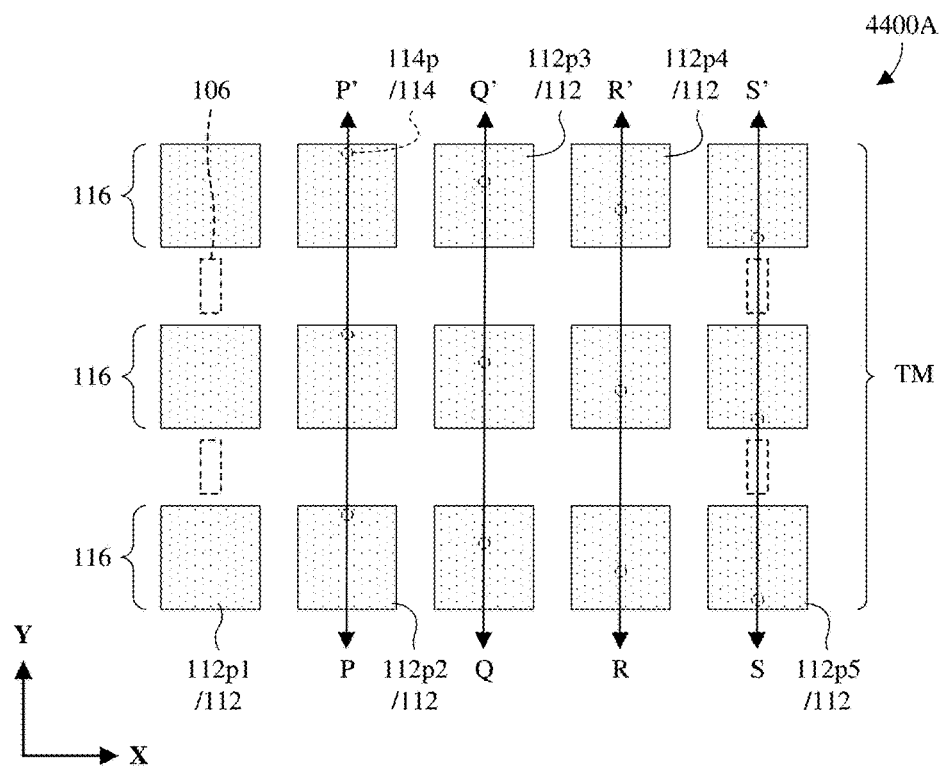
FIGS. 44A-44C illustrate top layouts of some embodiments of a level of frontside pad/bridge structures of FIG. 43.
Figure 44B:
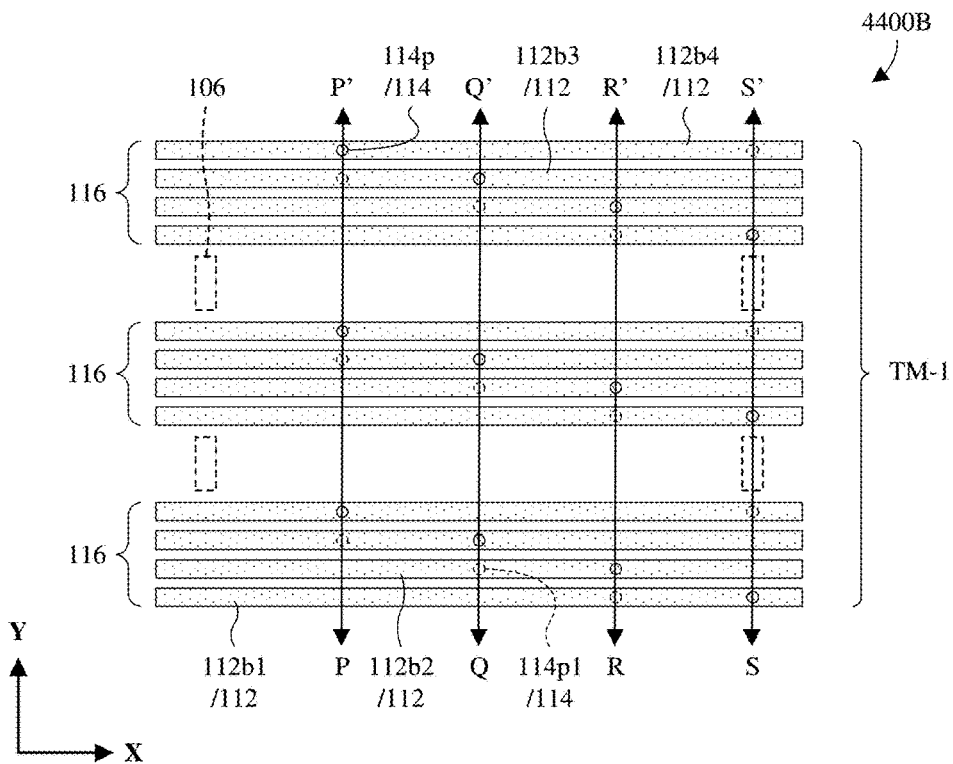
Figure 44C:
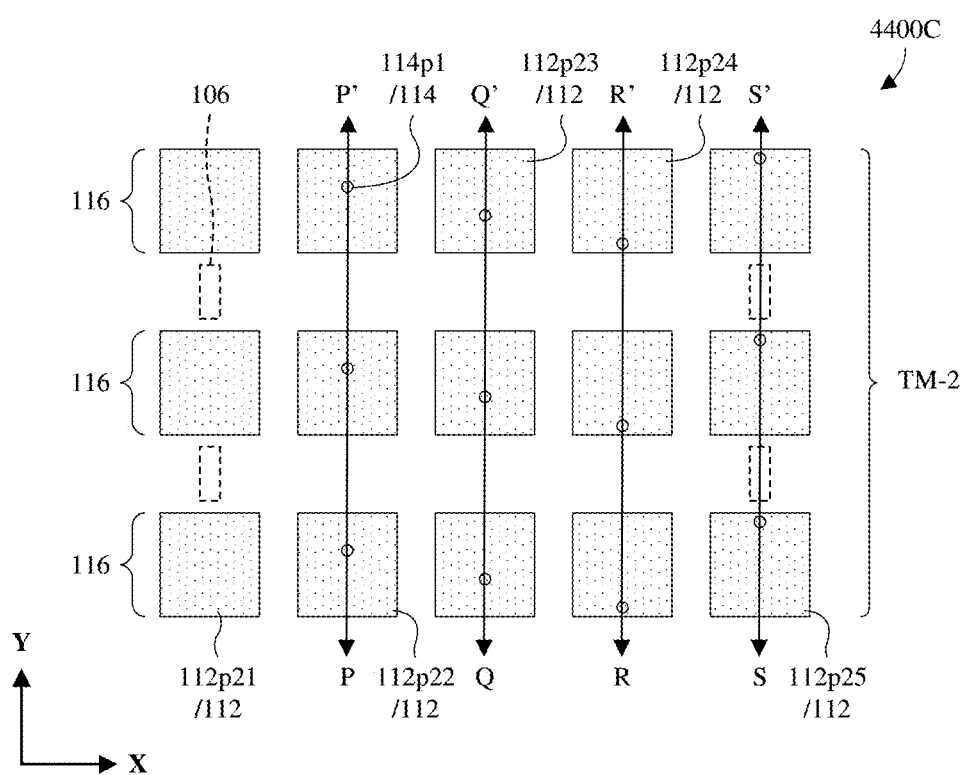
Figure 45A:
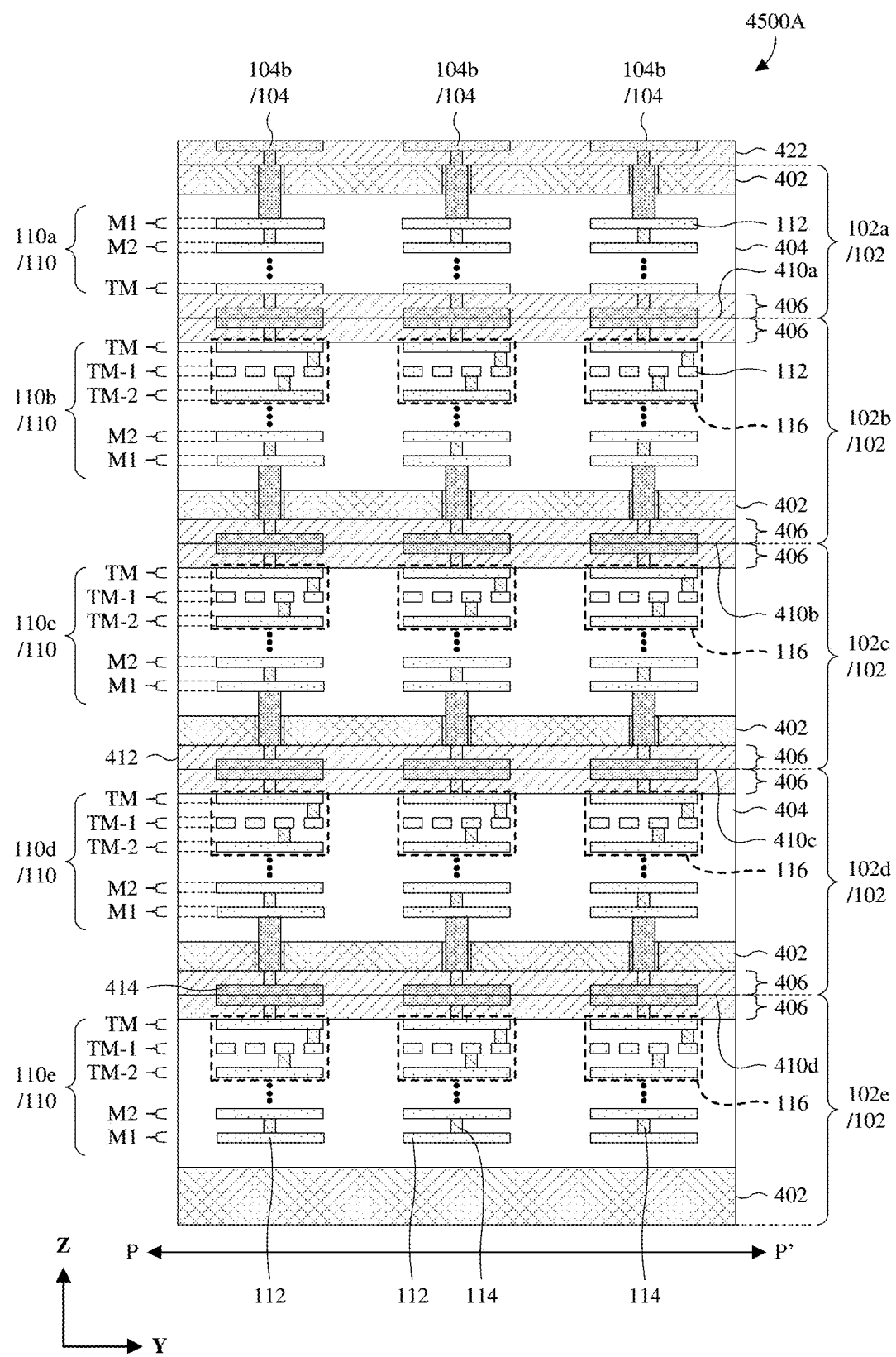
FIGS. 45A-45D illustrate cross-sectional views of some embodiments of the 3D IC of FIG. 43.
Figure 45B:
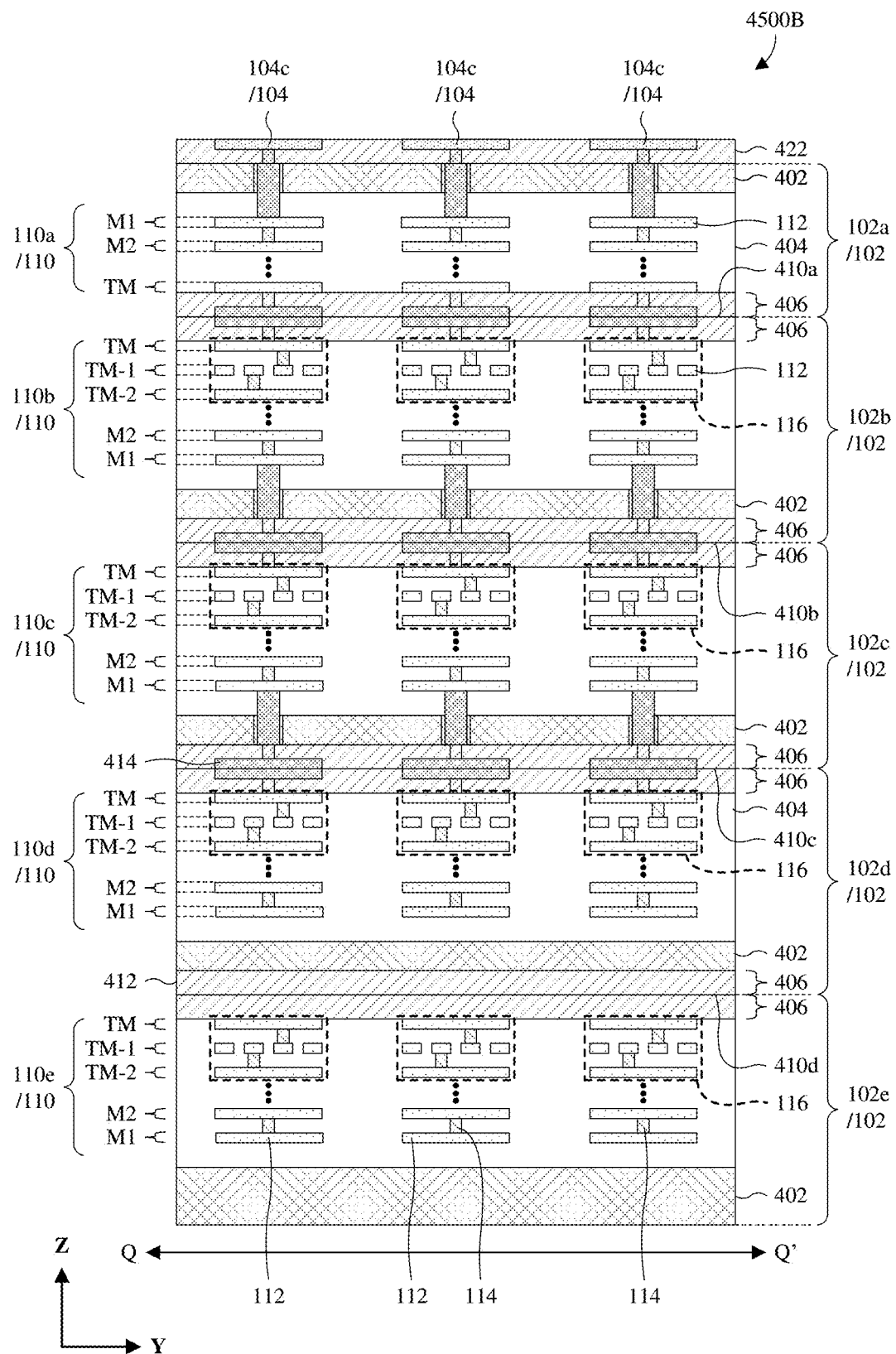
Figure 45C:
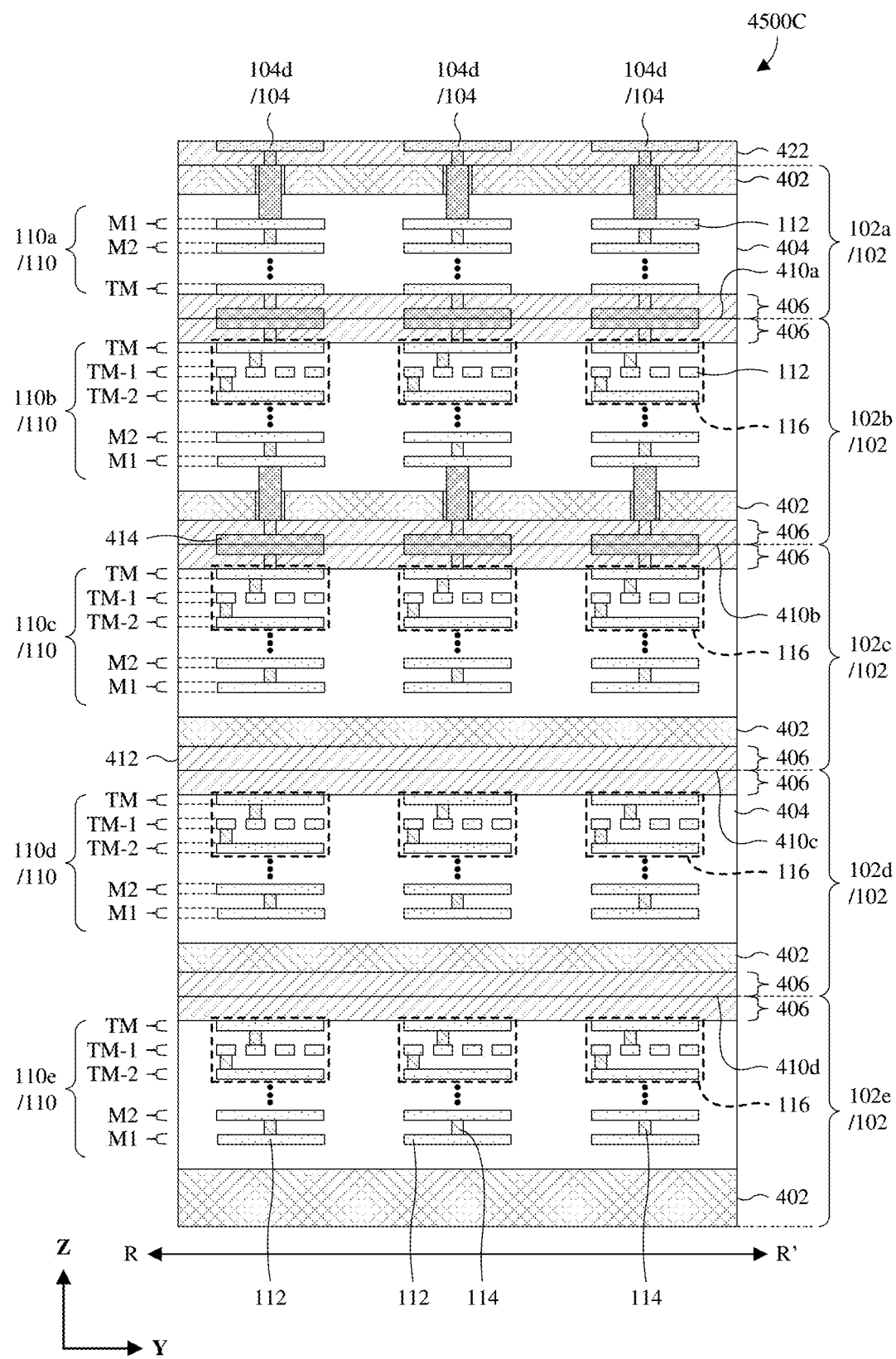
Figure 45D:
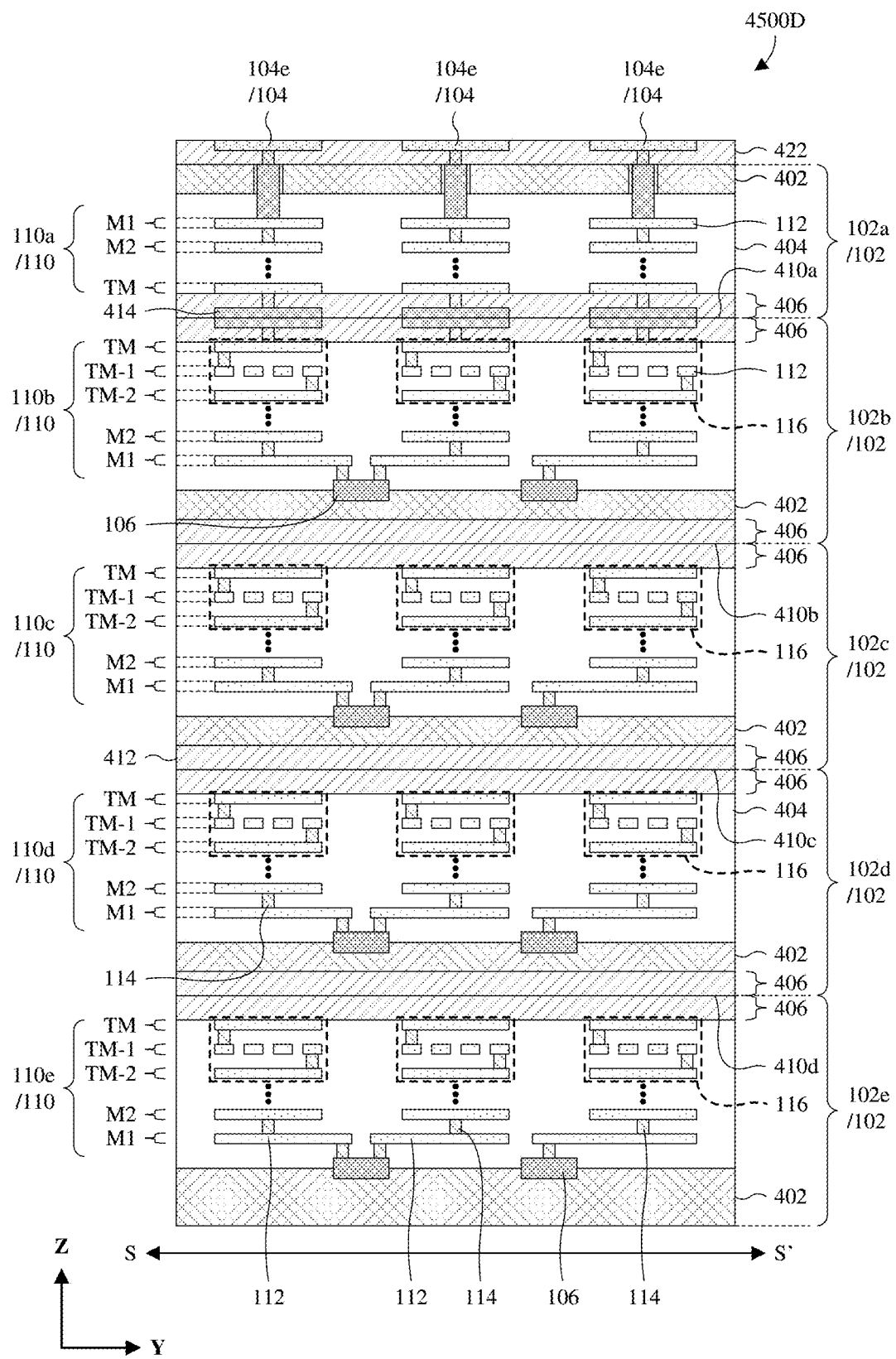

With reference to FIGS. 44A-44C, top layouts 4400A-4400C of some embodiments of a level of frontside pad/bridge structures 116 of FIG. 43 are provided. The semiconductor devices 106 of FIG. 43 are also shown in phantom to provide a common point of reference. FIG. 44A corresponds to a top layout 4400A at a TM layer, FIG. 44B corresponds to a top layout 4400B at a TM-1 layer, and FIG. 44C corresponds to a top layout 4400C at a TM-2 layer. The frontside pad/bridge structures 116 are spaced from each other in a dimension (e.g., a Y dimension), and the top layouts 4400A-4400C are made up of repetitions respectively of the top layouts 2300A-2300C of FIGS. 23A-23C in the dimension.

With reference to FIGS. 45A-45D, cross-sectional views 4500A-4500D of some embodiments of the 3D IC of FIG. 43 are provided. The cross-sectional view 4500A of FIG. 45A corresponds to line P-P' in FIGS. 44A-44C, the cross-sectional view 4500B of FIG. 45B corresponds to line Q-Q' in FIGS. 44A-44C, the cross-sectional view 4500C of FIG. 45C corresponds to line R-R' in FIGS. 44A-44C, and the cross-sectional view 4500D of FIG. 45D corresponds to line S-S' in FIGS. 44A-44C.

With reference to FIGS. 46, 47A-47C to 51A-51C, and 52-57, a series of views of some embodiments of a method for forming a 3D IC comprising a shared frontside pad/bridge layout is provided. Figures with a label suffixed by "A" or no letter correspond to perspective views, and figures with a label suffixed by "B" correspond to top layouts. Figures with a label suffixed by "C" correspond to cross-sectional views along line T-T' in like numbered figures with a label suffixed by "B". The method may, for example, be employed to form the 3D IC of FIG. 12 or some other suitable 3D IC.

Figure 46:
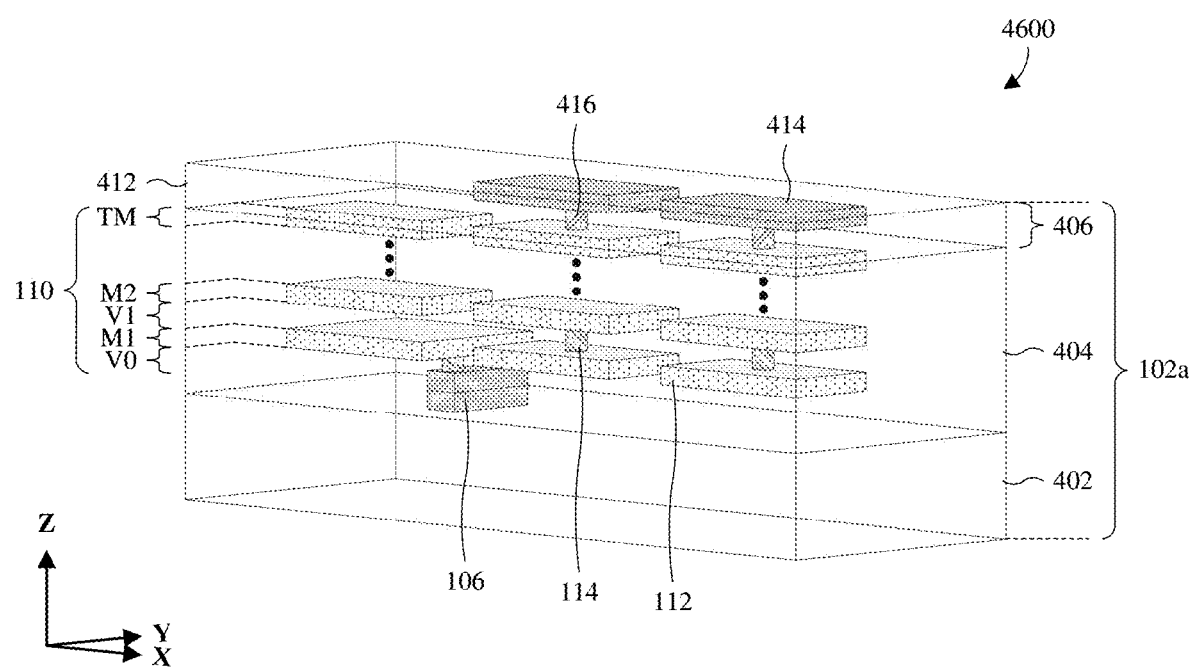
FIGS. 46, 47A-47C to 51A-51C, and 52-57 illustrate a series of views of some embodiments of a method for forming a 3D IC comprising a shared frontside pad/bridge layout.

As illustrated by the perspective view 4600 of FIG. 46, a first IC die 102a is formed. The first IC die 102a comprises a semiconductor substrate 402, a semiconductor device 106, an interconnect structure 110, and a HB structure 406. The semiconductor device 106 overlies and is partially formed by the semiconductor substrate 402 on a frontside of the semiconductor substrate 402. The interconnect structure 110 overlies and is electrically coupled to the semiconductor device 106 on the frontside, and the HB structure 406 overlies and electrically couples to the interconnect structure 110 on the frontside.

The interconnect structure 110 is surrounded by an interconnect dielectric layer 404 and comprises a plurality of interconnect features 112 and a plurality of interconnect vias 114. The interconnect features 112 are grouped by elevation respectively into a plurality of metal layers, including a M1 layer, an M2 layer, and a TM layer. The interconnect vias 114 are grouped by elevation respectively into a plurality of via layers alternatingly stacked with the metal layers and includes a V0 layer and a V1 layer. The ellipses represent N number of via layers and N−1 number of metal layers alternatingly stacked with the N number of via layers, where N is an integer greater than or equal to one. In some embodiments, each of the N number of via layers has a layout (e.g., is the same) as shown for the V1 layer, and/or each of the N−1 number of metal layers has a layout (e.g., is the same) as shown for the M2 layer.

The HB structure 406 comprises an HB dielectric layer 412, a plurality of HB layers 414, and a plurality of HB vias 416. The HB layers 414 and the HB vias 416 are inset into and surrounded by the HB dielectric layer 412. The HB layers 414 have individual top surfaces level, or about level, with a top surface of the HB dielectric layer. The HB vias 416 are between the TM layer of the interconnect structure 110 and the HB layers 414 and extend respectively from the HB layers 414 to the TM layer of the interconnect structure 110.

Figure 47A:
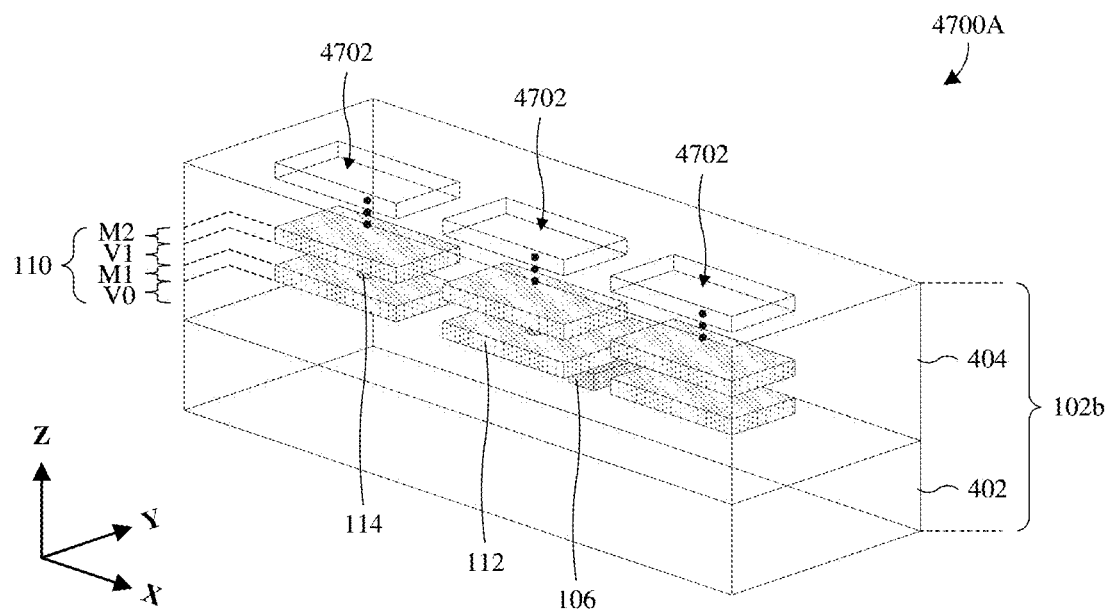
Figure 47B:
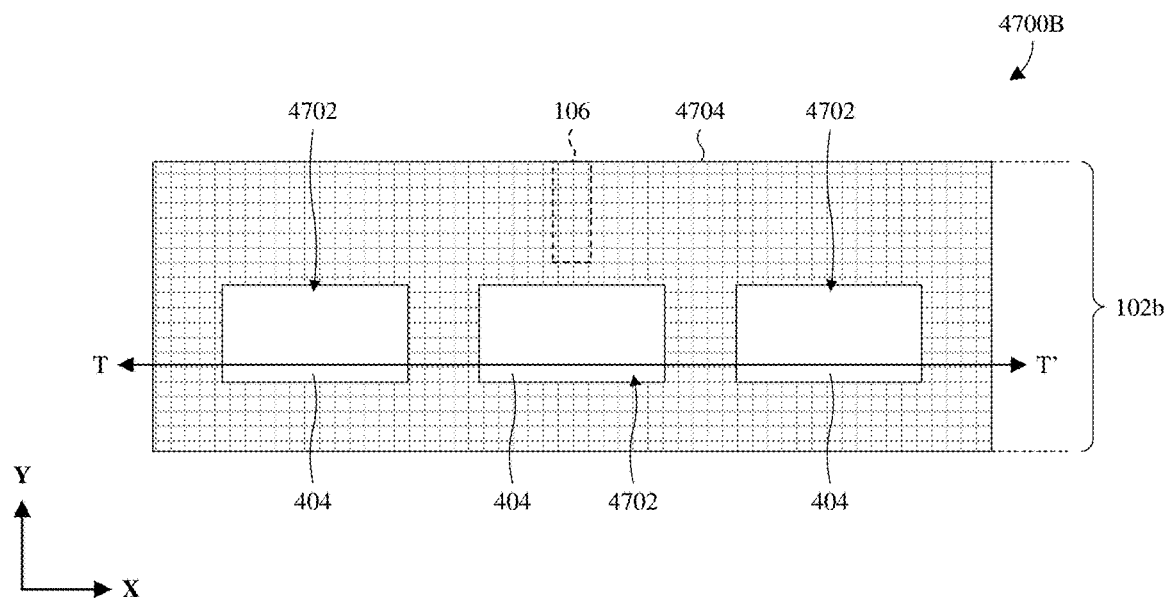
Figure 47C:
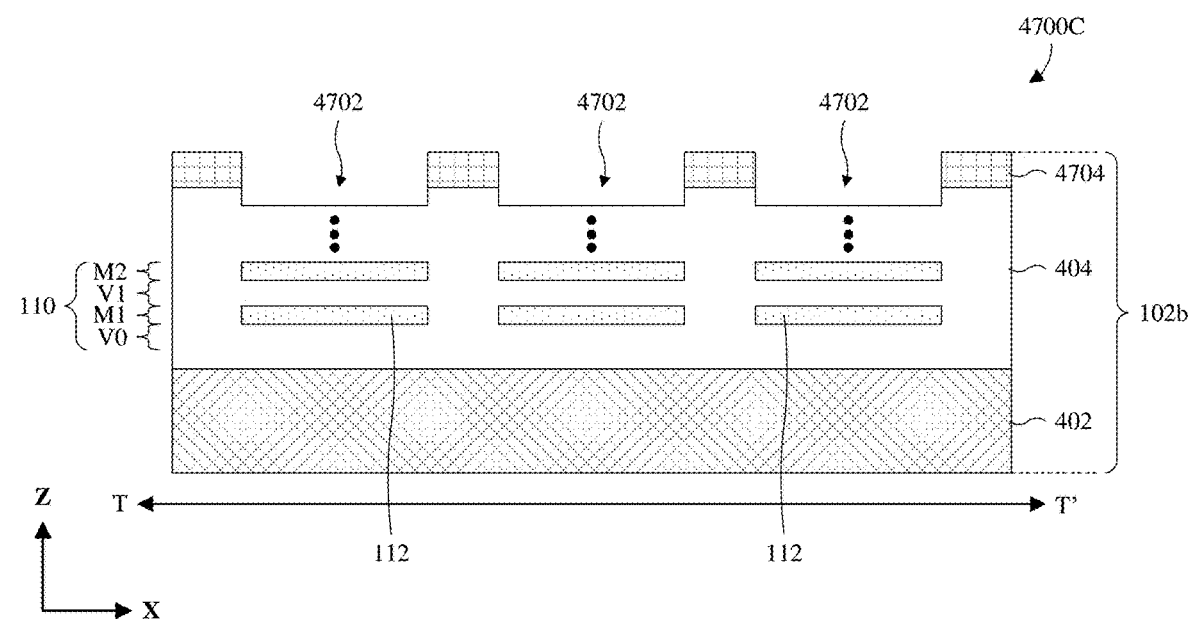

As illustrated by the views 4700A-4700C of FIGS. 47A-47C, a second IC die 102b is partially formed. The second IC die 102b comprises a semiconductor substrate 402, a semiconductor device 106, and an interconnect structure 110 that is partially formed. The semiconductor device 106 and the interconnect structure 110 are as described for the first IC die, except that: 1) the interconnect structure is partially formed to a TV-2 layer (not explicitly shown but included in the ellipses); and 2) the semiconductor device 106 is shifted.

Also illustrated by the views 4700A-4700C of FIGS. 47A-47C, a patterning process is performed to form a set of TM-2 openings 4702 in the interconnect dielectric layer 404. The patterning process may, for example, comprises: 1) performing photolithography using a TM-2 photoreticle/photomask to form a TM-2 photoresist mask 4704 overlying the interconnect dielectric layer 404; 2) performing an etch into the interconnect dielectric layer 404 with the TM-2 photoresist mask 4704 in place; and 3) removing the TM-2 photoresist mask 4704. Other suitable processes are, however, amenable. Note that the TM-2 photoresist mask 4704 is not shown in FIG. 47A for ease and clarity of illustration. Further, note that as used herein and hereafter, photoreticle/photomask refers to a photoreticle or a photomask.

Figure 48A:
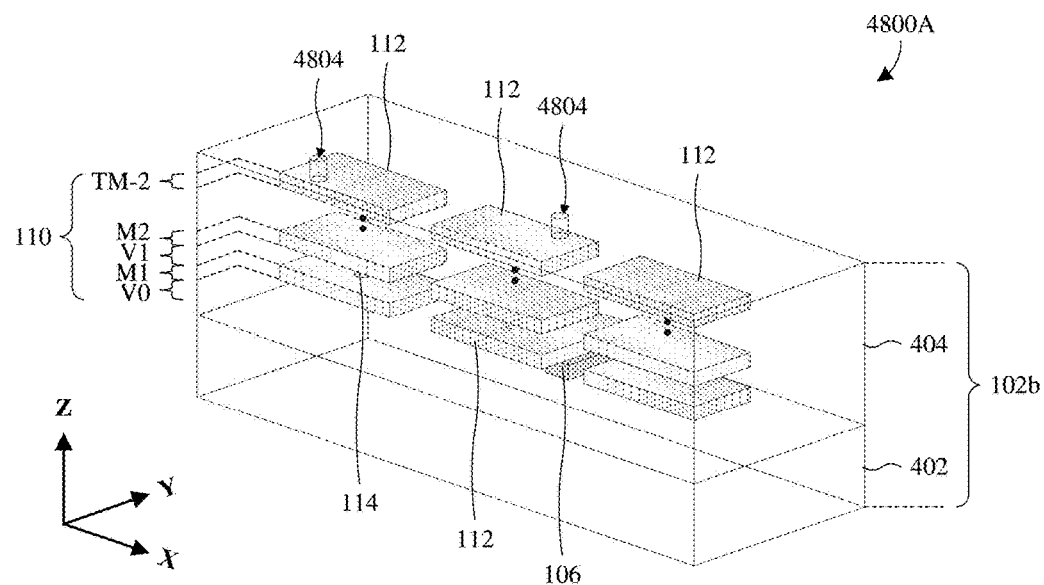
Figure 48B:
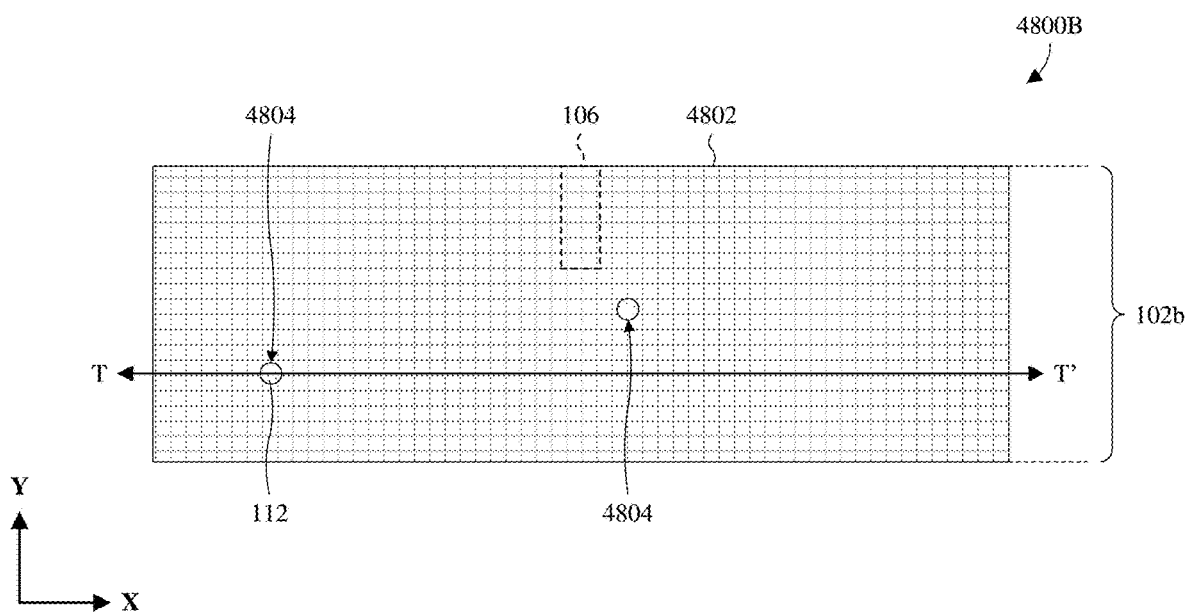
Figure 48C:
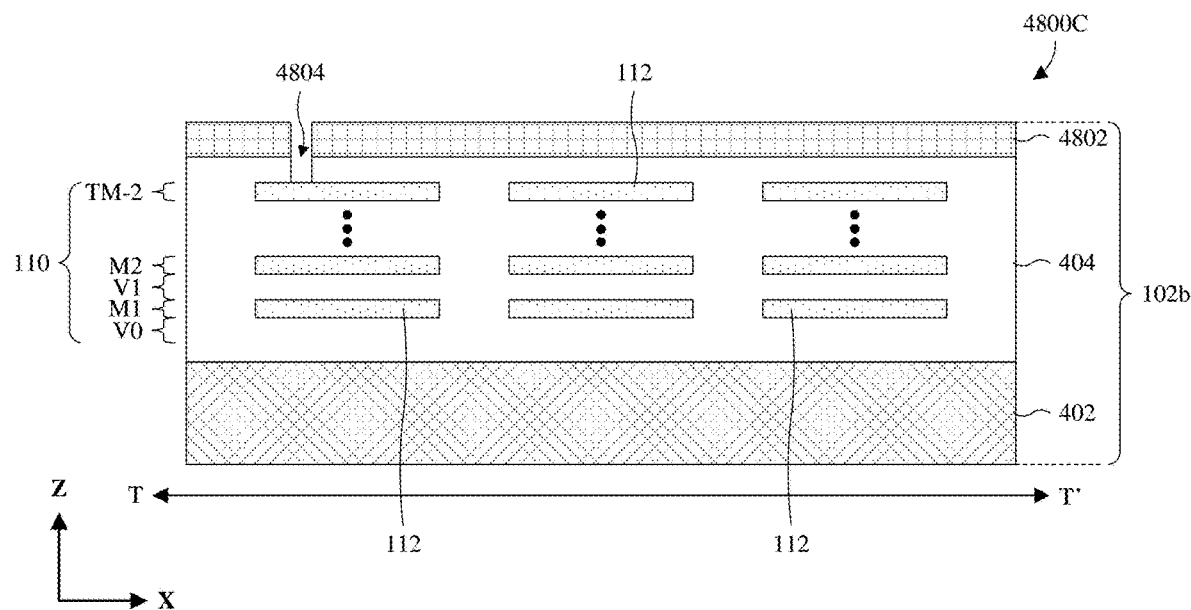

As illustrated by the views 4800A-4800C of FIGS. 48A-48C, the set of TM-2 openings 4702 (see, e.g., FIGS. 47A-47C) is filled with a conductive material to form a TM-2 layer of interconnect features 112. Such a filling process may, for example, comprise: 1) depositing a conductive layer (e.g., a metal layer) filling the set of TM-2 openings 4702 and covering a top surface of the interconnect dielectric layer 404; and 2) performing a planarization (e.g., a CMP or the like) to clear the conductive layer from atop the top surface. Other suitable processes are, however, amenable. Further, additional dielectric material is deposited to extend the interconnect dielectric layer 404 over the TM-2 layer, and the patterning process of FIGS. 47A-47C is repeated using a TV-1 photoresist mask 4802 (e.g., formed from a TV-1 photoreticle/photomask) in place of the TM-2 photoresist mask 4704 to form a set of TV-1 openings 4804. Note that the TV-1 photoresist mask 4802 is not shown in FIG. 48A.

Figure 49A:
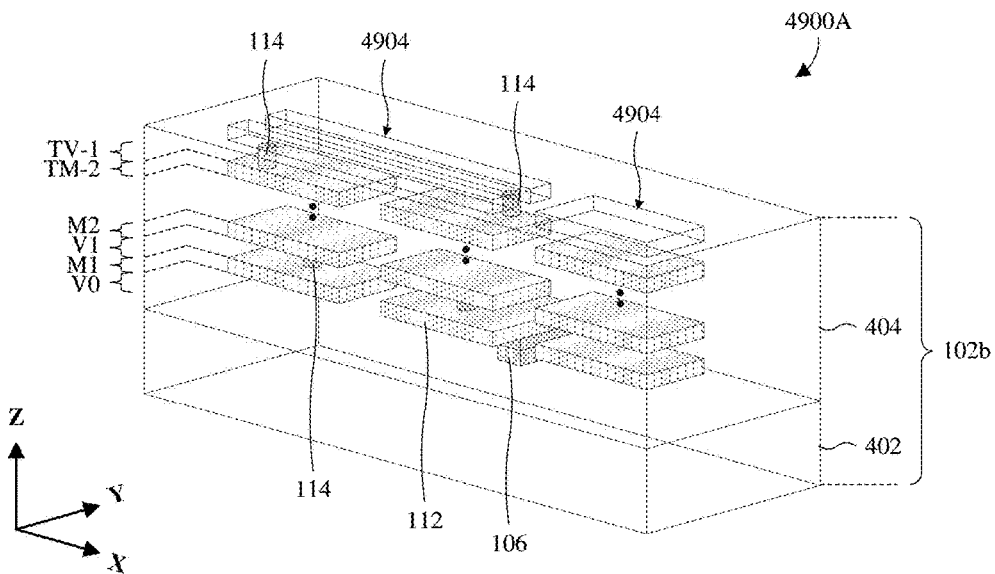
Figure 49B:
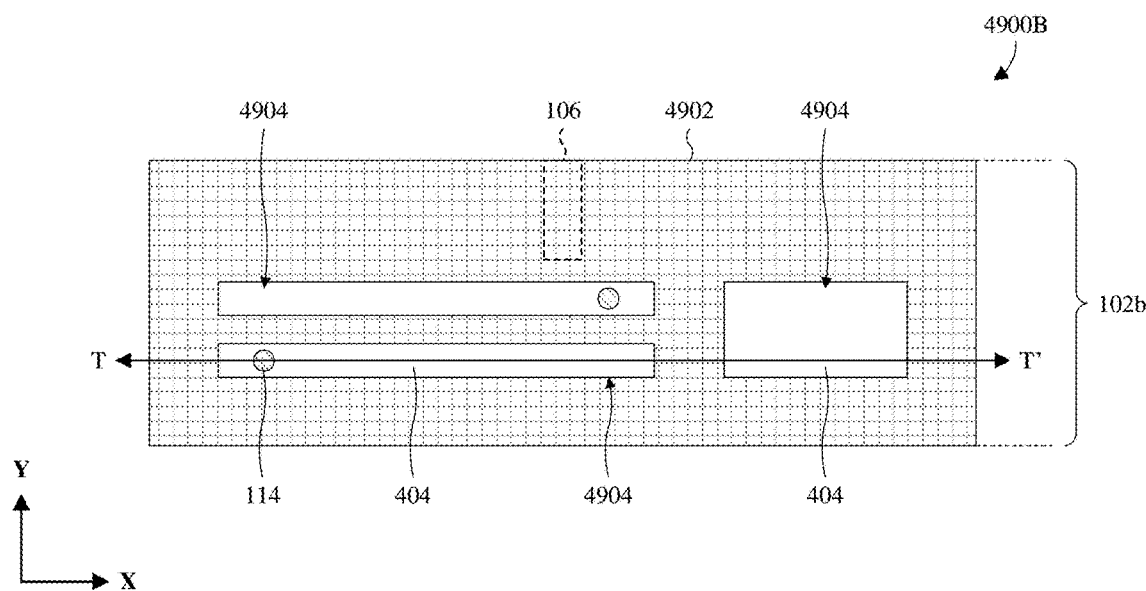
Figure 49C:
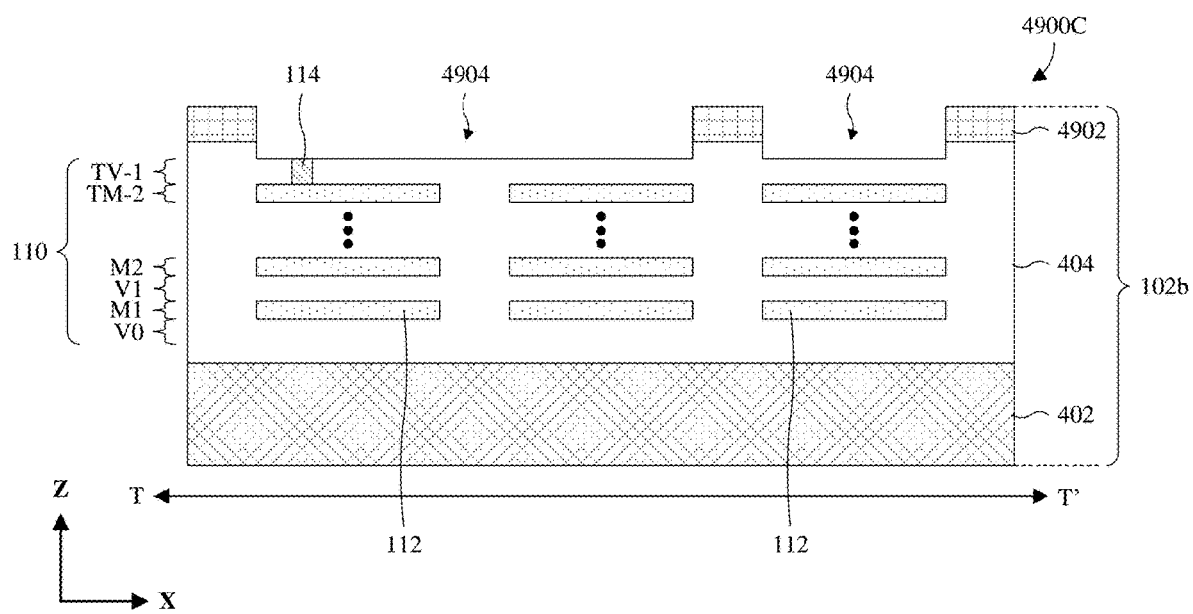

As illustrated by the views 4900A-4900C of FIGS. 49A-49C, the filling process of FIGS. 48A-48C is repeated to form a TV-1 layer in the set of TV-1 openings 4804 (see, e.g., FIGS. 48A-48C). Further, additional dielectric material is deposited to extend the interconnect dielectric layer 404 over the TV-1 layer, and the patterning process of FIGS. 47A-47C is repeated using a TM-1 photoresist mask 4902 (e.g., formed from a TM-1 photoreticle/photomask) in place of the TM-2 photoresist mask 4704 to form a set of TM-1 openings 4904. Note that the TM-1 photoresist mask 4902 is not shown in FIG. 49A.

Figure 50A:
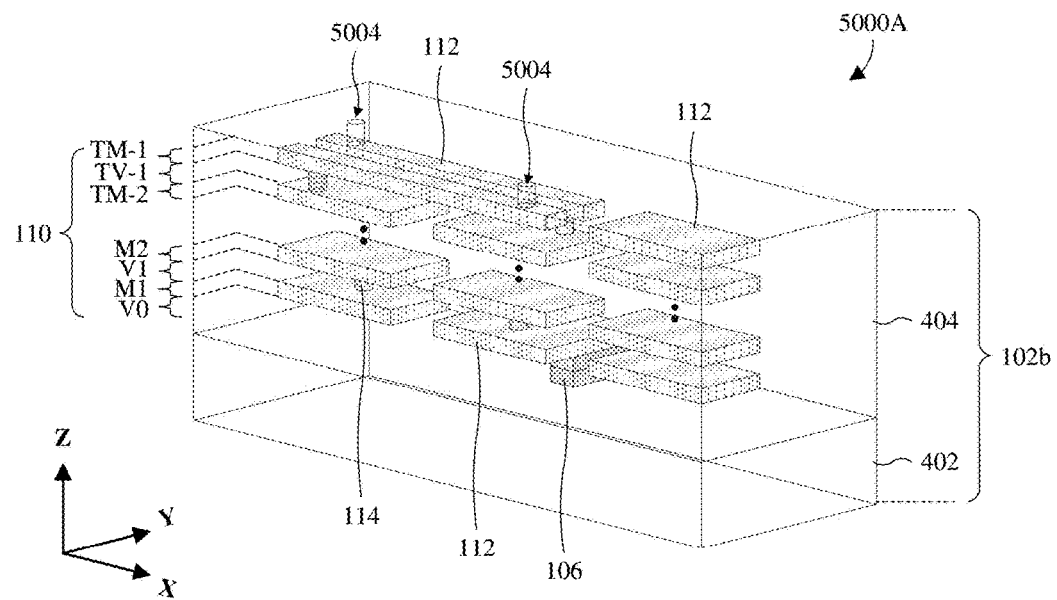
Figure 50B:
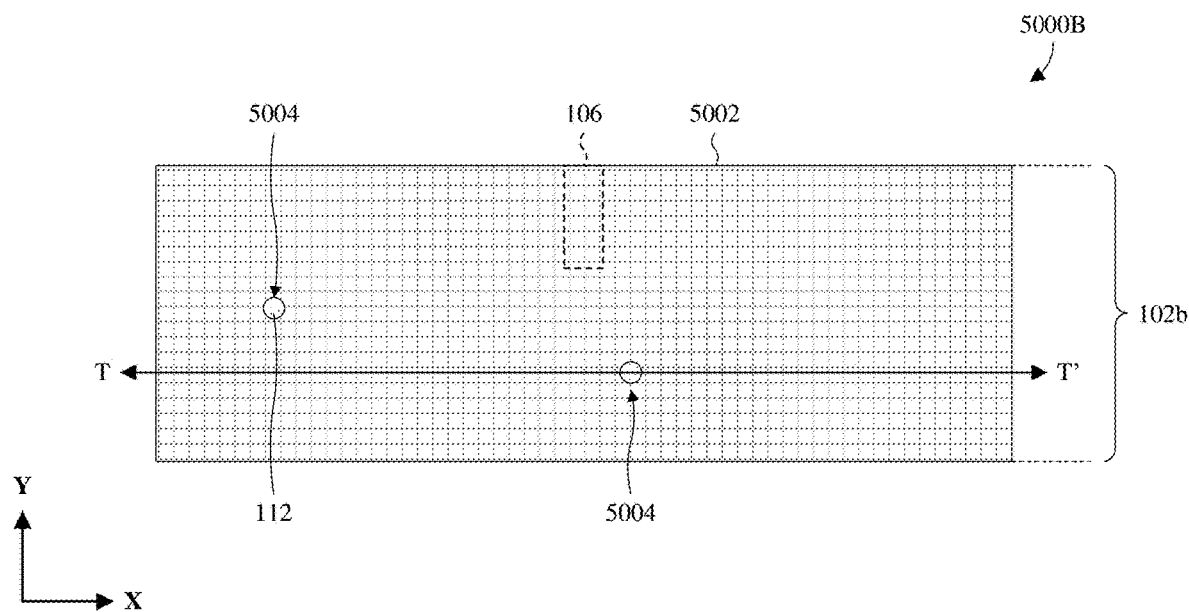
Figure 50C:
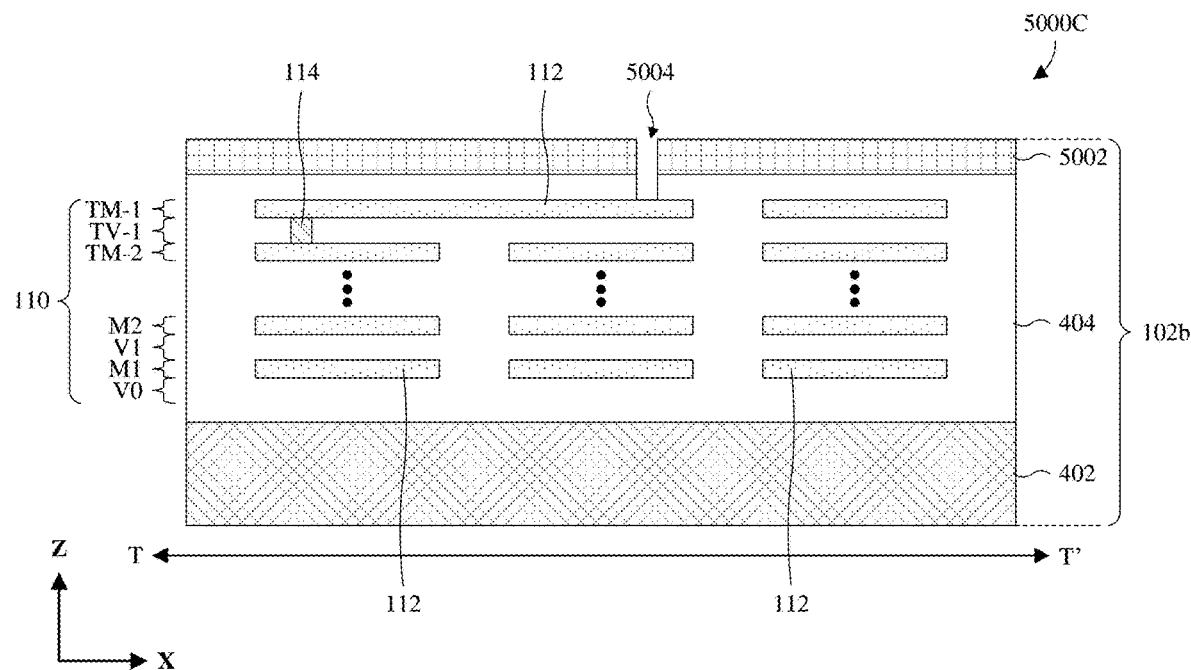

As illustrated by the views 5000A-5000C of FIGS. 50A-50C, the filling process of FIGS. 48A-48C is repeated to form a TM-1 layer in the set of TM-1 openings 4904 (see, e.g., FIGS. 49A-49C). Further, additional dielectric material is deposited to extend the interconnect dielectric layer 404 over the TM-1 layer, and the patterning process of FIGS. 47A-47C is repeated using a TV photoresist mask 5002 (e.g., formed from a TV photoreticle/photomask) in place of the TM-2 photoresist mask 4704 to form a set of TV openings 5004. Note that the TV photoresist mask 5002 is not shown in FIG. 50A.

Figure 51A:
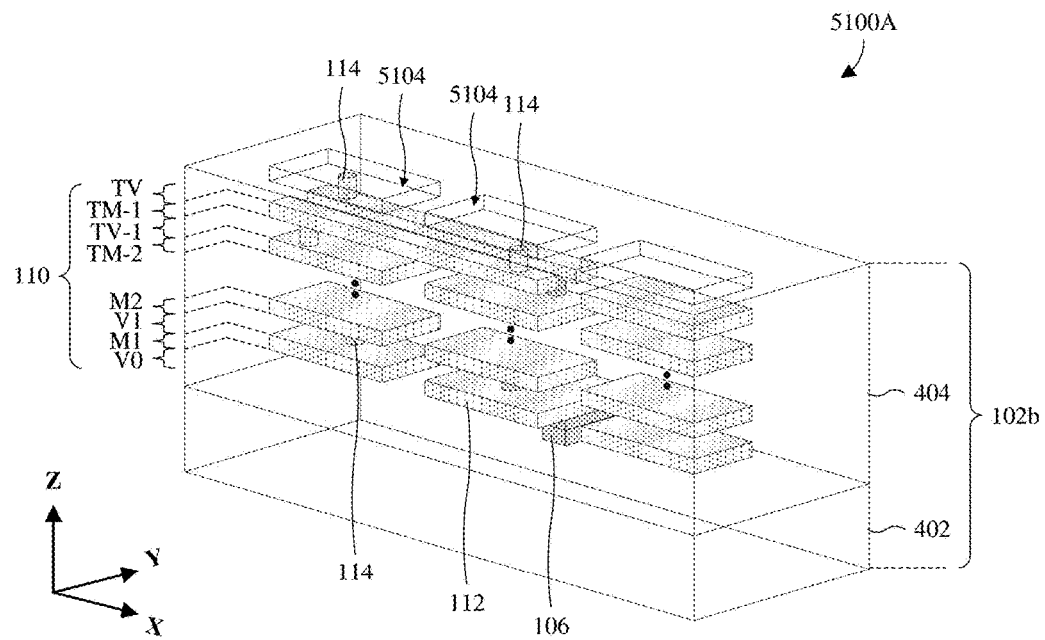
Figure 51B:
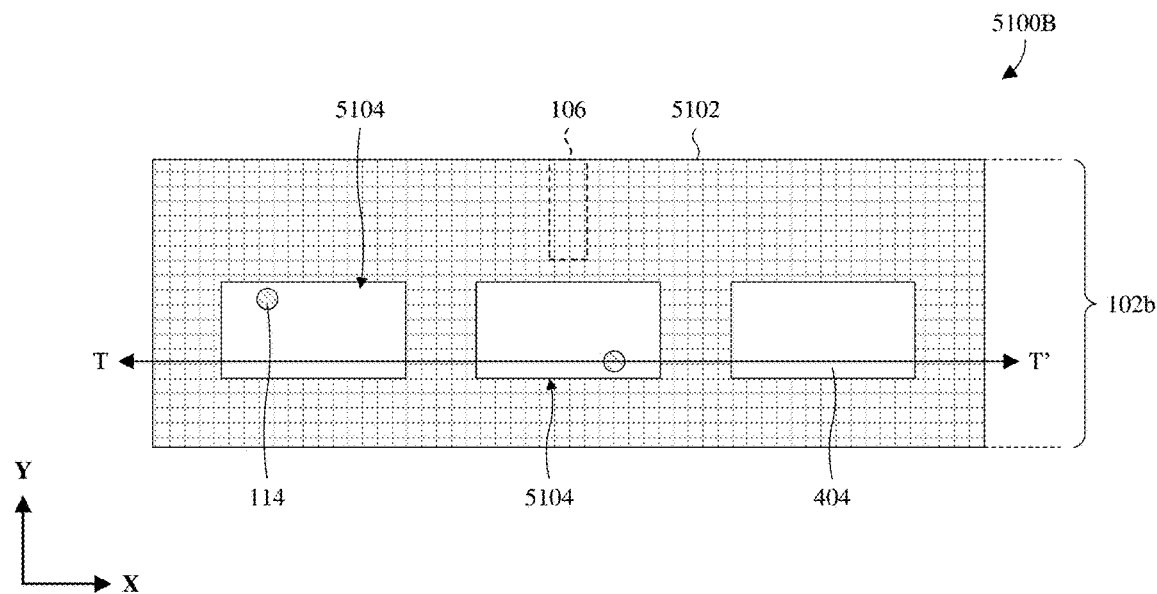
Figure 51C:
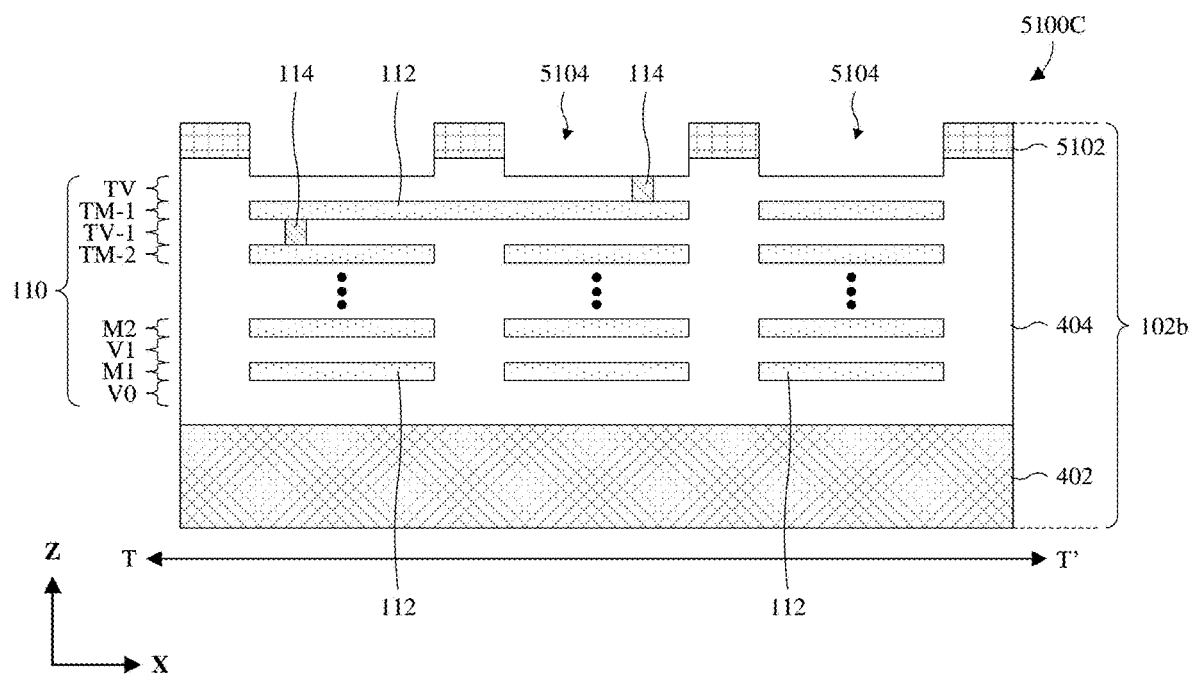

As illustrated by the views 5100A-5100C of FIGS. 51A-51C, the filling process of FIGS. 48A-48C is repeated to form a TV layer in the set of TV openings 5004 (see, e.g., FIGS. 50A-50C. Further, additional dielectric material is deposited to extend the interconnect dielectric layer 404 over the TV layer, and the patterning process of FIGS. 47A-47C is repeated using a TM photoresist mask 5102 (e.g., formed from a TM photoreticle/photomask) in place of the TM-2 photoresist mask 4704 to form a set of TM openings 5104. Note that the TM photoresist mask 5102 is not shown in FIG. 51A.

Figure 52:
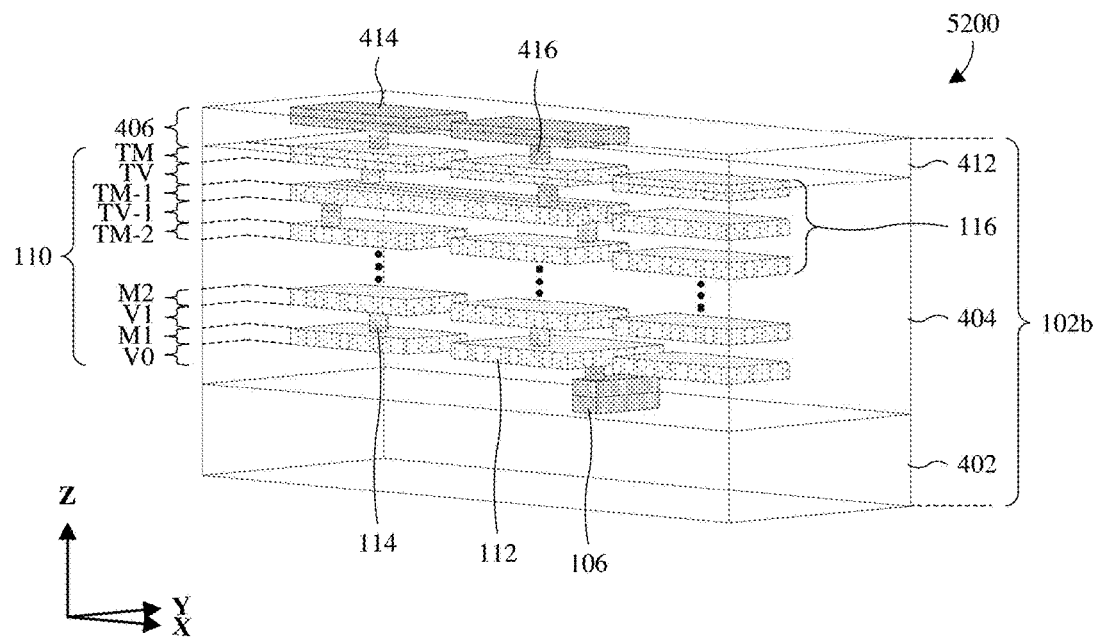

As illustrated by the perspective view 5200 of FIG. 52, the filling process of FIGS. 48A-48C is repeated to form a TM layer in the set of TM openings 5104 (see, e.g., FIGS. 51A-51C). This completes the interconnect structure 110 and forms a frontside pad/bridge structure 116, additional views of which may be found at FIGS. 13 and 14A-14C. Additionally, an HB structure 406 is formed overlying and electrically coupled to the interconnect structure 110. The HB structure 406 is as its counterpart is described with regard to FIG. 46.

Figure 53:
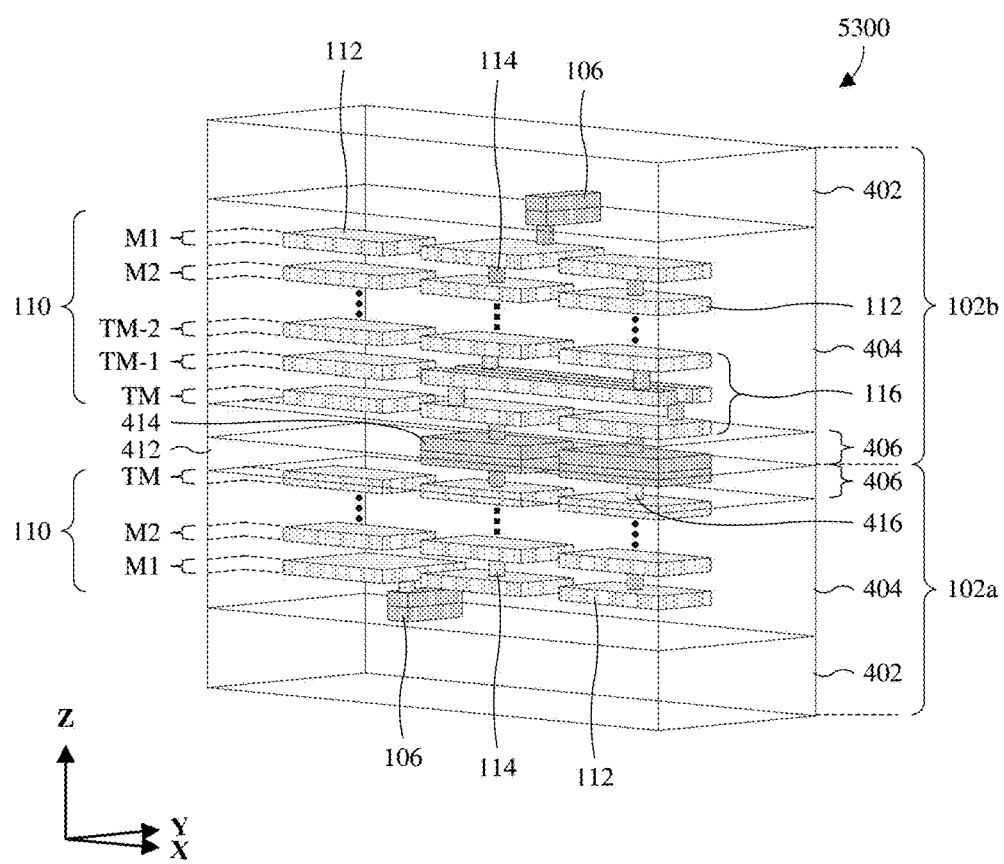

As illustrated by the perspective view 5300 of FIG. 53, the second IC die 102b of FIG. 52 is vertically flipped and hybrid bonded to the first IC die 102a of FIG. 46. As described above, hybrid bonding involves at least two types of bonding: metal-to-metal bonding; and non-metal-to-non-metal bonding. Bonding between the HB layers 414 corresponds to the metal-to-metal bonding, and bonding between the HB dielectric layers 412 corresponds to the non-metal-to-non-metal bonding. Further, in some embodiments, pads of the HB layers 414 may have different widths or the same widths.

In at least some embodiments, a process for performing the hybrid bonding comprises bonding individual surfaces respectively of the first and second IC dies 102a, 102b together. The individual surface of the first IC die 102a is formed by the HB layer 412 of the first IC die 102a and the HB layer 414 of the first IC die 102a, whereas the individual surface of the second IC die 102b is formed by the HB layer 412 of the second IC die 102b and the HB layer 414 of the second IC die 102b. In some embodiments, during the bonding, the HB dielectric layers 412 are bonded together through fusion bonding or the like and pads of the HB layers 414 are bonded together through metal-to-metal bonding or the like. In some embodiments, before the bonding, the process further comprises planarization (e.g., a CMP or the like), surface activation (e.g., plasma treatment or the like), cleaning, or the like to the surfaces to be bonded together.

The bonding may, for example, comprise alignment of the surfaces to be bonded together, contacting the surfaces together, and annealing the surfaces while in contact. In at last some embodiments, during the contacting and the annealing (e.g., when temperature rises), silicon-oxygen-hydrogen (e.g., Si—OH) bonds on surfaces of the HB dielectric layers 412 break to form strong silicon-oxygen-silicon (e.g., Si—O—Si) bonds, thereby bonding the HB dielectric layers 412 together through fusion bonds and through Van Der Waals force. Further, in at last some embodiments, metal (e.g., copper or some other suitable metal) of the HB layers 414 inter-diffuses, whereby metal-to-metal bonds are also formed. Hence, the resulting bonds between the first and second IC dies 102a, 102b are hybrid bonds.

During the contacting, a small pressing force is applied to press the first and second IC dies 102a, 102b against each other. The contacting may, for example, be performed at the room temperature, although higher temperatures may be used. The annealing increases the bond strength and, during the annealing, temperature rises. In some embodiments, the annealing is performed at a temperature of more than 250 degrees Celsius or some other suitable temperature. For example, the annealing may be performed at a temperature of 250-350 degrees Celsius, 300-400 degrees Celsius, or some other suitable temperature. Further, in some embodiments, the annealing is performed for about 1-2 hours or some other suitable amount of time.

Figure 54:
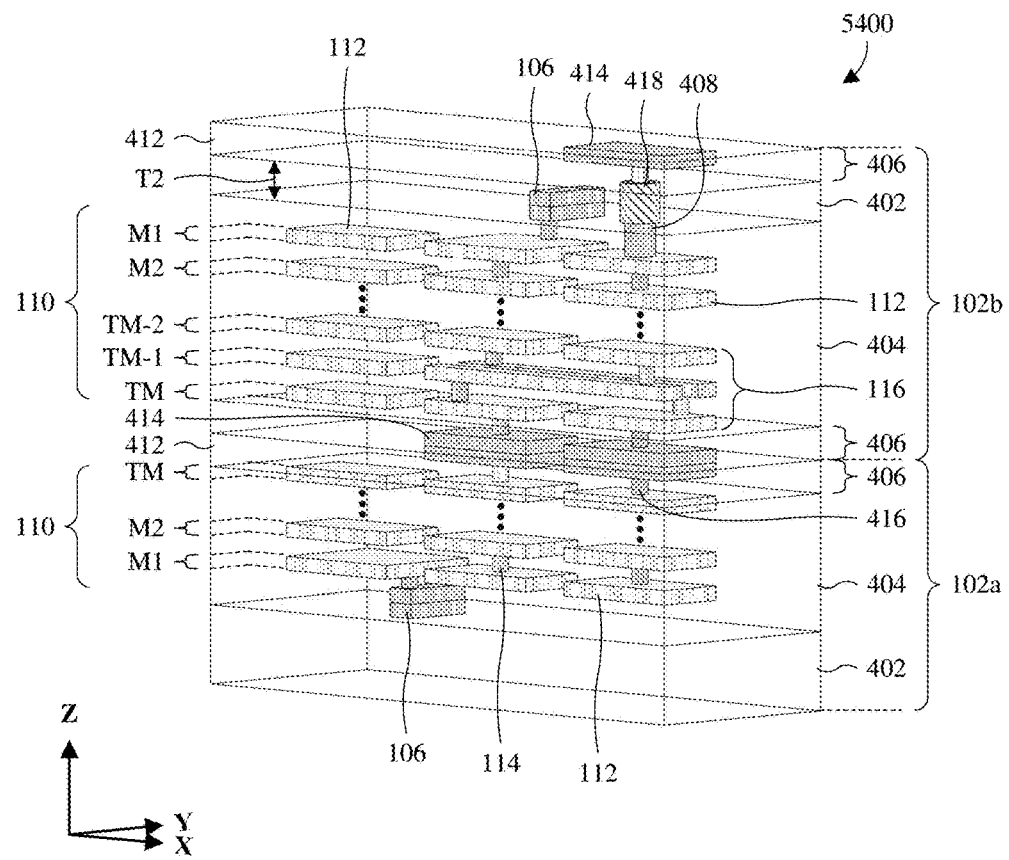

As illustrated by the perspective view 5400 of FIG. 54, the semiconductor substrate 402 of the second IC die 102b is thinned to reduce a thickness T2 of the semiconductor substrate 402. Further, a TSV 408 is formed extending through the semiconductor substrate 402 of the second IC die 102b, and an additional HB structure 406 is formed overlying the second IC die 102b on a backside of the semiconductor substrate 402 of the second IC die 102b. The additional HB structure 406 is as the other HB structures 406 are described above, except it has a lesser number of HB layers. Further, the additional HB structure 406 is electrically coupled to the interconnect structure 110 of the second IC die 102b by the TSV 408, which is separated from the semiconductor substrate 402 of the second IC die 102b by a TSV dielectric layer 418.

Figure 55:
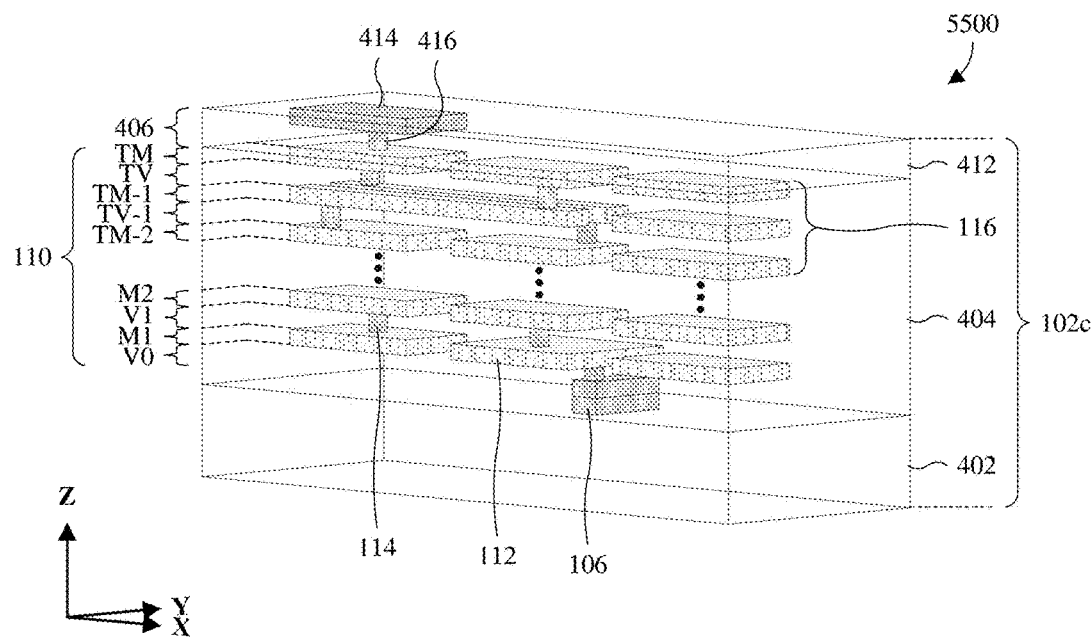

As illustrated by the perspective view 5500 of FIG. 55, the acts described with regard to FIGS. 47A-47C to FIGS. 51A-51C and FIG. 52 are repeated as described above to form a third IC die 102c. The third IC die 102c is as the second IC die 102b is illustrated in FIG. 52, except that the number of HB layers 414 is less. In alternative embodiments, the third IC die 102c has the same number of HB layers 414 as the second IC die 102b.

While the acts described with regard to FIGS. 47A-47C to FIGS. 51A-51C and FIG. 52 form the TM-2, TM-1, TM, TV-1, and TV layers of the second and third IC dies 102b, 102c using a single damascene process, it is to be appreciated that a dual damascene process may alternatively be used. The single damascene process was chosen for ease and clarity of illustration. In accordance with the dual damascene process, the TM and TV layers may be concurrently formed from the same conductive layer, the TM-1 and TV-1 layers may be concurrently formed from the same conductive layer, and the TM-2 layer and a TV-2 layer (not shown) may be concurrently formed from the same conductive layer.

The frontside pad/bridge structures 116 of the second and third IC dies 102b, 102c have a shared frontside pad/bridge layout, such the frontside pad/bridge structures 116 have the same layouts (e.g., top layouts, cross-sectional layouts, etc.) and may hence be regarded as the same. As a result, the TM-2, TM-1, TM, TV-1, and TV layers of the third IC die 102c may have the same layouts (e.g., top layouts, cross-sectional layouts, etc.) and may hence be regarded as the same respectively as the TM-2, TM-1, TM, TV-1, and TV layers of the second IC die 102b. Further, the TM-2, TM-1, TM, TV-1, and TV layers of the third IC die 102c may be formed from the same set of photoreticles/photomasks used to form the TM-2, TM-1, TM, TV-1, and TV layers of the second IC die 102b. For example, the TM-2, TV-1, TM-1, TV, and TM photoresist masks 4704, 4802, 4902, 5002, 5102 and the corresponding photoreticles/photomasks described above with regard to FIGS. 47A-47C to FIGS. 51A-51C may be the same while forming the third IC die 102c as while forming the second IC die 102b.

As seen hereafter, the frontside pad/bridge structures 116 provide bridging to facilitate electrical coupling of backside pads hereafter formed to the semiconductor devices 106 of the second and third IC dies 102b, 102c. The shared frontside pad/bridge layout shared by the frontside pad/bridge structures 116 allows the bridging to be the same at the second and third IC dies 102b, 102c. As described above, this enables the frontside pad/bridge structures 116 to be formed from the same set of photoreticles/photomasks. Use of the same set of photoreticles/photomasks may reduce costs compared to using separate sets of photoreticles/photomasks to form different frontside pad/bridge structures.

In some embodiments, the interconnect structures 110 of the second and third IC dies 102b, 102c respectively at FIGS. 52 and 55 are the same. In some embodiments, the second and third IC dies 102b, 102c respectively at FIGS. 52 and 55 are the same, except for the HB structures 406. In other embodiments, the second and third IC dies 102b, 102c respectively at FIGS. 52 and 55 are the same, including the HB structures 406.

Figure 56:
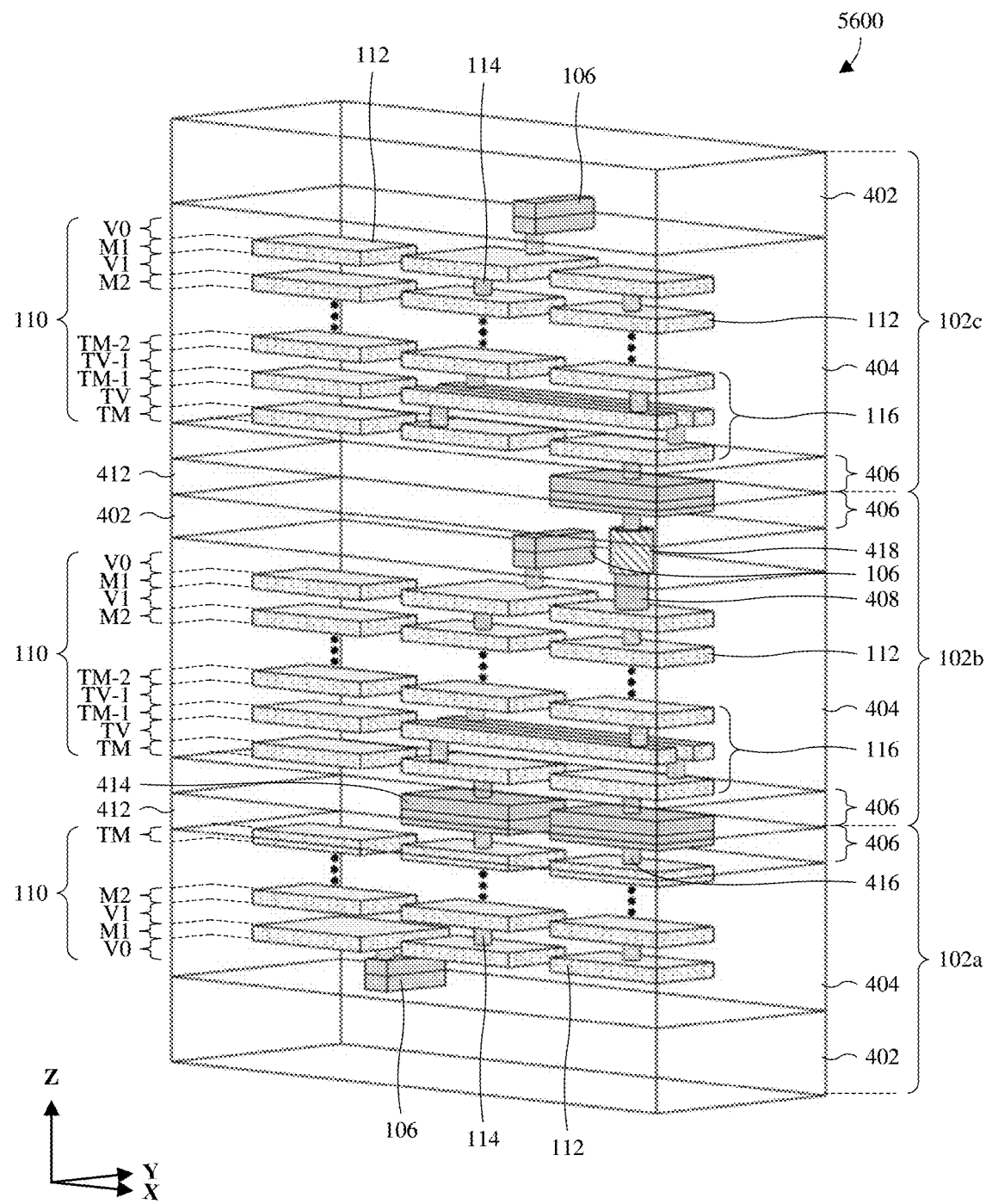

As illustrated by the perspective view 5600 of FIG. 56, the third IC die 102c of FIG. 55 is vertically flipped and hybrid bonded to the second IC die 102b of FIG. 54.

Figure 57:
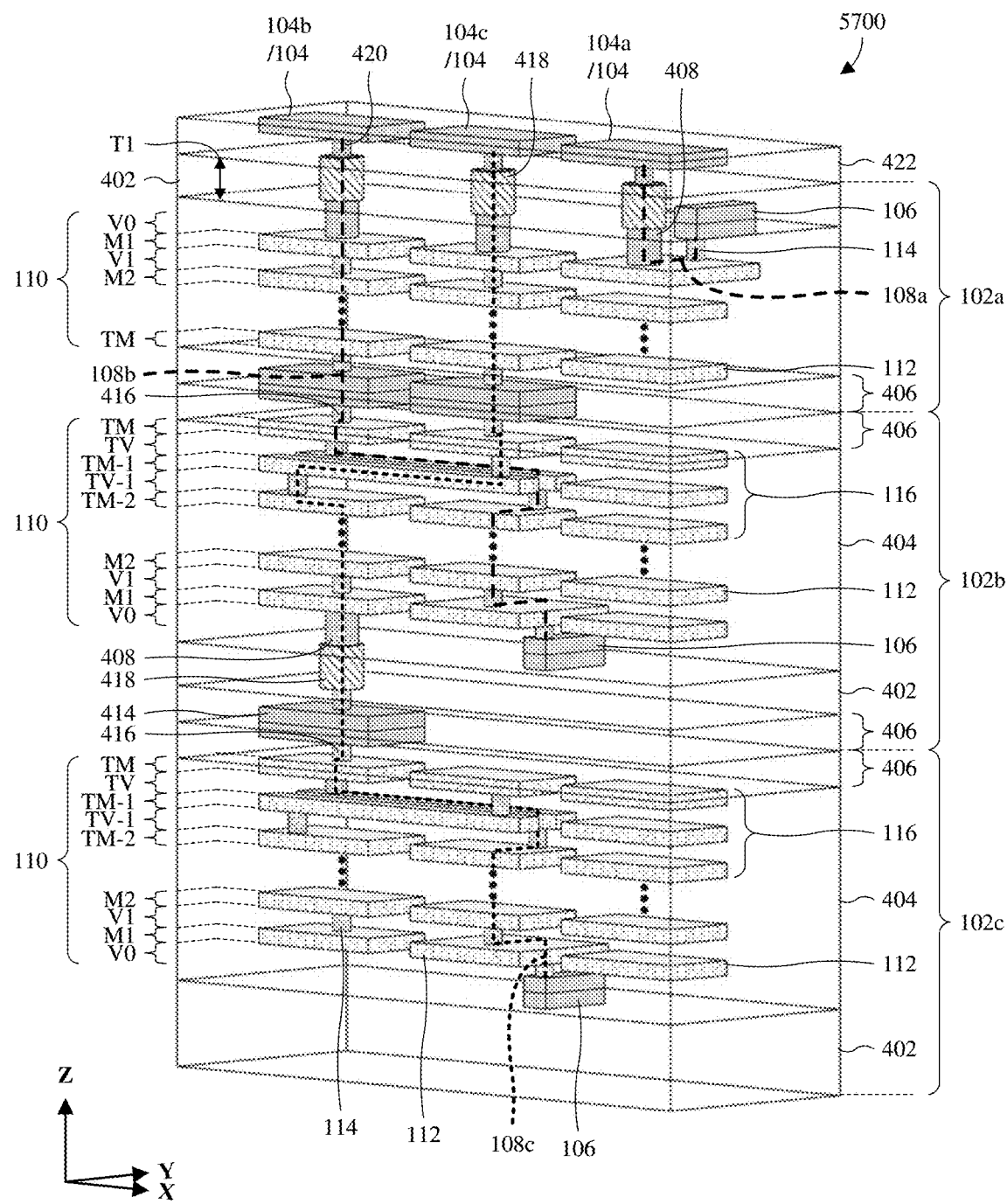

As illustrated by the perspective view 5700 of FIG. 57, the semiconductor structure of FIG. 56 is vertically flipped and the semiconductor substrate 402 of the first IC die 102a is thinned to reduce a thickness T1 of the semiconductor substrate 402. Further, additional TSVs 408 are formed extending through the semiconductor substrate 402 of the first IC die 102a, and a plurality of backside pads 104 and a plurality of backside vias 420 are formed.

The backside pads 104 and the backside vias 420 overlie the first IC die 102a, and are inset into a backside dielectric layer 422, on a backside of the semiconductor substrate 402 of the first IC die 102a. Further, the backside pads 104 are arranged in a row, and the backside vias 420 extend respectively from the backside pads 104 respectively to the additional TSVs 408. The additional TSVs 408 extend respectively from the backside vias 420 to the interconnect structure 110 of the first IC die 102a and are separated from the semiconductor substrate 402 of the first IC die 102a by additional TSV dielectric layers 418.

A first-die backside pad 104a is electrically coupled to the semiconductor device 106 of the first IC die 102a by a first-die conductive path 108a. A second-die backside pad 104b is electrically coupled to the semiconductor device 106 of the second IC die 102b by a second-die conductive path 108b formed in part by the frontside pad/bridge structure 116 of the second IC die 102b. A third-die backside pad 104c is electrically coupled to the semiconductor device 106 of the third IC die 102c by a third-die conductive path 108c formed in part by the frontside pad/bridge structures 116 of the second and third IC dies 102b, 102c.

While FIGS. 46, 47A-47C to 51A-51C, and 52-57 are described with reference to a method, it will be appreciated that the structures shown in FIGS. 46, 47A-47C to 51A-51C, and 52-57 are not limited to the method but rather may stand alone separate of the method. While FIGS. 46, 47A-47C to 51A-51C, and 52-57 are described as a series of acts, it will be appreciated that the order of the acts may be altered in other embodiments. While FIGS. 46, 47A-47C to 51A-51C, and 52-57 illustrate and describe as a specific set of acts, some acts that are illustrated and/or described may be omitted in other embodiments. Further, acts that are not illustrated and/or described may be included in other embodiments.

Figure 58:
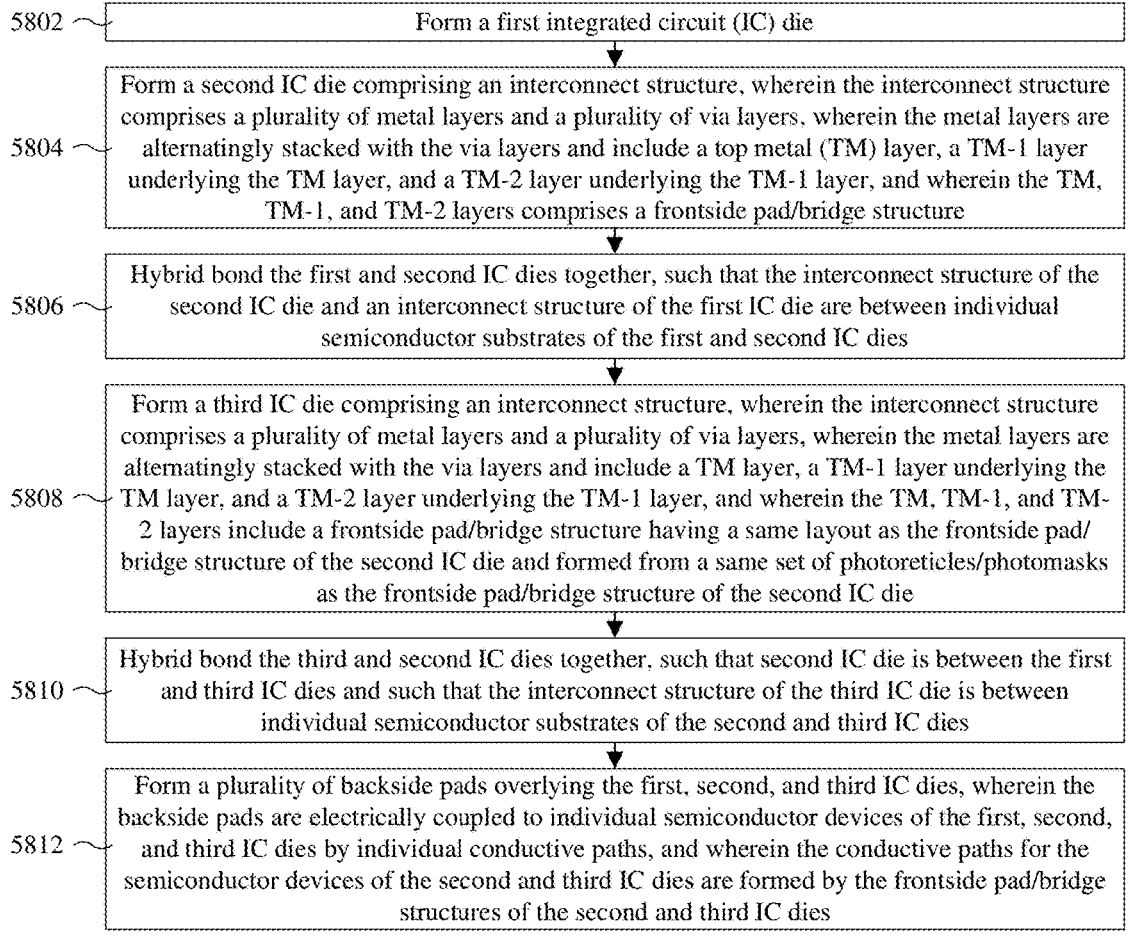
FIG. 58 illustrates a block diagram of some embodiments of the method of FIGS. 46, 47A-47C to 51A-51C, and 52-57.

With reference to FIG. 58, a block diagram of some embodiment of some embodiments of the method of FIGS. 46, 47A-47C to 51A-51C, and 52-57 is provided.

At 5802, a first IC die is formed. See, for example, FIG. 46.

At 5804, a second IC die comprising an interconnect structure is formed, wherein the interconnect structure comprises a plurality of metal layers and a plurality of via layers, wherein the metal layers are alternatingly stacked with the via layers and include a TM layer, a TM-1 layer underlying the TM layer, and a TM-2 layer underlying the TM-1 layer, and wherein the TM, TM-1, and TM-2 layers comprises a frontside pad/bridge structure. See, for example, FIGS. 47A-47C to 51A-51C and 52.

At 5806, the first and second IC dies are hybrid bonded together, such that the interconnect structure of the second IC die and an interconnect structure of the first IC die are between individual semiconductor substrates of the first and second IC dies. See, for example, FIG. 53.

At 5808, a third IC die comprising an interconnect structure is formed, wherein the interconnect structure comprises a plurality of metal layers and a plurality of via layers, wherein the metal layers are alternatingly stacked with the via layers and include a TM layer, a TM-1 layer underlying the TM layer, and a TM-2 layer underlying the TM-1 layer, and wherein the TM, TM-1, and TM-2 layers include a frontside pad/bridge structure having a same layout as the frontside pad/bridge structure of the second IC die and formed from a same set of photoreticles/photomasks as the frontside pad/bridge structure of the second IC die. See, for example, FIG. 55.

At 5810, the second and third IC dies are hybrid bonded together, such that second IC die is between the first and third IC dies and such that the interconnect structure of the third IC die is between individual semiconductor substrates of the second and third IC dies. See, for example, FIGS. 54 and 56.

At 5812, a plurality of backside pads is formed overlying the first, second, and third IC dies, wherein the backside pads are electrically coupled to individual semiconductor devices of the first, second, and third IC dies by individual conductive paths, and wherein the conductive paths for the semiconductor devices of the second and third IC dies are formed by the frontside pad/bridge structures of the second and third IC dies. See, for example, FIG. 57.

While the block diagram 5800 of FIG. 58 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 59, 60A-60C to 64A-64C, and 65-74, a series of views of some alternative embodiments of the method of FIGS. 46, 47A-47C to 51A-51C, and 52-57 is provided in which the 3D IC comprises additional IC dies. Figures with a label suffixed by "A" or no letter correspond to perspective views, and figures with a label suffixed by "B" correspond to top layouts. Figures with a label suffixed by "C" correspond to cross-sectional views along line U-U' in like numbered figures with a label suffixed by "B". The method may, for example, be employed to form the 3D IC of FIGS. 24 and 25A-25H or some other suitable 3D IC.

Figure 59:
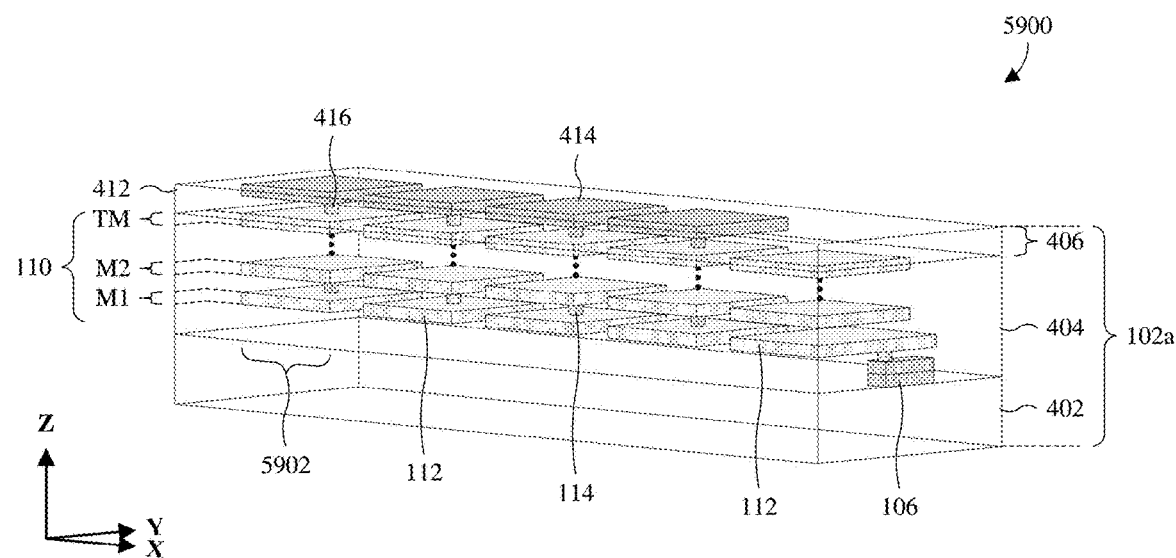
FIGS. 59, 60A-60C to 64A-64C, and 65-74 illustrate a series of views of some alternative embodiments of the method of FIGS. 46, 47A-47C to 51A-51C, and 52-57 in which the 3D IC comprises additional IC dies.
Figure 60A:
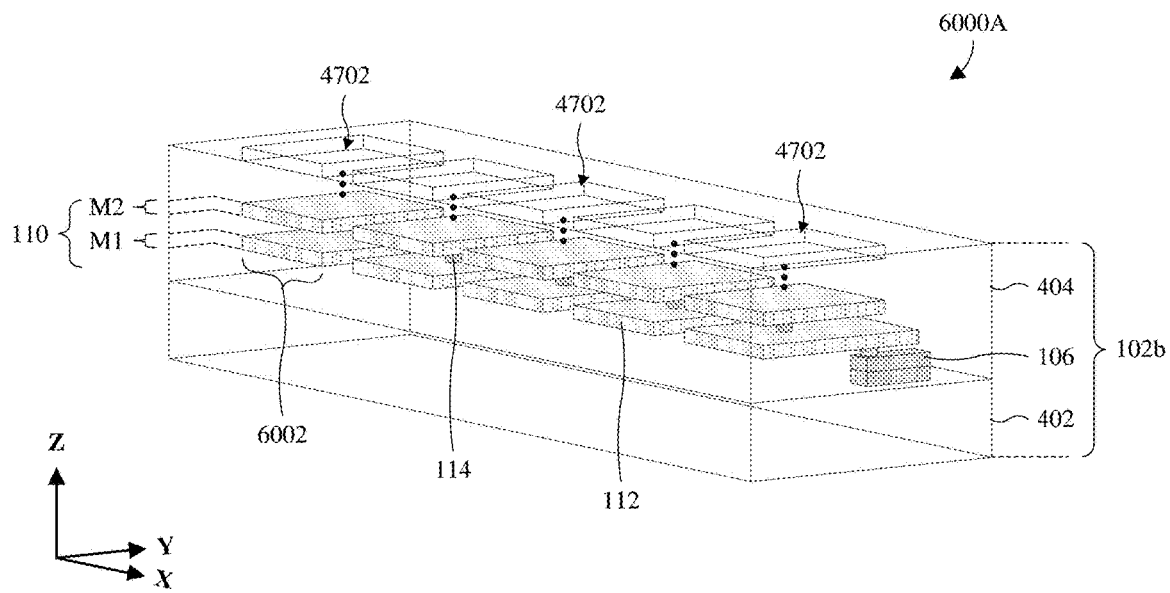
Figure 60B:
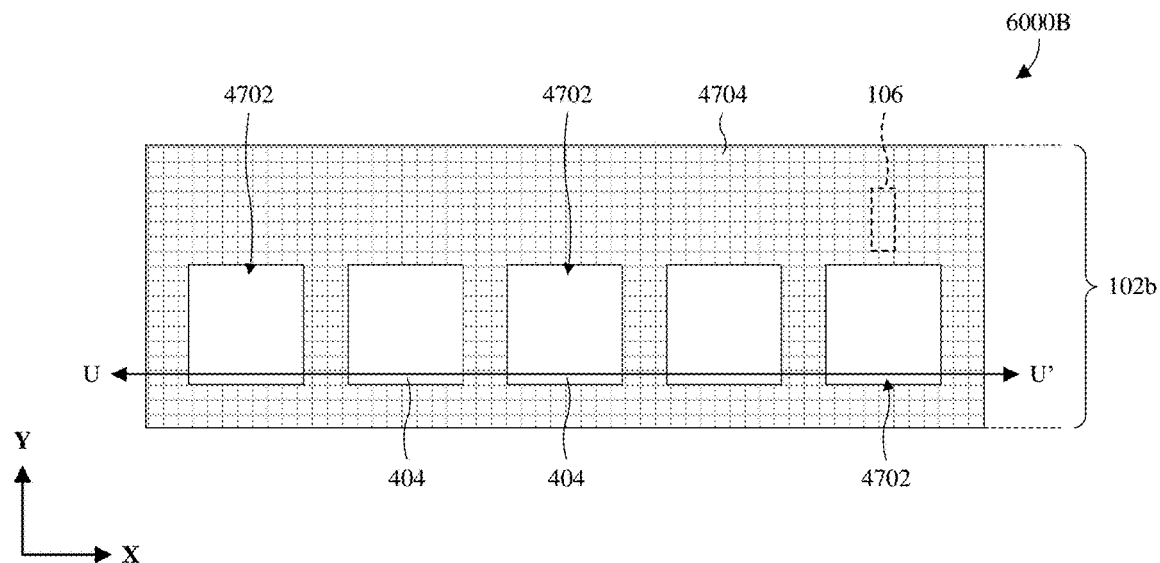
Figure 60C:
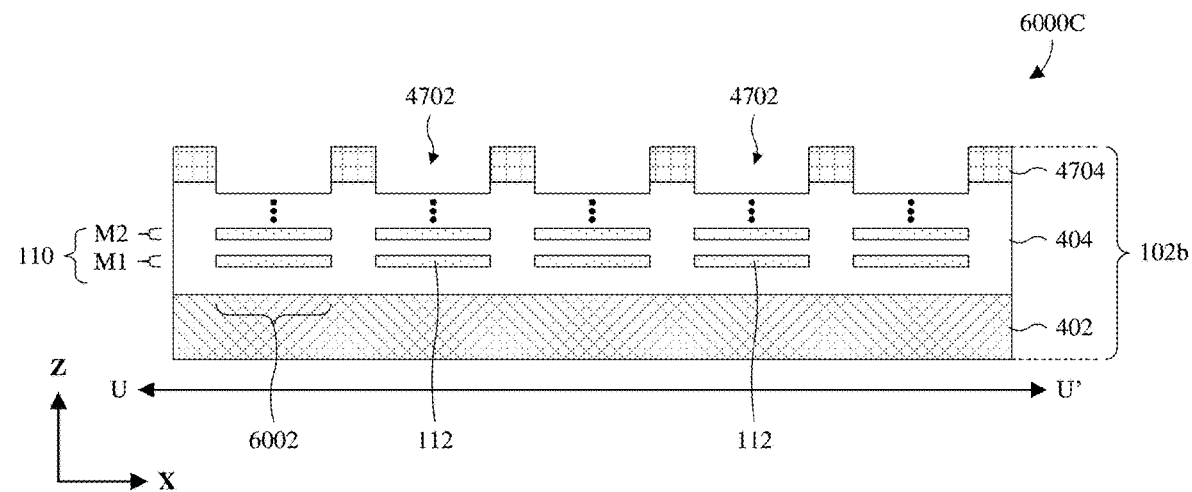
Figure 61A:
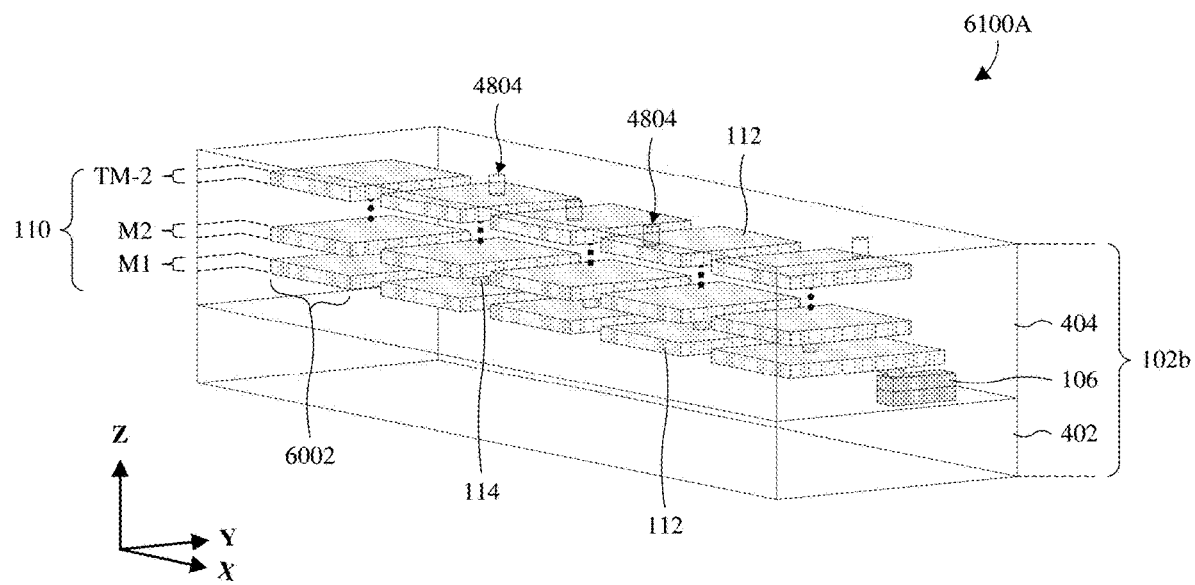
Figure 61B:
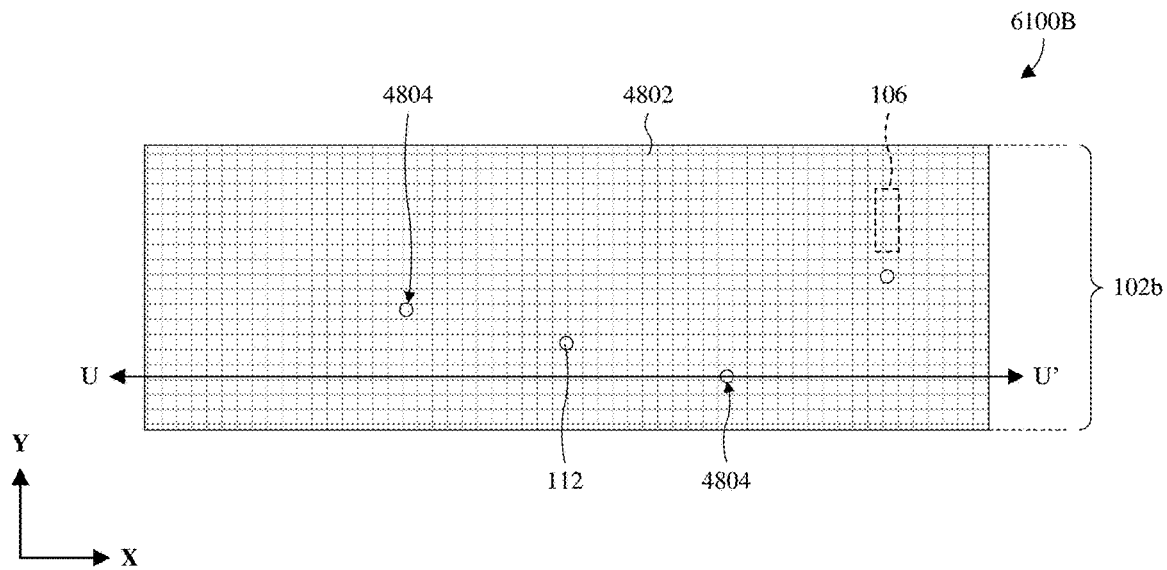
Figure 61C:
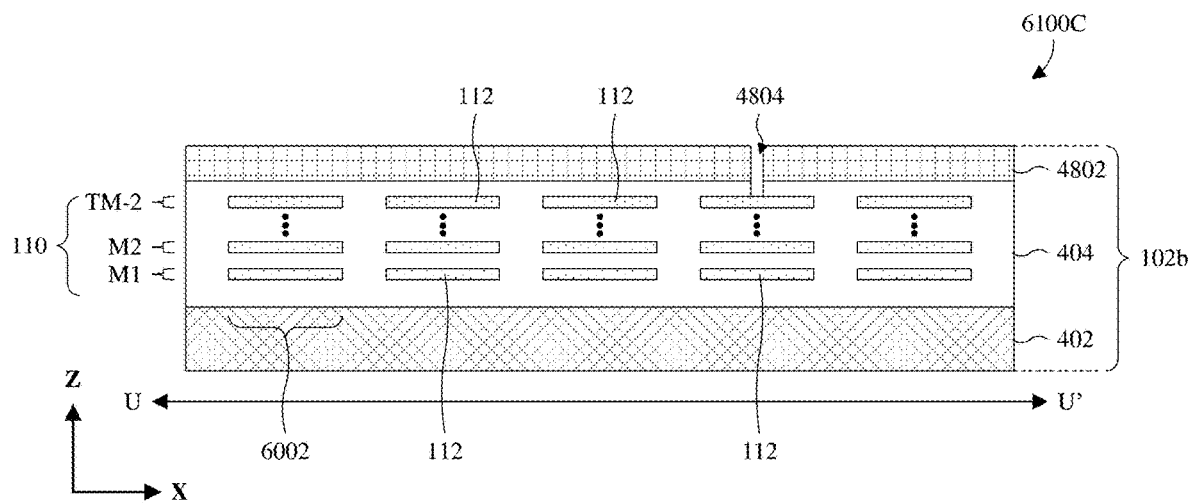
Figure 62A:
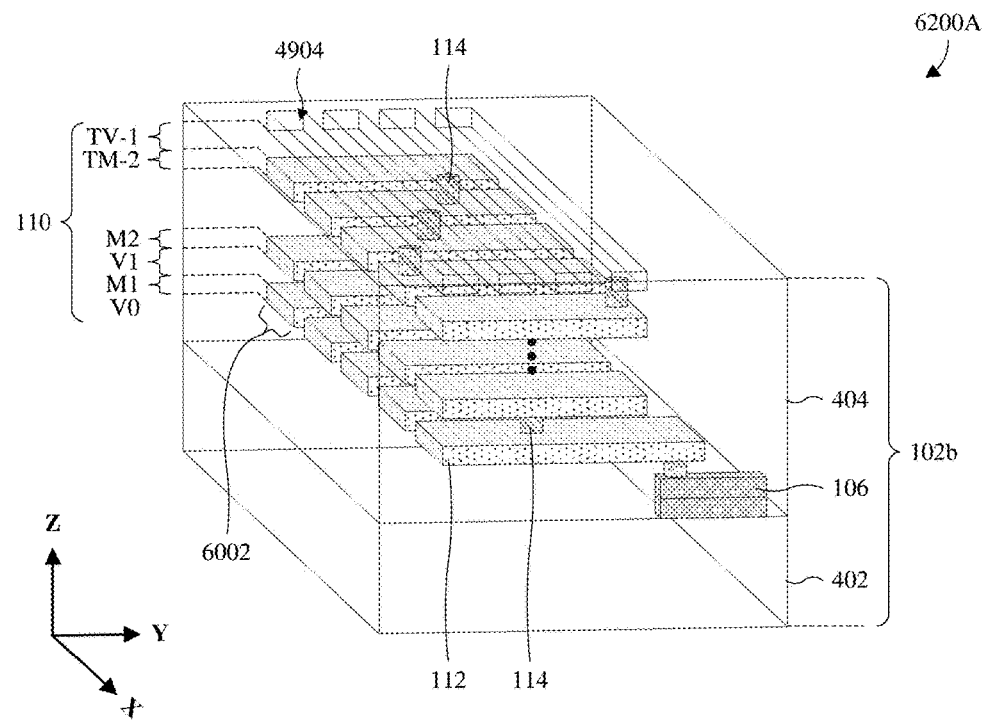
Figure 62B:
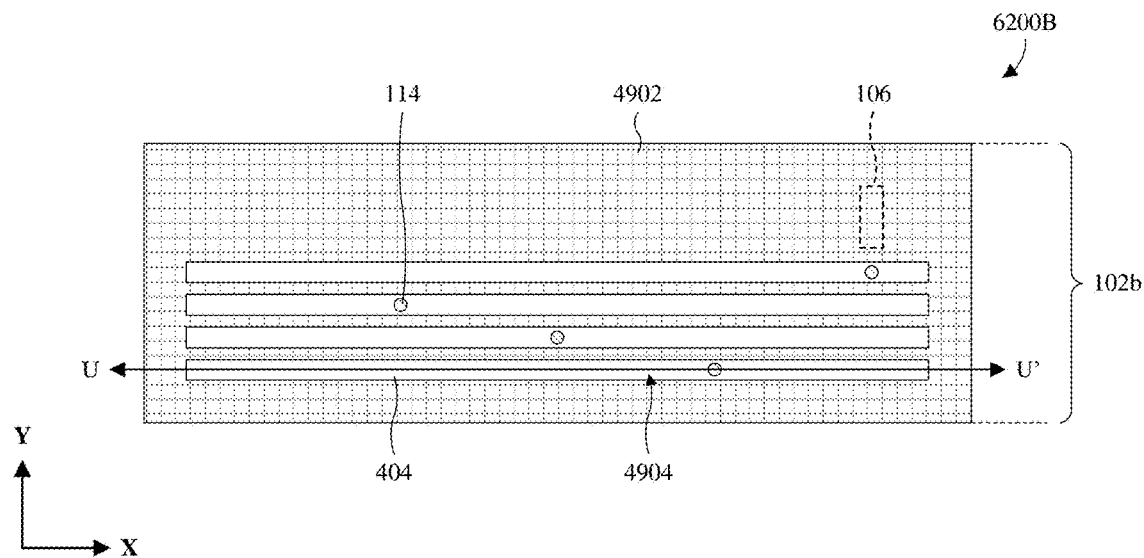
Figure 62C:
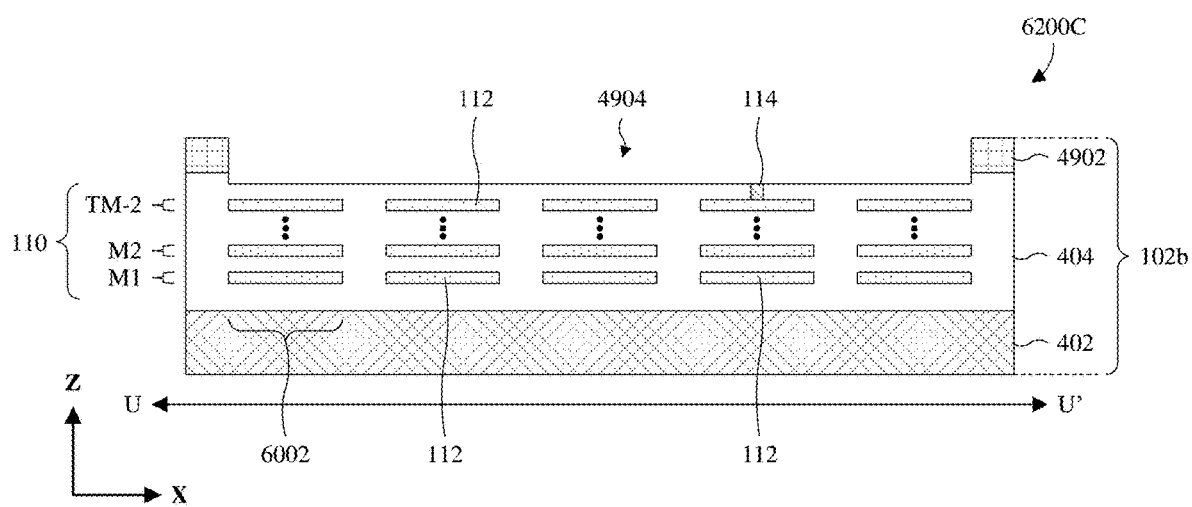
Figure 63A:
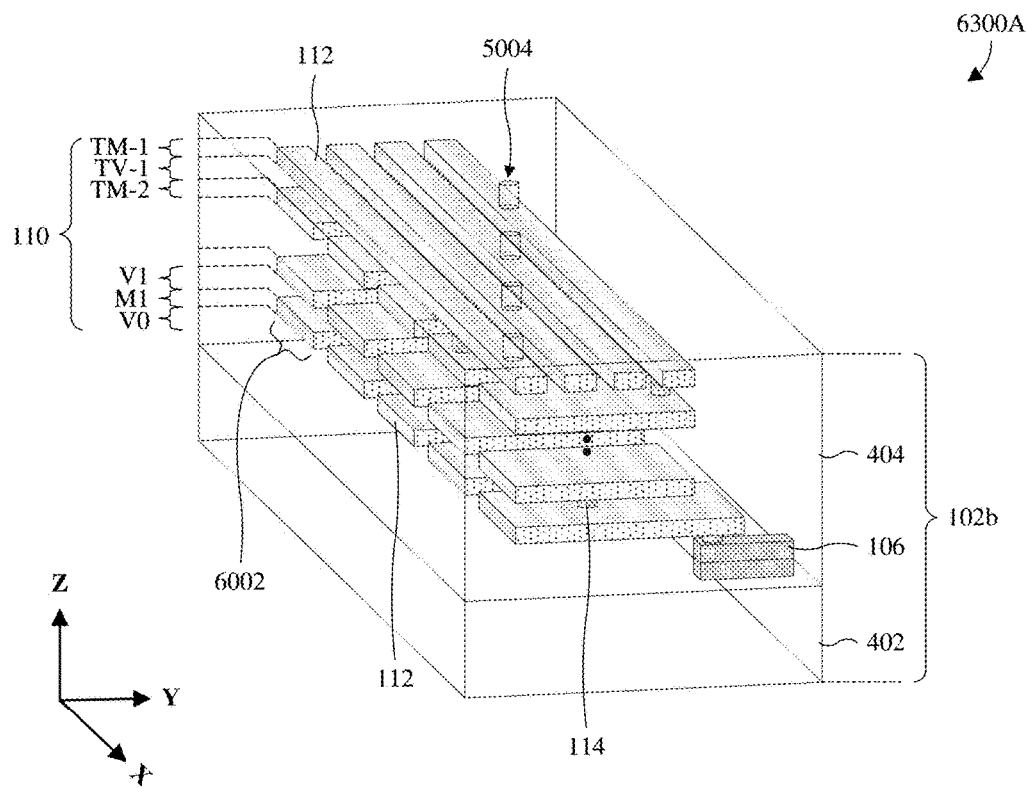
Figure 63B:
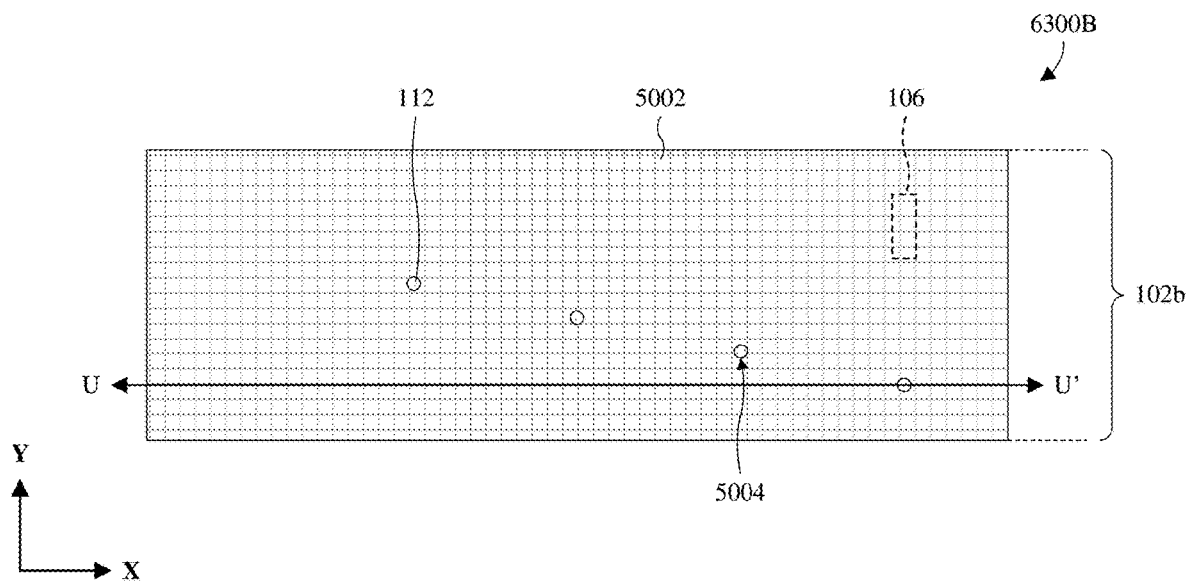
Figure 63C:
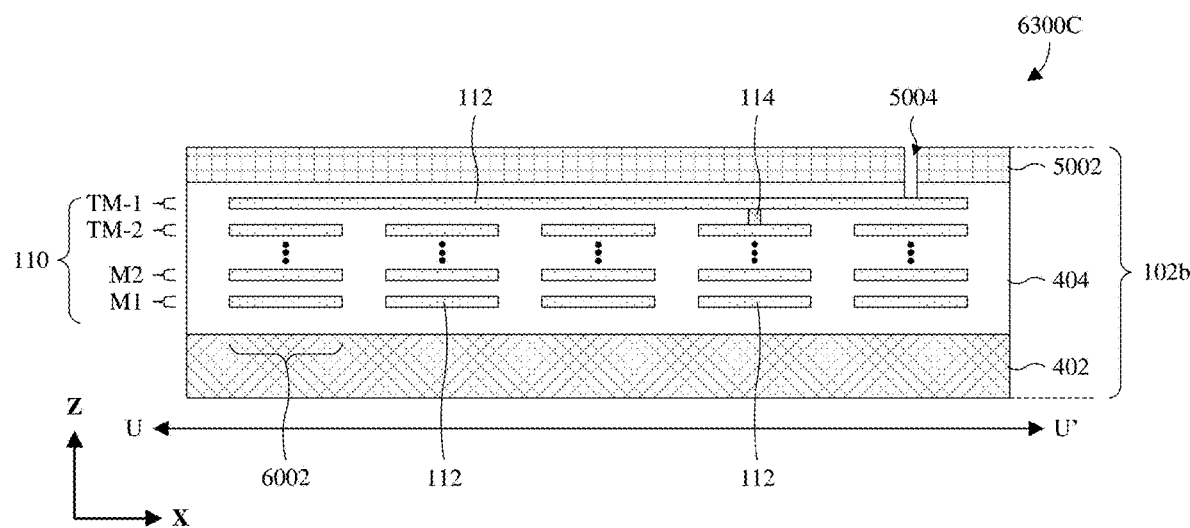
Figure 64A:
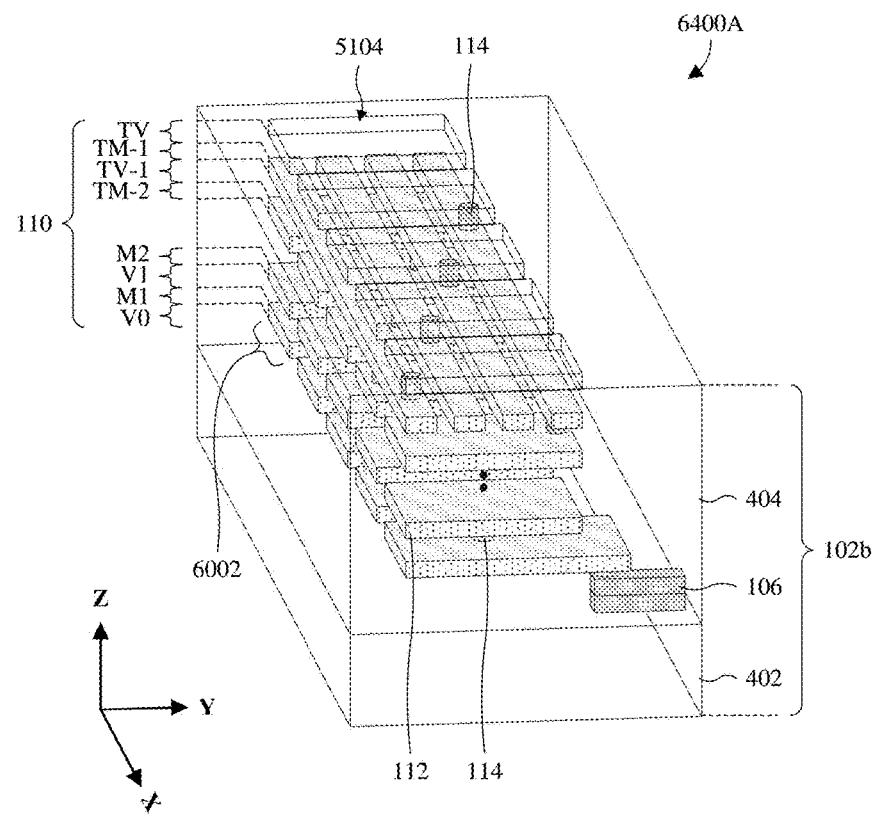
Figure 64B:
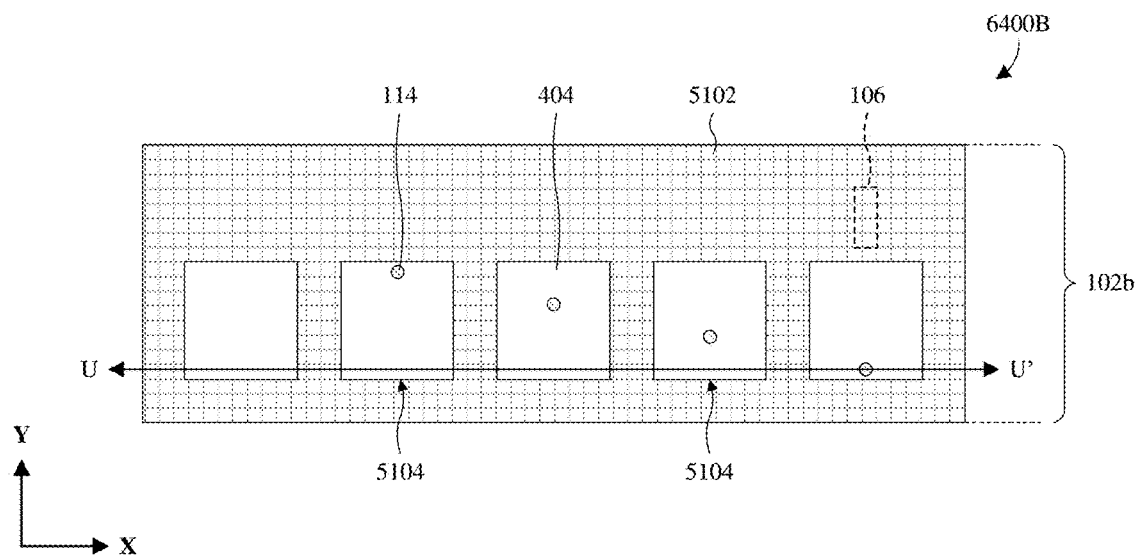
Figure 64C:
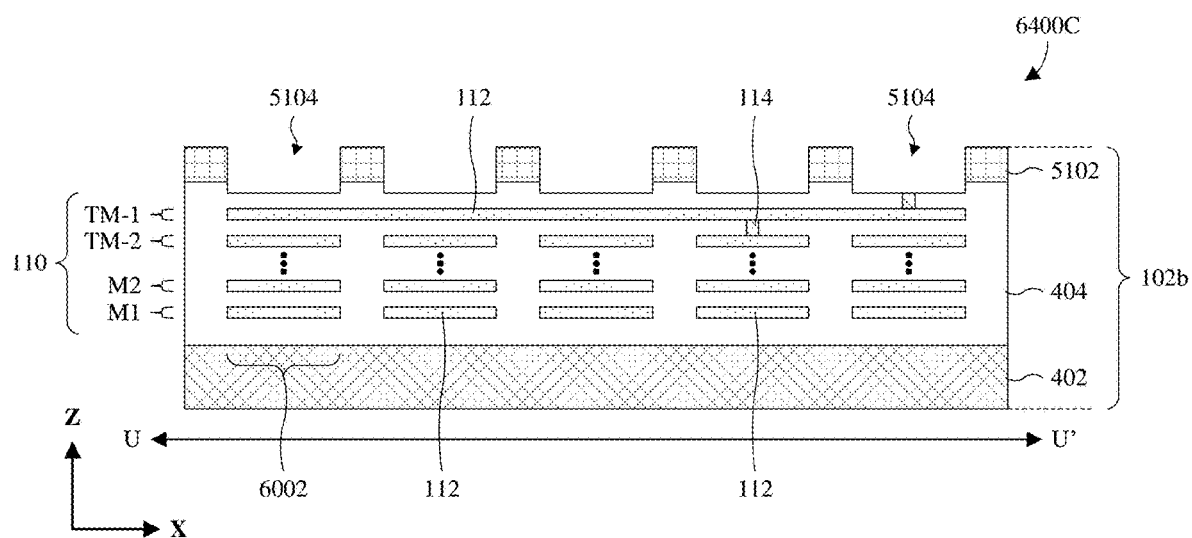

As illustrated by the perspective view 5900 of FIG. 59, the acts described with regard to FIG. 46 are performed to form a first IC die 102a. The first IC die 102a is as described with regard to FIG. 46 except for additional columnar structures (e.g., a columnar structure 5902).

Figure 65:
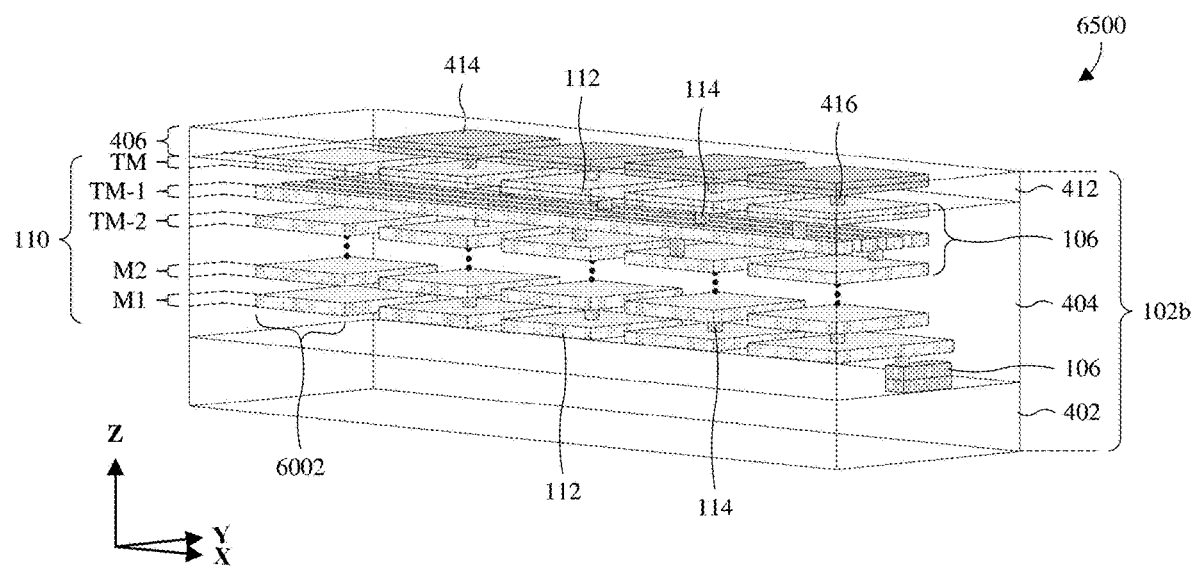

As illustrated by the views 6000A-6000C to 6400-6400C of FIGS. 60A-60C to 64A-64C, as well as the perspective view 6500 of FIG. 65, the acts described with regard to FIGS. 47A-47C to 51A-51C and FIG. 52 are respectively performed to form a second IC die 102b. The second IC die 102b is as described with regard to FIGS. 47A-47C to 51A-51C and FIG. 52 except for: 1) additional columnar structures (e.g., a columnar structure 6002); and 2) a shared frontside pad/bridge layout modified to accommodate the additional IC dies. Further, additional views of the frontside pad/bridge structure 116 may be found at FIGS. 22 and 23A-23C.

Figure 66:
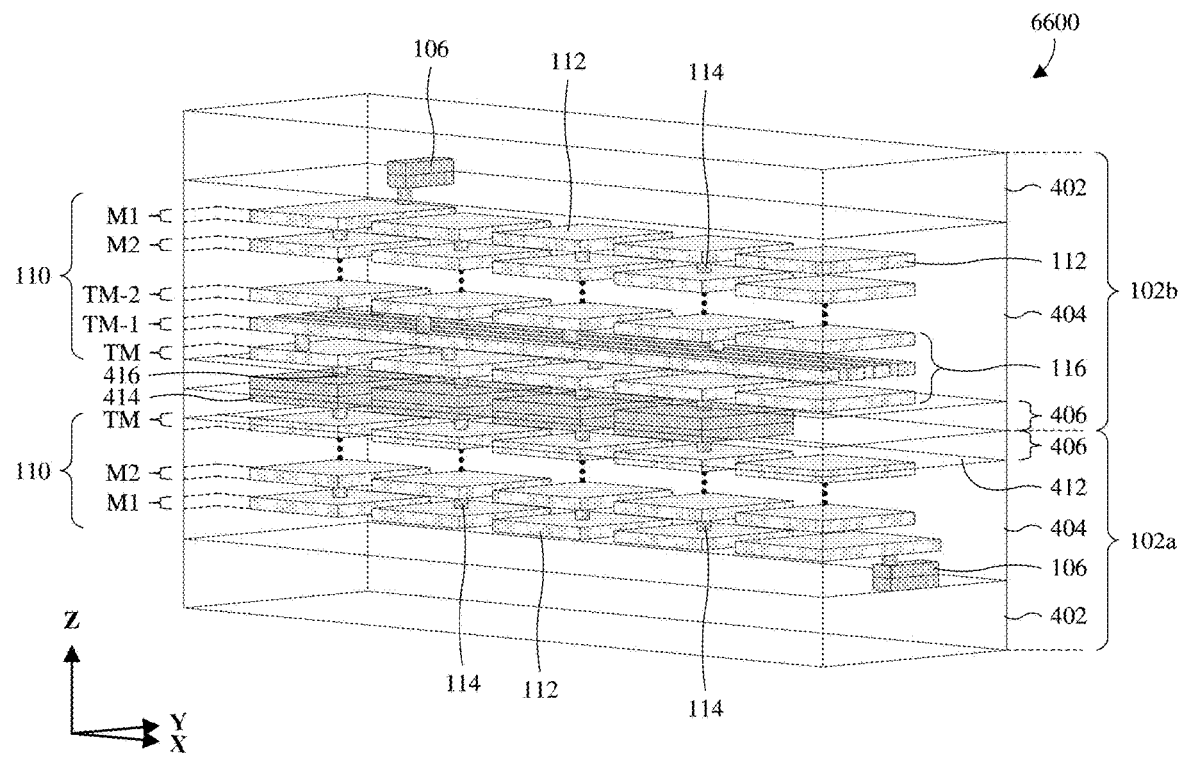
Figure 67:
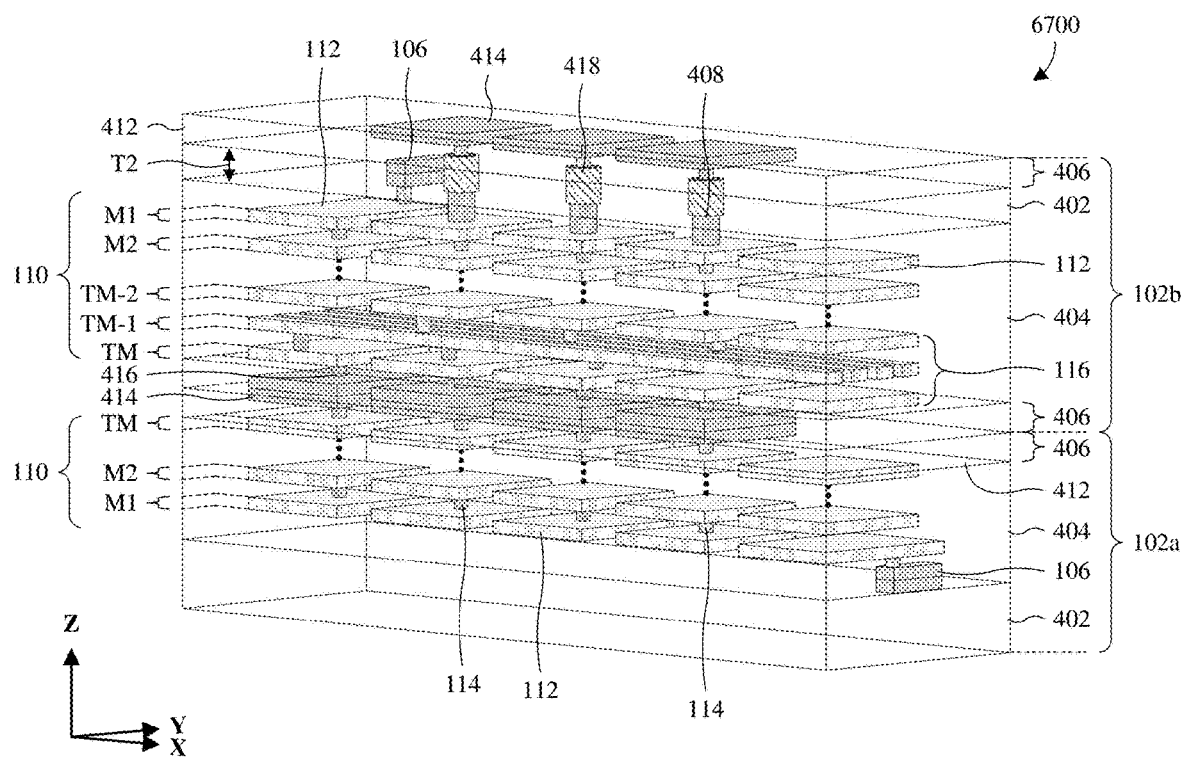

As illustrated by the perspective views 6600 and 6700 of FIGS. 66 and 67, the acts described with regard to FIGS. 53 and 54 are respectively performed. As such, the second IC die 102b is hybrid bonded to the first IC die 102a at FIG. 66. Additionally, an additional HB structure 406 is formed over the second IC die 102b at FIG. 67 and with a lesser number of HB layers 414 (e.g., one less) than the other HB structure of the second IC die 102b.

Figure 68:
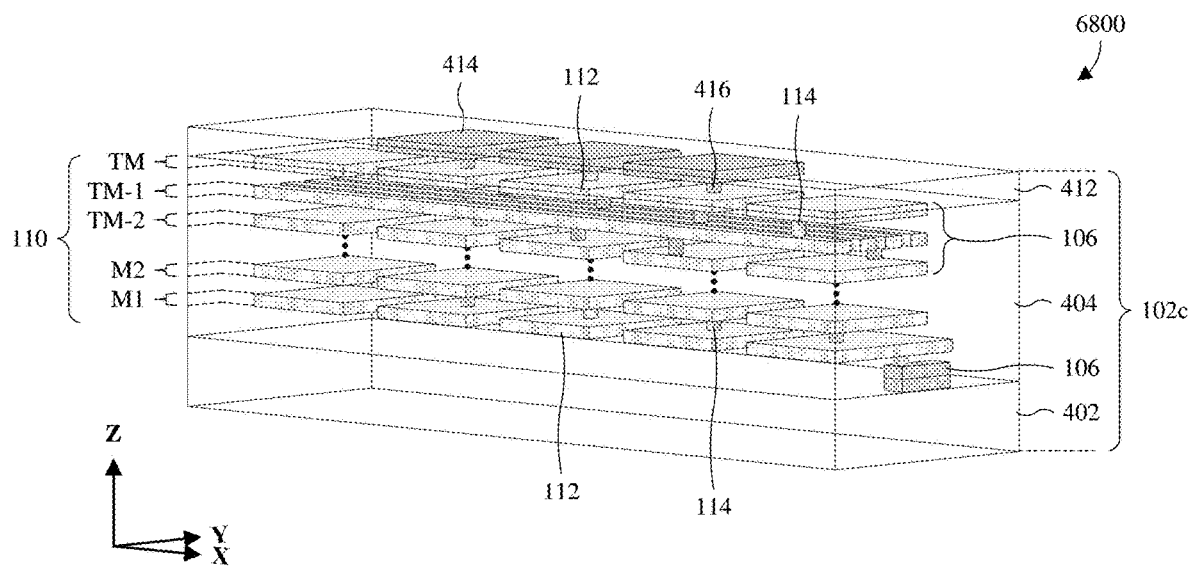

As illustrated by the perspective view 6800 of FIG. 68, the acts described with regard to FIGS. 60A-60C to 64A-64C and 65 are repeated to form a third IC die 102c. The third IC die 102c is as the second IC die 102b is described and illustrated in FIG. 65, except that the number of HB layers 414 is less (e.g., one less).

Figure 69:
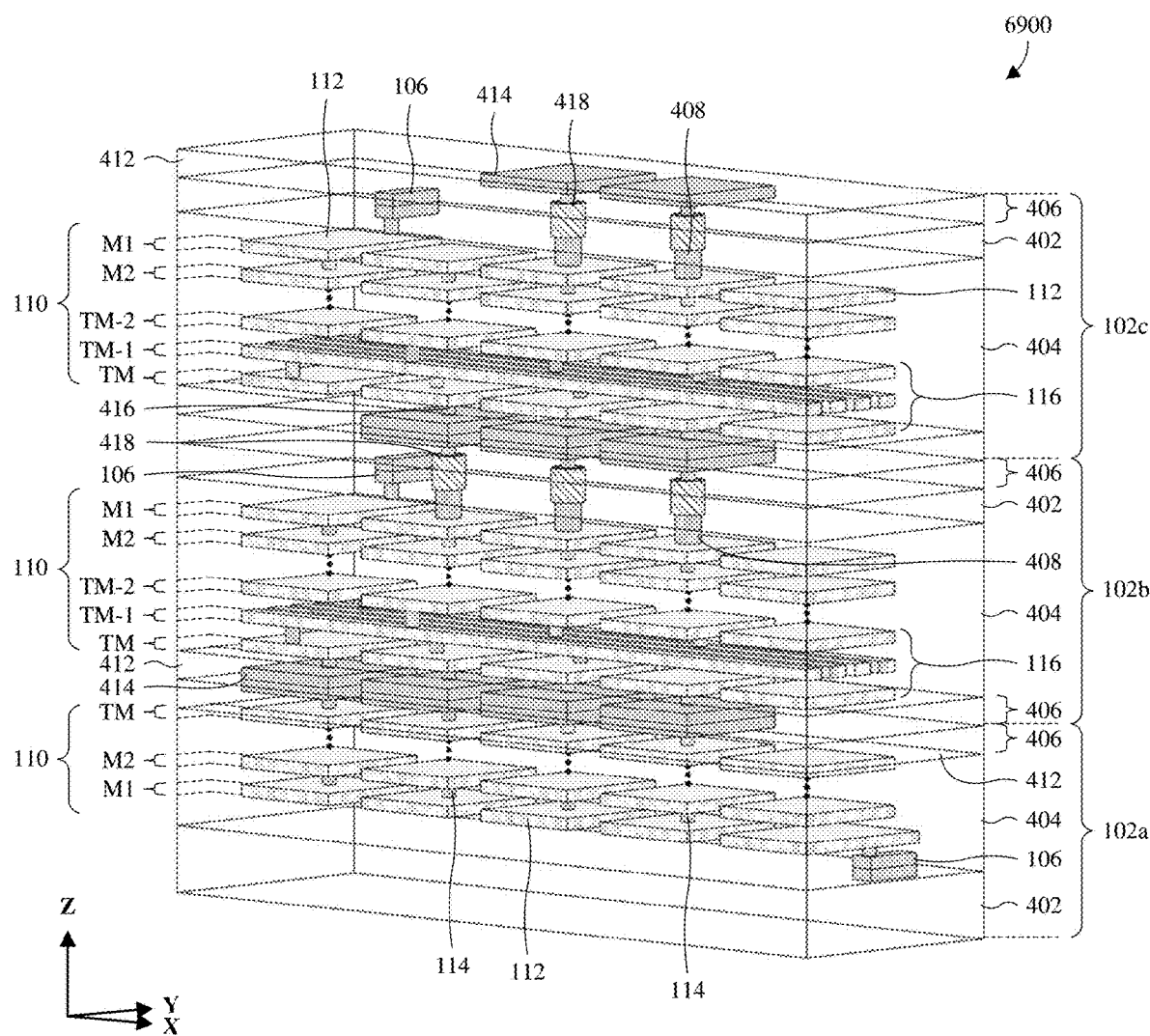

As illustrated by the perspective view 6900 of FIG. 69, the acts described with regard to FIGS. 66 and 67 are repeated respectively to: 1) hybrid bond the third IC die 102c to the second IC die 102b; and 2) form an additional HB structure 406 over the third IC die 102c. The formed HB structure 406 is as described and illustrated with regard to FIG. 67, except that the number of HB layers 414 is less (e.g., one less).

Figure 70:
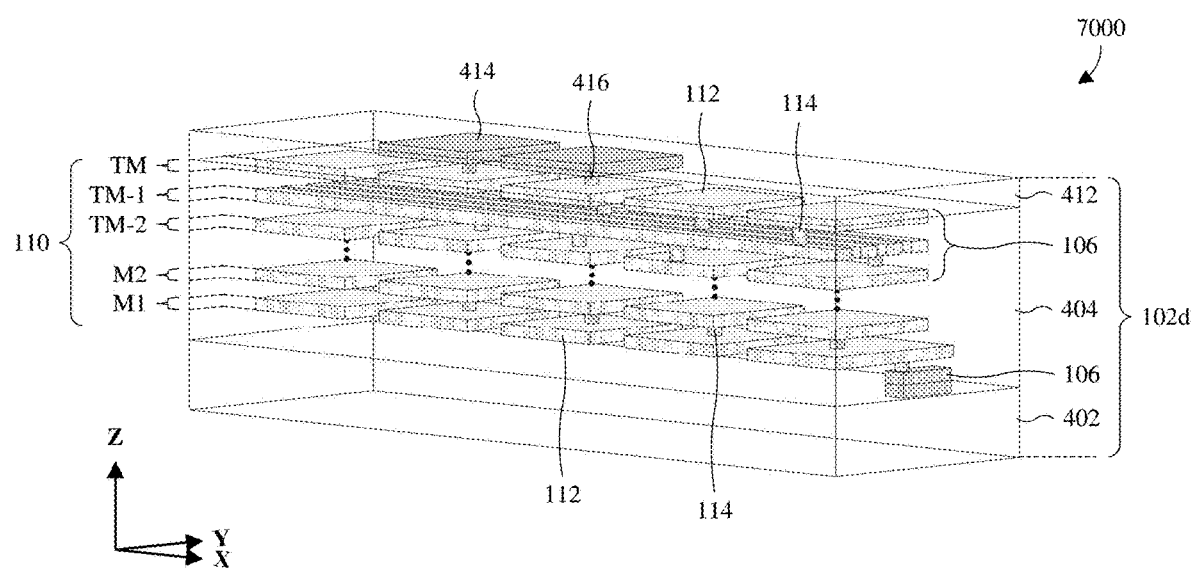

As illustrated by the perspective view 7000 of FIG. 70, the acts described with regard to FIGS. 60A-60C to 64A-64C and 65 are repeated to form a fourth IC die 102d. The fourth IC die 102d is as the second IC die 102b is described and illustrated in FIG. 65, except that the number of HB layers 414 is less (e.g., two less).

Figure 71:
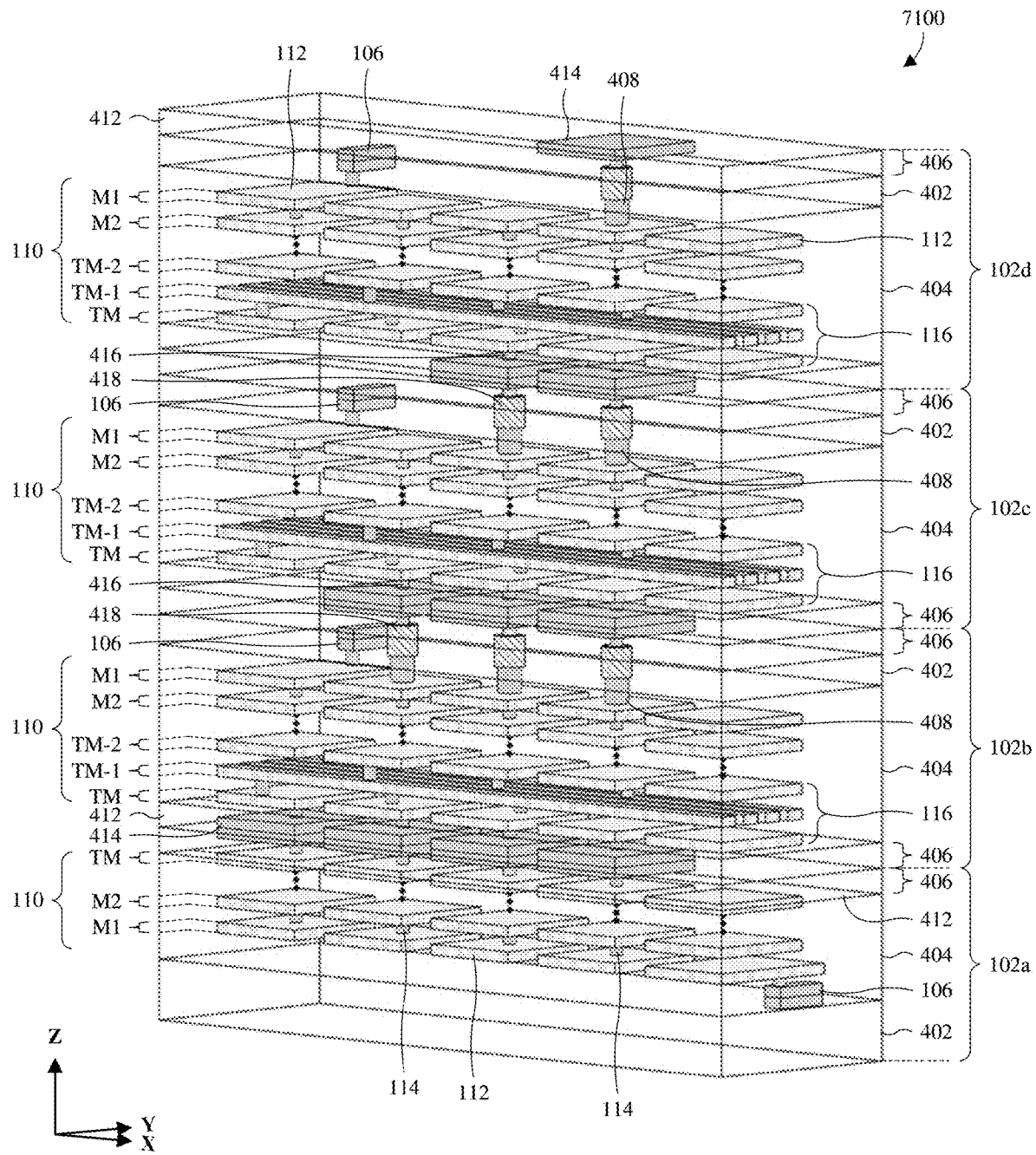

As illustrated by the perspective view 7100 of FIG. 71, the acts described with regard to FIGS. 66 and 67 are repeated respectively to: 1) hybrid bond the fourth IC die 102d to third IC die 102c; and 2) form an additional HB structure 406 over the fourth IC die 102d. The formed HB structure 406 is as is described and illustrated with regard to FIG. 67, except that the number of HB layers 414 is less (e.g., two less).

Figure 72:
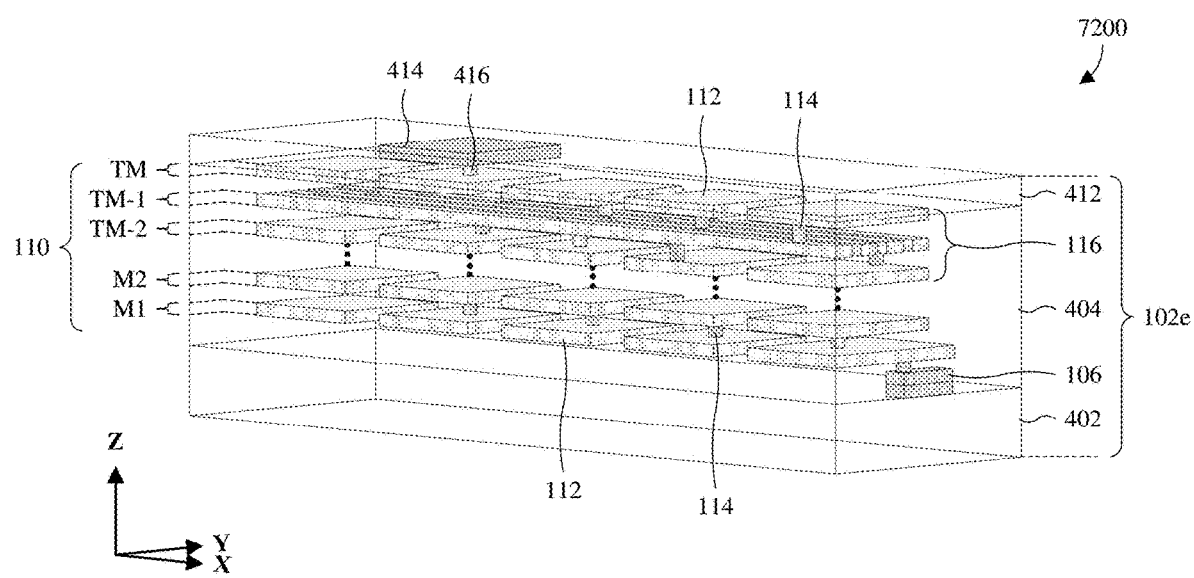

As illustrated by the perspective view 7200 of FIG. 72, the acts described with regard to FIGS. 60A-60C to 64A-64C and 65 are repeated to form a fifth IC die 102e. The fifth IC die 102e is as the second IC die 102b is described and illustrated in FIG. 65, except that the number of HB layers 414 is less (e.g., three less).

Figure 73:
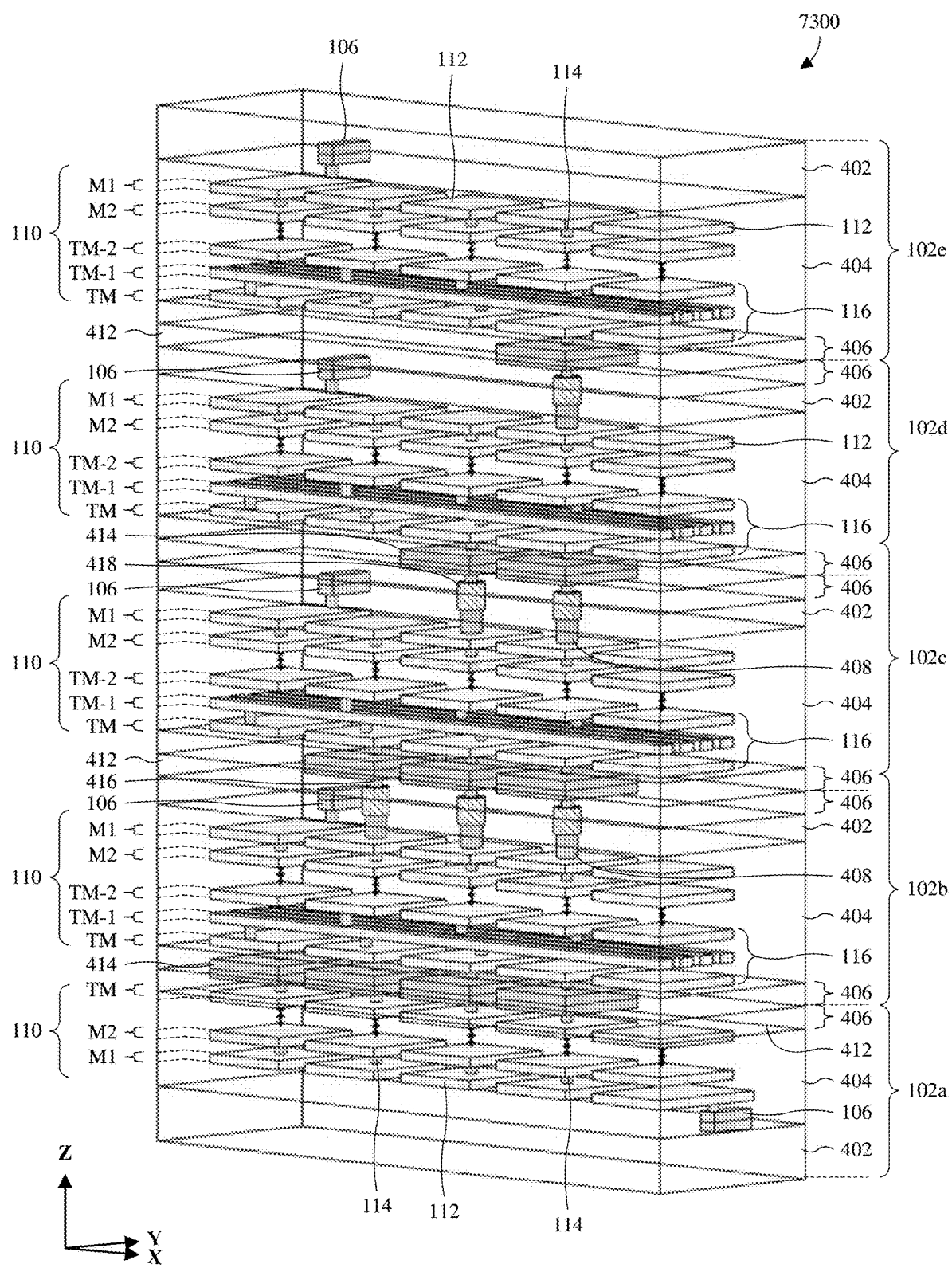

As illustrated by the perspective view 7300 of FIG. 73, the acts described with regard to FIG. 66 are repeated to hybrid bonded the fifth IC die 102e to fourth IC die 102d.

Figure 74:
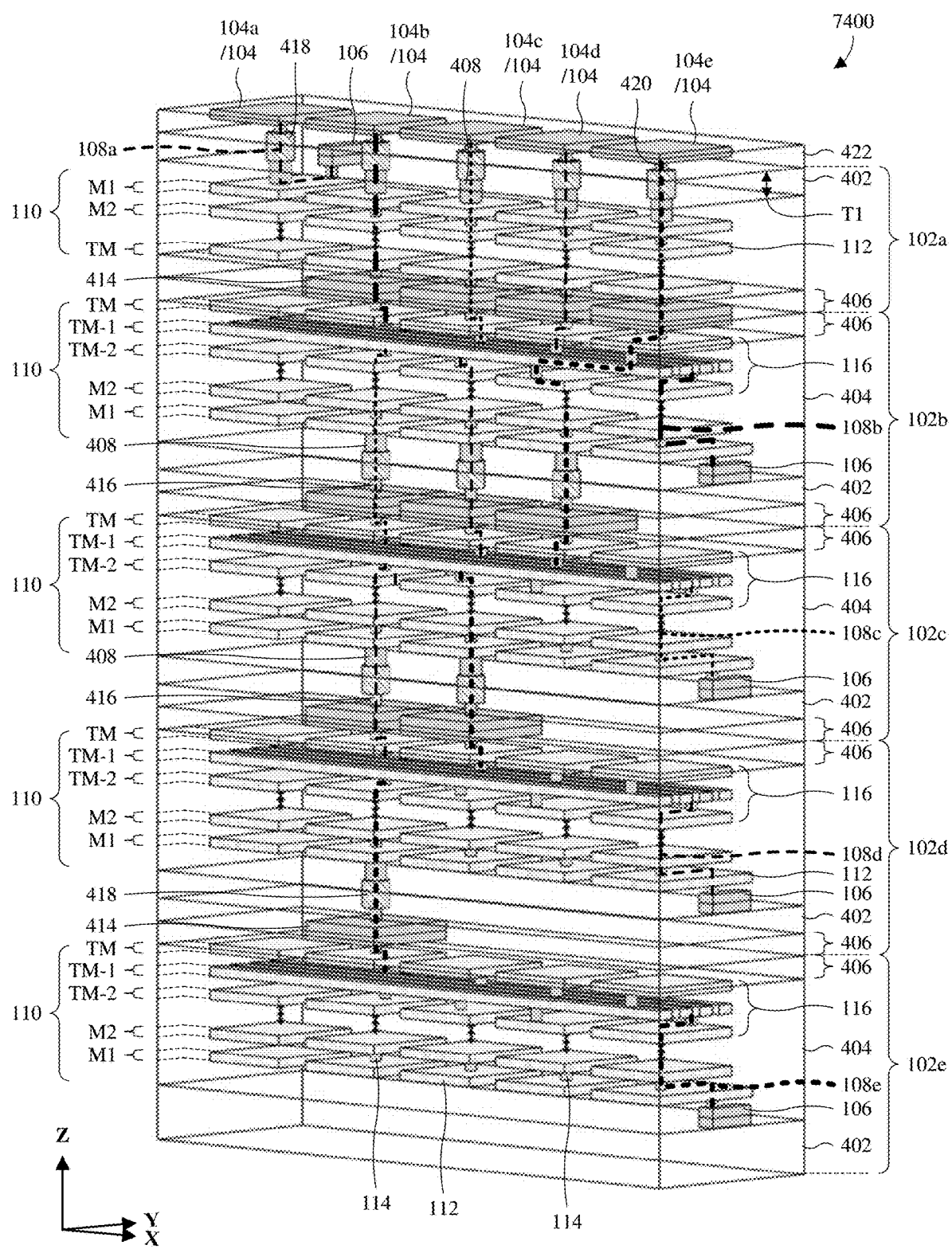

As illustrated by the perspective view 7400 of FIG. 74, the acts described with regard to FIG. 57 are performed. As a result, the structure of FIG. 73 is vertically flipped, the semiconductor substrate 402 of the first IC die 102a is thinned, and a plurality of backside pads 104 is formed overlying the first IC die 102a.

A first-die backside pad 104a is electrically coupled to the semiconductor device 106 of the first IC die 102a by a first-die conductive path 108a. A second-die backside pad 104b is electrically coupled to the semiconductor device 106 of the second IC die 102b by a second-die conductive path 108b formed in part by the frontside pad/bridge structure 116 of the second IC die 102b. A third-die backside pad 104c is electrically coupled to the semiconductor device 106 of the third IC die 102c by a third-die conductive path 108c formed in part by the frontside pad/bridge structures 116 of the second and third IC dies 102b, 102c. A fourth-die backside pad 104d is electrically coupled to the semiconductor device 106 of the fourth IC die 102d by a fourth-die conductive path 108d formed in part by the frontside pad/bridge structures 116 of the second, third, and fourth IC dies 102b-102d. A fifth-die backside pad 104e is electrically coupled to the semiconductor device 106 of the fifth IC die 102e by a fifth-die conductive path 108e formed in part by the frontside pad/bridge structures 116 of the second, third, fourth, and fifth IC dies 102b-102e.

While FIGS. 59, 60A-60C to 64A-64C, and 65-74 are described with reference to a method, it will be appreciated that the structures shown in FIGS. 59, 60A-60C to 64A-64C, and 65-74 are not limited to the method but rather may stand alone separate of the method. While FIGS. 59, 60A-60C to 64A-64C, and 65-74 are described as a series of acts, it will be appreciated that the order of the acts may be altered in other embodiments. While FIGS. 59, 60A-60C to 64A-64C, and 65-74 illustrate and describe as a specific set of acts, some acts that are illustrated and/or described may be omitted in other embodiments. Further, acts that are not illustrated and/or described may be included in other embodiments.

In view of the foregoing, some embodiments of the present disclosure provide a 3D IC including: a plurality of pads arranged in a row and including a first-die pad, a second-die pad, and a third-die pad; a first IC die underlying the plurality of pads, and including a first-die semiconductor device electrically coupled to the first-die pad by a first-die conductive path; a second IC die underlying and bonded to the first IC die, and including a second-die interconnect structure and a second-die semiconductor device electrically coupled to the second-die pad by a second-die conductive path; and a third IC die underlying and bonded to the second IC die, and including a third-die interconnect structure and a third-die semiconductor device electrically coupled to the third-die pad by a third-die conductive path; wherein each of the second-die and third-die interconnect structures includes an alternating stack of via layers and metal layers, including a TM-1 layer, wherein the TM-1 layer of the second IC die and the TM-1 layer of the third IC die have the same top layout and each changes the third-die conductive path from a location directly under a pad of the plurality of pads to a location directly under another pad of the plurality of pads. In some embodiments, the TM-1 layer of the second IC die changes the third-die conductive path from a location directly under the third-die pad to a location directly under the second-die pad, wherein the TM-1 layer of the third IC die changes the third-die conductive path from a location directly under the second-die pad to a location directly under the third-die pad. In some embodiments, the row consists of three pads, wherein the third-die pad is between the first-die and second-die pads. In some embodiments, the TM-1 layer of the second IC die further changes the second-die conductive path from a location directly under a pad of the plurality of pads to another pad of the plurality of pads. In some embodiments, the second-die and third-die conductive paths extend in opposite directions at the TM-1 layer of the second IC die in route respectively to the second-die and third-die semiconductor devices. In some embodiments, the alternating stack of each of the second-die and third-die interconnect structures includes a TM layer overlying the TM-1 layer of that alternating stack and further includes a TM-2 layer underlying the TM-1 layer of that alternating stack, wherein the TM and TM-2 layers of the second-die interconnect structure have the same top layouts respectively as the TM and TM-2 layers of the third-die interconnect structure. In some embodiments, the row extends in a dimension, wherein the TM-1 layer of the second IC die includes a plurality of bridge wires elongated in parallel in the dimension from directly under the second-die pad to directly under the third-die pad, and wherein the bridge wires respectively and partially form the second-die and third-die conductive paths. In some embodiments, the plurality of pads further includes a fourth-die pad and a fifth-die pad, wherein the 3D IC further includes: a fourth IC die underlying and bonded to the third IC die, and including a fourth-die interconnect structure and a fourth-die semiconductor device electrically coupled to the fourth-die pad by a fourth-die conductive path; and a fifth IC die underlying and bonded to the fourth IC die, and including a fifth-die interconnect structure and a fifth-die semiconductor device electrically coupled to the fifth-die pad by a fifth-die conductive path; wherein the TM-1 layer of the second IC die changes the third-die conductive path from a location directly under the third-die pad to a location directly under the second-die pad, and wherein the TM-1 layer of the third IC die changes the third-die conductive path from a location directly under the second-die pad to a location directly under the fifth-die pad. In some embodiments, the second-die and third-die interconnect structures are the same as each other.

In some embodiments, the present disclosure provides another 3D IC including: a plurality of pads arranged in a row and including a first-die pad, a second-die pad, and a third-die pad; a first IC die underlying the plurality of pads, and including a first-die semiconductor device electrically coupled to the first-die pad by a first-die conductive path; a second IC die underlying the first IC die, and including a second-die semiconductor device electrically coupled to the second-die pad by a second-die conductive path; a third IC die underlying the second IC die, and including a third-die semiconductor device electrically coupled to the third-die pad by a third-die conductive path; and a plurality of via layers and a plurality of metal layers alternatingly stacked across the first, second, and third IC dies and forming a second-die pad/bridge structure and a third-die pad/bridge structure respectively at the second and third IC dies, wherein the second-die and third-die pad/bridge structures are the same and each includes a plurality of bridge wires at a common elevation and having greatest dimensions extending in parallel from directly under the second-die pad to directly under the third-die pad, and wherein the second-die and third-die conductive paths extend along individual bridge wires of the second-die pad/bridge structure. In some embodiments, the third-die conductive path extends along an individual bridge wire of the third-die pad/bridge structure, wherein the second-die conductive path is spaced from the third-die pad/bridge structure. In some embodiments, the plurality of bridge wires of each of the second-die and third-die pad/bridge structures includes a first bridge wire and a second bridge wire, wherein the second-die conductive path extends along the second bridge wire of the second-die pad/bridge structure, wherein the third-die conductive path extends along the first bridge wire of the second-die pad/ bridge structure and the second bridge wire of the third-die pad/bridge structure, and wherein the second bridge wire of the third-die pad/bridge structure underlies the second bridge wire of the second-die pad/bridge structure. In some embodiments, the plurality of via layers and the plurality of metal layers form a first columnar structure, a second columnar structure, and a third columnar structure respectively underlying the first-die, second-die, and third-die pads, wherein the second-die and third-die pad/bridge structures provide bridging between the second and third columnar structures. In some embodiments, the second-die conductive path extends along the second columnar structure from the second-die pad to the second-die pad/bridge structure and extends along the third columnar structure from the second-die pad/bridge structure to the second-die semiconductor device. In some embodiments, the third-die conductive path extends along the third columnar structure from the third-die pad to the second-die pad/bridge structure, extends along the second columnar structure from the second-die pad/bridge structure to the third-die pad/bridge structure, and extends along the third columnar structure from the third-die pad/bridge structure to the third-die semiconductor device. In some embodiments, the 3D IC consists of X number of IC dies, wherein X is an integer greater than two, and wherein the plurality of bridge wires of the second-die pad/bridge structure consists of X number of bridge wires.

In some embodiments, the present disclosure provides a method for forming a 3D IC, the method including: forming a first IC die, a second IC die, and third IC die; bonding the second IC die to the first and third IC dies, such that the second IC die is between the first and third IC dies; and forming a plurality of backside pads arranged in a first row and overlying the first, second, and third IC dies, wherein the plurality of backside pads includes a first-die backside pad, a second-die backside pad, and a third-die backside pad electrically coupled respectively to individual semiconductor devices of the first, second, and third IC dies; wherein the second and third IC dies each includes an alternating stack of via layers and metal layers, including a TM layer and a TM-1 layer, wherein the TM layer includes a plurality of TM pads arranged in a second row, and wherein the TM-1 layer includes a plurality of bridge wires elongated in parallel from directly under a TM pad of the plurality of TM pads to directly under another TM pad of the plurality of TM pads; wherein the backside pads are formed respectively overlying the TM pads of the second IC die and the TM pads of the third IC die, and wherein the second-die and third-die backside pads are electrically coupled respectively to the individual semiconductor devices of the second and third IC dies respectively through the bridge wires of the second IC die; and wherein the TM and TM-1 layers of the second IC die are formed using the same photoreticles/photomasks respectively as the TM and TM-1 layers of the third IC die. In some embodiments, the bonding includes: hybrid bonding the first IC die to the second IC die; and hybrid bonding the third IC die to the second IC die, such that the individual semiconductor device of the second IC die is between the alternating stack of the second IC die and the alternating stack of the third IC die. In some embodiments, the third-die backside pad is electrically coupled respectively to the individual semiconductor device of the third IC die through a respective one of the bridge wires of the third IC die. In some embodiments, the alternating stack of the second IC die is the same as the alternating stack of the third IC die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional (3D) integrated circuit (IC) comprising:
   a plurality of pads arranged in a row and comprising a first-die pad, a second-die pad, and a third-die pad;
   a first IC die underlying the plurality of pads, and comprising a first-die semiconductor device electrically coupled to the first-die pad by a first-die conductive path;
   a second IC die underlying and bonded to the first IC die, and comprising a second-die interconnect structure and a second-die semiconductor device electrically coupled to the second-die pad by a second-die conductive path; and
   a third IC die underlying and bonded to the second IC die, and comprising a third-die interconnect structure and a third-die semiconductor device electrically coupled to the third-die pad by a third-die conductive path;
   wherein each of the second-die and third-die interconnect structures comprises an alternating stack of via layers and metal layers, including a top metal (TM)-1 layer, wherein the TM-1 layer of the second IC die and the TM-1 layer of the third IC die have the same top layout and each changes the third-die conductive path from a location directly under a pad of the plurality of pads to a location directly under another pad of the plurality of pads.

2. The 3D IC according to claim 1, wherein the TM-1 layer of the second IC die changes the third-die conductive path from a location directly under the third-die pad to a location directly under the second-die pad, and wherein the TM-1 layer of the third IC die changes the third-die conductive path from a location directly under the second-die pad to a location directly under the third-die pad.

3. The 3D IC according to claim 1, wherein the row consists of three pads, and wherein the third-die pad is between the first-die and second-die pads.

4. The 3D IC according to claim 1, wherein the TM-1 layer of the second IC die further changes the second-die conductive path from a location directly under a pad of the plurality of pads to another pad of the plurality of pads.

5. The 3D IC according to claim 1, wherein the second-die and third-die conductive paths extend in opposite directions at the TM-1 layer of the second IC die in route respectively to the second-die and third-die semiconductor devices.

6. The 3D IC according to claim 1, wherein the alternating stack of each of the second-die and third-die interconnect structures comprises a TM layer overlying the TM-1 layer of that alternating stack and further comprises a TM-2 layer underlying the TM-1 layer of that alternating stack, and wherein the TM and TM-2 layers of the second-die interconnect structure have the same top layouts respectively as the TM and TM-2 layers of the third-die interconnect structure.

7. The 3D IC according to claim 1, wherein the row extends in a dimension, wherein the TM-1 layer of the second IC die comprises a plurality of bridge wires elongated in parallel in the dimension from directly under the second-die pad to directly under the third-die pad, and wherein the bridge wires respectively and partially form the second-die and third-die conductive paths.

8. The 3D IC according to claim 1, wherein the plurality of pads further comprises a fourth-die pad and a fifth-die pad, and wherein the 3D IC further comprises:
   a fourth IC die underlying and bonded to the third IC die, and comprising a fourth-die interconnect structure and a fourth-die semiconductor device electrically coupled to the fourth-die pad by a fourth-die conductive path; and
   a fifth IC die underlying and bonded to the fourth IC die, and comprising a fifth-die interconnect structure and a fifth-die semiconductor device electrically coupled to the fifth-die pad by a fifth-die conductive path;
   wherein the TM-1 layer of the second IC die changes the third-die conductive path from a location directly under the third-die pad to a location directly under the second-die pad, and wherein the TM-1 layer of the third IC die changes the third-die conductive path from a location directly under the second-die pad to a location directly under the fifth-die pad.

9. The 3D IC according to claim 1, wherein the second-die and third-die interconnect structures are the same as each other.

10. A three-dimensional (3D) integrated circuit (IC) comprising:
    a plurality of pads arranged in a row and comprising a first-die pad, a second-die pad, and a third-die pad;
    a first IC die underlying the plurality of pads, and comprising a first-die semiconductor device electrically coupled to the first-die pad by a first-die conductive path;
    a second IC die underlying the first IC die, and comprising a second-die semiconductor device electrically coupled to the second-die pad by a second-die conductive path;
    a third IC die underlying the second IC die, and comprising a third-die semiconductor device electrically coupled to the third-die pad by a third-die conductive path; and
    a plurality of via layers and a plurality of metal layers alternatingly stacked across the first, second, and third IC dies and forming a second-die pad/bridge structure and a third-die pad/bridge structure respectively at the second and third IC dies, wherein the second-die and third-die pad/bridge structures are the same and each comprises a plurality of bridge wires at a common elevation and having greatest dimensions extending in parallel from directly under the second-die pad to directly under the third-die pad, and wherein the second-die and third-die conductive paths extend along individual bridge wires of the second-die pad/bridge structure.

11. The 3D IC according to claim 10, wherein the third-die conductive path extends along an individual bridge wire of the third-die pad/bridge structure, and wherein the second-die conductive path is spaced from the third-die pad/bridge structure.

12. The 3D IC according to claim 10, wherein the plurality of bridge wires of each of the second-die and third-die pad/bridge structures comprises a first bridge wire and a second bridge wire, wherein the second-die conductive path extends along the second bridge wire of the second-die pad/bridge structure, wherein the third-die conductive path extends along the first bridge wire of the second-die pad/bridge structure and the second bridge wire of the third-die pad/bridge structure, and wherein the second bridge wire of the third-die pad/bridge structure underlies the second bridge wire of the second-die pad/bridge structure.

13. The 3D IC according to claim 10, wherein the plurality of via layers and the plurality of metal layers form a first columnar structure, a second columnar structure, and a third columnar structure respectively underlying the first-die, second-die, and third-die pads, and wherein the second-die and third-die pad/bridge structures provide bridging between the second and third columnar structures.

14. The 3D IC according to claim 13, wherein the second-die conductive path extends along the second columnar structure from the second-die pad to the second-die pad/bridge structure and extends along the third columnar structure from the second-die pad/bridge structure to the second-die semiconductor device.

15. The 3D IC according to claim 13, wherein the third-die conductive path extends along the third columnar structure from the third-die pad to the second-die pad/bridge structure, extends along the second columnar structure from the second-die pad/bridge structure to the third-die pad/bridge structure, and extends along the third columnar structure from the third-die pad/bridge structure to the third-die semiconductor device.

16. The 3D IC according to claim 10, wherein the 3D IC consists of X number of IC dies, wherein X is an integer greater than two, and wherein the plurality of bridge wires of the second-die pad/bridge structure consists of X number of bridge wires.

17. A method for forming a three-dimensional (3D) integrated circuit (IC), the method comprising:
  forming a first IC die, a second IC die, and a third IC die;
  bonding the second IC die to the first and third IC dies, such that the second IC die is between the first and third IC dies; and
  forming a plurality of backside pads arranged in a first row and overlying the first, second, and third IC dies, wherein the plurality of backside pads comprises a first-die backside pad, a second-die backside pad, and a third-die backside pad electrically coupled respectively to individual semiconductor devices of the first, second, and third IC dies;
  wherein the second and third IC dies each comprises an alternating stack of via layers and metal layers, including a top metal (TM) layer and a TM-1 layer, wherein the TM layer comprises a plurality of TM pads arranged in a second row, and wherein the TM-1 layer comprises a plurality of bridge wires elongated in parallel from directly under a TM pad of the plurality of TM pads to directly under another TM pad of the plurality of TM pads;
  wherein the backside pads are formed respectively overlying the TM pads of the second IC die and the TM pads of the third IC die, and wherein the second-die and third-die backside pads are electrically coupled respectively to the individual semiconductor devices of the second and third IC dies respectively through the bridge wires of the second IC die; and
  wherein the TM and TM-1 layers of the second IC die are formed using the same photoreticles/photomasks respectively as the TM and TM-1 layers of the third IC die.

18. The method according to claim 17, wherein the bonding comprises:
  bonding the first IC die to the second IC die, wherein the bonding of the first IC die to the second IC die comprises bonding a first conductive region on the first IC die to a second conductive region on the second IC die and further bonding a first non-conductive region on the first IC die to a second non-conductive region of the second IC die; and
  bonding the third IC die to the second IC die, such that the individual semiconductor device of the second IC die is between the alternating stack of the second IC die and the alternating stack of the third IC die.

19. The method according to claim 17, wherein the third-die backside pad is electrically coupled respectively to the individual semiconductor device of the third IC die through a respective one of the bridge wires of the third IC die.

20. The method according to claim 17, wherein the alternating stack of the second IC die is the same as the alternating stack of the third IC die.

* * * * *